(12) United States Patent
Watanabe et al.

(10) Patent No.: US 7,092,305 B2
(45) Date of Patent: Aug. 15, 2006

(54) SEMICONDUCTOR MEMORY DEVICE

(75) Inventors: Naoya Watanabe, Hyogo (JP); Aiko Nishino, Hyogo (JP); Katsumi Dosaka, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 294 days.

(21) Appl. No.: 10/822,717

(22) Filed: Apr. 13, 2004

(65) Prior Publication Data

US 2004/0190352 A1  Sep. 30, 2004

Related U.S. Application Data

(60) Division of application No. 10/077,833, filed on Feb. 20, 2002, now Pat. No. 6,888,776, which is a continuation-in-part of application No. 09/839,401, filed on Apr. 23, 2001, now abandoned.

(30) Foreign Application Priority Data

Sep. 6, 2000 (JP) ............................. 2000-270060
Sep. 4, 2001 (JP) ............................. 2001-267765

(51) Int. Cl.
*G11C 7/00* (2006.01)
*G11C 8/00* (2006.01)

(52) U.S. Cl. .................. 365/222; 365/230.06

(58) Field of Classification Search ............... 365/222, 365/230.06, 230.03
See application file for complete search history.

(56) References Cited

U.S. PATENT DOCUMENTS

| | | | |
|---|---|---|---|
| 5,761,148 A | 6/1998 | Allan et al. | |
| 5,875,149 A | 2/1999 | Oh et al. | |
| 5,877,978 A * | 3/1999 | Morishita et al. | 365/149 |
| 5,986,964 A | 11/1999 | Ariki et al. | |
| 6,028,910 A * | 2/2000 | Kirchner et al. | 378/22 |
| 6,111,808 A | 8/2000 | Khang et al. | |
| 6,366,515 B1 | 4/2002 | Hidaka | |
| 6,477,108 B1 | 11/2002 | Arimoto et al. | |
| 6,538,953 B1 | 3/2003 | Hidaka | |

FOREIGN PATENT DOCUMENTS

JP  10-050958  2/1998

OTHER PUBLICATIONS

"Figure 9 SLDRAM Functional Block Diagram", IEEE Micro, Nov./Dec. 1997, pp. 38-39.
"A Configurable DRAM Macro Design for 2112 Derivative Organizations to be Synthesized Using a Memory Generator", Yabe et al., 1998 IEEE International Solid-State Circuits Conference, Digest of Technical Papers, pp. 72-73.

* cited by examiner

*Primary Examiner*—Son T. Dinh
(74) *Attorney, Agent, or Firm*—McDermott Will & Emery LLP

(57) ABSTRACT

A main control circuit generates a plurality of main control signals of different phases to local control circuits. The local control circuits produce row-related control signals greater in number than the main control signals in accordance with these main control signals. A semiconductor memory device can be easily adapted to change in bank structure, and can perform a fast and stable operation with a low current consumption.

6 Claims, 59 Drawing Sheets

FIG.46

| MEMORY BLOCK MB | ACT BLOCK ADDRESS DECODER | | | | | REF BLOCK ADDRESS DECODER | | | | |
|---|---|---|---|---|---|---|---|---|---|---|
| | SW4 | SW3 | SW2 | SW1 | SW0 | SW4 | SW3 | SW2 | SW1 | SW0 |
| 0 | 0 | 0 | 0 | 0 | 0 | 0 | 0 | 0 | 0 | 0 |
| 1 | 0 | 0 | 0 | 0 | 1 | 0 | 0 | 0 | 0 | 1 |
| 2 | 0 | 0 | 0 | 1 | 0 | 0 | 0 | 0 | 1 | 0 |
| 3 | 0 | 0 | 0 | 1 | 1 | 0 | 0 | 0 | 1 | 1 |
| 4 | 0 | 0 | 1 | 0 | 0 | 0 | 0 | 1 | 0 | 0 |
| 5 | 0 | 0 | 1 | 0 | 1 | 0 | 0 | 1 | 0 | 1 |
| 6 | 0 | 0 | 1 | 1 | 0 | 0 | 0 | 0 | 0 | 0 |
| 7 | 0 | 0 | 1 | 1 | 1 | 0 | 0 | 0 | 0 | 1 |
| 8 | 0 | 1 | 0 | 0 | 0 | 0 | 0 | 0 | 1 | 0 |
| 9 | 0 | 1 | 0 | 0 | 1 | 0 | 0 | 0 | 1 | 1 |
| 10 | 0 | 1 | 0 | 1 | 0 | 0 | 0 | 1 | 0 | 0 |
| 11 | 0 | 1 | 0 | 1 | 1 | 0 | 0 | 1 | 0 | 1 |

FIG.47

| MEMORY BLOCK MB | ACT BLOCK ADDRESS DECODER | | | | | REF BLOCK ADDRESS DECODER | | | | |
|---|---|---|---|---|---|---|---|---|---|---|
| | SW4 | SW3 | SW2 | SW1 | SW0 | SW4 | SW3 | SW2 | SW1 | SW0 |
| 0 | 0 | 0 | 0 | 0 | 0 | 0 | 0 | 0 | 0 | 0 |
| 1 | 0 | 0 | 0 | 0 | 1 | 0 | 0 | 0 | 0 | 1 |
| 2 | 0 | 0 | 0 | 1 | 0 | 0 | 0 | 0 | 0 | 0 |
| 3 | 0 | 0 | 0 | 1 | 1 | 0 | 0 | 0 | 0 | 1 |
| 4 | 0 | 0 | 1 | 0 | 0 | 0 | 0 | 0 | 0 | 0 |
| 5 | 0 | 0 | 1 | 0 | 1 | 0 | 0 | 0 | 0 | 1 |

SEMICONDUCTOR MEMORY DEVICE

This application is a divisional of application Ser. No. 10/077,833 filed Feb. 20, 2002 now U.S. Pat. No. 6,888,776, which is a Continuation-In-Part of U.S. Ser. No. 09/839,401, filed Apr. 23, 2001 now abandoned.

BACKGROUND OF THE INVENTION

1. Field of the Invention

The present invention relates to a semiconductor memory device, and particularly to a semiconductor memory device having a large storage capacity. In particular, the present invention relates to row-related control circuitry for controlling a row selecting operation in a refresh operation mode and a normal operation mode of a clock synchronous DRAM (Dynamic Random Access Memory) used, e.g., in a DRAM integrated on a common chip together with a logic or the like.

2. Description of the Background Art

FIG. 79 schematically shows a whole structure of a conventional clock synchronous semiconductor memory device. In FIG. 79, the clock synchronous semiconductor memory device includes a plurality of sub-memory arrays SMA0–SMA3, row decoders RD0–RD3 provided corresponding to sub-memory arrays SMA0–SMA3 for selecting rows of memory cells in corresponding sub-memory arrays, respectively, a column decoder CDA provided for sub-memory arrays SMA0 and SMA2 for producing a column select signal for selecting columns in these sub-memory arrays, a column decoder CDB provided corresponding to sub-memory arrays SMA1 and SMA3 for producing the column select signal for selecting columns in these sub-memory arrays, a data path DPA for transmitting data to and from memory cells in the column selected by column decoder CDA, and a data path DPB for transmitting data to and from memory cells in the column selected by column decoder CDB. Each of data paths DPA and DPB includes data input circuitry (an input buffer and a write buffer) and data output circuitry (an output buffer and a preamplifier).

Sub-memory arrays SMA0 and SMA1 form a bank BA#1, and sub-memory arrays SMA2 and SMA3 form a bank BA#0. Commonly to banks BA#1 and BA#0, there is arranged a main control circuit MCK that operates in synchronization with a clock signal CLK to receive an address signal ADD and a command CMD instructing an operation mode, and produces an operation control signal for banks BA#0 and BA#1. For bank BA#0, a sub-control circuit SCK0 is provided. For bank BA#1, a sub-control circuit SCK1 is provided. Main control circuit MCK produces an operation control signal for a designated bank in accordance with a bank address included in address signal ADD. Sub-control circuits SCK0 and SCK1 produce control signals for performing designated operations in accordance with the main operation control signal received from main control circuit MCK. These sub-control circuits SCK0 and SCK1 operate independently of each other in accordance with the operation control signal received from main control circuit MCK.

As shown in FIG. 79, the memory array is divided into two banks BA#0 and BA#1 so as to be activated and deactivated independently of each other in accordance with sub-control circuits SCK0 and SCK1, respectively. Therefore, the data access can be made to the banks in an interleaved manner, so that a penalty upon page switching is not caused, and fast access can be performed.

FIG. 80 schematically shows a structure of sub-memory arrays SMA0–SMA3 shown in FIG. 79. Sub-memory arrays SMA0–SMA3 have the same structure, and therefore, FIG. 80 shows only one sub-memory array as a representative.

In FIG. 80, sub-memory array SMA includes a plurality of memory blocks MB0–MB7, a sense amplifier bands SAB1–SAB7 arranged between memory blocks MB0–MB7, and sense amplifier bands SAB0 and SAB8 arranged outside memory blocks MB0 and MB7, respectively.

In memory block MB0, memory cells are arranged in rows and columns. In sense amplifier bands SAB0–SAB8, sense amplifier circuits are arranged corresponding to the columns of corresponding memory blocks MB0–MB7. Sense amplifier bands SAB0–SAB8 have a so-called "alternately arranged, shared sense amplifier structure", in which the sense amplifier circuits are arranged alternately on the opposite sides of the columns of the corresponding memory blocks, and each sense amplifier circuit is shared between the adjacent memory blocks.

In the sub-memory array SMA, the row selecting operation is performed on a block basis. One of the memory blocks is designated by the block select signal produced in accordance with the block address includes in address signal ADD, and the row selection is performed in the selected memory block. Since sub-memory array SMA is divided into the plurality of memory blocks MB0–MB7, each of sub-control circuits SCK0 and SCK1 is divided into local control circuits corresponding to memory blocks MB0–MB7.

As shown in FIG. 80, a block dividing operation or a partial activation is performed in sub-memory array SMA and the memory blocks in an unselected state are maintained in a precharged state for reducing a current consumption.

For arranging the sub-memory array shown in FIG. 80, sense amplifier band SAB8 of bank BA#1 and sense amplifier band SAB0 of bank BA#0 are arranged adjacently to each other on a boundary between banks BA#0 and BA#1. Thus, the sense amplifier band of each bank can be activated and deactivated independently of those of the other bank.

FIG. 81 schematically shows a structure for a portion related to sub-control circuits SCK0 and SCK1 shown in FIG. 79. Sub-memory array SMA2 included in bank BA#0 includes memory blocks MB00–MB07. Sub-memory array SMA0 of bank BA#1 includes memory blocks MB10–MB17. The sense amplifier bands are arranged on the opposite sides of these memory blocks MB00–MB07 and MB10–MB17 in the column direction. In FIG. 81, these sense amplifier bands are depicted as rectangular regions, respectively.

Sub-control circuit CK0 includes local control circuits LCK00–LCK07 provided corresponding to memory blocks MB00–MB07, respectively, and sub-control circuit CK1 includes local control circuits LCK10–LCK17 provided corresponding to memory blocks MB10–MB17, respectively.

Main control circuit MCK produces a row-related control signal group BRC and a predecode block address signal PDA for the banks in accordance with externally applied command CMD and address signal ADD, and also produces internal clock signal CLK in accordance with an externally applied clock signal ECLK. Internal clock signal CLK generated from main control circuit MCK is applied commonly to local control circuits LCK00–LCK07 and LCK10–LCK17. Row-related control signal group BRC for the banks includes a row-related control signal BR0 for bank BA#0 and a row-related control signal BR1 for bank BA#1.

Row-related control signal BR0 is applied commonly to local control circuits LCK00–LCK07, and row-related control signal BR1 is applied commonly to local control circuits LCK10–LCK17.

A predecode block address signal PBA is produced by predecoding a block address included in externally applied address signal ADD. Predecode block address signal PBA of 6 bits includes a predecode block address signal group PBG0 of 2 bits and a predecode block address signal group of 4 bits, and is applied commonly to banks BA#0 and BA#1. In FIG. 81, since each of banks BA#0 and BA#1 includes eight memory blocks, the predecode block address of 6 bits is produced. Predecode block address group PBG0 of 2 bits designates the memory blocks in an upper or lower half in each of banks BA#0 and BA#1. Predecode block address group PBG1 of 4 bits designates one memory block among these memory blocks in the upper half and the lower half in each of the banks. Therefore, each of local control circuits LCK00–LCK07 and LCK10–LCK17 receives one bit in each of these predecode block address bit groups PBG0 and PBG1.

Predecode block address signal PBA commonly designates the memory blocks in banks BA#0 and BA#1. In accordance with row-related control signal group BRC for the banks, the row-related control signals for the bank designated by the bank address included in address signal ADD is activated, and the operation related to row selection is performed in an activated bank.

For simplifying the figure, structures of sub-memory arrays SMA1 and SMA3 are not shown in FIG. 81. These sub-memory arrays SMA1 and SMA3 have structures similar to those of sub-memory arrays SMA0 and SMA2, and local control circuits LCK00–LCK07 and LCK10–LCK17 controls the row selecting operation therein.

Each of data paths DPA and DPB includes a write driver, a preamplifier and a data I/O buffer, and transmits data to and from the memory cell on a column selected by column decoder CDA.

As shown in FIG. 81, the row selection is performed on a block basis in each of banks BA#0 and BA#1, so that unselected memory blocks can be maintained in the precharged state, and the current consumption can be reduced.

The address signal (referred to as a "word line address signal", hereinafter) for designating a word line must be applied commonly to all the memory blocks, or commonly to local control circuits LCK00–LCK07 and LCK10 and LCK17.

FIG. 82 shows an example of a structure of an input buffer in main control circuit MCK. Main control circuit MCK takes in externally applied command CMD and address signal ADD in synchronization with external clock signal ECLK (internal clock signal CLK). In FIG. 82, input buffer IB includes: an inverter IV that inverts clock signal (internal clock signal) CLK; a transmission gate XF1 that is turned on to pass input signal IN when clock signal CLK is at L-level; an inverter latch IL1 that latches the signal passing through transmission gate XF1; a transmission gate XF2 that is turned on to pass the signal latched by inverter latch IL1 when clock signal CLK is at H-level; and an inverter latch IL2 that latches the signal passing through transmission gate XF2 for producing an internal output signal OUT.

Transmission gates XF1 and XF2 are CMOS transmission gates, respectively, and are turned on/off in synchronization with clock signal CLK and a complementary clock signal generated from inverter IV. An operation of input buffer IB shown in FIG. 82 will now be described with reference to a signal waveform diagram shown in FIG. 83.

When clock signal CLK is at L-level, transmission gate XF1 is conductive, and inverter latch IN1 latches input signal IN. Meanwhile, transmission gate XF2 is non-conductive, and output signal OUT does not change.

When clock signal CLK rises to H-level, transmission gate XF1 is turned off, and input signal IN does not affect the latched signal of inverter latch IL1. When clock signal CLK rises to H-level, transmission gate XF2 is responsively turned on, and the signal latched by inverter latch IL1 is transmitted to inverter latch IL2, so that output signal OUT is produced. Accordingly, output signal OUT changes in synchronization with the rising of clock signal CLK.

Input buffer IB shown in FIG. 82 is provided in main control circuit MCK for each of address signal ADD and command CMD. Internal signals are produced in synchronization with rising of clock signal CLK, and therefore, the internal signals change in synchronization with the rising of clock signal CLK if a setup/hold time to clock signal CLK is ensured. Therefore, it is not necessary to consider a skew between these input signals, and it is possible to set the start timing of the internal operations faster.

FIG. 84 schematically shows line loads of the internal clock signal, row-related control signal and the predecode block address signal. In FIG. 84, internal clock signal CLK is transmitted by a clock driver DRV0 via a signal line SGL0. Row-related control signal BR (BR0 or BR1) is transmitted by a drive circuit DRV1 through a signal line SGL1. Predecode block address signal PB is transmitted by a drive circuit DRV2 via a signal line SGL2.

As shown in FIG. 81, the internal clock signal must be applied commonly to local control circuits LCK00–LCK07 and LCK10–LCK17, and therefore, signal line SGL0 have the largest load capacitance C0.

As for the row-related control signal BR, since all the local control circuits of the corresponding bank are coupled thereto, signal line SGL1 have a second largest load capacitance C1.

As for predecode block address signal PB, the local control circuits for the two memory blocks are connected in each bank to predecode block address signal bit group PBG1, so that the signal lines for the predecode block address signal bit group PBG1 has the smallest load capacitance C2. For predecode block address signal group PBG0, four local control circuits are connected in each bank to the signal lines for transmitting the predecode block address signal group PBG0. Therefore, a repeater may be arranged between the banks, whereby the load of the driver can be reduced, and the line load thereof can be made smaller than that for the row-related control signal. Since these signal lines SGL0–SGL2 have different line load capacitances C0–C2, their signal transmission delay times are different from each other, resulting in skews between these signals. In particular, these signals are transmitted unidirectionally along the column direction from main control circuit MCK toward local control circuit LCK17 at the remotest position. Therefore, a difference in signal transmission delay time also occurs between local control circuit LCK00 nearest to main control circuit MCK and local control circuit LCK17 remotest therefrom, and therefore a difference occurs in magnitude of the skew between the both.

FIG. 85 schematically shows a timing relationship among the input signals of local control circuits LCK00 and LCK17 as well as the externally applied signals, i.e., clock signal ECLK, address signal ADD and command CMD.

Main control circuit MCK is supplied with external clock signal ECLK, address signal ADD and command CMD. In synchronization with rising of external clock signal ECLK, main control circuit MCK takes in externally applied address signal ADD and command CMD, and produces predecode block address signal PBA and row-related control signal BR (BR0 or BR1). For local control circuit LCK00 nearest to main control circuit MCK, the smallest phase difference occurs between internal clock signal CLK and external clock signal ECLK. Main control circuit MCK produces row-related control signal BR0 and predecode block address signal PBA in synchronization with internal clock signal CLK, for transmission to local control circuit LCK00.

In local control circuit LCK00, signal line SGL0 transmitting internal clock signal CLK has large interconnection capacitance C0, and internal clock signal CLK arrives at local control circuit LCK00 with a slight delay to arrival of predecode block address signal PBA and row-related control signal BR0. In this case, however, the interconnection lines of these signals are short so that a skew between predecode block address signal PBA and internal clock signal CLK is small. If local control circuit LCK00 performs an operation synchronized with internal clock signal CLK at the above described timing, the setup time of the predecode block address signal PBA is insufficient so that a malfunction may occur.

In local control circuit LCK17 remotest from main control circuit MCK, internal clock signal CLK is transmitted with the largest delay due to the long interconnection length. Likewise, the delay times of row-related control signal BR1 and predecode block address signal PBA are larger than those for local control circuit LCK00, but are smaller than that of internal clock signal CLK to the local control circuit LCK7. In this case, a large phase difference occurs between predecode block address signal PBA and internal clock signal CLK, and thus a large skew occurs. In local control circuit LCK17, therefore, it is impossible to advance a timing for starting an internal operation, and the fast operation is impossible.

The operation start timing in each local control circuit may be determined depending on the distance from main control circuit MCK. However, such individual determination scheme complicates the circuit design. As external clock signal ECLK becomes faster, the timing adjustment time becomes an extremely short time, so that the timing adjustment must be performed extremely exactly. For the operation stability, the operation timing of the internal circuits may be determined in accordance with the worst skew conditions of local control circuit LCK17 remotest from main control circuit MCK. However, such a scheme based on the worst case makes the fast operation impossible.

In predecode block address signal PBA, predecode block address bit groups PBG0 and PBG1 are different in line load and delay time. Therefore, the timing at which all the predecode block address bits are made definite differs for different local control circuits, and an accurate decoding may not be performed.

FIG. 86 shows schematically a structure of main control circuit MCK. In FIG. 86, main control circuit MCK includes: a clock buffer 900 which receives externally applied clock signal ECLK, and produces internal clock signal CLK; a command input buffer 902 which takes in externally applied command CMD in synchronization with internal clock signal CLK from clock buffer 900; a row address input buffer 904 which takes in externally applied address signal ADD in synchronization with internal clock signal CLK; a row-related control signal generating circuit 905 which decodes the command received from command input buffer 902 in synchronization with internal clock signal CLK, and produces a row-related control signal BR0 for bank BA#0 in accordance with the result of decoding; a row-related control signal generating circuit 906 which decodes the command received from command input buffer 902 in synchronization with internal clock signal CLK, and produces a row-related control signal BR1 for bank BA#1 in accordance with the result of decoding; and a column related control circuit 908 which decodes the command received from command input buffer 902 in synchronization with internal clock signal CLK, and controls the operation of circuits related to data access (column selection).

Row-related control signal generating circuits 905 and 906 receive a bank address BAD from row address input buffer 904, and activates the row-related signal generating circuit provided for the bank designated by bank address BAD. Row-related control signal BR0 for bank BA#0 includes a row address decode enable signal RADE<0>, a word line drive timing signal RXT<0>, a bit line isolation instructing signal BLI<0>, a bit line equalize instructing signal BLEQ<0> and sense amplifier activating signals SON<0> and SOP<0>. Likewise, row-related control signal BR1 for bank BA#1 includes the corresponding signals RADE<1>, RXT<1>, BLI<1>, BLEQ<1>, SON<1> and SOP<1>.

According to the configuration shown in FIG. 86, column-related control circuit 908 controls data path DP performing input/output of data. However, column-related control circuit 908 also controls the operation of column decoders provided for banks BA#0 and BA#1. Data path DP includes a write driver, a preamplifier, a data input buffer and a data output buffer.

As shown in FIG. 86, main control circuit MCK includes row-related control signal generating circuits 905 and 906 corresponding to banks B#0 and BA#1, respectively. For providing more banks, therefore, the row-related control signal generating circuits must be increased in number, and therefore, a layout of the row-related control signal generating circuits in main control circuit MCK must be changed. Therefore, main control circuit MCK must be re-designed depending on a bank configuration. When the load on the signal line changes in re-designing, further re-design is required for adjusting an inter-signal skew. Therefore, it is difficult to accommodate the change in bank structure. If the banks increase in number, the row-related control signal generating circuits increase in number, and the signal lines for transmitting the row-related control signals increase in number, so that the interconnection region and the area occupied by the circuits increase, and the chip size increases.

In general, a storage capacity required for an embedded DRAM merged with a logic on a common chip depends on its application purpose, and it is required to change the number of memory blocks in accordance with the required storage capacity. In the embedded DRAM, memory cells store information in the form of electric charges accumulated in capacitors. Therefore, a refresh operation for rewriting or restoring the stored information of the memory cells must be performed periodically. If the memory blocks are variable in number as described above, a power is wasted in the refresh operation, and an access efficiency is lowered as well.

FIG. 87 schematically shows a structure of a portion related to refresh of one sub-memory array SMA. In FIG. 87, sub-memory array SMA includes, e.g., 12 memory blocks MB0–MB11. In each of memory blocks MB0–MB11, 512 word lines WL are arranged.

Local control circuits LCK0–LCK11 are arranged corresponding to memory blocks MB0–MB11, respectively.

Local control circuits LCK0–LCK11 control operations related to row selection in corresponding memory blocks MB0–MB11, respectively. FIG. 87 representatively shows a block decoder BD, which produces a block select signal for selecting the corresponding memory block. Word line driver groups WDG0–WDG11 are provided corresponding to memory blocks MB0–MB11, respectively. Word line driver groups WDG0–WDG11 drive the word lines, which are selected in accordance with word line select signals applied from corresponding local control circuits LCK0–LCK11, to the selected state, respectively.

Each of word line driver groups WDG0–WDG11 includes word line drivers arranged corresponding to word lines in corresponding one among memory blocks MB0–MB11. The word line driver includes a main word line driver and a sub-word line driver if word line WL in the memory block is formed into a hierarchical word line structure. The sub-word line drivers are arranged corresponding to the sub-word lines, respectively, and are distributed in the corresponding memory block. The main word line driver is arranged corresponding to the main word line, and is located on one side of the corresponding memory block. For the sake of simplicity, FIG. 87 shows the word line driver group (main word line drivers) arranged on one side of the memory block.

For generating a block address for designating the memory block, there are provided: an address input buffer 910 which takes in an externally applied address signal ext<11:0> of 12 bits in synchronization with clock signal CLK; a refresh counter 912 performing a count operation in synchronization with a refresh activating signal REF that is rendered active for a predetermined period in response to the refresh instruction signal applied from a command decoder shown in FIG. 86, and generating a refresh address QA<11:0>; a multiplexer 914 which selects one of the internal address signal applied from address input buffer 910 and read address bits QA<11:0> applied from refresh counter 912 in accordance with refresh activating signal REF; and inverters IV2–IV0 which invert block address signal RA<11:9> of 3 bits received from multiplexer 914 to produce a complementary internal address signal. Multiplexer 914 applies an address signal RA<8:0> of 9 bits to a row decoder of a local control circuit (not shown).

Refresh counter 912 increments or decrements its refresh count value (refresh address) in synchronization with rising or falling of clock signal CLK when refresh activating signal REF is active.

In the structure shown in FIG. 87, the block address signal is formed of three bits RA<11:9>, and two memory blocks are simultaneously selected in twelve memory blocks MB0–MB11. In the arrangement shown in FIG. 87, a block address "000" is allocated to memory blocks MB0 and MB6, a block address "001" is allocated to memory blocks MB1 and MB7, and a block address "010" is allocated to memory blocks MB2 and MB8.

Also, a block address "011" is allocated to memory blocks MB3 and MB9, and a block address "100" is allocated to memory blocks MB4 and MB 10. A block address "101" is allocated to memory blocks MB5 and MB11.

When the refresh is executed in this structure, therefore, word lines WL are simultaneously driven to the selected state in the two memory blocks. If refresh counter 912 are configured to accommodate 16 memory blocks, count value QA<11:9> of this block address must return to the initial block address "000" after changing from "000" to "101". For applying refresh counter 912 to the structure including 16 memory blocks, a block address of four bits must be generated. Depending on a required specification, the refresh is executed on a memory block basis (i.e., a memory block at a time) or is executed in a unit of two memory blocks (i.e., two memory blocks at a time). In order to adapt to various specifications, a block address signal of four bits is required for executing the refresh on the memory block basis.

Therefore, if refresh counter 912 of the above structure is used, the count value of refresh counter 912 must be counted up from "110_00000 0001" to "1111_1111 1111" when the refreshing for memory blocks MB5 and MB1 is completed. Thus, a refresh command must be successively input until the count-up of refresh counter 912. Thus, in spite that refreshing of the memory cells in the whole space of sub-memory array SMA is completed by counting up refresh address QA<11:0> from "000_000000000" to "101_111111111", the refresh command must be further applied (512×2) times for setting the refresh address to the initial value.

Accordingly, in the structure formed of 12 memory blocks, the refresh command must be applied (512×8=4 K) times in total although the refresh of memory cells in the whole space is completed by applying the refresh command (512×6=3 K) times. Therefore, it is necessary to input the refresh command, which does not cause the refresh but is used merely for operating the refresh counter. During this period of input of refresh command, external access is impossible, and in addition, refresh counter 912 wastes the power.

It may be considered to provide refresh counter 912 with a reset circuit for resetting the count value to an initial value of "000 000 000" when the count value reaches "101_111111111". However, such reset circuit can be employable only for a structure formed of 12 memory blocks, and cannot be employed for a structure of 16 memory blocks.

If the number of memory blocks is equal to an integer of a power of 2, input of an unnecessary refresh command can be prevented by resetting the count value of refresh counter 912 at the time of change in any one of block address bits RA<11:9>. However, if the number of memory blocks is equal to, e.g., 12, and is not equal to an integer of a power of 2, as shown in FIG. 87, it is required to program the address of the final refresh memory block in the refresh sequence using a fuse program circuit or the like, for resetting refresh counter 912 in accordance with matching/mismatching between the block address bits output from refresh counter 912 and the programmed refresh block address. A layout area of a fuse element is larger than that of a transistor element. Also, the fuse program circuit requires a large layout area for preventing short-circuit due to a fragment produced upon blowing off the fuse. Therefore, if the fuse program circuit is used, a circuit scale of the refresh counter increases, and an area occupied by the refresh counter increases.

If the number of memory blocks increases to 16 in the structure shown in FIG. 87, the number of bank address signal bits increases to 4 bits, so that it is necessary to change the combination of the block address signal bits for selecting a block decoder BD. Accordingly, for changing the input of the address signal of block decoder BD in each local control circuit, an interconnection pattern must be changed in accordance with the number of memory blocks, resulting in a problem that the memory blocks cannot be expanded easily. In other words, it becomes difficult to change the number of memory blocks by optimising the layout of word line driver group WDG and local control circuit LCK for one memory block, and repeating this optimised layout. The interconnection layout of the block address signal bits must be changed in accordance with change in number of the memory blocks. As a result, it is impossible to adapt to the change in number of memory blocks and thus change in storage capacity without difficulty.

In the case of changing the refresh cycle in accordance with a required specification, i.e., changing the number of word line(s) to be selected simultaneously in the refresh operation, the greatest block address of the refresh address counter also changes, and the block address in the refresh operation for the memory blocks must be changed. Therefore, it is impossible to accommodate for the change in refresh cycle, similarly to the above case.

For ensuring reliability of the semiconductor memory device, the semiconductor memory device must be tested after production. For this test, the test control signal must be applied in synchronization with a clock signal if the semiconductor memory device is of a clock synchronous type. Timing margins of each external signal and data for the clock signal as well as access times can be tested in the semiconductor memory device of the clock synchronous type described above.

However, it is impossible to test a timing margin for to an internal control signal when internally selecting a memory cell. For example, it is impossible to measure a so-called RAS precharge time tRP through measurement of a time period required for internal precharge. In this case, the minimum measurable unit time of the RAS precharge time is equal to one clock cycle time of the clock signal even if the precharge command instructing the precharge and the row active command instructing the memory cell selection are successively applied. This is because the command is applied in synchronization with the clock signal. With a fast operable tester, the clock cycle period can be reduced, and the internal timing can be measured. However, such a fast test apparatus is expensive, and increases a test cost per device so that the semiconductor memory device becomes expensive.

SUMMARY OF THE INVENTION

An object of the invention is to provide a semiconductor memory device with an improved main control circuit, which can overcome the foregoing problems.

Another object of the invention is to provide a semiconductor memory device, which can be flexibly adapted to change in bank structure.

Still another object of the invention is to provide a semiconductor memory device, in which a skew between signals does not change regardless of a position of a memory block.

Yet another object of the invention is to provide a semiconductor memory device, which can reduce a signal interconnection area.

Further another object of the invention is to provide a semiconductor memory device of a multi-bank structure, which has a reduced chip size, and can operate stably.

A further object of the invention is to provide a semiconductor memory device, which can suppress increase in area of interconnections for main control signals even if banks increase in number.

A still further object of the invention is to provide a semiconductor memory device, in which a structure of main control circuit is independent of a bank configuration.

A further object of the invention is to provide a semiconductor memory device provided with a refresh-related circuit, which can efficiently refresh a memory array of an arbitrary storage capacity.

A further object of the invention is to provide a refresh-related circuit, which can efficiently perform a refresh operation without requiring an additional circuit and change in circuit configuration even if the number of memory blocks and/or the number of word lines change.

A further object of the invention is to provide a semiconductor memory device, which can easily implement various refresh cycles.

A further object of the invention is to provide a semiconductor memory device, which can reduce power consumption during a standby state.

A further object of the invention is to provide a semiconductor memory device, which allows accurate measuring of internal operation timing.

A further object of the invention is to provide a semiconductor memory device, which allows accurate measuring of internal operation timing with a slow test apparatus.

A semiconductor memory device according to the present invention includes: a main control circuit for producing a plurality of main control signals different in phase from each other in response to a row-related instructing signal instructing an operation related to row selection; and a sub-control circuit receiving the plurality of main control signals, for producing sub-control signals greater in number than the plurality of main control signals. These sub-control signals are signals for controlling an operation instructed by the row-related instructing signal.

A semiconductor memory device according to a second aspect of the present invention includes a plurality of memory blocks each having a plurality of memory cells each requiring storage data refreshed periodically.

A semiconductor memory device according to the second aspect of the invention further includes a refresh address generating circuit for generating a refresh address signal designating a memory cell to be refreshed in accordance with a refresh instruction instructing refresh of the memory cell data. The refresh address signal includes a refresh block address signal designating a memory block to be refreshed among said plurality of memory blocks.

The semiconductor memory device according to the second aspect of the invention further includes block select circuits arranged corresponding to the plurality of memory blocks, and each producing a refresh block select signal indicating whether the corresponding memory block is selected or not, in accordance with the refresh address signal. The refresh address generating circuit includes a reset signal producing circuit for producing a reset signal for resetting a refresh block address signal generated by said refresh address generating circuit to an initial value in accordance with at least the refresh block select signal.

The plurality of main control signals are produced in accordance with the row-related instructing signal, and these main control signals different in phase are converted into the sub-control signals by the sub-control circuit. Thus, it is not necessary to generate a large number of signals by the main control circuit, and control signal lines between the main control circuit and the sub-control circuit can be reduced in number. Accordingly, the area occupied by the signal interconnection lines can be reduced.

These main control signals are produced merely in accordance with the row-related instructing signal, and the main control signal common to the plurality of banks can be produced. Neither the reduction in interconnection area nor the change in number and structure of banks requires the change in structure of the main control circuit, so that it is possible to accommodate for the change in bank configuration flexibly.

With the main control signal and an address signal equal in line load, signal transmission delay of each signal line can be made equal to those of other signal lines, and an inter-signal skew can be reduced. Even if a signal transmission delay occurs, the delay of signal in each sub-control circuit can be equal to that in other sub-control circuits, and the inter-signal skews in the sub-control circuits can be equal to each other. Therefore, the signal timing can be easily adjusted, and a stably operating semiconductor memory device can be achieved.

By adjusting an active period of the main control signal in accordance with the test control signal, it is possible to adjust an activation period and timing of the sub-control signal produced from the main control signal. Thereby, the internal operation parameter can be measured. In particular, the semiconductor memory device may be supplied with the test control signal, which is produced asynchronously to the clock signal, so that various operation parameters can be measured while changing internal operation conditions, with a slow test apparatus.

The refresh address signal generated by the refresh address generating circuit is reset to the initial value in accordance with at least the refresh block select signal for a specific memory block applied from the block select circuit provided for each of the memory blocks. Thereby, it is possible to set the refresh address generated by the refresh address generating circuit to an initial value in accordance with the refresh block select signal of the final memory block in the refresh sequence. Accordingly, it is not necessary to provide a complicated circuit arrangement such as a program circuit in the refresh address generating circuit. Regardless of the number of memory blocks, it is not necessary to change the structure of the refresh address generating circuit in accordance with the storage capacity. Further, the number of times of refreshing can be easily set in accordance with the number of memory cells to be refreshed. It is not necessary to input unnecessarily a refresh command, and it is possible to suppress increase in power consumption as well as decrease in access efficiency. Further, it is easy to accommodate for a change in storage capacity.

When the internal address signal line is statically driven, the internal address signal is fixed at the refresh address except the period of access in the normal operation mode. Thereby, charging and discharging of the internal address signal line can be prevented so that. the power consumption can be reduced. Further, the power consumption of the block decoder can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 46 represents a state of program of a selector shown in FIG. 45;

FIG. 47 represents another state of program of the selector shown in FIG. 45;

DESCRIPTION OF THE PREFERRED EMBODIMENTS.

FIRST EMBODIMENT

Figure 1:
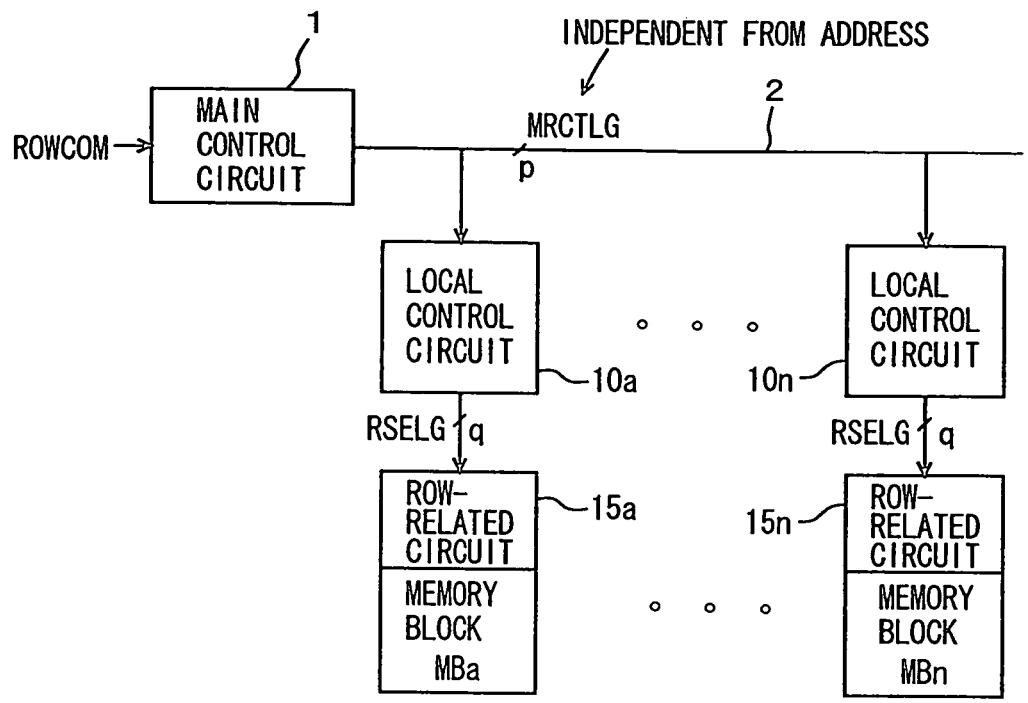
FIG. 1 schematically shows a structure of a main portion of a semiconductor memory device according to a first embodiment of the invention.

FIG. 1 schematically shows a structure of a main portion of a semiconductor memory device according to a first embodiment of the invention. For memory blocks MBa–MBn, there are provided row-related circuits 15a–15n, respectively. Each of row-related circuits 15a–15n includes a sense amplifier circuit, a bit line isolating circuit, a bit line precharge/equalize circuit and others. More specifically, each of row-related circuits 15a–15n executes an operation related to a row selection in corresponding one of memory blocks MBa–MBn when made active. Also, each of row-related circuits 15a–15n drives the corresponding one of memory blocks MBa–MBn to the precharged state when made inactive.

Local control circuits 10a–10n are provided for row-related circuits 15a–15n, respectively. Each of these local control circuits 10a–10n is activated in accordance with a block select signal (not shown), and produces a local row control signal group RSELG for corresponding one of row-related circuits 15a–15n when made active. Local row control signal group RSELG includes q row control signals. The row control signals included in local row control signal group RSELG will be described later in greater detail.

A main control circuit 1 is provided commonly to these local control circuits 10a–10n. Main control circuit 1 produces a group of a plurality of main row control signals MRCTLG having different phases from each other when it receives a row-related command ROWCOM, and transmits the generated signals via a control signal bus 2. This main row control signal group MRCTLG includes p control signals, with p smaller than the number q of row control signals included in local row control signal group RSELG.

As described above, main control circuit 1 produces and transmits the plurality of main control signals having different phases onto control signal bus 2 when it receives a row-related command ROWCOM instructing an operation related to selection/dis-selection of a row. Main row control signal group MRCTLG is independent of the address signal. Local control circuits 10a–10n produces, when selected, local row control signal group RSELG greater in number than main row control signal group MRCTLG, in accordance with main row control signal group MRCTLG. Therefore, if the load of control signal bus 2 is large, the number of control signal lines can be reduced so that the current consumption and interconnection area can be both reduced. Further, main row control signal group MRCTLG is independent of an address, and therefore it is not necessary to change the structure of main control circuit 1 even when the banks increase in number. In this case, addition of the local control circuit is merely required, and it is easy to be adapted to the change in bank configuration.

Figure 2:
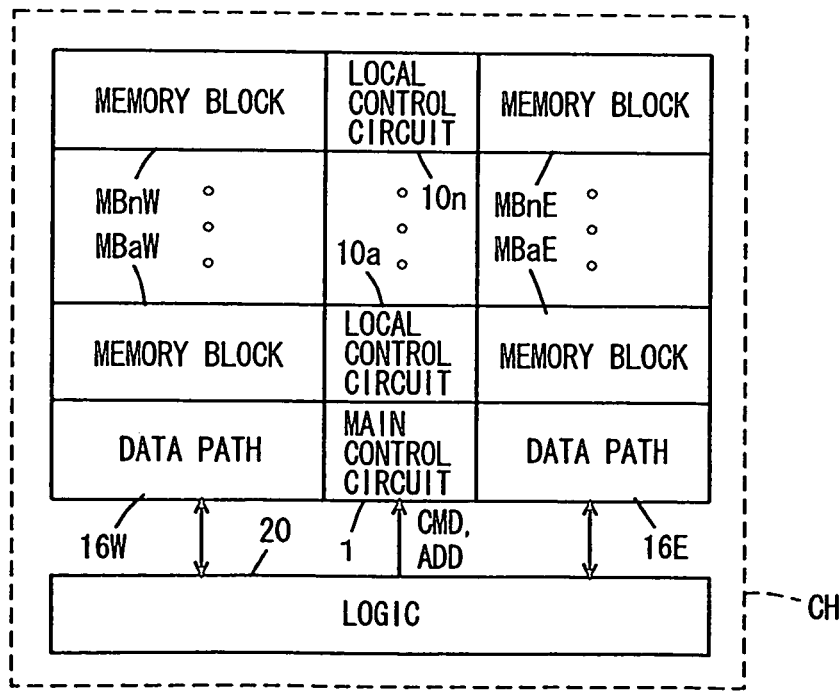
FIG. 2 schematically shows a structure of a semiconductor integrated circuit device containing a semiconductor memory device according to the invention.

FIG. 2 schematically shows a structure of a semiconductor integrated circuit device including the semiconductor memory device according to the present invention. In a semiconductor integrated circuit device CH shown in FIG. 2, the semiconductor memory device is integrated together with a logic 20, which performs predetermined processing and data access to this semiconductor memory device, on a common semiconductor chip. The semiconductor memory device includes a plurality of memory blocks MBaW–MBnW and MBaE–MBnE, local control circuits 10a–10n arranged corresponding to memory blocks MBaW and MBAE to MBnW and MBnE, respectively, a main control circuit 1 which receives a command CMD and an address ADD from logic 20, to produce main row-related control signals for local control circuits 10a–10n, a data path 16W provided for memory blocks MBaW–MBnW, and a data path 16E provided for memory blocks MBaE–MBnE. Each of data paths 16W and 16E includes a data input buffer, a data output buffer, a write driver for producing internal write data and a preamplifier for producing internal read data, and transmits data to and from logic 20.

As shown in FIG. 2, the layout of a whole of the semiconductor memory device itself is substantially the same as that of a conventional device. However, configuration of row-related control signals transmitted from main control circuit 1 to local control circuits 10a–10n is different from that in the conventional device, and therefore the structures of local control circuits 10a–10n are also different from the conventional structure. Specific structures will now be described.

Figure 3:
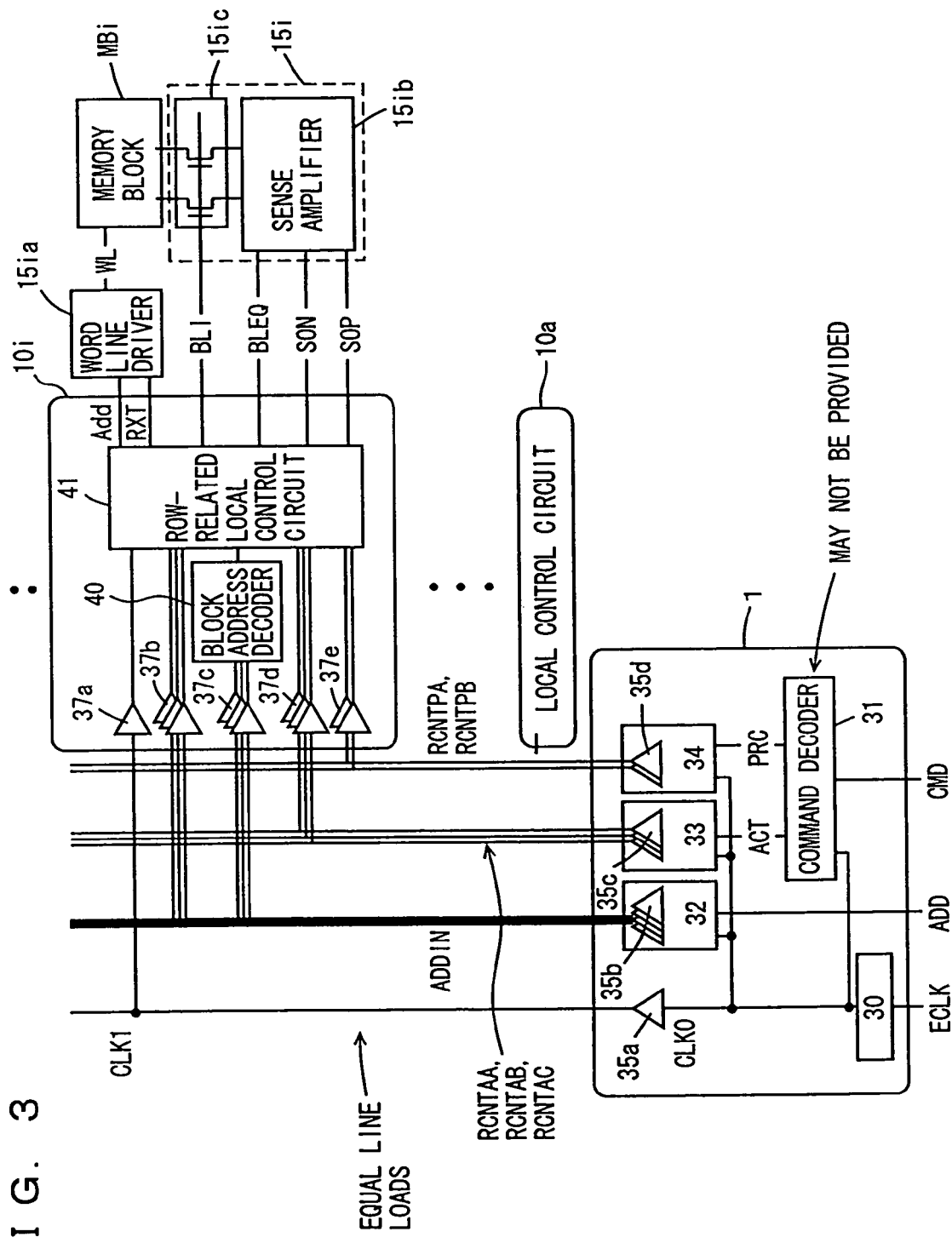
FIG. 3 shows more specifically a structure of a main control circuit and a local control circuit shown in FIG. 1.

FIG. 3 schematically shows row-related control circuit portions in the main and local control circuits. In FIG. 3, main control circuit 1 includes a clock input buffer 30 that receives a clock signal ECLK from the logic, to produce an internal clock signal CLK0, a command decoder 31 that takes in and decodes command CMD sent from the logic in synchronization with internal clock signal CLK0 received from clock input buffer 30, for selectively activating and deactivating a row active signal ACT and a precharge instructing signal PRC, a clock driver 35a that receives internal clock signal CLK0 generated from clock input buffer 30, to transmit an internal clock signal CLK1 to local control circuits 10a–10n, an address input buffer 32 that takes in address signal ADD to produce an internal address signal ADDIN in synchronization with internal clock signal CLK0, a main row activation control circuit 33 that receives row active signal ACT from command decoder 31, to produce signals of three phases, i.e., main row activating signals RCNTAA, RCNTAB and RCNTAC, and a main precharge control circuit 34 that receives a precharge instructing signal PRC generated from command decoder 31 in synchronization with internal clock signal CLK0 to produce signals of two phases, i.e., main precharge activating signals RCNTPA and RCNTPB.

These internal signals CLK1, RCNTAA, RCNTAB RCNTAC, RCNTPA, RCNTPB, and ADDIN are transmitted through internal signal transmission lines that are the same in interconnection line length and in line impedance.

Each of address input buffer 32, main row activation control circuit 33 and main precharge control circuit 35 has a drive circuit for its output signal. All of the drive circuits have the same structure (same transistor size), and drive the corresponding signals to local control circuits 10a–10n with the same driving capability. The internal signal transmission lines are the same in line impedance, and therefore, the internal signals CLK1, RCNTAA, RCNTAB RCNTAC, RCNTPA, RCNTPB, and ADDIN are transmitted at the same rate with the same driving capability of the drivers 35a–35d to the respective local control circuits 10a–10n, and the timing skew of the internal signals can be eliminated at each of the local control circuits 10a–10n.

Each of local control circuits 10a–10n have the same structure, and FIG. 3 schematically shows an internal structure of local control circuit 10i as a representative. Local control circuit 10i includes: a clock input circuit 37a for receiving internal clock signal CLK1, an address input circuit 37b for receiving internal address signal ADDIN; an input circuit 37d for receiving main row activating signals RCNTAA–RCNTAC; an input circuit 37e for receiving main precharge control signals RCNTPA and RCNTPB; a block address decoder 40 for receiving and decoding the block address signal generated from address input circuit 37*c*; and a row-related local control circuit 41 for producing row-related control signals BLI, BLEQ, SON, SOP and RXT as well as a word line select signal Add in accordance with the block select signal generated from block address decoder 40, the internal clock signal generated from clock input circuit 37*a* and the output signals of input circuits 37*d* and 37*e*.

Input circuits 37*a*–37*e* include buffer circuits having the same structure, and have the same input load (input impedance). Therefore, all the drive loads of drivers 35*a*–35*d* of main control circuit 1 are equal to each other, and each signal transmitted from main control circuit 1 to the local control circuit is associated with equal line loads for all the memory blocks. Therefore, inter-signal skews for the individual memory blocks can be equal to each other.

Memory block MBi is provided for local control circuit 10*i*. As a row-related circuit 15*i* for memory block MBi, there are provided a word line driver 15*ia*, a sense amplifier 15*ib* and a bit line isolating circuit 15*ic*. Word line driver 15*ia* drives a word line WL corresponding to an addressed row in memory block MBi in accordance with word line select signal Add and word line drive timing signal RXT generated from row-related local control circuit 41.

Bit line isolating circuit 15*ic* includes bit line isolating gates provided corresponding to respective bit line pairs in memory block MBi, and isolates sense amplifier 15*ib* and memory block MBi from each other when bit line isolation instructing signal BLI is at L-level. Sense amplifier 15*ib* includes sense amplifier circuits provided corresponding to the bit line pairs and bit line precharge/equalize circuits provided corresponding to the bit line pairs. Bit line equalize instructing signal BLEQ is applied to bit line equalize/precharge circuit for precharging and equalizing each bit line pair to an intermediate voltage level. Sense amplifier activating signals SON and SOP selectively activate and deactivate the sense amplifier circuits included in sense amplifier 15*ib*.

Figure 4:
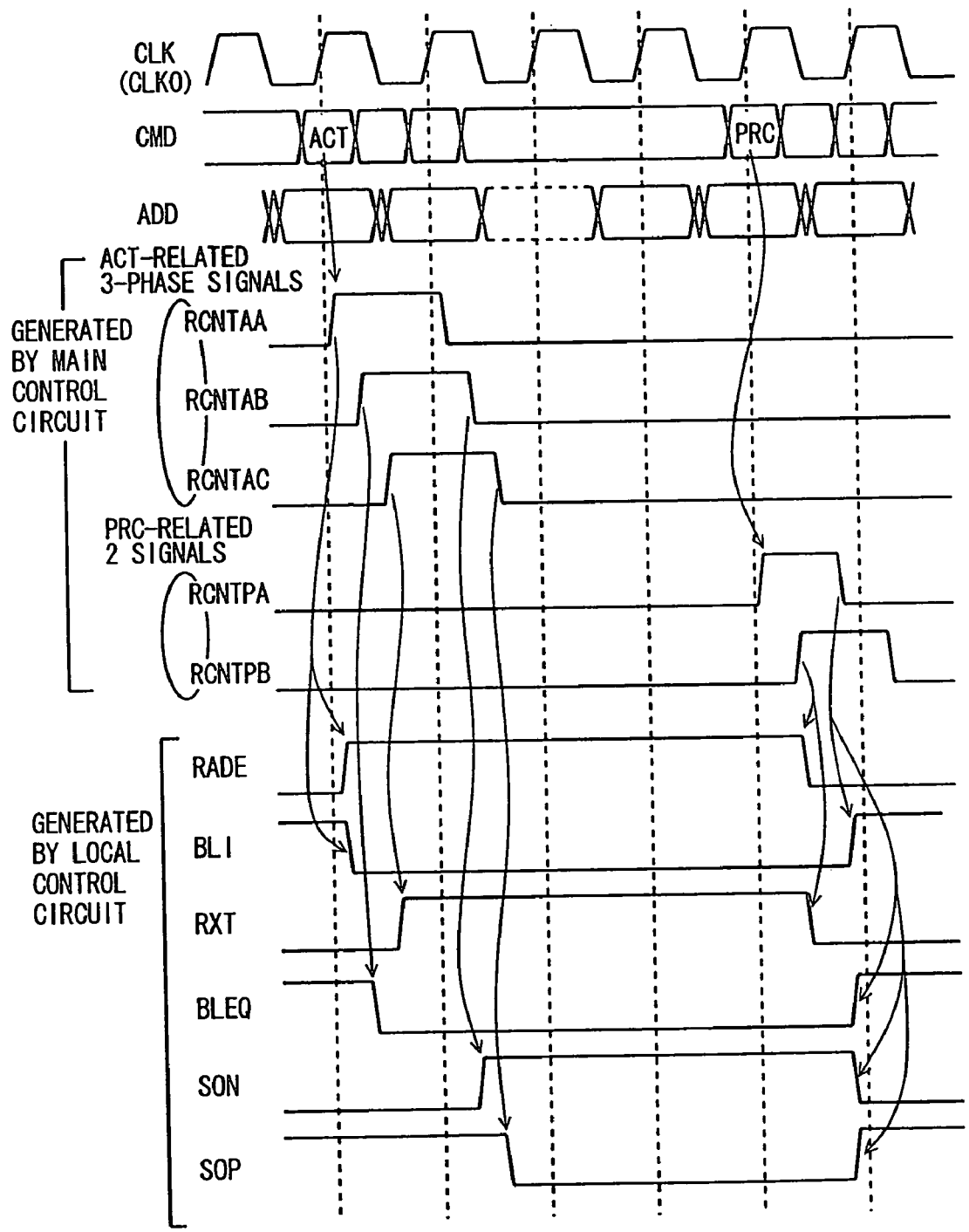
FIG. 4 is a signal waveform diagram representing an operation of the circuits shown in FIG. 3.

Operations of the main and local control circuits shown in FIG. 3 will now be described with reference to a signal waveform diagram shown in FIG. 4.

In main control circuit 1, command decoder 31 takes in command CMD, which is externally applied, e.g., from the logic, at the rising edge of internal clock signal CLK0, and produces a signal instructing an operation mode designated by the command taken. In the case of row active command, i.e., in the case where command CMD instructs the row selection, command decoder 31 activates row active signal ACT. Main row activation control circuit 33 is responsive to the activation of row active signal ACT, for producing main row activating signals RCNTAA, RCNTAB and RCNTAC of three phases, which rise and fall at different timings.

In local control circuit 10*i*, block address decoder 40 decodes the block address included in the address signal, and produces the block select signal (block hit signal) indicating a result of this decoding. When the block select signal is active, row-related local control circuit 41 activates sequentially the row-related control signals in response to the edges of the main row activating signals. More specifically, row-address decode enable signal RADE is activated in response to the rising of main row activating signal RCNTAA, and bit line isolation instructing signal BLI also attains L-level in response to the rising of main row activating signal RCNTAA. By this falling of bit line isolation instructing signal BLI to L-level, a memory block paired with the selected memory block is isolated from the sense amplifier (band).

Then, bit line equalize instructing signal BLEQ falls to L-level in response to the rising of main row activating signal RCNTAB, and the operation of equalizing and precharging the bit lines stops.

Then, word line drive timing signal RXT is activated in response to the rising of main row activating signal RCNTAC. In accordance with word line drive timing signal RXT, word line driver 15*ia* is activated to drive, to the selected state, an addressed word line in accordance with word line select signal Add produced through decoding in response to the activation of row address decode enable signal RADE.

Then, sense amplifier activating signal SON rises to H-level in response to the falling of main row activating signal RCNTAB, and sense amplifier activating signal SOP lowers to L-level in response to the falling of main row activating signal RCNTAC. Responsively, sense amplifier 15*ib* is activated to sense, amplify and latch the data of memory cells connected to the selected word line. These signals RADE, BLI, RXT, BLEQ, SON and SOP maintain the current states until a precharge command instructing the end of row selection is applied subsequently.

When a precharge command for driving the selected memory block to the unselected state is applied as command CMD, command decoder 31 drives the precharge instructing signal PRC to the active state. Responsively, main precharge control circuit 34 produces main precharge control signals RCNTPA and RCNTPB of two phases in accordance with precharge instructing signal RPC and in synchronization with internal clock signal CLK0. These main precharge control signals RCNTPA and RCNTPB rise and fall with different phases. In response to the rising of main precharge control signal RCNTPB, row address decode enable signal RADE and word line drive timing signal RXT fall to L-level, and the selected word line is driven to the unselected state.

Then, in response to the falling of main precharge control signal RCNTPA, bit line isolation instructing signal BLI attains H-level, and bit line equalize instructing signal BLEQ attains H-level. Responsively, the paired, unselected memory block is connected to the sense amplifier band, and the bit line precharge/equalize circuit is activated in the sense amplifier, so that each bit line is precharged and equalized to the predetermined intermediate voltage. Further, sense amplifier activating signals SON and SOP attain L- and H-levels, respectively, in response to the fall of main precharge control signal RCNTPA, and the sense amplifier circuits are deactivated.

Therefore, it is possible to produce more local row-related control signals required for the row-related circuits by combining the phases of the control signals of the row-related local control circuits. Thereby, it is possible to reduce the number of control signal lines, having a large line load, for transmitting the row-related control signals from the main control circuit to the local control circuit. Therefore, the charge/discharge currents on the transmission lines can be reduced, and the current consumption can be reduced. Further, the main row activating signals transmitted from main control circuit 1 to local control circuits 10*a*–10*n* can be reduced in number, and thus the line-occupying area can be reduced.

In the above discussion, the local row-related control signals are of six types, and three phase main row control signals are generated. However, if the local row-related control signals are of four kinds, only two phase main row control signals needs to be generated because four edges of the main row control signals can be assigned to the respective local row-related control signals of four kinds. Therefore, the number of phases of the main row control signals is appropriately determined according to the number of the local row-related control signals to be generated. The condition that main row control signals of M phases are produced to generate local row-related control signals of N kinds at different timings, is that M<N, and 2M≧N.

Figure 5:
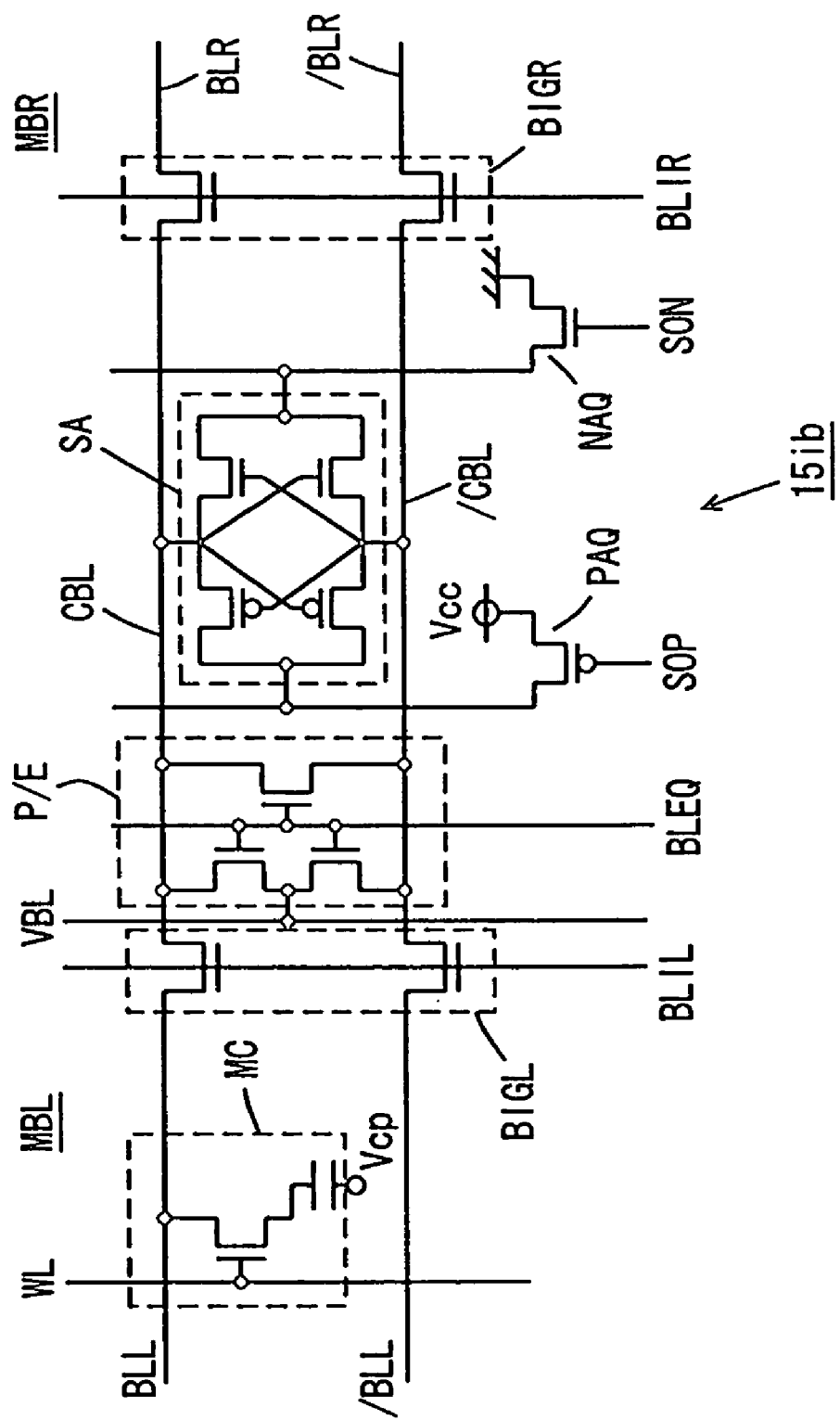
FIG. 5 shows more specifically a structure of a sense amplifier and a memory block shown in FIG. 3.

FIG. 5 shows more specifically the structure of the sense amplifier portion shown in FIG. 3. FIG. 5 shows the structure of the sense amplifier circuit included in the sense amplifier between two memory blocks MBL and MBR, and provided for one bit line pair. In FIG. 5, sense amplifier 15*ib* includes: a precharge/equalize circuit P/E which precharges and equalizes common bit lines CBL and /CBL to an intermediate voltage VBL in response to bit line equalize instructing signal BLEQ; a sense amplifier circuit SA which differentially amplifies and latches the potentials on common bit lines CBL and /CBL when made active; a sense amplifier activating transistor PAQ which transmits a power supply voltage Vcc to sense amplifier circuit SA in accordance with sense amplifier activating signal SOP; and a sense amplifier activating transistor NAQ which transmits a ground voltage to sense amplifier circuit SA in response to activation of sense amplifier activating signal SON. Sense amplifier circuit SA includes cross-coupled P-channel MOS transistors (insulated gate field effect transistors) and cross-coupled N-channel MOS transistors.

Common bit lines CBL and /CBL are connected to bit lines BLL and /BLL via a bit line isolating gate BIGL, and is also connected to bit lines BLR and /BLR via bit line isolating gate BIGR. Bit line isolating gate BIGL is made conductive when bit line isolation instructing signal BLIL is at H-level, and bit line isolating gate BIGR is made conductive when bit line isolation instructing signal BLIR is at H-level. The bit lines in a selected memory block are connected to common bit lines CBL and /CBL, and the unselected memory block that is paired with the selected memory block, is isolated from common bit lines CBL and /CBL.

In memory block MBL, a memory cell MC is arranged corresponding to a crossing between word line WL and bit line BL. Although not shown clearly, memory cell MC is arranged corresponding to a crossing between word line WL and one of bit lines BL and /BL. In a similar manner, the memory cells are arranged in memory block MBR as well.

In the structure shown in FIG. 5, bit line precharge/equalize circuit P/E may be arranged corresponding to each of the pair of bit lines BLL and /BLL and the pair of bit lines BLR and /BLR in respective memory blocks MBL and MBR.

One pair of sense amplifier activating transistors PAQ and NAQ are generally provided for a predetermined number of sense amplifier circuits SA.

According to the first embodiment of the invention, as described above, the main control circuit produces a plurality of main control signals having different phases in accordance with a row-related command, and transmits the generated main control signals to the local control circuits. The local control circuit in turn produces the row-related operation control signal required for executing a designated row-related operation in accordance with the plurality of main control signals. Therefore, the main control signal lines with large line loads can be reduced in number, and the current consumption and the line-occupying area can be reduced.

In the structure shown in FIG. 3, main control circuit 1 includes command decoder 31 for decoding command CMD externally applied, e.g., from the logic. However, the logic may be configured to apply an operation mode instructing signal that is already decoded. In this case, command decoder 31 is not required particularly.

SECOND EMBODIMENT

Figure 6:
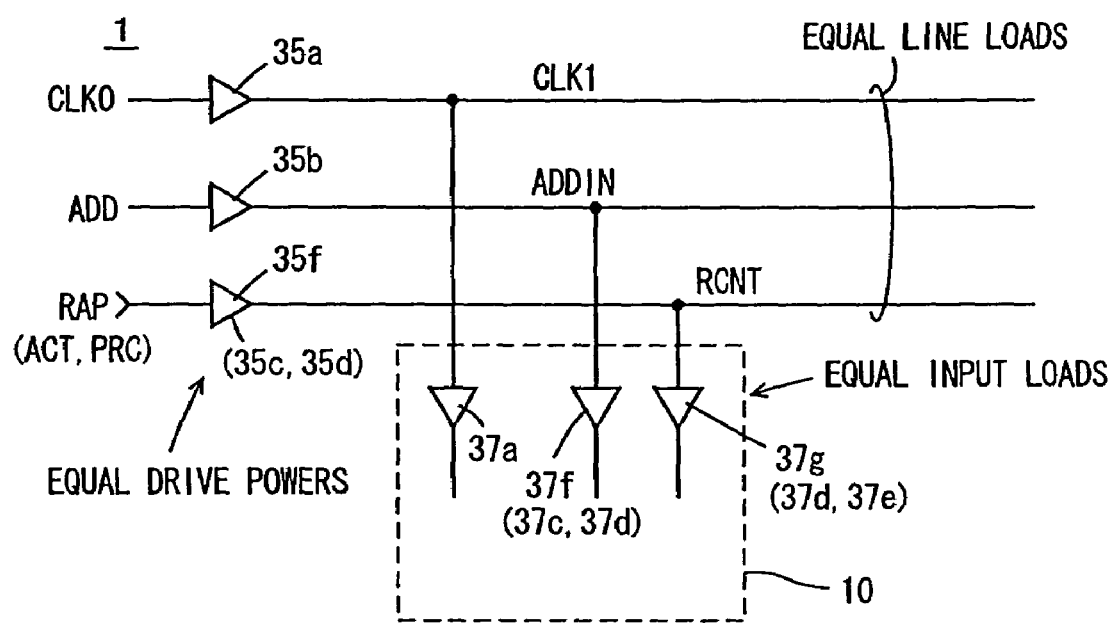
FIG. 6 schematically shows a structure of an output portion of the main control circuit and an input portion of the local control circuit in the first embodiment of the invention.

FIG. 6 schematically shows a structure of a main portion of a second embodiment according to the present invention. FIG. 6 shows an output portion of the main control circuit and an input portion of the local control circuit. In main control circuit 1 shown in FIG. 6, driver 35*a* transmits clock signal CLK0 as internal clock signal CLK1 to local control circuit 10 (10*a*–10*n*). Driver 35*b* transmits address signal ADD as internal address signal ADDIN to local control circuits 10 (10*a*–10*n*).

The main control signal produced from row-related operation instructing signal RAP (ACT and PRC) is transmitted commonly to local control circuits 10 (10*a*–10*n*) as row-related control signal RCNT by drivers 35*f* (35*c*, 35*d*). These drivers 35*a*, 35*b* and 35*f* have the same drive capability, and these signals CLK1, ADDIN and RCNT are transmitted by the same driving capability.

In local control circuit 10, input circuit 37*a* receives internal clock signal CLK1, input circuit 37*f* (37*c*, 37*d*) receives internal address signal ADDIN, and input circuit 37*g* (37*d*, 37*e*) receives row-related control signal RCNT. These input circuits 37*a*, 37*c* and 37*e* have the same input load (input impedance) because they are the same in transistor size and circuit configuration. Accordingly, all the loads of signals CLK1, ADDIN and RCNT are equal to each other. All the loads of the signal lines for respective signals are equal to each other, and the skew between the signals can be uniform in the respective memory blocks, so that stable operations can be achieved.

These signal interconnection lines are made equal in length owing to an appropriate layout. The interconnection lengths may slightly vary depending on the positions of the circuits in the main control circuit. However, the interconnection lines arranged over the whole local control circuits 10*a*–10*n* each are long and are about, e.g., several millimeters in length. Thus, the difference in interconnection length in the main control circuit is only to a negligible extent, and the loads of interconnection lines for the respective signals can be made equal to each other.

Figure 7:
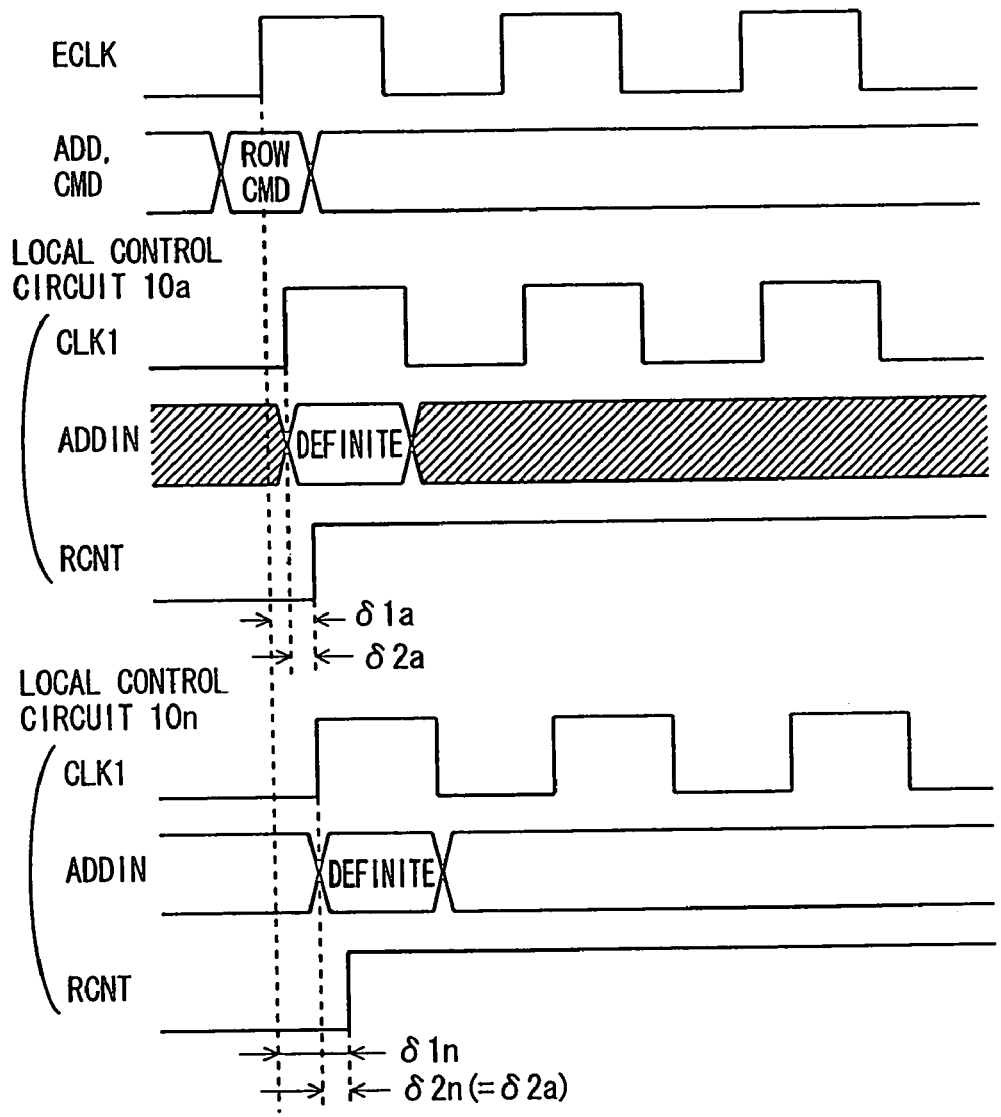
FIG. 7 is a signal waveform diagram representing an operation of the structure shown in FIG. 6.

FIG. 7 is a signal waveform diagram representing signal transmission in the structure shown in FIG. 6.

At the rising of external clock signal CLK, command CMD and address signal ADD are taken into the main control circuit, and are transmitted by the circuits 32, 33 and 34 shown in FIG. 3 to the inputs of each respective local control circuit.

Since local control circuit 10*a* is nearest to main control circuit 1, the delay time of internal clock signal CLK1 with respect to external clock signal ECLK is the smallest. Since internal address signal ADDIN is produced in accordance with internal clock signal CLK1, and is transmitted via driver 36*b*, the delay of internal address signal ADDIN with respect to internal clock signal CLK1 is also small.

Likewise, row-related control signal RCNT is transmitted to local control circuit 10 via driver 35*f*. An operation of internally producing control signals of different phases is required. This row-related control signal RCNT has a delay time δ2*a* with respect to internal address signal ADDIN, and row-related control signal RCNT has a delay time δ1*a* with respect to external clock signal ECLK.

In local control circuit 10n remotest from main control circuit 1, internal clock signal CLK1 arrives with a further delay relative to external clock signal ECLK. However, internal address signal ADDIN is transmitted with the same load as that for internal clock signal CLK1. Therefore, the relationship in timing between internal clock signal CLK1 and internal address signal ADDIN can be the same for local control circuits 10n and 10a. Further, row-related control signal RCNT is transmitted to local control circuit 10n with a larger signal transmission delay (due to its long interconnection length), as compared with local control circuit 10a. However, internal address signal ADDIN and row-related control signal RCNT are transmitted by drivers 35b and 35f having the same drive capability, and are applied to the circuits of the same input load. Therefore, a skew δ2n between these signals of the local control circuit 10n is the same as skew δ2a of local control circuit 10a.

Thus, signal transmission delays occur in local control circuits 10a–10n, respectively, but all the inter-signal skews are uniform so that the control signals and address signals are applied to the local control circuits with the same timing relationship. Even if local control circuits 10a–10n operate in accordance with internal clock signal CLK1 and in accordance with row-related control signal RCNT, the internal operations can be performed in all the local control circuits with the same timing relationship. Thus, the same setup/hold time conditions are satisfied in all the local control circuits, so that accurate operations can be ensured.

Figure 8:
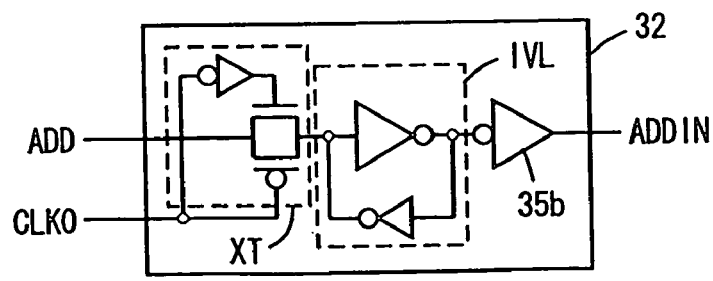
FIG. 8 shows an example of a structure of an address input circuit shown in FIG. 3.

FIG. 8 shows an example of the structure of address input buffer 32 shown in FIG. 3. In FIG. 8, address input buffer 32 includes: a transmission gate XT which takes in address signal ADD in response to the rising of internal clock signal CLK0; an inverter latch IVL which latches the signal taken in by transmission gate XT; and a driver 35b which buffers the signal latched by inverter latch IVL, and transmits the buffered signal as internal address signal ADDIN to each local control circuit.

In address input buffer 32 shown in FIG. 8, transmission gate XT is conductive when internal clock signal CLK0 is at L-level. When internal clock signal CLK0 is at H-level, transmission gate XT is non-conductive. Thus, internal address signal ADDIN changes in accordance with externally applied address signal ADD when internal clock signal CLK0 is at L-level. When internal clock signal CLK0 is at H-level, internal address signal ADDIN is in the definite state. Therefore, internal address signal ADDIN is in the definite state when internal clock signal CLK1 rises. In the operation of decoding the address signal in local control circuit 10, therefore, the address signal ADDIN is already in the definite state when the decoding operation starts in response to the rising of internal clock signal CLK1, strictly, in response to row address decode enable signal RADE. Therefore the decoding operation can be performed accurately.

Since the line loads for the respective signals are equal to each other, the row selecting operation can be performed accurately in each memory block even in the case where the line load is large.

Figure 9A:
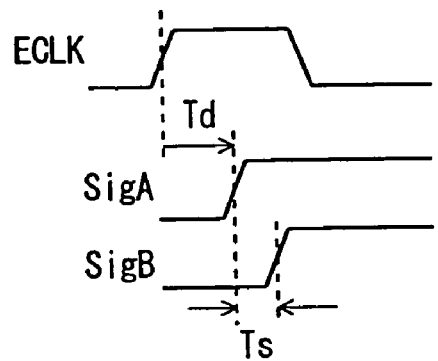
FIGS. 9A–9C schematically illustrate an effect of the structure shown in FIG. 6.
Figure 9B:
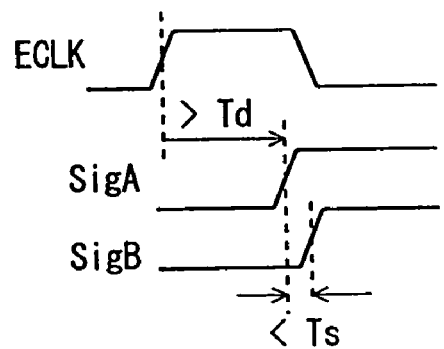

The description will now be given on the case where a time difference (setup time) of Ts is present between two signals SigA and SigB, as shown in FIG. 9A. In this case, signal SigA has a delay time Td with respect to external clock signal CLK. In this state, if the memory blocks are increased in number, and therefore a bank expansion is performed, loads of signals SigA and SigB change. Conventionally, as shown in FIG. 9B, loads of signals SigA and SigB are different from each other. Therefore, the transmission delay time of signal SigA is longer than delay time Td provided before the expansion, and the time difference between signals SigA and SigB becomes shorter, so that a setup time failure occurs, and accurate operation cannot be ensured. Accordingly, re-designing is required when the memory blocks increase in number to increase the loads of signal lines.

Figure 9C:
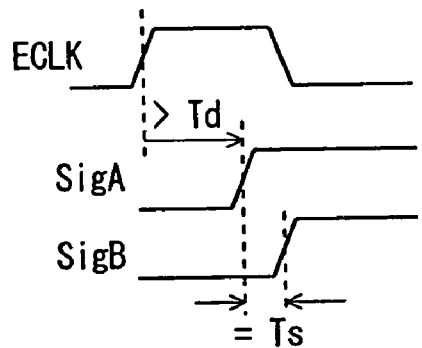

In contrast, the loads of all the signals are equal to each other according to the present invention. In this case, as shown in FIG. 9C, the delay time of signal SigA with respect to external clock signal ECLK is longer than original delay time Td, but the time difference (setup time difference) between signals SigA and SigB is equal to the original time Ts. Therefore, even in the case where the number of banks or memory blocks increases and therefore the loads of signals increase, the timing relationship between these signals SigA and SigB can be maintained. Accordingly, change in memory array structure does not require re-designing of the main control circuit.

According to the second embodiment of the present invention, as described above, the loads of signals transmitted from the main control circuit to the local control circuits are all made equal to each other. Therefore, the signal transmission delays can be made equal to each other for each signal, and the skews between the signals can be constant in all the memory blocks independently of the positions of the memory blocks so that stable operations can be ensured. Even when the memory array structure is changed, e.g., for bank expansion, the condition that all the loads of signals are equal is maintained. Therefore, the timing relationship between the signals can be maintained even after change in array structure, and the stable operations can be ensured.

The local control circuits are provided corresponding to the memory blocks, respectively. In this case, each local control circuit can be operated as a bank control circuit.

THIRD EMBODIMENT

Figure 10A:
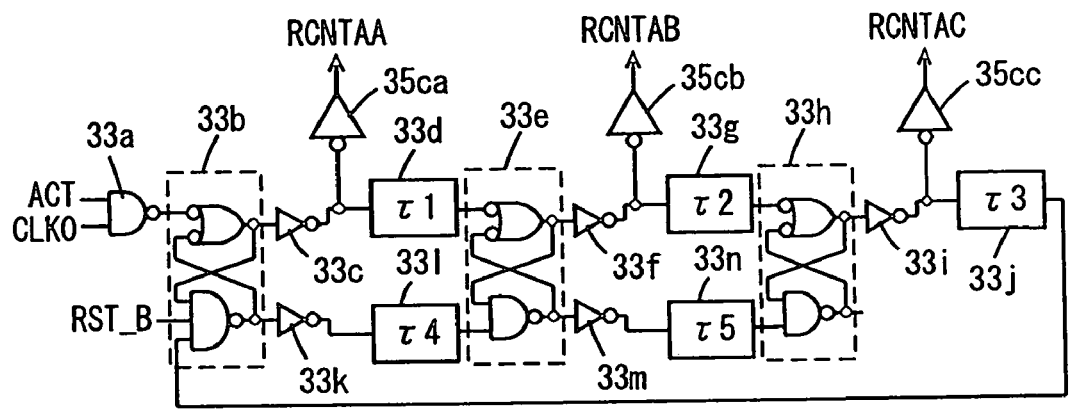
FIG. 10A shows a structure of a main row activation control circuit shown in FIG. 3.

FIG. 10A shows a structure of main row activation control circuit 33 according to a third embodiment of the invention. In FIG. 10A, main row activation control circuit 33 includes: an NAND circuit 33a which receives row active signal (or command) ACT and internal clock signal CLK0; a set/reset flip-flop 33b which is set to generate a signal of an active state (H-level) at its first output when the output signal of NAND circuit 33a is at L-level; an inverter 33c which inverts the signal on the first output of set/reset flip-flop 33b; a driver 35ca which receives the output signal of inverter 33c and produces main row activating signal RCNTAA; a delay circuit 33d which delays the output signal of inverter 33 by a time τ1; a set/reset flip-flop 33e which is reset to drive the signal on a first output thereof to H-level when the output signal of delay circuit 33d is at L-level; an inverter 33f which inverts the signal on the first output of set/reset flip-flop 33e; a driver 35cb which inverts the output signal of inverter 33f to produce main row activating signal RCNTAB; a delay circuit 33g which delays the output signal of inverter 33f by a time τ2; a set/reset flip-flop 33h which is set to generate a signal of H-level at its first output when the output signal of delay circuit 33g is at L-level; an inverter 33i which inverts the signal on the first output of set/reset flip-flop 33h; and a driver 35cc which inverts the output signal of inverter 33i to produce main row activating signal RCNTAC.

With delay circuits 33d and 33g, main row activating signal RCNTAB is activated after time τ1 from activation of main row activating signal RCNTAA, and main row activating signal RCNTAC is activated after time τ2 from activation of main row activating signal RCNTAB. In response to activation of row active signal ACT, main row control signals RCNTAA–RCNTAC, which rise with different phases, can be produced. Drivers 35ca–35cb have the equal drive capability.

Main row activation control circuit 33 further includes: a delay circuit 33j which delays the output signal of inverter 33a by a time τ3, and resets set/reset flip-flop 33d; an inverter 33k which inverts the signal on a second output of set/reset flip-flop 33b; a delay circuit 33l which delays the output signal of inverter 33k by a time τ4, and resets set/reset flip-flop 33e; an inverter 33m which inverts the signal on a second output of set/reset flip-flop 33l; and a delay circuit 33n which delays the output signal of inverter 33m by a time τ5 for application to a second input of set/reset flip-flop 33h.

Figure 10B:
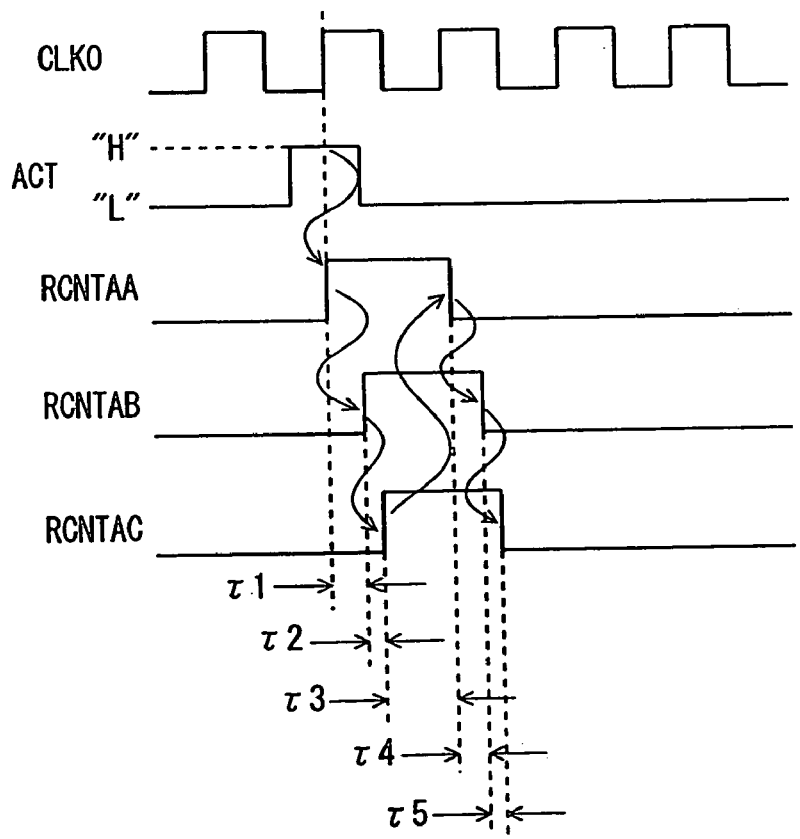
FIG. 10B is a signal waveform diagram representing an operation of the circuit shown in FIG. 10A.

When the output signal of delay circuit 33n attains L-level, set/reset flip-flop 33h is reset. When the output signals of delay circuits 33j and 33l attain L-level, set/reset flip-flops 33b and 33e are reset. Set/reset flip-flop 33b in the initial stage is supplied with a system reset signal RST_B. System reset signal RST_B is driven to L-level of the active state upon power-on or system reset. An operation of main row activation control circuit 33 shown in FIG. 10A will now be described with reference to a timing chart of FIG. 10B.

When a row active command is externally applied, row active signal ACT generated from the command decoder is rendered active in response to the rising of internal clock signal CLK, and the output signal of NAND circuit 33a attains L-level. Thereby, set/reset flip-flop 33b is set so that main row activating signal RCNTAA rises to H-level. In this operation, the command decoder may activate row active signal ACT at the rising of internal clock signal CLK0. In this case, row active signal ACT shown in FIG. 10B attains H-level in synchronization with the rising of internal clock signal CLK0. In the case where the logic applies, as a command, row active signal ACT in synchronization with external clock signal ECLK, row active signal ACT is already at H-level when internal clock signal CLK0 rises.

When main row activating signal RCNTAA rises to H-level, set/reset flip-flop 33e is set after elapsing of delay time τ1 of delay circuit 33d, and the output signal of inverter 33f attains L-level. Therefore, main row activating signal RCNTAB sent from driver 35cb rises to H-level.

When delay time τ2 of delay circuit 33g then elapses, set/reset flip-flop 33h is reset, and main row activating signal RCNTAC transmitted from driver 35cc rises to H-level. By utilizing delay circuits 33d and 33g, therefore, these main row activating signals RCNTAA, RCNTAB and RCNTAC can be sequentially and accurately driven to the active state in a predetermined sequence.

When delay time τ3 of delay circuit 33j then elapses, set/reset flip-flop 33b is reset, and the output signal of inverter 33c attains H-level so that main row activating signal RCNTAA falls to L-level. When the delay time τ4 of the delay circuit 33l elapses, the output signal of the delay circuit 33l falls, and set/reset flip-flop 33e is reset, and main row activating signal RCNTAB falls to L-level. When delay time τ5 of delay circuit 33n then elapses, set/reset flip-flop 33h is reset, and main row activating signal RCNTAC falls to L-level. Owing to these delay circuits 33j, 33l and 33n, main row activating signals RCNTAA–RCNTAC can be accurately driven to the inactive state in a predetermined sequence.

If these main row activating signals RCNTAA–RCNTAC are generated independently of each other by one-shot pulse generating circuits, the respective one-shot pulse generating circuits may have different operation characteristics due to variations in manufacturing process parameters of transistors. If the delay times in the one-shot pulse generating circuits change, the sequence of activation/deactivation of main row activating signals RCNTAA–RCNTAC may change. If the transistor characteristics change due to variations in process parameters and the pulse width of a one-shot pulse signal is reduced, a circuit at the next stage cannot detect the activation of the main row activating signal, resulting in an operation failure.

However, by utilizing the delay circuits as shown in FIG. 10A, main row activating signals RCNTAA–RCNTAC can be accurately and successively activated in a predetermined sequence, and then can be deactivated in a predetermined sequence even if variations occur in delay times of the delay circuits. Accordingly, even if the characteristics of transistors change due to variations in manufacturing parameters, main row activating signals RCNTAA–RCNTAC can be activated and deactivated stably in accordance with a predetermined fixed sequence without an influence of the variations in operation characteristics.

[Modification]

Figure 11A:
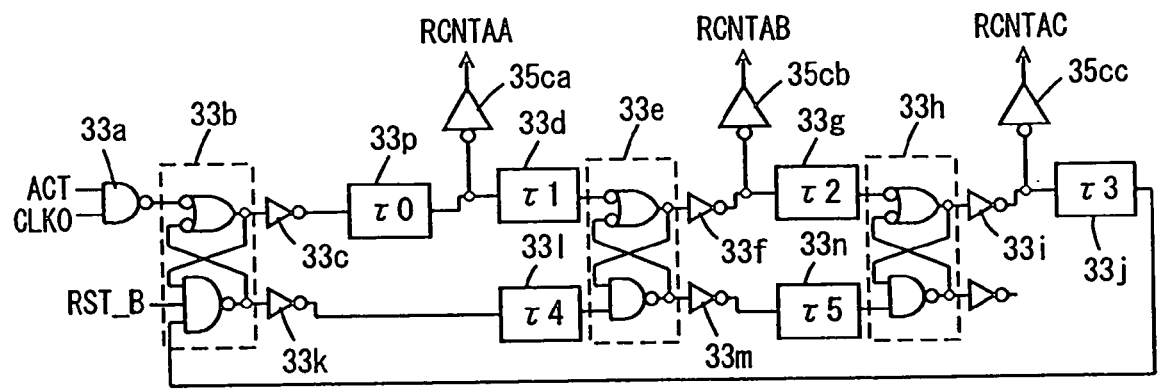
FIG. 11A shows a modification of the main row activation control circuit.

FIG. 11A shows a modification of the main row activation control circuit 33 according to the third embodiment. Main row activation control circuit 33 shown in FIG. 11A differs from the main row activation control circuit 33 shown in FIG. 10A in the following point. More specifically, the main row activating control circuit 33 shown in FIG. 11A includes a delay circuit 33p for delaying the output signal of the inverter 33c by a predetermined time period τ0 for application to the subsequent driver 35a and the delay circuit 33d. Other components are the same as those shown in FIG. 10A, and corresponding components are denoted by the same reference numerals.

Figure 11B:
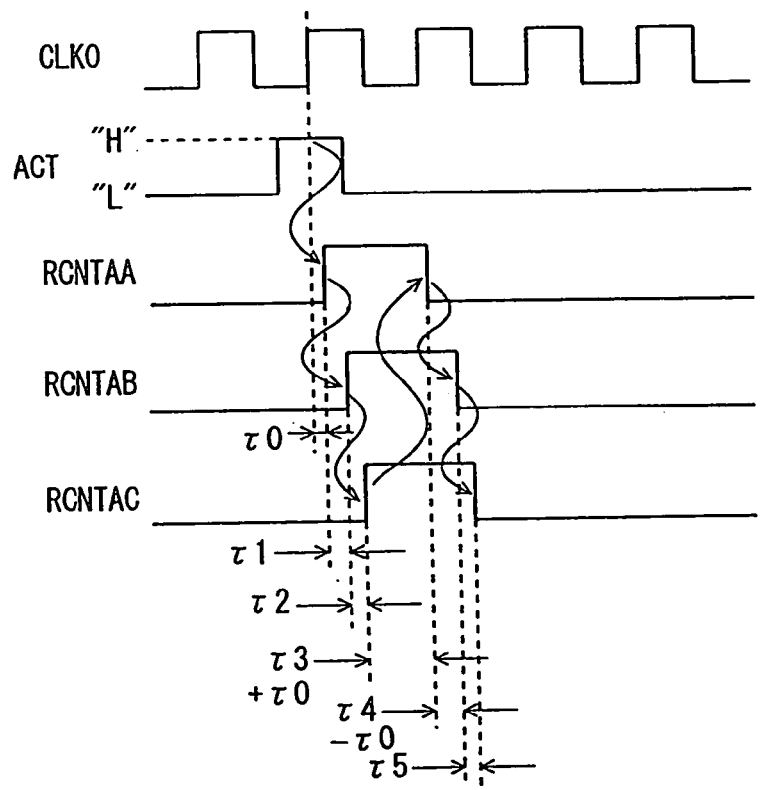
FIG. 11B is a signal waveform diagram representing an operation of the circuit of FIG. 11A.

In the arrangement shown in FIG. 11A, the timing of the main row activating signal RCNTAA can be adjusted by the delay circuit 33p as shown in the operational waveform diagram of FIG. 11B. Referring to FIG. 11A, the main row activating signal RCNTAA is delayed by the delay time τ0 relative to the edge of the internal clock signal CLK0, and the subsequent main row activating signals are sequentially activated in response to the main row activating signal RCNTAA. Thus, the internal timing of the main row activating signals can be adjusted more accurately.

In the arrangement of FIG. 11A, the delay circuit 33p delays the activation and deactivation of main row activating signal RCNTAA, and the pulse width of the main row activating signal RCNTAA can also adjusted by the delay circuit 33p, because the main row activating signal RCNTAA is deactivated after elapse of the delay times τ0 and τ3 when main row activating signal RCNTAC is activated. However, the delay circuit 33p may be configured to delay only one of the activation and deactivation of main row activating signal RCNTAA. For delaying only the activation of main row activating signal RCNTAA, a fall delay circuit for delaying only the fall of the output signal of inverter 33c can be employed.

In the arrangements shown in FIGS. 10A and 11A, three phase main row activating signals RCNTAA–RCNTAC are produced in response to row active signals ACT. However, more main row activating signals than three phases may be generated for accurate controlling of the timing of the local row activating signals. For generating the main row activating signals more than three phases, the flip-flops are increased in number, as needed, in the arrangements shown in FIGS. 10A and 11A.

Figure 12A:
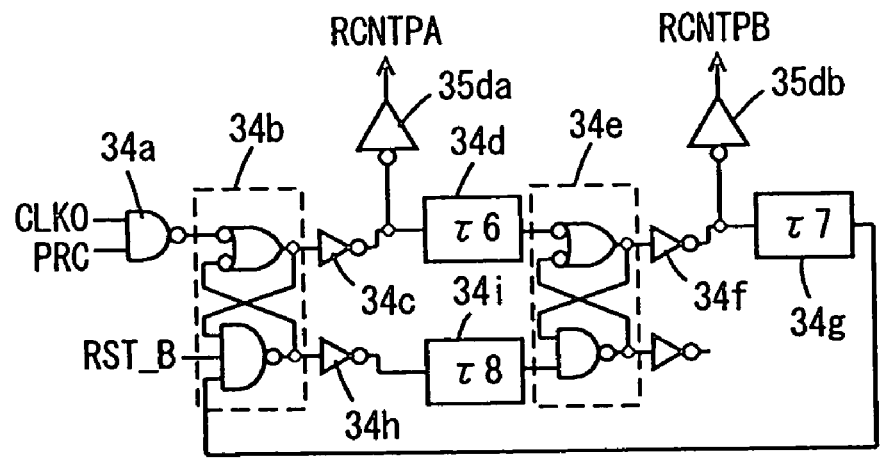
FIG. 12A shows a structure of a main precharge control circuit shown in FIG. 3.

FIG. 12A shows a structure of a main precharge control circuit 34 shown in FIG. 3. In FIG. 12A, main precharge control circuit 34 includes: an NAND circuit 34a which receives internal clock signal CLK0 and precharge instructing signal PRC; a set/reset flip-flop 34b which is set to generate a signal at H-level at its first output when the output signal of NAND circuit 34a is at L-level; an inverter 34c which inverts the signal on the first output of set/reset flip-flop 34b; a driver 35da which inverts an output signal of inverter 34c to produce a main precharge activating signal RCNTPA; a delay circuit 34d which delays the output signal of inverter circuit 34c by a time τ6; a set/reset flip-flop 34e which is set to generate a signal at H-level at its first output when the output signal of delay circuit 34d is at L-level; an inverter 34f which inverts the signal on the first output of set/reset flip-flop 34e; a driver 35db which inverts the output signal of inverter 34f to produce main precharge activating signal RCNTPB; a delay circuit 34g which delays the output signal of inverter 34f by a time τ7, an inverter 34h which inverts a signal on a second output of set/reset flip-flop 34g; and a delay circuit 34i which delays the output signal of inverter 34h by a time of τ8 for application to a second input of set/reset flip-flop 34g.

Figure 12B:
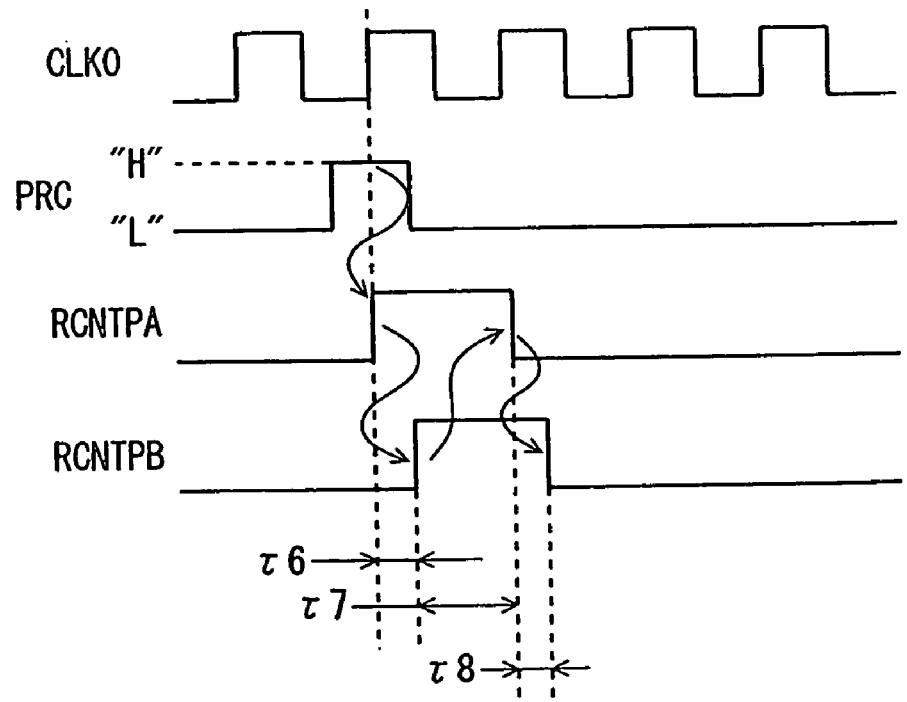
FIG. 12B is a signal waveform diagram representing an operation of the circuit shown in FIG. 12.

Delay circuit 34g resets set/reset flip-flop 34b when the output signal thereof attains L-level. Set/reset flip-flop 34b also receives the system reset signal RST_B. When system reset signal RST_B is at L-level, set/reset flip-flop 34b is reset. Likewise, when the output signal of delay circuit 34i attains L-level, set/reset flip-flop 34e is reset. The operation of main precharge control circuit 34 shown in FIG. 12A will now be described with reference to a signal waveform diagram of FIG. 12B. Drivers 35da and 35db have the same structure and the same drive capability.

When the precharge instruction is applied, precharge instructing signal PRC attains H-level at the rising edge of internal clock signal CLK0. If the command decoder is not provided, the logic directly applies precharge instructing signal (command) PRC. If the command decoder is employed for decoding the command, precharge instructing signal PRC rises to H-level in response to the rising of internal clock signal CLK0.

When internal clock signal CLK0 rises to H-level, the output signal of NAND circuit 34a attains L-level, and set/reset flip-flop 34b is set so that the output signal of inverter 34c attains L-level. Thus, main precharge activating signal RCNTPA rises to H-level. When delay time τ6 of delay circuit 34d elapses, the output signal of delay circuit 34d attains L-level so that set/reset flip-flop 34e is set, and main precharge activating signal RCNTPB sent from driver 35db rises to H-level.

When main precharge activating signal RCNTPB rises to H-level, the output signal of delay circuit 34e attains L-level after elapsing of delay time τ7 of delay circuit 34g. Thereby, set/reset flip-flop 34b is reset, and main precharge activating signal RCNTPA falls to L-level. When set/reset flip-flop 34b is reset, the output signal of inverter 34h attains L-level, and set/reset flip-flop 34e is reset after elapsing of a delay time τ8 of delay circuit 34i so that main precharge activating signal RCNTPB falls to L-level.

Therefore, these main precharge activating signals RCNTPA and RCNTPB can likewise be activated and deactivated in a predetermined sequence owing to delay circuits 34b, 34g and 34i. Even if variations occur in transistor parameters, the above sequence remains unchanged. Thus, the main precharge activating signals RCNTPA and RCNTPB can be activated and deactivated accurately in a predetermined sequence, so that the precharge control circuit which can operate stable to generate the precharge control signals of two phases can be achieved.

[Modification of Main Precharge Control Circuit]

Figure 13A:
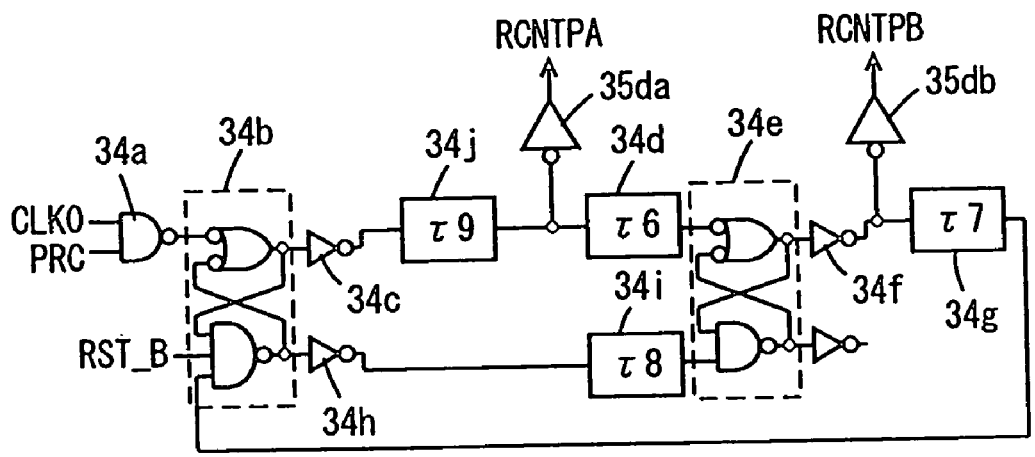
FIG. 13A shows a modification of the main precharge control circuit.

FIG. 13A shows a modification of the main precharge control circuit 34. In the arrangement of main precharge control circuit 34, a delay circuit 34j is additionally provided between the output of the inverter 34c, and delay circuit 34d and driver 35da. Delay circuit 34j delays the output signal of inverter 34c by a predetermined time τ9 for application to delay circuit 34d and driver 35da. The delay time of delay circuit 34j is adjustable similarly to the other delay circuits 34d, 34g, and 34i. The other construction of the main precharge control circuit 34 is the same as that of the circuit shown in FIG. 12A, and corresponding components are denoted by the same reference numerals.

Figure 13B:
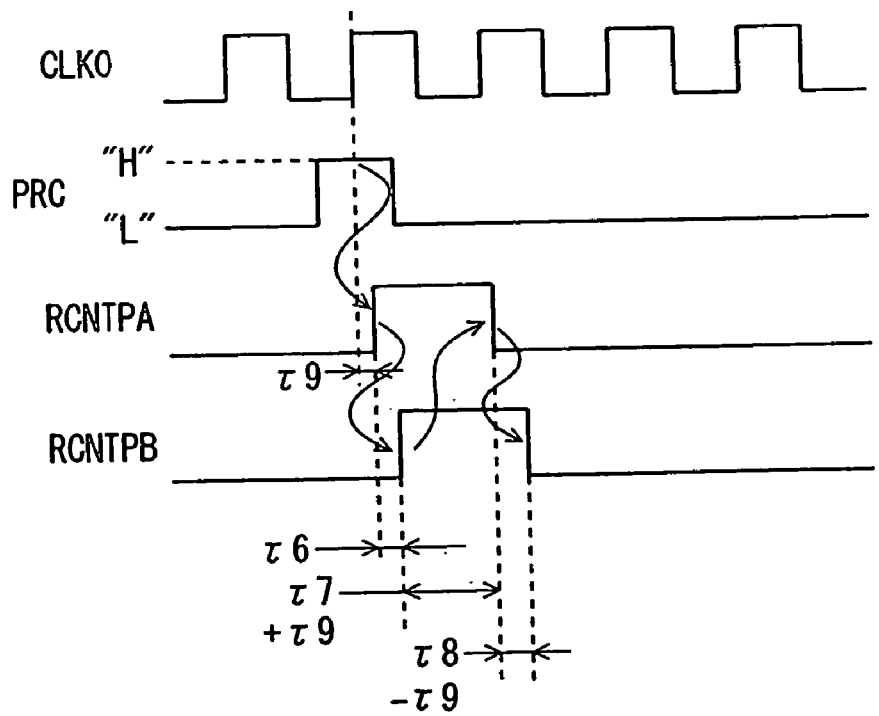
FIG. 13B is a signal waveform diagram representing an operation of the circuit of FIG. 13A.

In the arrangement of FIG. 13A, the activation timing of main precharge activating signal RCNTPA can be adjusted by the delay circuit 34j having the delay time τ9 adjustable as shown in the operation waveform diagram of FIG. 13B. The other main precharge activating signal RCNTPB is activated in response to the activation of main precharge activating signal RCNTPA. Thus, more precise timing adjustment can be achieved. In addition, the deactivation timing of main precharge activating signal RCNTPA is delayed by the delay circuit 34j, and the pulse width of main precharge activation signal RCNTPA can also be adjusted.

In the arrangement of FIG. 13A, the delay circuit 34j delays the activation and deactivation of the main precharge activating signal RCNTPA because main precharge activating signal RCNTPA is deactivated after elapse of the delay times of τ9 and τ7 when main precharge activating signal RCNTPB is activated. However, the delay circuit 34j may be configured to delay only one of the activation and deactivation of main precharge activating signal RCNTPA. A fall delay circuit for delaying the fall of the output signal of inverter 34c can be employed for delaying only the activation of the main precharge activating signal RCNTPA.

As for the main precharge activating signals as well, the number of phases of the main precharge activating signals is not restricted to two, and may be more than two. The number of the flip-flops for generating the main precharge activating signals needs only to be increased depending on the required number of the main precharge activating signals.

Figure 14:
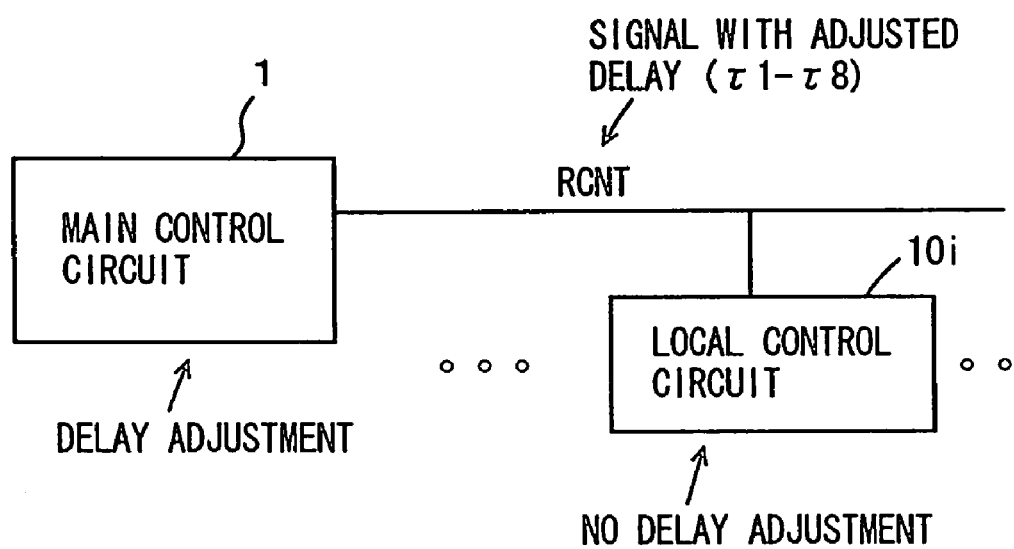
FIG. 14 schematically illustrates an effect of the structures shown in FIGS. 10A and 12A.

Main row activation control circuit 33 and main precharge control circuit 34 can have the timing of main activating signals adjusted through adjusting of the delay times of delay circuits. More specifically, main control circuit 1 has the delay time of main control signal RCNT (main activating signal and main precharge activating signal) adjusted through the adjustment of the delay time of the delay circuits, to transfer the main control signal subjected to the delay adjustment to local control circuit 10i, as shown in FIG. 14, where the local control circuit 10i representatively indicates local control circuits 10a–10n. Therefore, there is no need to provide delay circuits for adjusting timings of main activating signals RCNTAA–RCNTAC and main precharge activating signals RCNTPA and RCNTPB in each of local control circuits 10a–10n. Accordingly, an area occupied by the local control circuits can be reduced, and steps for timing adjustment can be simplified.

According to the third embodiment of the invention, as described above, activation and deactivation of the main control signals are successively executed through the delay circuits, and the sequence of activation/deactivation of main control signals can be fixed without an influence by variations in transistor parameters. Therefore, it is possible to produce the control signals of multiple phases, which are activated and deactivated accurately in a predetermined sequence. Mere adjustment of the delay times of the delay circuits in the main control circuit allows the timing adjustment of the main control signals for each local control circuit because the line loads for the respective memory blocks are equal to each other, and the timing relationship is kept. Therefore, an area occupied by the local control circuits can be reduced.

FOURTH EMBODIMENT

Figure 15A:
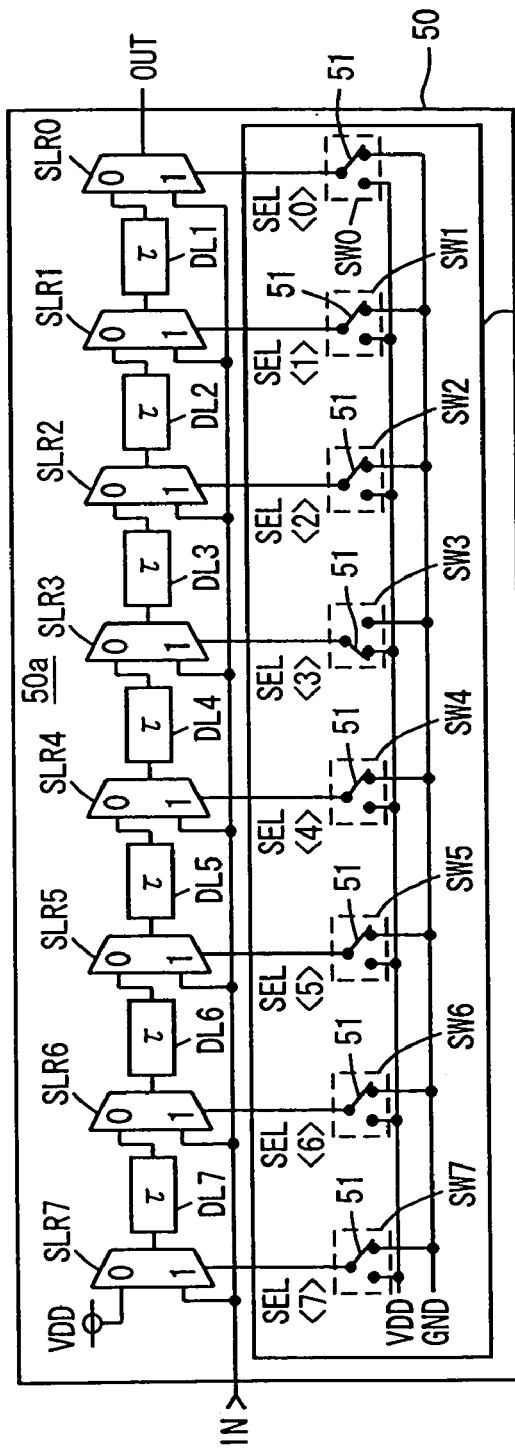
FIG. 15A shows a structure of a delay circuit shown in FIG. 12.

FIG. 15A schematically shows a structure of a delay circuit according to a fourth embodiment of the invention. The delay circuit shown in FIG. 15A is utilized as the delay circuits in main activation control circuit 33 and main precharge control circuit 34 of the main control circuit in the third embodiment described above.

In FIG. 15A, a delay circuit 50 includes a delay portion 50a for delaying input signal IN, and a delay value setting circuit 50b for setting the delay time of delay portion 50a. Delay portion 50a includes: delay stages DL7–DL1 each having a unit delay time τ; select circuits SLR0 are arranged at output portions of delay stages DL7–DL1 for selecting input signal IN or the output signals of corresponding delay stages DL7–DL1 in accordance with corresponding select signals SEL<6>SEL<0> generated from delay value setting circuit 50b; and a select circuit SLR7 arranged before delay stage DL7 for selecting either input signal IN or a power supply voltage VDD in accordance with a select signal SEL<7> generated from delay value setting circuit 50b. Select circuit SLR0 generates final output signal OUT.

Delay value setting circuit 50b includes switch circuits SW7–SW0; which are provided corresponding to select circuits SLR7–SLR0, for selecting either power supply voltage VDD or ground voltage GND to produce select signals SEL<7>–SEL<0>, respectively.

One of select signals SEL<7>–SEL<0> is set to the level of power supply voltage VDD, and the other signals are set to the level of ground voltage GND. Mask metal interconnection line 51 is used for determining a connection path in the switching circuit SLR. The mask metal interconnection line is formed with a predetermined mask in a manufacturing step to determine the activation and deactivation of the select signals SEL<0>–SEL<7>. In the example shown in FIG. 15A, switch circuit SW3 selects power supply voltage VDD via mask metal interconnection line 51 to produce select signal SEL<3>, and the other select signals SEL<7>–SEL<4> and SEL<2>–SEL<0> are set to ground voltage GND level via the mask interconnection line 51. In this state, input signal IN is selected by select circuit SLR3, and is applied to delay stage DL3.

Select circuits SLR6–SLR4 and SLR2–SLR0 select the output signals of the preceding delay stages, respectively. Select circuit SLR7 selects power supply voltage VDD. In this state, input signal IN passes through delay stages DL3, DL2 and DL1, and is outputted as output signal OUT via select circuit SLR0. Therefore, output signal OUT has a delay time of 3·τ with respect to input signal IN. The states of select signals SEL<7>–SEL<0> are set by metal mask interconnection lines 51, and the delay time ranging from the maximum value of 7·τ to the minimum value of 0 can be achieved. In this case, delay times of select circuits SLR7–SLR0 are ignored.

In the structure shown in FIG. 15A, delay portion 50a has seven cascaded delay stages. However, the number of delay stages is not restricted to seven stages, and can be appropriately determined in view of variations in wafer process and others.

[First Modification]

Figure 15B:
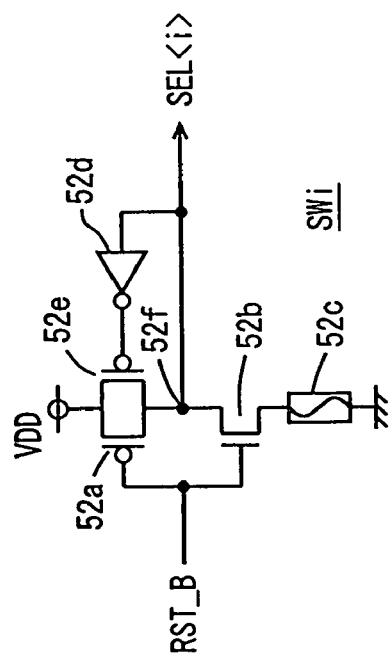
FIG. 15B shows a modification of a delay value setting circuit shown in FIG. 15A.

FIG. 15B shows a structure of a first modification of the fourth embodiment of the invention. FIG. 15B shows one switch circuit SWi included in delay value setting circuit 50b. In FIG. 15A, switch circuit SWi includes: a P-channel MOS transistor 52a which is connected between a power supply node and an internal node 52f, and has a gate receiving a reset signal RST_B; an N-channel MOS transistor 52b which is connected at one conduction node to internal node 52f, and has a gate receiving reset signal RST_B; a fusible link element (fuse element) 52c which is connected between another conduction node of MOS transistor 52b and the ground node; an inverter 52d for inverting a signal on node 52f; and a P-channel MOS transistor 52e which is connected between the power supply node and internal node 52f, and has a gate receiving an output signal of inverter 52d. Select signal SEL<i> is generated from internal node 52f.

Reset signal RST_B is rendered L-level for a predetermined time at the time of reset or power-on, and is fixed at H-level during a normal operation otherwise. When fuse element 42c is conductive, the following operation is performed. Even when reset signal RST_B temporarily precharges internal node 52f to power supply voltage VDD, MOS transistor 52b is turned on when reset signal RST_B returns to H-level. Responsively, internal node 52f attains the ground voltage level, and select signal SEL<i> is fixed to L-level. Since inverter 52d generates the signal at H-level (power supply voltage VDD level), MOS transistor 52e maintains the off state.

When fuse element 52c is cut off, internal node 52f is temporarily precharged to power supply voltage VDD level via MOS transistor 52a by reset signal RST_B being L-level. In this case, even when reset signal RST_B returns to H-level to turn off MOS transistor 52a, internal node 52f maintains H-level because the fuse element 52c is cut off. Further, the output signal of inverter 52d is at L-level, and MOS transistor 52e is turned on so that select signal SEL<i> generated at internal node 52f is kept at power supply voltage VDD level.

In the structure of FIG. 15B, the delay value of delay circuit can be set by fuse element 52c. Therefore, the best delay value can be determined in a test at a wafer level after completion of wafer process, and the delay times can be finely adjusted accurately according to variations in process parameters, even if such variations are present.

[Second Modification]

Figure 16:
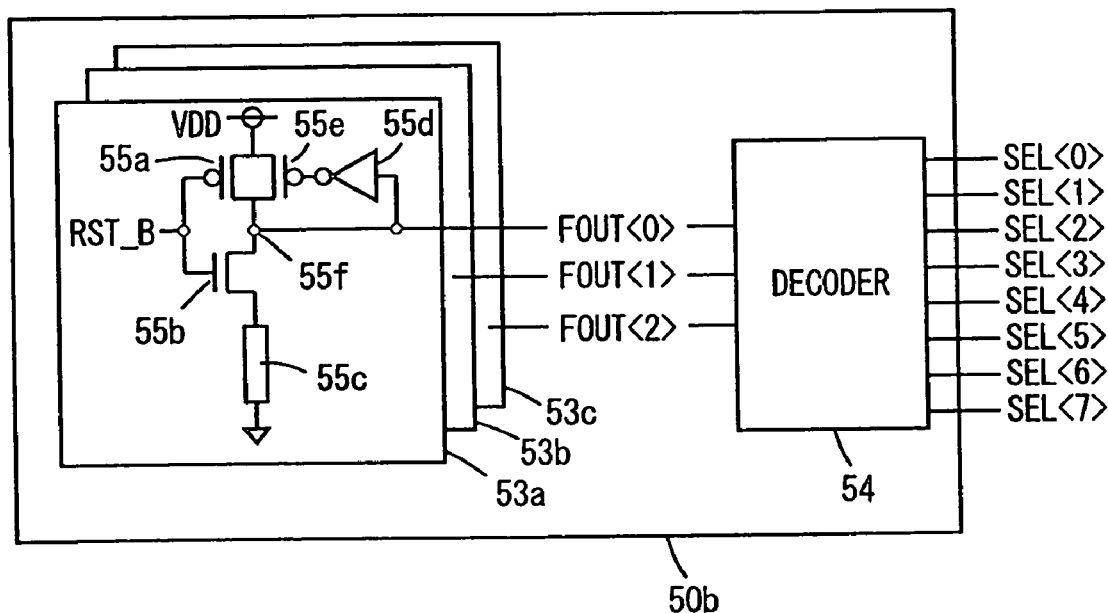
FIG. 16 shows a structure of a second modification of the delay value setting circuit shown in FIG. 15A.

FIG. 16 shows a structure of a second modification of the fourth embodiment of the invention. In FIG. 16, delay value setting circuit 50b includes fuse circuits 53a–53c for fuse programming, and a decoder 54 for decoding output signals FOUT<2:0> of fuse circuits 53a–53c to produce select signals SEL<7:0>. Fuse circuits 53a–53c have the same structure, and each includes: P- and N-channel MOS transistors 55a and 55b which receive reset signal RST_B on their gates; a fuse element 55c which is connected between MOS transistor 55b and the ground node; an inverter 55d which inverts the output signal of an internal node 55f; and a P-channel MOS transistor 55e which is turned on to transmit power supply voltage VDD to internal node 55f when the output signal of inverter 55d is at L-level. Output signals FOUT<0>–FOUT<2> are generated from internal nodes 55f. The structures of fuse circuits 53a–53c are the same as that of switch circuit SWi shown in FIG. 15B. Therefore, the logical levels of these output signals FOUT<0>–FOUT<2> can be set (programmed) by blowing or not blowing fuse elements 55c.

Decoder 54 decodes output signals FOUT<2:0> of three bits to produce select signals SEL<7:0> of 8 bits. Therefore, decoder 54 sets one of select signals SEL<7:0> (=SEL<7>–SEL<0>) to H-level, and sets the other select signals at L-level.

By utilizing the delay value setting circuit shown in FIG. 16, it is not necessary to provide a fuse circuit for each of select signals SEL<7:0>, so that the components can be reduced in number, and therefore the occupying area can be reduced.

[Third Modification]

Figure 17:
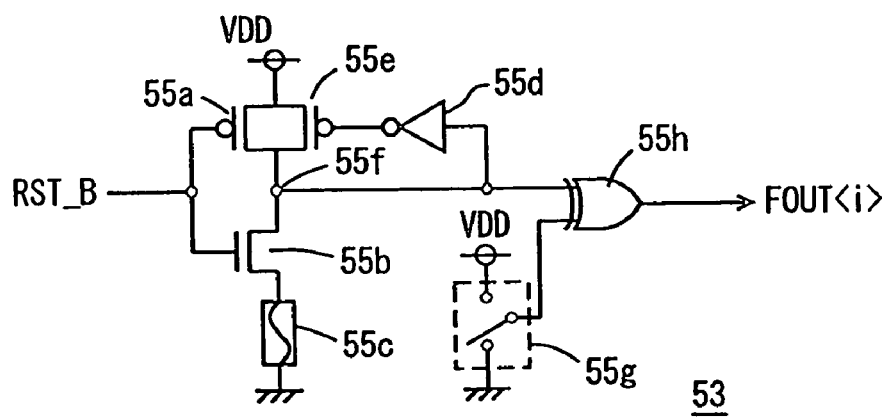
FIG. 17 shows a structure of a third modification of the delay value setting circuit shown in FIG. 15A.

FIG. 17 shows a structure of a third modification of a fourth embodiment of the invention. FIG. 17 shows a modification of the fuse circuit shown in FIG. 16. In FIG. 17, fuse circuit 53 includes, in addition to the structure shown in FIG. 16, a default setting switch 55g for setting initial values, and an XOR circuit 55h receiving a signal on internal node 55f and the output signal of default setting switch 55g to produce an output signal FOUT<i>.

Default setting switch 55g is, e.g., a master slice switch, of which connection path is determined by a metal interconnection line. The master slice switch is formed in a master process of forming only the switch circuit thereof as well as a slice process of forming connection path thereof. In the initial state, fuse element 55c is conductive. Default setting switch 55g is set to the state for selecting power supply voltage VDD or the ground voltage with the assumption that fuse element 55c is conductive. Output signal FOUT<i> generated from XOR circuit 55h attains L-level when default setting switch 55g is set to the state for selecting the ground voltage. When fuse element 55c is blown in the above state, output signal FOUT<i> from XOR circuit 55a attains H-level.

By programming the blowing and non-blowing of fuse element 55c, the logical level of output signal FOUT<i> can be changed, and the delay time set by default setting switch 55g can be adjusted to either a larger value or a smaller value. For example, output signals FOUT<2>, FOUT<1> and FOUT<0>, which were set to L-, L- and H-levels by default setting switch 55g, respectively, are to be readjusted to L-, H- and L-levels by programming fuse elements 55c, respectively. In this case, fuse element 55c for signal FOUT<1> is blown off.

Accordingly, the delay time of delay circuit, which is initially set in the slice process, can be set to an appropriate value in a wafer test after completion of the wafer process, and the shift of the delay value from the designed value can be finely adjusted. In this case, the delay time can also be changed to either a larger value or a smaller value, and the delay time can be accurately and finely adjusted.

According to the fourth embodiment of the present invention, as described above, the timing adjustment of each control signal is performed in the main control circuit, and it is not necessary to arrange the delay stage for timing adjustment of the main control signal in the local control circuit. Therefore, the area of local control circuit can be reduced. Since the number of main control signals is not smaller than the number of actually produced control signals, the required delay circuits can also be small in number, so that the occupation area can be remarkably reduced as compared with the conventional structure.

In the wafer test, the timing and phase of the main control signal can be finely readjusted by programming the fuse elements, and the shift in delay time, which may be caused by variations in parameters in the wafer process, can be finely adjusted. Therefore, the yields of products can be improved.

FIFTH EMBODIMENT

Figure 18:
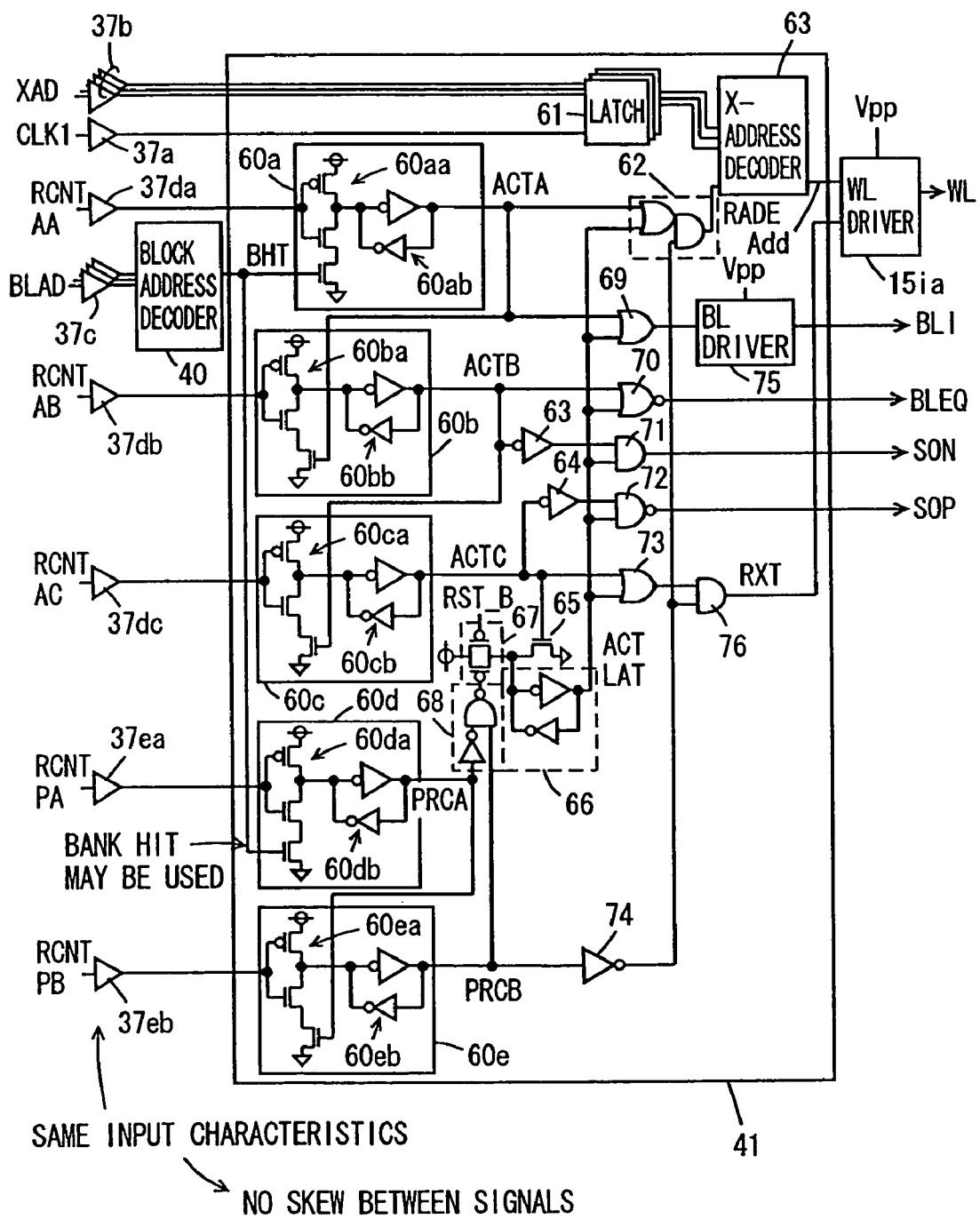
FIG. 18 shows a structure of a local control circuit shown in FIG. 3.

FIG. 18 shows a structure of a row-related local control circuit 41 according to a fifth embodiment of the invention. In FIG. 18, row-related local control circuit 41 includes: a latch circuit 61 which latches a word line address (X address) XAD sent from input circuit 37b in synchronization with the internal clock signal sent from clock input circuit 37a; a buffer circuit 60a which takes in main row activating signal RCNTAA sent from an input circuit 37da, and produces internal row control signal ACTA in accordance with a block hit signal BHT sent from block address decoder 40; an input buffer 60b which produces internal row control signal ACTB in accordance with main row activating signal RCNTAB sent from an input circuit 37db when internal row control signal ACTA is active; an input buffer circuit 60c which produces internal row control signal ACTC in accordance with main row activating signal RCNTAC sent from an input circuit 37d c when internal row control signal ACTB is active; an input buffer circuit 60d which produces an internal precharge control signal PRCA in accordance with block hit signal BHT and main precharge activating signal RCNTPA; and an input buffer circuit 60e which produces an internal precharge control signal PRCB in accordance with main precharge activating signal RCNTPB sent from an input circuit 37eb when internal precharge control signal PRCA is active.

Input circuits 37b correspond to input circuit 37b shown in FIG. 3, input circuits 37da–37dc correspond to input circuit 37d shown in FIG. 3, and input circuits 37e a and 37eb correspond to input circuit 37e shown in FIG. 3. These input circuits 37a, 37b, 37da, 37dc, 37e a and 37eb are the same in structure and in transistor size. Therefore, all the input impedances of these input circuits are equal to each other, and all the loads of signal lines for the respective input signals are equal to each other. Thus, the transmission delays of all the signals for row-related local control circuit 41 are equal to each other.

Input buffer circuit 60a includes: an input circuit 60a a which produces an internal signal in accordance with the output signal of input circuit 34da when block hit signal BHT is at H-level and indicates that the corresponding memory block is selected; and an inverter latch 60ab which latches the output signal of input circuit 60aa. In this input buffer circuit 60a, when block hit signal BIT is at H-level, input circuit 60aa produces an internal row control signal ACTA corresponding to main row activating signal RCNTAA. When block hit signal BHT is at L-level and indicates an unselected state, input circuit 60aa is disabled, and input buffer circuit 60a has its internal signal latched by latch circuit 60ab. Main row activating signal RCNTAA is at L-level during the standby state, and the P-channel MOS transistor in input circuit 60aa is kept on. During standby state, therefore, latch circuit 60ab sets internal row control signal ACTA to L-level. Therefore, internal row control signal ACTA is driven to the active state only for the selected memory block, of which block hit signal BHT is at H-level.

Input buffer circuit 60b includes: an input circuit 60ba which inverts an output signal of an input circuit 30db to produce an internal signal when internal row control signal ACTA is at H-level; and an inverter latch 60b which latches an output signal of input circuit 60ba. Therefore, input circuit 60ba produces the internal signal in accordance with main row activating signal RCNTAB after internal row control signal ACTA is rendered active. Accordingly, an internal row control signal ACTB is driven to the active state after internal row control signal ACTA is driven to the active state.

Input buffer circuit 60c includes: an input circuit 60ca which produces an internal signal in accordance with the signal sent from input circuit 37dc when internal row control signal ACTB is active; and an inverter latch 60cb which latches an output signal of input circuit 60ca. In input buffer circuit 60c, input circuit 60ca produces an internal row control signal ACTC in accordance with main row activating signal RCNTAC after internal row control signal ACTB is rendered active. Therefore, internal row control signal ACTC is driven to the active state after internal row control signal ACTB is rendered active.

Input buffer circuit 60d includes: an input circuit 60da which produces an internal signal in accordance with main precharge activating signal RCNTPA sent from input circuit 37ea when block hit signal BHT is active; and an inverter latch 60db which latches an output signal of input circuit 60da, and produces an internal precharge control signal PRCA. Therefore, internal precharge control signal PRCA is produced in accordance with main precharge activating signal RCNTPA when block hit signal BHT is at H-level. When block hit signal BHT is at L-level, the output signal of input circuit 60da is at H-level so that internal precharge control signal PRCA maintains L-level.

For main precharge activating signal, block hit signal BHT is applied because the precharge operation is performed on a memory block basis. This corresponds to the structure in which one memory block is utilized as a bank. If each bank is formed of a plurality of memory blocks, the precharge operation is executed on a bank basis. In this case, a bank hit signal is applied to input buffer circuit 60d instead of block hit signal BHT.

Input buffer circuit 60e includes: an input circuit 60ea which produces an internal signal in accordance with the output signal of input circuit 37eb when internal precharge control signal PRCA is active; and an inverter latch 60eb which latches the output signal of input circuit 60ea, and produces an internal precharge control signal PRCB. After internal precharge control signal PRCA is rendered active, internal precharge control signal PRCB is driven to the active state. Therefore, internal control signals PRCA and PRCB are sequentially activated in a predetermined sequence.

Input buffer circuits 60a–60e include inverter latches 60ab–60eb, respectively. This is for the purpose of preventing an electrically floating state of the internal control signals even in the case where the output nodes of input circuits 60aa–60ea are in the high impedance state in which both the N- and P-channel MOS transistors are off. The above floating state may occur when main control signal RCNTAB is at H-level and internal control signal ACTA is at L-level.

Row-related local control circuit 41 further includes: an inverter 63 which receives internal row control signal ACTB; an inverter 64 which receives internal row control signal ACTC; an N-channel MOS transistor 65 which receives internal row control signal ACTC on a gate thereof; an inverter latch 66 which latches the voltage on a drain node of MOS transistor 65; a logic circuit 68 which produces a signal for changing the logical level of the latched signal of inverter latch 66 in accordance with internal precharge control signals PRCA and PRCB; a reset circuit 67 which resets the logical level of the latched signal of inverter latch 66 in accordance with the output signal of logic circuit 68 and reset signal RST_B; a composite gate 62 which receives latched signal ACTLAT of inverter latch 66 and internal row control signal ACTA, and produces a row address decode enable signal RADE; an OR circuit 69 which receives internal row control signal ACTA and latched signal ACTLAT; an NOR circuit 70 which receives latched signal ACTLAT and internal row control signal ACTB, and produces a bit line equalize instructing signal BLEQ; an AND circuit 71 which receives the output signal of inverter 63 and latched signal ACTLAT, and produces a sense amplifier activating signal SON; an NAND circuit 72 which receives the output signal of inverter 64 and latched signal ACTLAT, and produces a sense amplifier activating signal SOP; an OR circuit 73 which receives internal row control signal ACTC and latched signal ACTLAT; an inverter 74 which receives internal precharge control signal PLCB; and an AND circuit 75 which receives the output signals of inverter 74 and OR circuit 73, and produces a word line drive timing signal RXT.

Logic circuit 68 produces a reset instructing signal when internal precharge control signals PRCA and PRCB are at L- and H-level, respectively. When reset instructing signal RST_B is at L-level, or the output signal of logic circuit 68 is at L-level, reset circuit 67 sets latched signal ACTLAT of inverter latch 66 to L-level. Therefore, latched signal ACTLAT is driven to the active state of H-level when internal row control signal ACTC attains the active state of H-level, to maintain the active state of H-level until main precharge activating signal RCNTPA is applied subsequently, and internal precharge control signal PRCA attains L-level. Accordingly, when the row active command is applied, the internal row-related control signals maintain the active state in accordance with latched signal ACTLAT even when internal row control signals ACTA–ACTC are each driven in a one-shot pulse form to an active state for a predetermined period.

In the structure shown in FIG. 18, NOR circuit 70 produces bit line equalize instructing signal BLEQ. This structure corresponds to the case where a bit line equalize/precharge circuit is provided in the corresponding memory block, and the bit line precharge/equalize circuit is not shared between adjacent memory blocks. If the bit line precharge/equalize circuit is arranged in a shared sense amplifier band, bit line equalize instructing signal BLEQ is applied to the memory block sharing the sense amplifiers that are used by the corresponding memory block.

Composite gate 62 maintains row address decode enable signal RADE at H-level when one of internal row control signal ACTA and latched signal ACTLAT is at H-level, and the output signal of inverter 74 is at H-level. Therefore, row address decode enable signal RADE generated from composite gate 62 maintains H-level until internal precharge control signal PRCB rises to H-level after application of the precharge command.

Row-related local control circuit 41 further includes: an X-address decoder (word line address decoder) 63 which decodes the word line address latched by latch circuit 61 in response to the activation of row address decode enable signal RADE received from composite gate 62, and produces word line select signal Add; and a BLI driver 75 which drives a bit line isolation instructing signal BLI in accordance with the output signal of OR circuit 69. BLI driver 75 is supplied with a high voltage Vpp as one operation power supply voltage. The logical level of bit line isolation instructing signal BLI depends on the corresponding sense amplifier band structure. In the case where bit line precharge/equalize circuit is provided in each memory block for isolating each bit line of the memory block from the sense amplifier circuit during a standby state, a selected memory block is connected to the sense amplifier circuits. Alternatively, the memory blocks may be connected to the corresponding sense amplifiers in a standby state, and the unselected memory block paired with a selected memory block may be isolated from the sense amplifiers in a row selecting operation. In this case, bit line isolation instructing signal BLI is applied to the bit line isolating circuits of the memory block which shares the sense amplifiers with the corresponding memory block. The scheme of the bit line isolation has only to be appropriately determined in accordance with the structure of the memory array.

Figure 19:
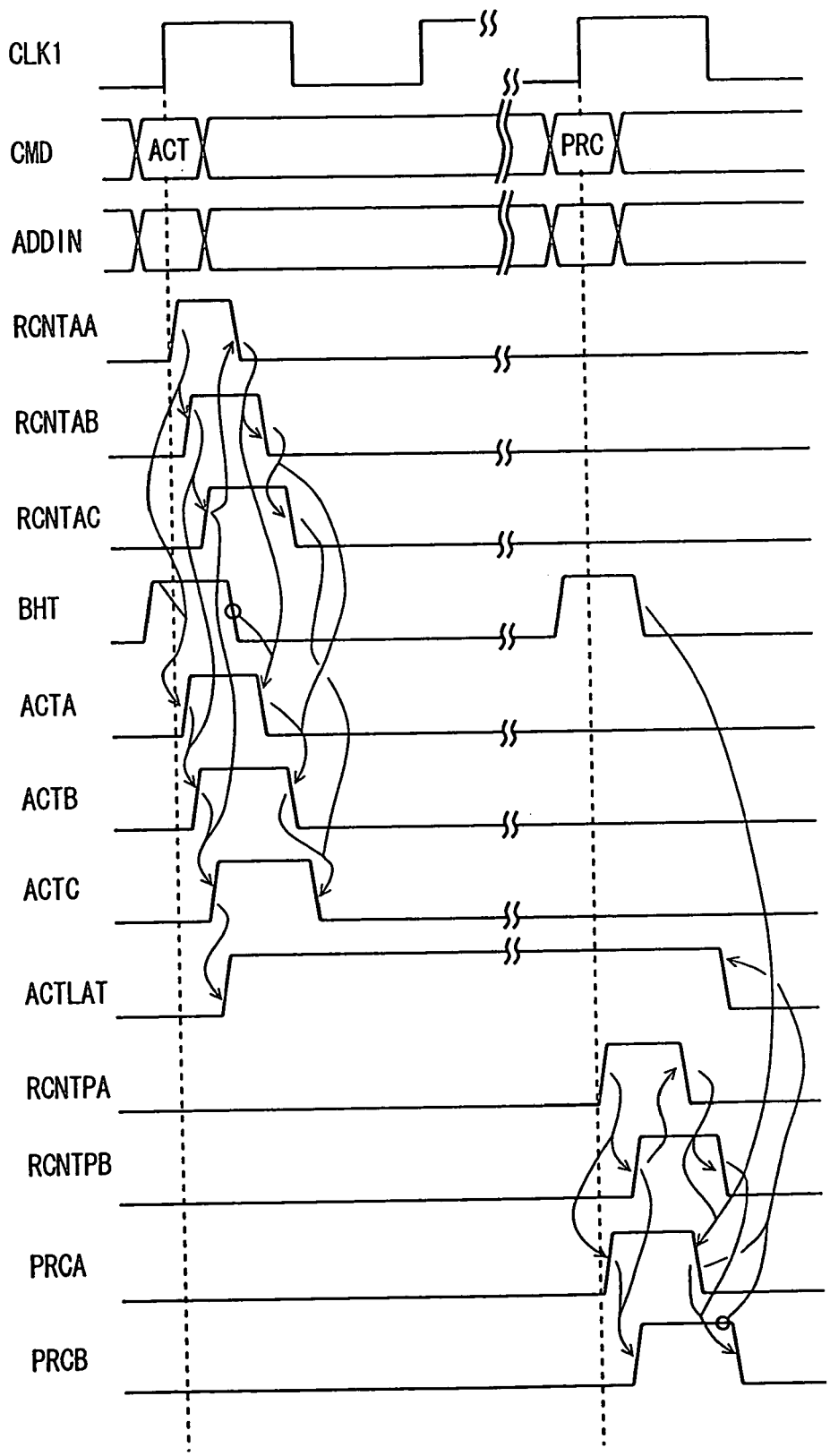
FIG. 19 is a signal waveform diagram representing an operation of a circuit shown in FIG. 18.

Word line driver (WL driver) 40*a* is supplied with word line drive timing signal RXT from AND circuit 76. The operation of row-related local control circuit 41 will now be described with reference to a signal waveform diagram of FIG. 19.

Block decoder 40 is supplied with block address signal BLAD from input circuit 37*c* asynchronously with the clock signal, and block decoder 40 performs the decoding operation by utilizing a setup time of word line address XAD. Therefore, when a row active command is first applied, block hit signal BHT corresponding to the selected memory block rises in accordance with the currently applied address signal.

Then, main row activating signals RCNTAA–RCNTAC are sequentially activated in accordance with row active signal (command) ACT. When block hit signal BHT is at H-level, and main row activating signal RCNTAA attains H-level, input circuit 60*aa* in input buffer circuit 60*a* operates, and internal row control signal ACTA rises to H-level. When block hit signal BHT attains L-level and main row control signal RCNTAA attains L-level, the output signal of input circuit 60*aa* attains L-level, and internal row control signal ACTA attains L-level. When main row control signal RCNTAA is at H-level and block hit signal BHT is at L-level, latch circuit 60*ab* prevents the internal nodes from being electrically floated.

When internal row control signal ACTA attains H-level, composite gate 62 sets row address decode enable signal RADE to the active state of H-level, and word line address XAD latched by latch 61 in synchronization with internal clock signal CLK1 is decoded, and word line select signal Add is activated.

When internal row control signal ACTA rises to H-level, input buffer 60*b* is enabled to raise internal row control signal ACTB to H-level in accordance with main row activating signal RCNTAB. When internal row control signal ACTB attains H-level, bit line equalize instructing signal BLEQ attains L-level, and the precharge/equalize operation of the bit line of corresponding memory block is completed. When internal row control signal ACTA attains H-level, BLI driver 75 drives bit line isolation instructing signal BLI to H- or L-level depending on the array structure, to couple the corresponding memory block to the corresponding sense amplifier band because the output signal of OR circuit 69 attains H-level.

When internal row control signal ACTB is driven to H-level, input buffer circuit 60*c* drives internal row control signal ACTC to H-level in accordance with main row activating signal RCNTAC. When internal row control signal ACT is driven to H-level, MOS transistor 65 is turned on, and latched signal ACTLAT of latch circuit 66 is driven to H-level. During operation of the row-related circuitry, the output signal of inverter 74 is at H-level. Therefore, when internal row control signal ACTC attains H-level and the output signal of OR circuit 73 attains H-level, word line drive timing signal RXT is driven to H-level, and WL driver (word line driver) 40*a* drives a word line WL to the selected state in accordance with word line select signal Add received from X-address decoder 63.

When internal row control signal ACTB attains L-level while latched signal ACTLAT is at H-level, sense amplifier activating signal SON generated from AND circuit 71 is driven to the active state of H-level, and the N-sense amplifier in the sense amplifier circuit operates. When internal row control signal ACTC subsequently falls to L-level, the output signal of inverter circuit 64 attains H-level, and sense amplifier activating signal SOP generated from NAND circuit 72 attains L-level so that the P-sense amplifier in the sense amplifier circuit operates to pull up the bit line. This state is maintained while latched signal ACTLAT is at H-level.

When the precharge command is applied and the precharge activating signal PRCA rises to H-level, block hit signal BHT attains H-level so that input buffer circuit 60*d* operates to drive internal precharge control signal PRCA to H-level in accordance with main precharge control signal RCNTPA. Logic circuit 68 maintains its output signal at H-level, and latched signal ACTLAT maintains H-level.

When internal precharge control signal PRCA attains H-level, input buffer circuit 60*e* drives internal precharge control signal PRCB to H-level in accordance with main precharge activating signal RCNTPB. When internal precharge control signal PRCB attains H-level, the output signal of inverter circuit 74 attains L-level, and word line drive timing signal RXT generated from AND circuit 76 attains L-level. Further, row address decode enable signal RADE generated from composite gate 62 attains the inactive state of L-level, and the selected word line is driven to the unselected state. When internal precharge control signal PRCA subsequently falls to L-level, the output signal of logic circuit 68 attains L-level so that latched signal ACTLAT attains L-level, and each row-related control signal is inactivated and driven to the reset state (standby state).

Internal precharge control signal PRCA is driven to L-level when block hit signal BHT attains L-level and main precharge control signal RCNTPA attains L-level. Responsively, internal precharge control signal PRCB is driven to L-level when internal precharge control signal PRCA attains L-level and main precharge control signal RCNTPB attains L-level. Therefore, these internal precharge control signals PRCA and PRCB likewise have pulse-like waveforms, respectively.

Input buffer circuits 60*a*–60*e* are enabled in accordance with the internal control signals from the preceding stages, respectively. Thereby, the internal control signals can be sequentially and accurately driven to the active state in the predetermined sequence. Therefore, even if variations occur in operation parameters, these internal control signals can be successively and accurately driven to the active state in a predetermined sequence, and the internal row-related control signals can be activated and deactivated in a predetermined sequence.

Input buffer circuits 60*a*–60*c* are activated in the same sequence as that of main row activating signals to activate internal row-related signals. Input buffer circuits 60d and 60e are successively activated in the precharge operation, to produce the internal row control signals in accordance with main row precharge control signals RCNTPA and RCNTAB, respectively. Therefore, each bank is activated and deactivated in an interleaved manner, and the internal row control signals can be accurately produced in each local control circuit even when a next row active signal is applied while the control signals described above are active.

Figure 20:
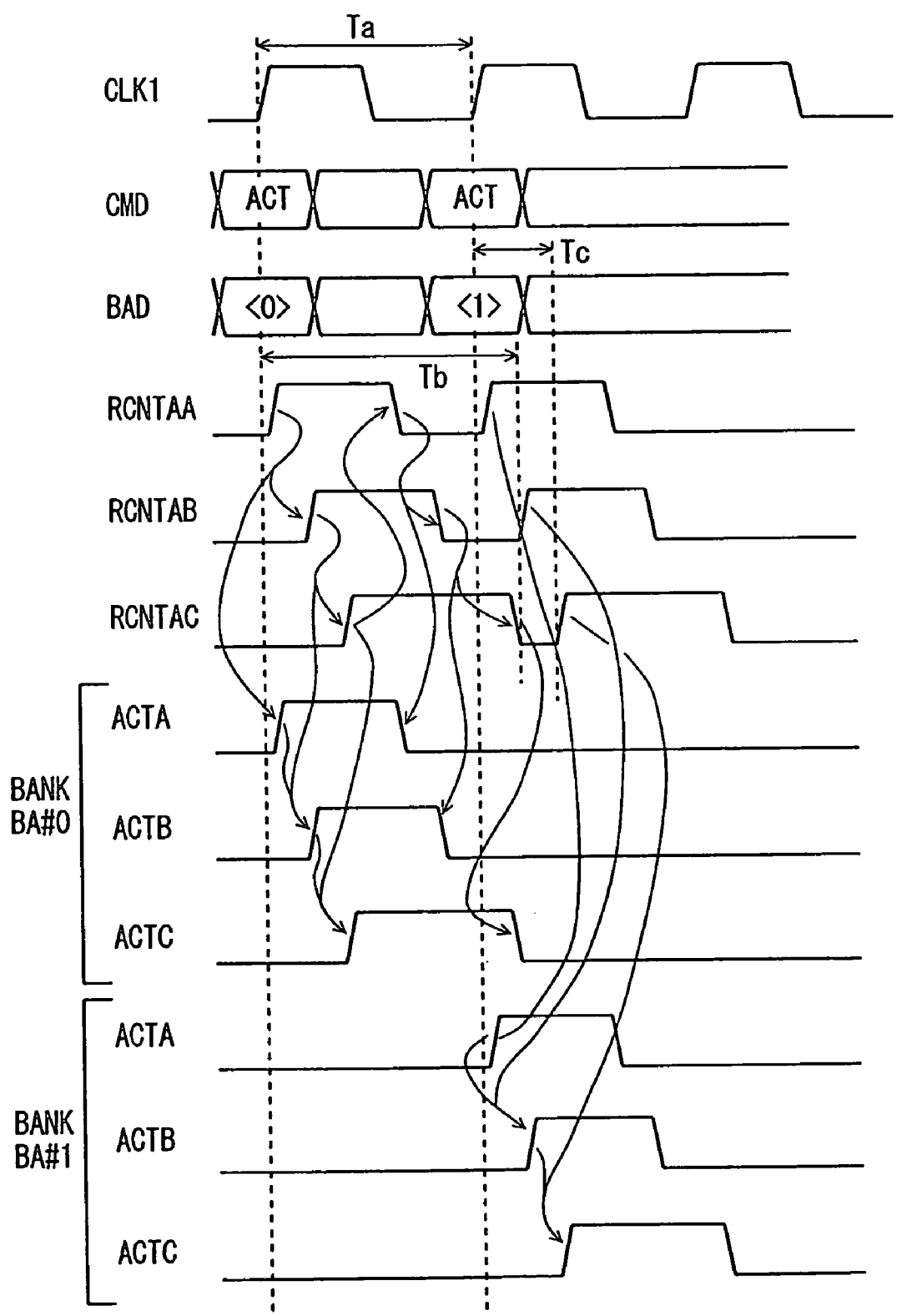
FIG. 20 shows signal waveforms in high speed operation of the circuit shown in FIG. 18.

FIG. 20 is a signal waveform diagram representing a fast operation of the row-related local control circuit according to the fifth embodiment of the invention. In FIG. 20, the row active command is applied in synchronization with internal clock signal CLK1, and a bank address BAD<0> specifying bank BA#0 is applied. In accordance with row active command (row active signal ACT), main row activating signals RCNTAA–RCNTAC are successively activated. Responsively, internal row control signals ACTA–ACTC are driven to the selected state in bank BA#0, and an addressed row in bank BA#0 is driven to the selected state.

Internal clock signal CLK1 (external clock signal ECLK) is a fast clock signal. When the row active command (row active signal ACT) for bank BA#1 is applied in the next clock cycle, the main control circuit drives main row activating signals RCNTAA–RCNTAC to the selected state again. In this case, even when main row activating signal RCNTAC is active, main row activating signal RCNTAA can be driven to the active state in the main control circuit again if main row control signal RCNTAA is already driven to the inactive state. Therefore, main row activating signals RCNTAA–RCNTAC are driven to the active state again. In bank BA#1, therefore, internal row control signals ACTA–ACTC are driven to the active state in accordance with main row control signals RCNTAA–RCNTAC.

Therefore, the row-related local control circuit can accurately produce the internal row-related control signals for each bank, provided that the time parameters Ta, Tb, and Tc satisfy the following relationship, where the time Th represents a time period required after main row control signal RCNTAA is driven to the active state and before main row control signal RCNTAC is driven to the inactive state, the time Ta indicates a cycle of clock signal CLK (CLK1), and the time Tc represents a time difference between main row control signals RCNTAA and RCNTAC:

$Tb < Ta + Tc$.

As can be seen from the structure of the row-related local control circuit, the memory block can be used as a bank. By utilizing the bank hit signal instead of block hit signal BHT, each row-related local control circuit can be operated as the row-related control circuit for the bank.

According to the fifth embodiment of the invention, as described above, the row-related local control circuits each operate to enable successively the input buffer circuits in accordance with the main row control signals, for producing the internal row control signals, and the internal row-related control signals based on the internal row control signals. Therefore, the row-related control signals can be produced accurately by producing the internal row control signals in a predetermined sequence. Even in the fast operation, therefore, the semiconductor memory device can accurately takes in the main row control signals for producing the row-related control signals in a predetermined sequence, and therefore can perform fast and stable operation.

SIXTH EMBODIMENT

Figure 21:
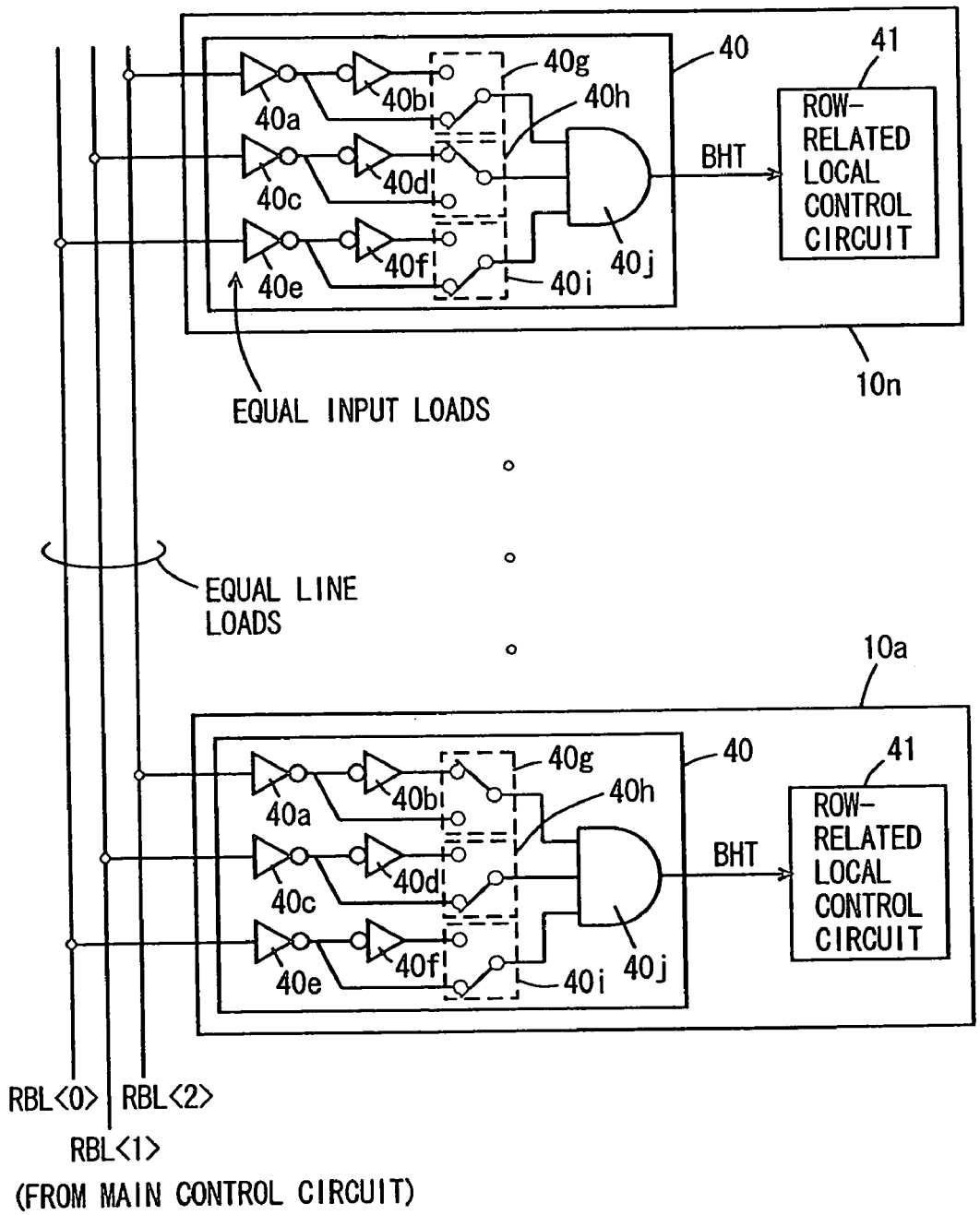
FIG. 21 shows a structure of a block address decoder shown in FIG. 3.

FIG. 21 shows a structure of a block address decoder 40 according to a sixth embodiment of the invention. In FIG. 21, block decoders 40 of the same structure are arranged in local control circuits 10a–10n, respectively. Block hit signals BHT sent from block address decoders 40 are applied to local row-related control circuits 41, respectively.

In FIG. 21, block address decoder 40 includes: inverter circuits 40a, 40c nd 40e which receive block address bits RBL<2>–RBL<0> from the main control circuit, respectively; inverter circuits 40b, 40d and 40f which invert the output signals of inverter circuits 40a, 40c and 40e, respectively; a switch circuit 40g which selects one of the output signals of inverter circuits 40a and 40b; a switch circuit 40h which selects one of the output signals of inverter circuits 40c and 40d; a switch circuit 40i which selects one of the output signals of inverter circuits 40e and 40f; and an AND circuit 40j which receives the output signals of switch circuits 40g, 40h and 40i, and produces block hit signal BHT.

Each of switch circuits 40g–40i are formed of metal interconnection lines. Inverter circuits 40a–40f produce complementary bits of block address bits RBL<2>–RBL<0>. Each of switch circuits 40g–40i selects one of the paired bits complementary to each other, and the block address can be programmed. When corresponding memory block is designated, block hit signal BHT sent from AND circuit 40a is driven to H-level.

These inverter circuits 40a, 40c and 40e in the input stages may be formed of the transistors of the same size for providing the same input impedance. More specifically, all block address decoders 40 in local control circuits 10a–10n can have the same input impedance. Thus, all the signal line loads of block address bits RBL<2>–RBL<0> can be equal to each other, to eliminate a signal skew between the memory blocks. Thus, the signals can be applied to block address decoders 40 of local control circuits 10a–10n with the same timing relationship.

Block address bits RBL<2>–RBL<0> are block address bits included in the externally applied address signal, and are undecoded signal bits. By producing the complementary address bits in each block address decoder 40, the interconnection lines for transmitting the block address signal from the main control circuit to local control circuits 10a–10n can be reduced in number, and the area occupied by the interconnections can be reduced. Utilizing the setup times of the word line addresses in row-related local control circuits 10a–10n, the block address can be decoded.

Block address decoder 40 decodes the row block address of 3 bits in the case where eight memory blocks are arranged in one bank. Bank expansion can be easily achieved for adding a bank including eight memory blocks because the block address decoder of the same structure can be used without modification. Furthermore, each of switch circuits 40g–40i selects one of the complementary address bits in a pair by utilizing the mask metal interconnection. Thus, only provision of the mask interconnection line is required, and provision of transistors is not required so that an area occupied by the switch circuits can be reduced.

In the layout process, the same structures can be employed for all the block address decoders of the local control circuits, and it is merely required to change the connection paths of the switch circuits in accordance with the block addresses of the memory blocks. Therefore, the design efficiency can be improved.

With the signal interconnection lines of the same length employed for block address bits RBL<2>–RBL<0>, these signal interconnection lines can reliably have the same line load.

An inverter circuit having the same structure as inverter circuits 40a, 40c and 40b in the input stage of block address decoder 40 can be utilized as a receiving circuit for receiving the main row-related control signal sent from main control circuit. Thus, accurate operations can be ensured while preventing a skew between the main row-related control signals as well as a difference in skews, which in turn might occur between the row address signal bits and the main row-related control signals, between memory blocks.

Inverters 40a, 40c and 40e in the input stage correspond to input circuit 37c shown in FIG. 18.

[First Modification]

Figure 22:
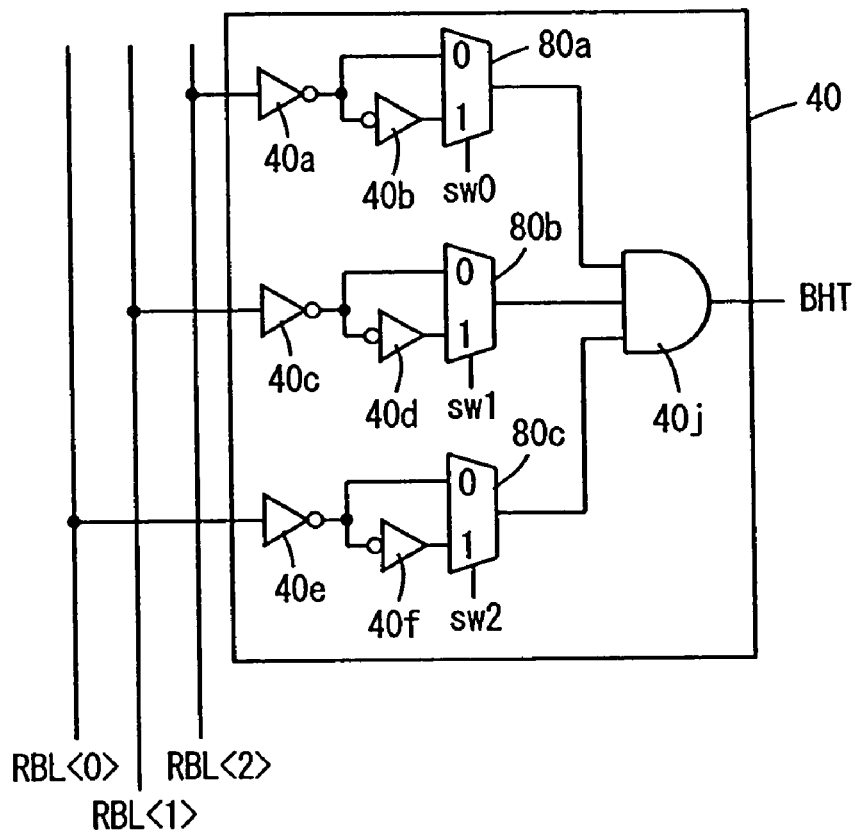
FIG. 22 shows a structure of a first modification of the block address decoder shown in FIG. 21.

FIG. 22 schematically shows a structure of a first modification of the sixth embodiment of the invention. In the structure shown in FIG. 22, block address decoder 40 includes select circuits 80a–80c instead of switch circuits 40h–40i. Select circuits 80a–80c have the select paths set by switch signals SW0–SW2, respectively. The other structures of block address decoder 40 shown in FIG. 22 are the same as those shown in FIG. 21. The corresponding portions bear the same reference numerals, and description thereof is not repeated.

Figure 23:
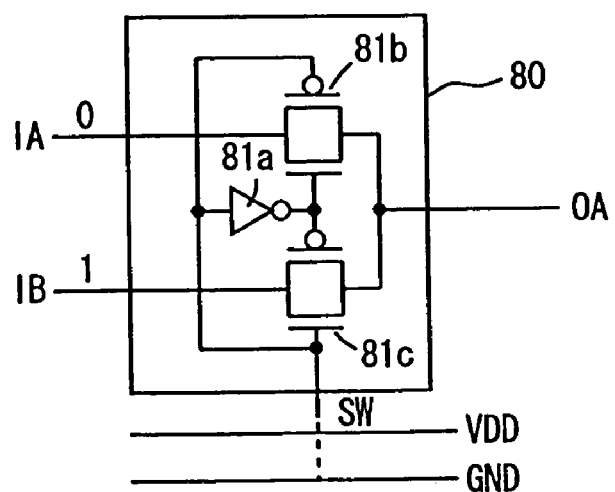
FIG. 23 shows a structure of a select circuit shown in FIG. 22.

FIG. 23 shows an example of the structures of select circuits 80a–80c shown in FIG. 22. In FIG. 23, only one select circuit 80 is shown because select circuits 80a–80c have the same structure. Select circuit 80. includes: an inverter 81a which inverts a switch signal SW; a transmission gate 81b which selects an input signal IA in response to switch signal SW and the output signal of inverter 81a; and a transmission gate 81c which is rendered conductive complimentarily with transmission gate 81b in response to switch signal SW and the output signal of inverter 81a, to select an input signal IB. One of these transmission gates 81b and 81c is made conductive in accordance with switch signal SW, and one of input signals IA and IB is selected to produce an output signal OA.

Switch signal SW is produced by coupling a mask metal interconnection to a power supply that supplies power supply voltage VDD or to ground voltage GND.

According to the block address decoder shown in FIG. 22, it is merely required to change the voltage levels of switch signals SW0–SW2, and it is possible to employ the block address decoders of the same layout in all the memory blocks. Therefore, the local control circuits of the same structure can be employed for the respective memory blocks. Accordingly, it is not necessary to provide the block address decoders having different arrangements (layouts) for the respective memory blocks so that the structures of the whole circuits can be made simple, and can be easily adapted to the change in number of the memory blocks.

[Second Modification]

Figure 24:
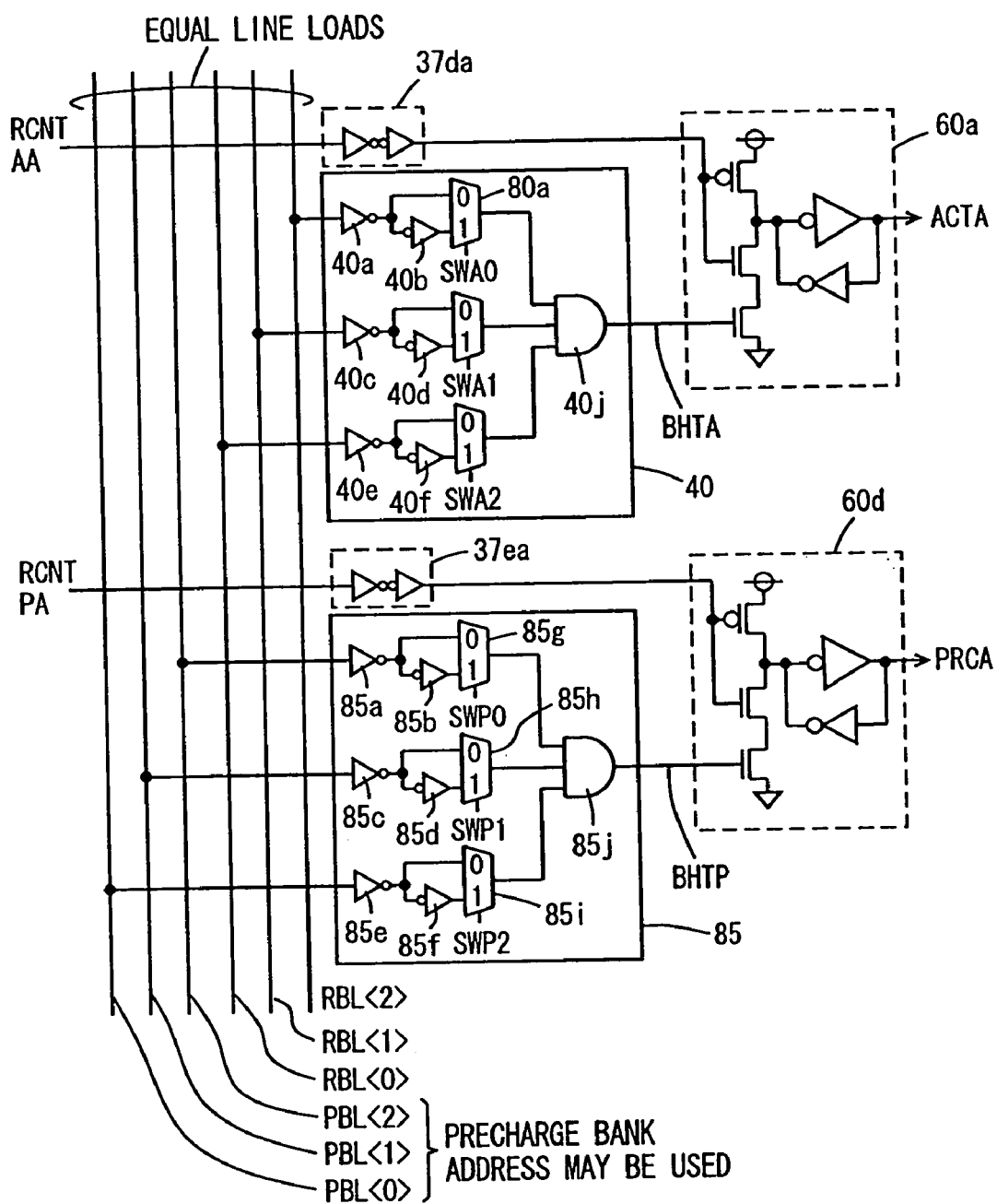
FIG. 24 schematically shows a structure of a second modification of a block address decoder shown in FIG. 21.

FIG. 24 shows a structure of a modification of a block address decoder according to a sixth embodiment of the invention. In the structure shown in FIG. 24, block address decoder 40, which decodes the block address when the row active command is applied, is provided independently of a precharging block address decoder 85, which decodes a precharge block address applied in the precharging operation together with a precharge command. Block address decoder 40 for the row activation has the same structure as that shown in FIG. 22, and the corresponding portions bear the same reference numerals. However, select circuits 80a–80c are supplied with switch signals SWA0–SWA2 instead of the switch signals sw0 to sw2, respectively. Block hit signal BHTA generated from block address decoder 40 is applied to input buffer circuit 60a in the next stage. Input buffer 60a in the next stage is supplied with main row activating signal RCNTAA via driver 37da. When block hit signal BHTA is in the selected state of H-level, input buffer circuit 60a drives the internal row control signal ACTA to the active state.

Block address decoder 85 for precharging includes: inverter circuits 85a and 85b which produce complementary address bits from precharge block address bit PBL<2>; inverter circuits 85c and 85d which are connected in series, and produce complementary address bits from precharge block address bit PBL<1>; inverter circuits 85e and 85f which are connected in series, and produce complementary address bits from precharge block address bit PBL<0>; a select circuit 85g which selects one of the output signals of inverter circuits 85a and 85b in accordance with a switch signal SWP0; a select circuit 85h which selects one of the output signals of inverter circuits 85c and 85d in accordance with a switch signal SWP1; a select circuit 85i which selects one of the output signals of inverter circuits 85e and 85f in accordance with a switch signal SWP2; and an AND circuit 85j which produces a precharge block hit signal BHTP in accordance with the output signals of select circuits 85g–85i.

Precharge block address bits PBL<2>–PBL<0> define the precharge operation on a block basis. Thus, the memory block can be used as one bank. If the bank includes a plurality of memory blocks, the bank address bits for precharging are applied instead of precharge block address bits PBL<2>–PBL<0>. If the banks are two in number, one bit (e.g., PBL<2>) among the precharge block address bits is changed in accordance with the bank address for precharging, and the other precharge block address bits PBL<1> and PBL<0> are fixed, e.g., to H-level. Thereby, the plurality of memory blocks included in a selected bank can be simultaneously precharged.

In the structure shown in FIG. 24, block address decoder 40 for row activation and block address decoder 85 for precharging have the same structure, and all inverter circuits 40a–40c, 40e, 85a, 85c and 85e at the input stage have the same input load (input impedance). Thus, the line loads for address bits PBL<2:0> are equal to each other, and the transmission delays of these signals are all equal to each other for each memory block. Therefore, even if the memory blocks or the banks increase in number, the skew of the block address bits in each memory block does not change independently of the number of memory blocks, and the decoding operation and the internal operation can be accurately performed.

The block address bits are merely applied to the local control circuits after buffering by the main control circuit, and the block address bits are decoded within the local control circuits. Thus, the signal lines for transferring the address bits from the main control circuit to the local control circuits can be reduced in number, and the interconnection layout area therefor can be reduced.

[Third Modification]

Figure 25:
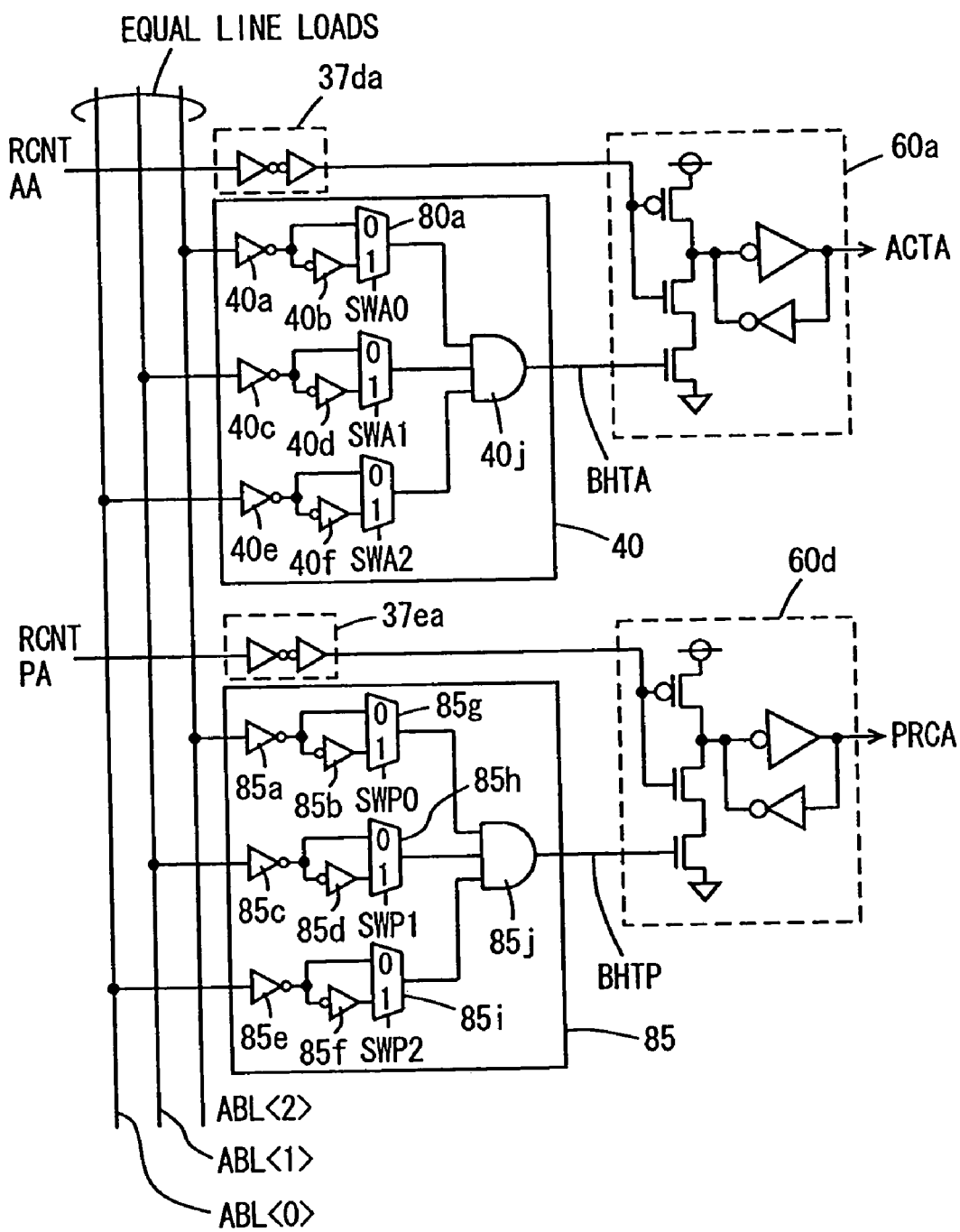
FIG. 25 shows a structure of a third modification of a block address decoder shown in FIG. 24.

FIG. 25 shows a structure of a third modification of the sixth embodiment of the invention. In the structure shown in FIG. 25, the block address bits for precharging and the block address bits for row activation are transmitted via the same signal lines. Thus, block address decoders 40 and 85 are commonly supplied with address bits ABL<2>–ABL<0> from the main control circuit. The bank/block address bits for precharging are applied via the same input nodes as the block address bits for row activation in each local control circuit. This can also reduce the number of signal lines.

The structures other than the above shown in FIG. 25 are the same as those shown in FIG. 24. The corresponding portions bear the same reference numerals, and description thereof is not repeated.

In the structure shown in FIG. 25, block address decoders 40 and 85 drive the block hit signals BHTA and BHTP to the active state based on block address bits ABL<2>–ABL<0>. However, only one of main row activating signals RCNTAA and RCNTPA is activated depending on whether the applied command is the row active command or the precharge command, and both main row activating signals RCNTAA and RCNTPA are never activated simultaneously. Therefore, only one of internal row control signals ACTA and PRCA is driven to the active state in accordance with the applied command, and the accurate internal operation is ensured.

According to the sixth embodiment, as described above, the block address decoder arranged in the local control circuit decodes the address signal bits, and the block address decoders in the respective memory blocks have the same structure. Thus, the loads of the block address bits are made equal to each other, and the skew between signals in each memory block is not different from those in other memory blocks. Therefore, accurate internal operations can be ensured. Increase in number of the memory blocks or the banks can be accommodated merely by additionally providing the local control circuit of the same circuit structure, and therefore the change in number of the memory blocks or banks can be easily accommodated. Even if the banks or memory blocks increase in number, the load of each address bit does not change, and the skew between signals in each memory block does not vary from the skews in other memory blocks so that accurate operations can be ensured.

SECOND EMBODIMENT

Figure 26:
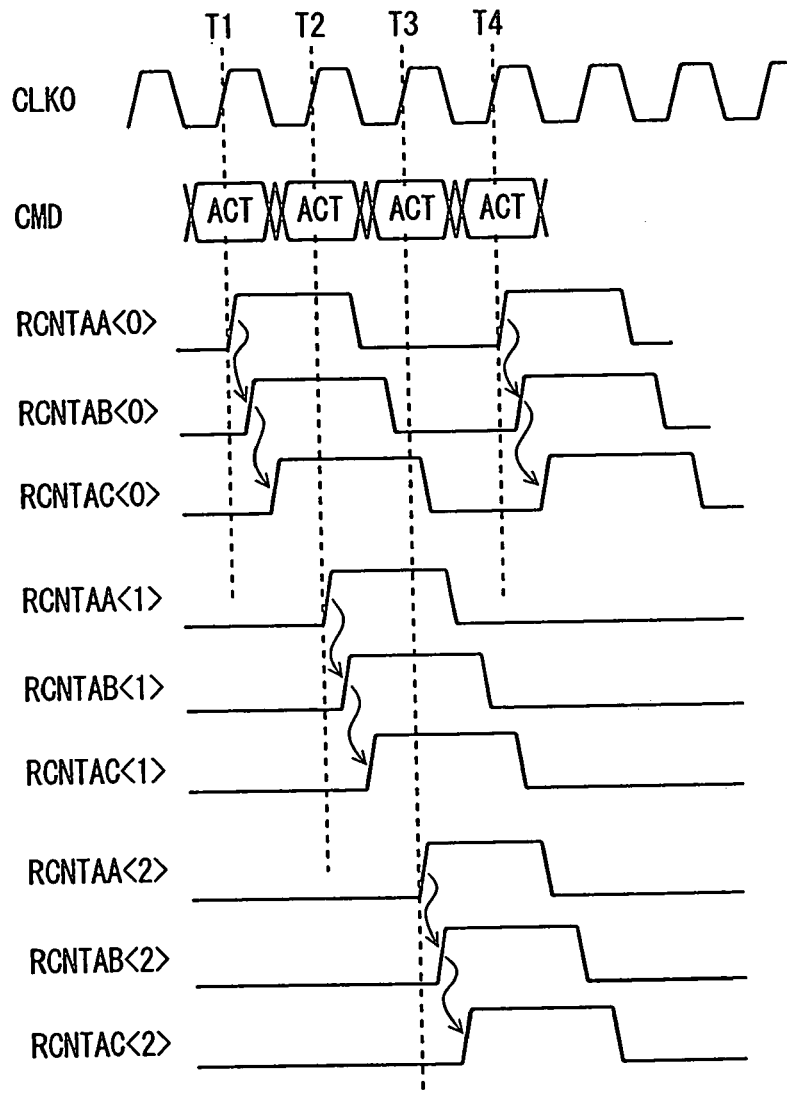
FIG. 26 shows a sequence for generating a plurality of main control signal sets.

FIG. 26 shows a sequence of generation of main row activating signals of the main control circuit according to a seventh embodiment of the invention. In FIG. 26, an external logic directly applies row active command ACT. Thus, in this embodiment, a command decoder for decoding a command is not provided. The main control circuit includes a plurality of sets of circuits for producing main row activating signals RCNTAA–RCNTAC. By sequentially activating the main row activating signals, the main row activating signal generating circuits are sequentially activated in accordance with externally applied row active command ACT, to drive main row activating signals RCNTAA–RCNTAC to the active state.

At a time T1 in FIG. 26, row active command ACT is applied. Responsively, one set of the main row activating signal generating circuits is first activated, and main row activating signals RCNTAA<0>–RCNTAC<0 > are sequentially activated.

While main row activating signal RCNTAA<0> is active, row active command ACT for another bank is applied again at time T2. Another main row activating signal generating circuitry is activated, and main row activating signals RCNTAA<1>–RCNTAC<1> are sequentially activated in accordance with row active command ACT applied at time T2.

At a time T3, row active command ACT designating a further bank is applied. Thereby, further main row activating signal generating circuitry is activated, and main row activating signals RCNTAA<2>–RCNTAC<2> are sequentially activated in accordance with row active command ACT applied at time T3.

When row active command ACT is applied again at a time T4, the main row activating signal generating circuit, which is first activated, is already returned to the standby state, and is activated responsively, to sequentially activate main row activating signals RCNTAA<0>–RCNTAC<0> in accordance with row active command ACT applied at time T4.

Therefore, the main row activating signals can be internally produced, and the row selection can be performed even if the row active commands are applied in the bank interleaved manner in accordance with fast clock signal CLK (CLK0). These main row activating signals RCNTAA–RCNTAC are independent of the bank address, and are activated when row active command ACT is applied. Therefore, even if. the number of banks changes, it is not necessary to change the structure of the main row activating signal generating circuitry at all, and the change in bank structure can likewise be accommodated easily.

Figure 27:
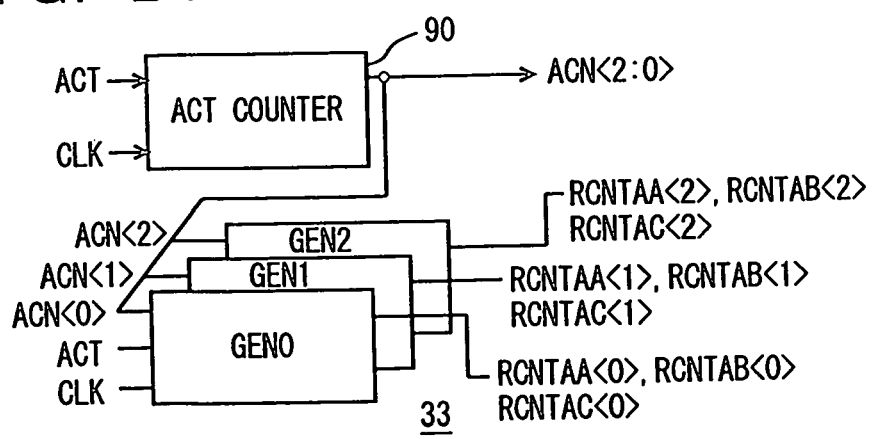
FIG. 27 schematically shows a structure of a main control circuit implementing an operation sequence shown in FIG. 26.

FIG. 27 schematically shows a structure of a main row activation control circuit 33. In FIG. 27, main row activation control circuit 33 includes an ACT counter 90 which counts active command ACT in response to the rising of clock signal CLK(CLK0), and main row activating signal generating circuits GEN2–GEN0 which are enabled in response to a count value ACN<2:0>, to produce main row-related control signals RCNTAA<2>–RCNTAC<2> and RCNTAA<1>–RCNTAC<1> and RCNTAA<0>–RCNTAC<0> in accordance with clock signal CLK and active command ACT.

ACT counter 90 updates its count bits ACN<2:0> when row active command ACT is applied at the rising of clock signal CLK (CLK0). Main row activating signal generating circuits GEN2–GEN0 are enabled in accordance with count bits ACT<2>–ACN<0>, respectively, to activate the corresponding main row activating signals in a predetermined sequence according to clock signal CLK and row active command ACT. These main row activating signal generating circuits GEN0–GEN2 are equivalently corresponding to the structure shown in FIG. 10, but is configured to receive the corresponding count bit by the NAND gate at the input stage. These main row activating signal generating circuits GEN0–GEN2 are sequentially activated in accordance with count bits ACT<2:0>, whereby the main row control signals can be accurately produced even in the fast operation as shown in FIG. 26.

Figure 28C:
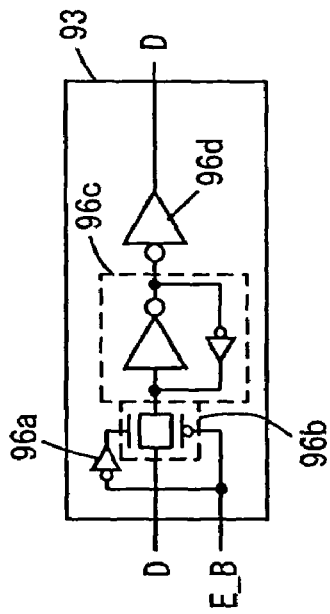
FIG. 28C shows a structure of a latch 93 shown in FIG. 28A.
Figure 28A:
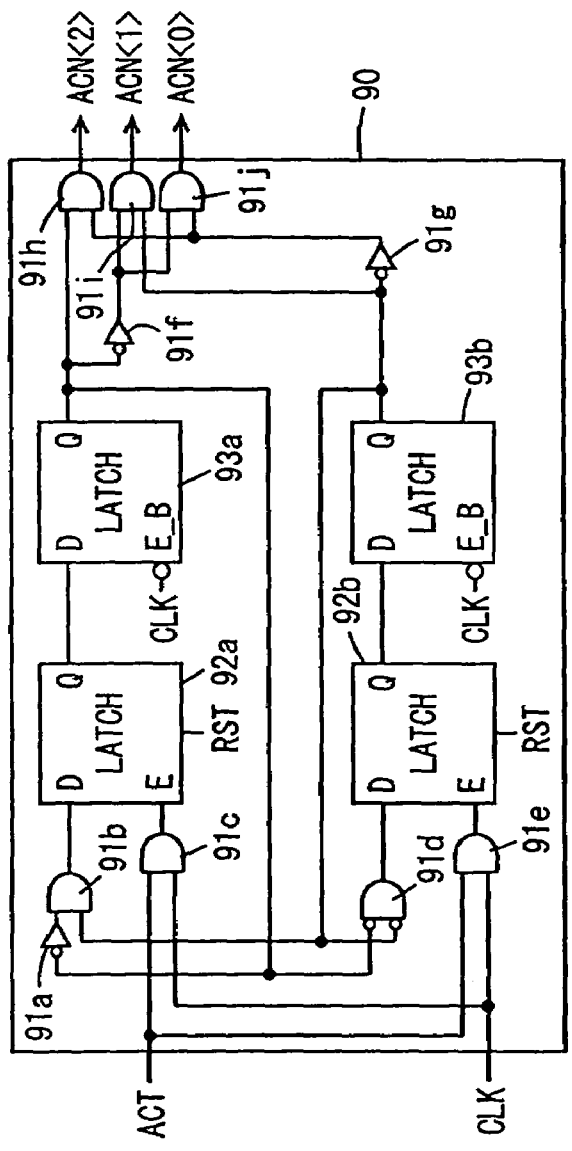
FIG. 28A shows a structure of an ACT counter shown in FIG. 27.

FIG. 28A schematically shows a structure of the ACT counter shown in FIG. 27. In FIG. 28A, ACT counter 90 includes: AND circuits 91c and 91e each of which receive row active command (signal) ACT and clock signal CLK (CLK0); a latch 92a which latches the signal applied to input D thereof in response to the output signal of AND circuit 91c; a latch 92b which latches the signal applied to input D thereof in response to the output signal of AND circuit 91e; latches 93a and 93b which latch the signals generated from outputs Q of latches 92a and 92b in response to clock signal CLK, respectively; an inverter 91a which receives the signal from outputs Q; an AND circuit 91b which receives the signal generated from output Q of latch 93b and the output signal of inverter 91a and applies an output signal thereof to input D of latch 92a; and an NOR circuit 91d which receives the signals from outputs Q of latches 93a and 93b and applies an output signal thereof to input D of latch 92b.

Each of latches 92a and 92b takes in the signal applied to the input D when the signal applied to its input E is at H-level, and attains the latch state when the signal applied to its input E attains L-level. In each of latches 92a and 92b, the signal on its output Q is reset to L-level in response to reset signal RST.

Each of latches 93a and 93b takes in the signal applied to its input D thereof when clock signal CLK is at L-level, and enters the latch state when clock signal CLK is at H-level.

ACT counter 90 further includes: an inverter 91f which receives the signal from output Q of latch 93a; an inverter 91g which receives the signal from output Q of latch 93b; an AND circuit 91h which receives the signal generated from output Q of latch 93a (referred to as the "output signal", hereinafter) and the output signal of inverter 91g, and produces count bit ACN<2>; an AND circuit 91i which receives the output signals of inverter 91f and latch 93b, and produces count bit ACN<1>; and an AND circuit 91j which receives the output signals of inverters 91f and 91g, and produces count bit ACN<0>.

This ACT counter 90 is a counter of 2 bits. Latches 92b and 93b calculate the count value of the lower bit, and latches 92a and 93a calculate the count value of the higher bit. Inverters 91f and 91g as well as AND circuits 91h–91j form a decode circuit for decoding these count bits.

Figure 28B:
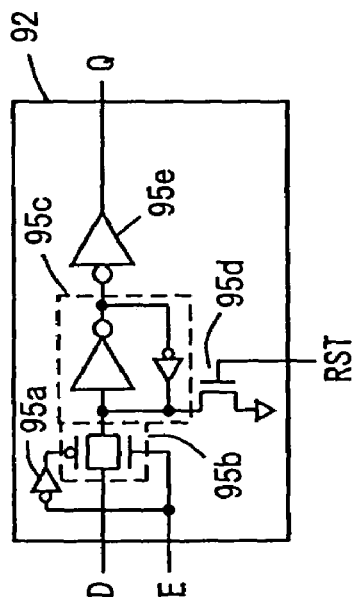
FIG. 28B shows a structure of a latch 92 shown in FIG. 28A.

FIG. 28B shows a structure of latches 92a and 92b shown in FIG. 28A. Since latches 92a and 92b have the same structure, FIG. 28B shows only one latch 92 as a representative.

In FIG. 28B, latch 92 includes: an inverter 95a which receives a signal applied to an input E; a transmission gate 95b which passes a signal applied to an input D in accordance with the signal received from inverter 95a and the signal on input E; an inverter latch 95c which latches the signal transferred from transmission gate 95b; an inverter 95e which inverts the latched signal of inverter latch 95c, and outputs the inverted signal from output Q; and a resetting transistor 95d which resets the latched signal of inverter latch 95c in accordance with reset signal RST.

In FIG. 28B, resetting transistor 95d is formed of an N-channel MOS transistor. When reset signal RST attains H-level, resetting transistor 95d holds the input node of inverter latch 95c at the ground potential level, to set the signal on output Q to L-level.

FIG. 28C shows a structure of latches 93a and 93b shown in FIG. 28A. Since latches 93a and 93b have the same structure, FIG. 28C shows only one latch 93 as a representative.

In FIG. 28C, latch 93 includes: an inverter 96a which inverts the signal applied to an input E_B; a transmission gate 96b which passes the signal applied to an input D in accordance with the signal on input E_B and the output signal of inverter 96a; an inverter latch 96c which latches the signal transmitted from transmission gate 96b; and an inverter 96d which inverts the latched signal of inverter latch 96c, and applies the inverted signal to output Q.

Latch 93 shown in FIG. 28C is not provided with a reset function. Latches 92a and 92b in the preceding stage has a reset function, and the latched signals of these latches 93a and 93b are reset to the initial state in synchronization with clock signal CLK applied to input E_B. Now, an operation of the ACT counter shown in FIGS. 28A–28C will be briefly described below.

In the initial state, latches 92a and 92b are reset by reset signal RST, and the signals on their outputs Q are at L-level. When clock signal CLK attains L-level, latches 93a and 93b take in and latch the output signals of latches 92a and 92b, respectively, so that latches 93a and 93b output the output signals at L-level. In the initial state, therefore, the output signals of inverters 91f and 91g are at H-level, so that count bit ACN<0> from AND circuit 91j is at H-level, and the remaining count bits ACT<2:1> are both at L-level.

While row active command ACT is not supplied, AND circuits 91c and 91e output the signals at L-level, and transmission gate 95b shown in FIG. 28B is non-conductive, so that latches 92a and 92b maintain the latch state. Therefore, ACT counter 90 maintains the reset state until the active command is applied. In this state, the output signal of NOR circuit 91d is at H-level, and the output signal of AND circuit 91b is at L-level.

When row active command ACT is applied, the output signals of AND circuits 92c and 91e attain H-level in synchronization with the rising of clock signal CLK, and latch 92a takes in the output signal of AND circuit 91b, and generates the signal at L-level at its output Q. Meanwhile, latch 92b takes in the signal at H-level from NOR circuit 91d in response to the rising of output signal of AND circuit 91e, and generates the signal at H-level. While the clock signal CLK is at H-level, latches 93a and 93b are in the latch state. Therefore, when row active command ACT is applied in the above state, main row activating signal generating circuit GEN0 shown in FIG. 27 is in the enabled state, and produces main row activating signals RCNTAA<0>–RCNTAC<0> in accordance with row active command ACT.

When clock signal CLK attains L-level, transmission gate 96b shown in FIG. 28C is turned on to take in and generate the output signals of latches 92a and 92b at its output Q. Accordingly, the output signal of latch 93b attains H-level, and the output signal of latch 93a maintains L-level. In response to the change in output signals of latches 93a and 93b, the output signal of inverter circuit 91a falls to L-level. The output signal of inverter circuit 91f is at H-level. Therefore, count bit ACN<1> generated from AND circuit 91i rises to H-level, and count bit ACN<0> falls to L-level. When the output signal of latch 93b rises to H-level, the output signal of NOR circuit 91d attains L-level, and the output signal of AND circuit 91b attains H-level.

When row active command ACT is applied again, latch 92b takes in and outputs the signal at L-level generated from NOR circuit 91d, and latch 92a takes in and outputs the signal at H-level received from AND circuit 91b. Therefore, when clock signal CLK subsequently falls to L-level, latch 93a generated the signal at H-level, and latch 93b generates the signal at L-level. Therefore, the output signal of inverter 91d attains H-level, and the output signal of inverter 91f attains L-level. Also, count bit ACN<1> from AND circuit 91i becomes L-level, and count bit ACN<2> from AND circuit 91h attains H-level.

When the output signal of latch 93a attains H-level, the output signal of inverter 91a becomes L-level, and responsively the output signal of AND circuit 91b falls to L-level. NOR circuit 91d generates the signal at L-level in accordance with the output signal of latch 93a.

When row active command ACT is applied, D latch 92b takes in and latches the signal at L-level, and D latch 93b generates the signal at L-level in synchronization with the falling of clock signal CLK. Likewise, latch 92a takes in and latches the signal at L-level received from AND circuit 91b in synchronization with the rising of clock signal CLK, and subsequently latch 93a takes in and outputs the signal received from latch 92a in response to the falling of clock signal CLK. Therefore, both the output signals of latches 93a and 93b attain L-level so that count bit ACN<0> attains H-level, and count bit ACN<2> attains L-level.

Therefore, ACT counter 90 forms a so-called ternary counter, and count bit ACN<0> attains H-level every time the row active command ACT is applied three times.

Thereby, main row activating signal generating circuits GEN0–GEN2 shown in FIG. 27 can be sequentially activated.

Figure 29:
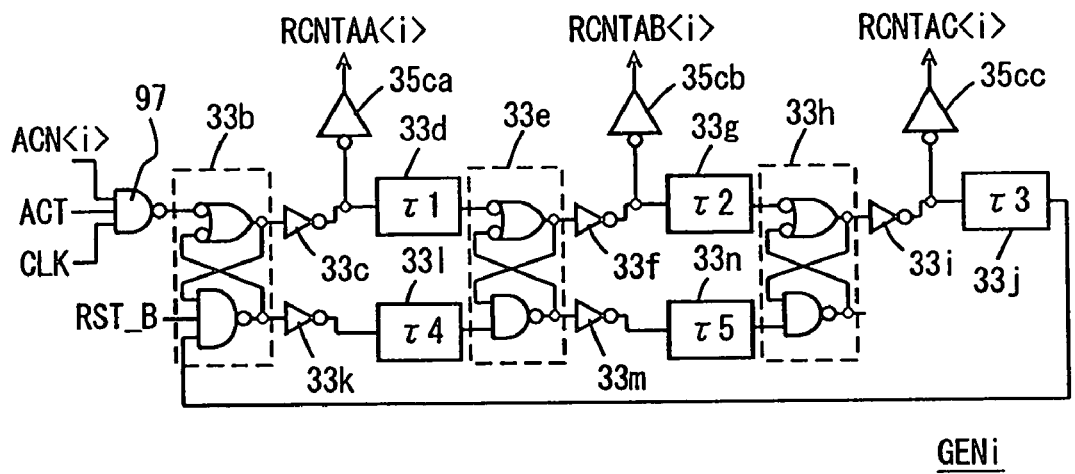
FIG. 29 shows a structure of a main row activating signal generating circuit shown in FIG. 27.

FIG. 29 shows a structure of a main row activating signal generating circuit GENi shown in FIG. 27. In FIG. 29, there is provided at an input stage of the main row activating circuit with an NAND circuit 97, which in turn receives count bit ACN<i>, row active command ACT and clock signal CLK (CLK0). Structures other than the above are the same as those of main row activation control circuit 33 shown in FIG. 10, and the corresponding portions bear the same reference numerals.

Main row activating signal generating circuit GENi generates main row control signals RCNTAA<i>–RCNTAC<i>. When count bit ACN<i> is at L-level, set/reset flip-flop 33b at the input stage of main row activating signal generating circuit GENi is not reset, and therefore main row activating signal generating circuit GENi does not change its state. When count bit ACN<i> is at H-level, main row activating signal generating circuit GENi operates in accordance with row active command ACT, and produces main row activating signals RCNTAA<i>–RCNTAC<i> in a predetermined sequence when activated.

Figure 30:
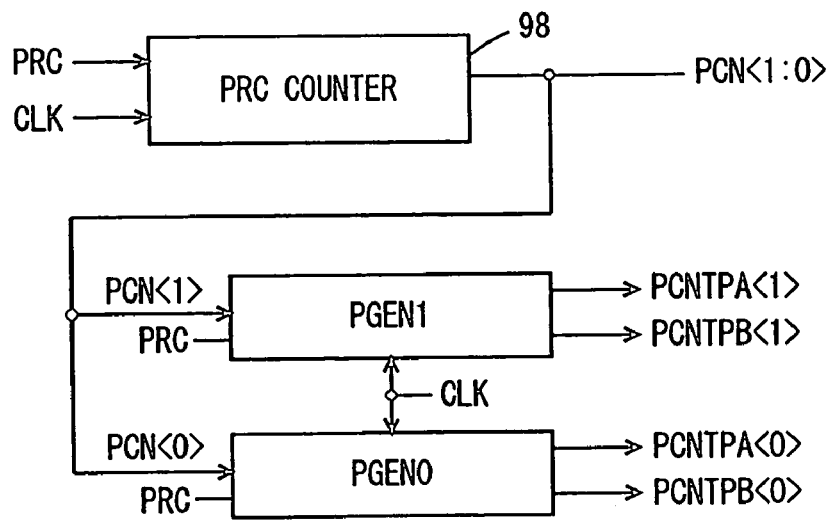
FIG. 30 schematically shows a structure of a main precharge control circuit corresponding to the structure show in FIG. 27.

FIG. 30 schematically shows a structure of a main precharge control circuit in the seventh embodiment of the invention. In FIG. 30, the main precharge control circuit includes: a PRC counter 98 which counts precharge instructing command PRC in response to the rising of clock signal CLK; a main precharge activating signal generating circuit PGEN0 which is enabled when count bit PCN<0> of PRC counter 98 is at H-level, and produces main precharge activating signals RCNTPA<0> and RCNTPB<0> in accordance with clock signal CLK and precharge command PRC when enabled; and a main precharge activating signal generating circuit PGEN1 which is enabled when count bit PCN<1> of PRC counter 98 is at H-level, and produces main precharge activating signals RCNTPA<1> and RCNTPB<1> in accordance with clock signal CLK and precharge command PRC when enabled.

PRC counter 98 produces count value PCN<1:0> of 2 bits. The precharge operation period is sufficiently shorter than the row active period. Main row activating signals RCNTAA–RCNTAC control the row-related control signals that are generated for a period from start of the row selection to the sense amplifier activation. In the precharge operation, these row-related control signals are merely reset to the standby state in the precharge period, and the pulse widths of main precharge activating signals RCNTPA and RCNTPB can be shorter than the pulse widths of main row activating signals RCNTAA–RCNTAC. Therefore, the fast operation can be sufficiently achieved even with the structure, in which two main precharge activating signal generating circuits PGEN1 and PGEN0 are employed, and are alternately enabled.

Figure 31:
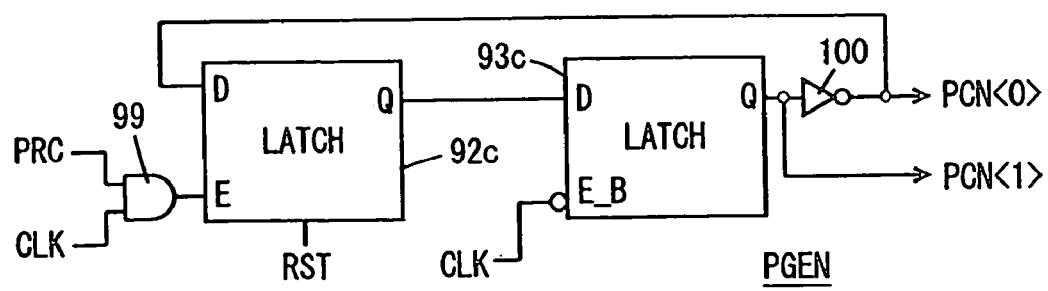
FIG. 31 shows an example of a structure of a PRC counter shown in FIG. 30.

FIG. 31 schematically shows a structure of main precharge activating signal generating circuits PGEN0 and PGEN1 shown in FIG. 30. Since these main precharge activating signal generating circuits PGEN0 and PGEN1 have the same structure, FIG. 31 shows representatively them as a main precharge activating signal generating circuit PGEN.

In FIG. 31, main precharge activating signal generating circuit PGEN includes: an AND circuit 99 which receives precharge command PRC and clock signal CLK; a latch 92c which receives on an input E thereof the output signal of AND circuit 99; a latch 93c which takes in the output signal of latch 92c in accordance with clock signal CLK applied to an input E_B thereof, and an inverter circuit 100 which inverts the output signal of latch 93c, and produces count bit PCN<1>. The output signal of inverter circuit 100 is also applied to an input D of latch 92c.

In accordance with reset signal RST, latch 92c resets an output signal thereof to L-level. These latches 92c and 93c have the same structures as latches 92 and 93 shown in FIGS. 28B and 28C, respectively. Inverter circuit 96d (see FIG. 28C) at the output stage of latch 93c has the drive capability equal to that of inverter circuit 100. This achieves equal signal transmission delays for count bits PCN<1:0> sent to the local control circuit, which will be described later.

When main precharge activating signal generating circuit PGEN shown in FIG. 31 is in the initial state, the output signal of latch 92c is at L-level, and the output signal of latch 93c is at L-level. Thus, count bit PCN<0> is at H-level, and count bit PCN<1> is at L-level. This state is kept until precharge command PRC is applied.

When precharge command PRC is applied latch 92c takes in count bit PCN<0> in synchronization with the rising of clock signal CLK, and raises its output signal to H-level. When clock signal CLK attains L-level, latch 93c takes in the output signal of latch 92c, and raises its output signal, i.e., count bit PCN<1> to H-level, and count bit PCN<0> attains L-level.

When precharge command PRC is applied again, latch 92c takes in count bit PCN<0> at L-level, and the output signal thereof attains L-level. When clock signal CLK attains L-level, latch 93c takes in the signal at L-level of latch 92c, and sets count bit PCN<1> to L-level and count bit PCN<0> to H-level.

In main precharge activating signal generating circuit PGEN shown in FIG. 31, count bits PCN<0> and <PCN1> are alternately driven to H-level upon each application of precharge instructing command PRC, and main precharge activating signal generating circuits PGEN0 and PGEN1 shown in FIG. 30 are alternately activated As shown in FIGS. 27 and 30, main row activating signals RCNTPA–PCNTPB are activated in a predetermined sequence when the row active command is applied, and main precharge activating signals RCNTPA and RCNTPB are activated in a predetermined sequence when the precharge command is applied. No bank address is combined. Even when the bank structure changes, therefore, it is not necessary to change the structure of main row-related control signal generating circuit in the main control circuit, and no change in circuit structure is required even in the case of the bank change.

More specifically, by designing and optimizing one row-related main control circuit, the resultant circuit structure can be adapted to a structure of any number of the banks, and the design efficiency is significantly improved. Even if the banks increase in number, no increase in number of the control circuits and the control signals occurs in row-related main control circuit, and therefore the layout area can be significantly reduced as compared with the prior art.

The row-related main control circuit can be adapted to any bank structure and the any array structure (the numbers of banks, arrays and memory blocks). Thus, an optimum circuit structure suitable for a module generator performing automatic arrangement and interconnection can be achieved so that the arrangement and interconnection of the row-related main control circuits can be effectively performed. Thus, the design efficiency can be improved.

Figure 32:
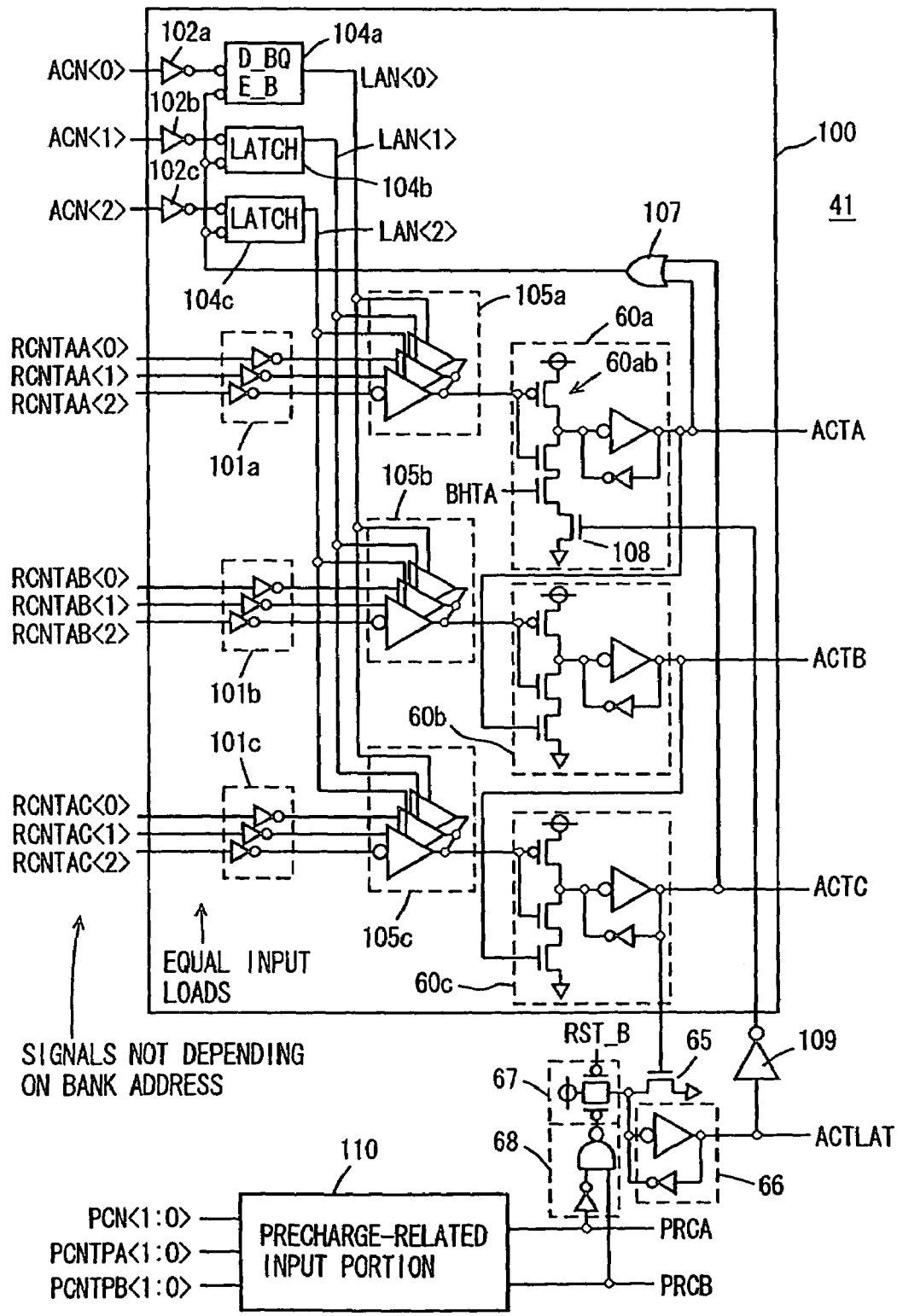
FIG. 32 shows a structure of a local control circuit corresponding to the structure shown in FIG. 27.

FIG. 32 shows a structure of a row-related local control circuit 41 included in the local control circuit. Row-related local control circuit 41 shown in FIG. 32 includes: an act-related input portion 100 for producing internal row control signals ACTA, ACTB and ACTC; and a precharge-related input portion 110 for producing internal precharge control signals PRCA and PRCB in accordance with main precharge activating signals RCNTP<1:0> and RCNTPB<1: 0> and precharge count bits PCN<1:0>.

Act-related input portion 100 includes: an input circuit 101a which receives main row activating signals RCN-TAA<2:0>; an input circuit 101b which receives main row activating signals RCNTAB<2:0> in parallel; an input circuit 101cb which receives main row activating signals RCNTAC<2:0> in parallel; input inverter buffer circuits 102a–102c which receives count bits ACT<2:0>, respectively; latches 104a–104c which latch the output signals of input inverter buffer circuits 102a–102c, and produce latch count bits LAN<2:0>, respectively; a tristate buffer 105a which includes tristate inverter buffers provided corresponding to respective latch circuits 104a–104c, and buffers the main row-related control signal RCNTAA<2:0> sent from input circuit 101a in accordance with latch count bits LAN<2:0> for application to input buffer circuit 60a; a tristate inverter buffer 105b which is selectively enabled in accordance with latch count bits LAN<2:0>, and buffers and inverts the main row-related control signals RCNTAB<2:0> sent from input circuit 101b for application to input buffer circuit 60b; a tristate inverter buffer 105c which is selectively enabled in accordance with latch count bits LAN<2: 0>, and buffers the main row-related control signals RCN-TAC<2:0> sent from input circuit 101c for application to input buffer circuit 60c; and an OR circuit 107 which receives internal row control signals ACTA and ACTC to apply a resultant signal the latch inputs of latches 104a–104c.

Each of input circuits 101a–101c includes inverter circuits of 3 bits, which are provided corresponding to the main row control signals of 3 bits, respectively, and inverts the corresponding main row-related control signals for application to tristate inverter buffers 105a–105c, respectively.

Tristate inverter buffers 105a–105c includes tristate inverter buffers provided corresponding to the inverters in corresponding input circuit 101a, 101b and 101c, respectively, and are enabled to invert the output signals of the inverters in corresponding input circuit 101a, 101b and 101c, respectively, when corresponding latch count bits LAN<2:0> are at H-level and active. The tristate inverter buffer circuits included in tristate inverter buffers 105a–105c attain the output high-impedance state when the corresponding count bits are at L-level and inactive.

The structures of input buffer circuits 60a–60c are the same as the structures shown in FIG. 18 except for the following points. Input buffer circuit 60a producing internal row control signal ACTA includes an N-channel MOS transistor 108, which in turn is arranged between a MOS transistor receiving a block hit signal BHTA and the ground node, and receives a latched row activating signal ACTLAT on a gate thereof via an inverter 109. When the corresponding memory block is selected and a row is in the selected state, the precharge command is to be applied, and latched row activating signal ACTLAT is at H-level, and responsively the output signal of inverter circuit 109 is at L-level. In input buffer circuit 60a, therefore, input buffer 60ab in the input stage generates the signal at H-level regardless of the output signal of the tristate inverter buffer 105a, and internal row control signal ACTA is kept at L-level. Thus, even if block hit signal BHTA is driven to the active state when the corresponding memory block is in the selected state, the memory block is not activated again. Thereby, multiple selection of the word lines in the memory block can be prevented, and circuit malfunction can be prevented.

Latches 104a–104c have the structure similar to that of latch 93 shown in FIG. 28C. When the output signal of OR circuit 107 attains H-level, these latches 104a–104c enter the latching state, and the value of internal latched count bits ACT<2:0> do not change even when the value of count bits ACT<2:0> change. In accordance with latched count bits LAN<2:0>, the corresponding tristate inverter buffer in each of tristate inverter buffers 105a–105c operates to buffer and apply the corresponding main row-related control signal to input buffer circuits 60a–60c at the next stage.

Thus, input buffer circuit 60a is enabled to enter the state of waiting for the change in main row activating signals RCNTAA<2:0>. In tristate inverter buffer 105a which is in the above state, one tristate inverter buffer circuit is made active in accordance with latch count bits LAN<2:0>. When main row activating signal RCNTAA change, corresponding input circuit 101a and tristate inverter buffer 105a apply to input buffer circuit 60a one of the main row activating signals RCNTAA<2:0>, that is, the main row activating signal corresponding to the latched count bit in the selected state among latched count bits LAN<2:0>. When input buffer circuit 60a drives internal row control signal ACTA to the active state of H-level, the output signal of OR circuit 107 attains H-level, and latches 104a–104c attain the latch state. In accordance with the activation of internal row control signal ACTA, one of main row activating signals RCNTAB<2:0> and one of main row activating signals RANTAC<2:0> are subsequently applied to tristate inverter buffers 105b and 105c via input circuits 101b and 101c, respectively. Responsively, input buffer circuits 60b and 60c sequentially activate internal row control signals ACTB and ACTC, respectively.

Accordingly, when latches 104a–104c are in the latch state, main row activating signals RCNTAB<2:0> and RCN-TAC<2:0>, which are activated subsequently to activation of main row activating signals RCNTAA<2:0>, can be accurately taken into act-related input portion 100, to produce internal row control signals ACTB and ACTO even if the count value of count bits ACN<2:0> changes. Thus, the row selection can be accurately performed in the addressed memory block even if row active command ACT is successively applied at high speed as shown in FIG. 26.

When internal row control signal ACTC attains L-level, internal row control signal ACTA is already at L-level, and the output signal of OR circuit 107 attains L-level so that latches 104a–104c can take in count bits ACN<2:0>, respectively. Thereby, new count bits can be taken in after all internal row control signals ACTA–ACTC are once activated and then become inactive.

Precharge-related input portion 110 has the structure similar to that of act-related input portion 100 described above. More specifically, input inverter circuits are provided for respective main precharge activating signals RCNTPA<1:0>. In each input inverter circuit, tristate inverter buffers are selectively activated in accordance with the output signals of the latch circuits latching count bits PCN<1:0>, and internal precharge control signal PRC is activated. A similar structure is employed for precharge activating signals RCNTP<1:0> for activating internal precharge control signal PRCB.

In the structure of act-related input portion 100 shown in FIG. 32, input inverter circuits 102a–102c and the input inverter circuits of input circuits 101a–101c have the same input load (input impedance) similarly to the previous structure, and all the loads for count bits ACT<2:0> and main row activating signals RCNTAA<2:0>, RCNTAB<2:0> and RCNTAC<2:0> are equal to each other, so that the skew is prevented.

In the foregoing structure, three sets of circuits are employed for generating the main row control signals, and two sets of precharge activating signal generating circuits are employed for producing the main precharge control signals. However, these circuits may be increased in number, so that fast operations can be performed even if the frequency of clock signal further increases. The number of row activating signal generating circuits and the number of precharge activating signal generating circuits can be determined appropriately in accordance with the frequency of clock signal CLK and the pulse widths of internal row/precharge control signals. It is merely required that internal row control signals ACTA–ACTC are activated and deactivated within a period between times T4 and T1 shown in FIG. 26.

According to the seventh embodiment of the invention, as described above, a plurality of sets of main row activating signal generating circuits and a plurality of sets of main precharge activating signal generating circuits are provided, and these sets of the circuits are sequentially activated in accordance with the count value. Thus, the semiconductor memory device capable of fast operation is achieved. Further, the main row activating signals and the main precharge activating signals are control signals independent of the bank address, and the circuits for generating these signals are independent of the number of banks. Thus, it is not necessary to change the structures of these circuits even in bank expansion, and the structure can be easily adapted to the bank expansion and to the change in number of the memory blocks.

EIGHTH EMBODIMENT

Figure 33:
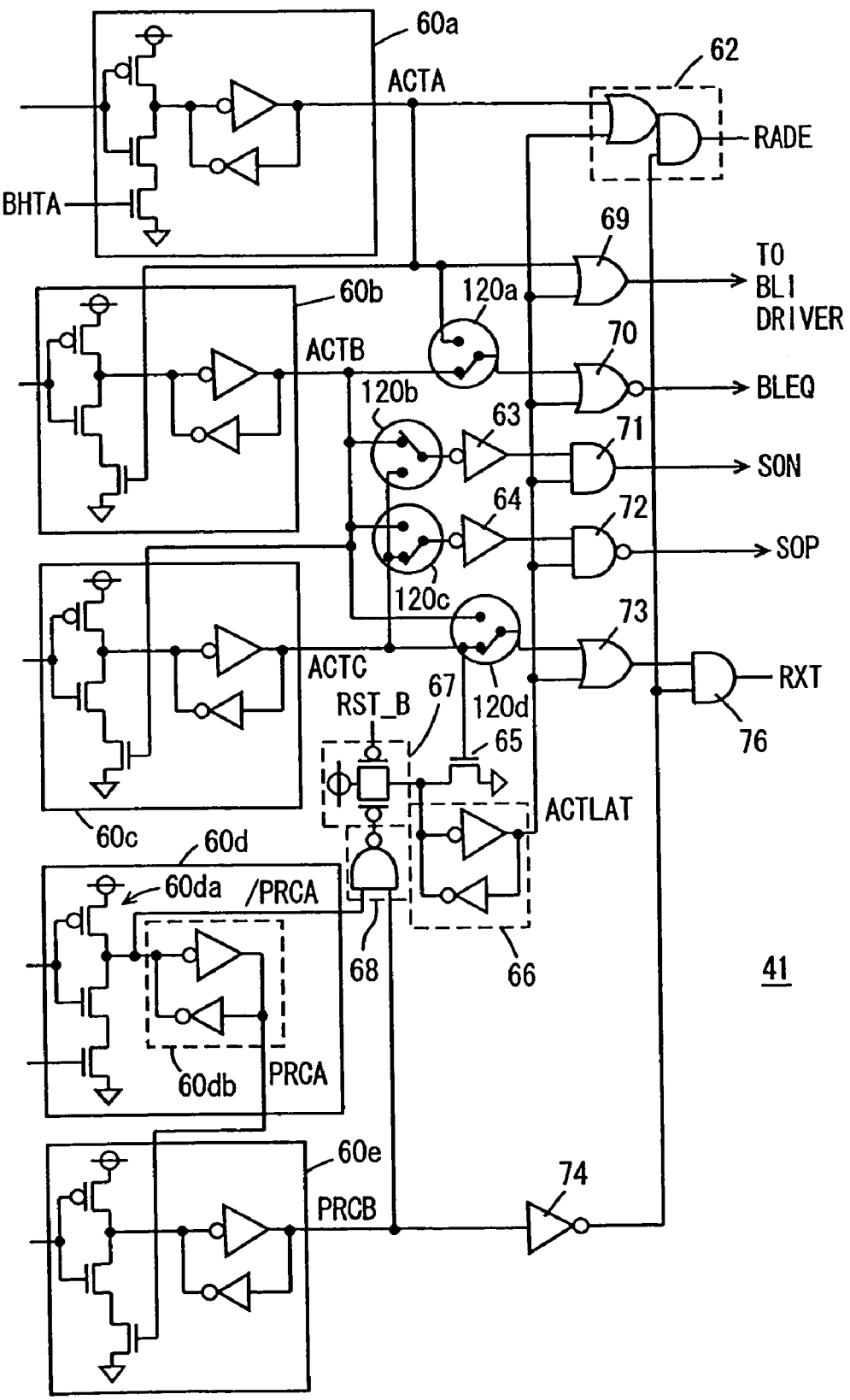
FIG. 33 shows another embodiment of the local control circuit.

FIG. 33 shows a structure of a row-related local control circuit according to an eighth embodiment of the invention. Row-related local control circuit 41 shown in FIG. 33 differs from the row-related local control circuit shown in FIG. 18 in the following points. NOR gate 70 which produces bit line equalize instruction signal BLEQ is supplied with an output signal of a select circuit 120*a* selecting one of internal row control signals ACTA and ACTB and latch row activating signal ACTLAT.

A select circuit 120*b* for selecting one of internal row control signals ACTB and ACTC is provided for AND circuit 71 which in turn produces sense amplifier activating signal SON. The output signal of select circuit 120*b* is applied to AND circuit 71 via inverter 63.

A select circuit 120*c* for selecting one of internal row control signals ACTB and ACTC is provided for NAND circuit 72 which in turn produces sense amplifier activating signal SOP. The output signal of select circuit 120*c* is applied to NAND circuit 72 via inverter 64.

A select circuit 120*d* for selecting one of internal row control signals ACTB and ACTC is provided for AND circuit 76 producing word line drive timing signal RXT. The output signal of select circuit 120*d* is applied to AND circuit 76 via OR circuit 73, which in turn receives the output signal of select circuit 120*d* and the latched row activation signal ACTLAT.

By these select circuits 120*a*–120*d*, it is possible to change the activation timing of the respective internal row control signals.

Logic circuit 68 is supplied with a complementary output signal /PRCA of input inverter buffer 60*da* in precharging input buffer circuit 60*d*. Therefore, logic circuit 68 is formed of an NAND gate in the eighth embodiment.

Structures other than the above are the same as those shown in FIG. 18. The corresponding portions bear the same reference numerals, and description thereof is not repeated.

In the structure shown in FIG. 33, the timing of deactivation of bit line equalize instructing signal BLEQ can be determined by one of internal row control signals ACTA and ACTB. Further, the activation timing of sense amplifier activating signals SON and SOP can be determined by one of internal row control signals ACTB and ACTC.

When the sequence of edges of rising and falling of main row activating signals RCNTAA–RCNTAC is fixed, activation and deactivation of internal row control signals ACTA–ACTC are accordingly performed at fixed timings. For adjusting the timings of internal row-related control signals, the activation timings of internal row-related control signals can be adjusted in accordance with the delay times between internal row control signals ACTA–ACTC. Further, it may be required or desired to delay the internal row-related control signals by an extent equal to or larger than the phase difference between the edges of the internal row control signals. This delay can be achieved by utilizing a further later edge of internal row control signals ACTA–ACTC.

By these select circuits 120*a*–120*d*, it is possible to change the activation sequence of the row-related control signals. For example, sense amplifiers may have such transistor characteristics that the sense operation can be performed more fast and stably by simultaneously activating the N- and P-sense amplifiers (e.g., in the case where a P-sense power supply transistor has a slow response). In this case, select circuits 120*b* and 120*c* are adapted to select internal row control signal ACTB, so that sense amplifier activating signals SON and SOP can be simultaneously activated in accordance with internal row control signal ACTB. Naturally, the activation timing of sense amplifier activating signal SON may be interchanged with that of sense amplifier activating signal SOP. This is true also to word line drive timing signal RXT and bit line equalize instructing signal BLEQ. For example, if the driving speed of a selected word line is slow, word line drive timing signal RXT may be activated in accordance with internal row control signal ACTB with a faster timing.

The same is also true for the relationship between row address decode enable signal RADE and bit line equalize instructing signal BLEQ. For example, the activation of address decode enable signal RADE and the deactivation of bit line equalize instructing signal BLEQ may be performed in accordance with internal row control signal ACTA.

More specifically, the timing adjustment of the row-related control signals in row-related local control circuit is effected by select circuits 120*a*–120*d*. Select circuits 120*a*–120*d* occupy a smaller area than the delay circuits. For example, if select circuits 120*a*–120*d* have the connection paths merely formed of mask metal interconnection lines, select circuits 120*a*–120*d* occupy the area similar to that of contact holes. Therefore, it is not necessary to arrange a delay circuit for timing adjustment in row-related local control circuit 41, and an area of row-related local control circuit 41 can be reduced.

These select circuits 120*a*–120*d* may be formed of multiplexers, of which connection paths are switched in accordance with select signals (see FIG. 23).

In the structure shown in FIG. 33, input buffer circuit 60*a* may be configured to be disabled when latch row activating signal ACTLAT is active and at H-level (see FIG. 32).

Each of select circuits 120a–120d shown in FIG. 33 is a two-to-one select circuit. However, each of select circuits 120a–120d may be a three-to-one select circuit.

NINTH EMBODIMENT

Figure 34:
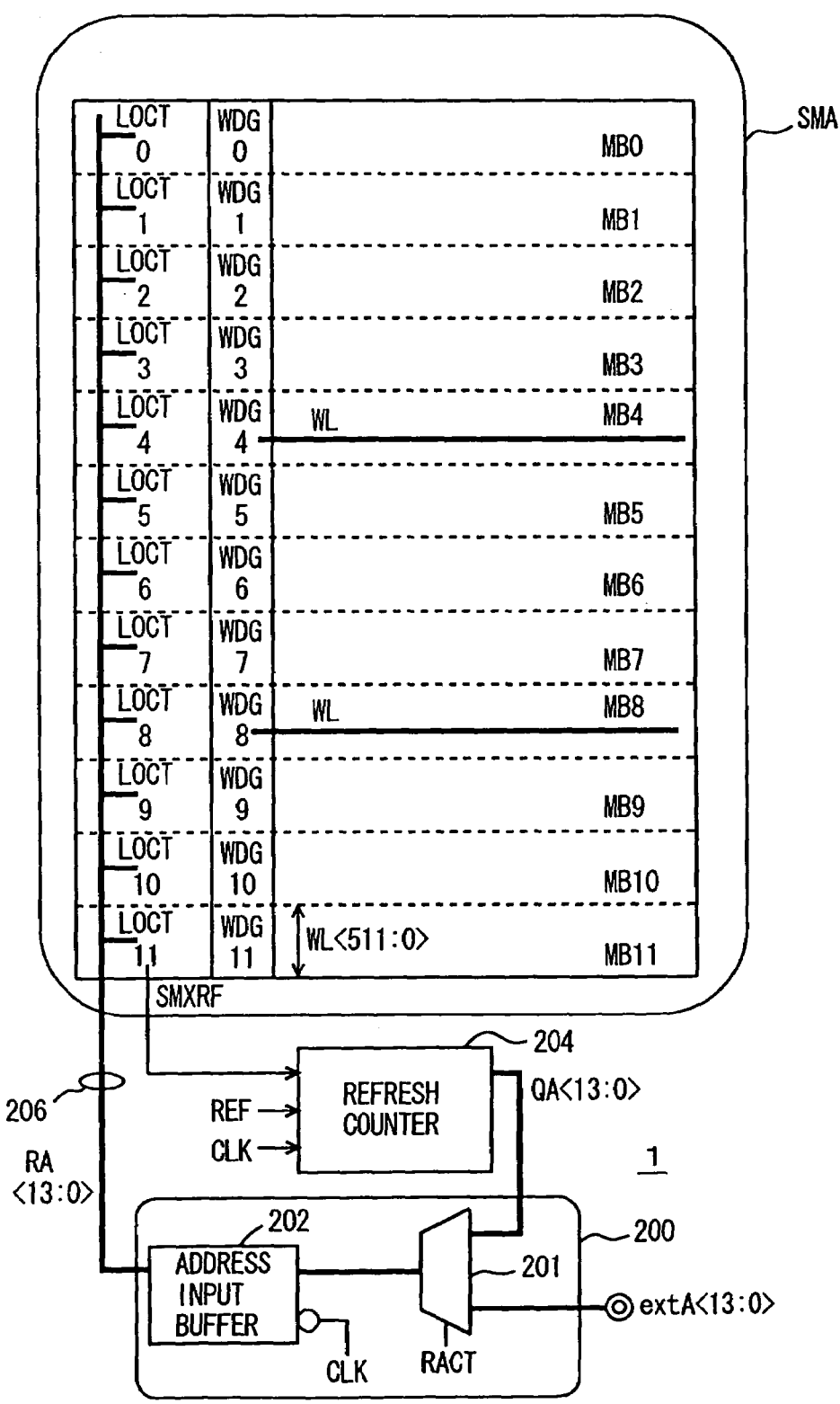
FIG. 34 schematically shows a main portion of a semiconductor memory device according to a ninth embodiment of the invention.

FIG. 34 schematically shows a main portion of a semiconductor memory device according to a ninth embodiment of the invention. FIG. 34 shows one sub-memory array SMA as a representative. A plurality of banks may be provided similarly to the structures of the first to eighth embodiments. For the sake of simplicity, it is assumed in the following description that the semiconductor memory device is of a single bank configuration. Sub-memory array SMA includes 12 memory blocks MB0–MB11, for example. Each of memory blocks MB0–MB11 includes 512 word lines WL<511:0>. Therefore, sub-memory array SMA has a storage capacity of 6 K bits.

For memory blocks MB0–MB11, word line driver groups WDG0–WDG11 are provided, respectively. Each of word line driver groups WDG0–WDG11 drives an addressed word line to the selected state when the corresponding memory block is selected. As already described in connection with the first to eighth embodiments, word line driver groups WDG0–WDG11 include the word line drivers provided corresponding to word lines WL, respectively. Word line WL may be a hierarchical word line formed of a main word line and sub-word lines.

For memory blocks MB0–MB11, local control circuits LOCT0–LOCT11 are arranged, respectively. Local control circuits LOCT0–LOCT11 commonly receive a row address signal RA<13:0> of 14 bits via an internal address bus 206. In local control circuits LOCT0–LOCT11, there are arranged address input buffers, which receive address signal bits RA<13:0> transmitted via internal address bus 206 with the same input load (see the first embodiment). Similarly to the first embodiment, therefore, a signal skew does not occur in each memory block, and the operation can be performed accurately in synchronization with the clock signal even if the memory blocks in the sub-memory array SMA increases or decreases in number.

Main control circuit 1 includes: a refresh counter 204 which produces address bits QA<13:0> for refresh; a multiplexer 201 which selects either of refresh address bits QA<13:0> applied from refresh counter 204 and externally applied address bits extA<13:0> in accordance with an array activation instructing signal RACT; and an address input buffer 202 which takes in the address bits output from multiplexer 201 in synchronization with clock signal CLK, for transmission to internal address bus 206. These multiplexer 201 and address input buffer 202 form an address input circuit 200.

Address input buffer 202 statically operates in synchronization with clock signal CLK, and buffers refresh address bits QA<13:0> applied from refresh counter 204 or external address bits extA<13:0> for transmission to internal address bus 206. The address bits RA<13:0> include a block address RA<13:9> of 4 bits specifying a memory block, and word line address bits RA<8:0> of 9 bits specifying a word line. In accordance with block address bits RA<13:0>, a predetermined number of memory blocks are selected from memory blocks MB0–MB11.

Array activation instructing signal RACT becomes active for a predetermined period when row active signal ACT is applied. Thereby, array activation instructing signal RACT indicates that the row access is instructed. When array activation instructing signal RACT is active, multiplexer 201 selects externally applied address bits extA<13:0>, and applies the same to address input buffer 202. When array activation instructing signal RACT is inactive, multiplexer 201 selects refresh address bits QA<13:0> applied from refresh counter 204.

Even when an external address signal extA changes in a standby state, array activation instructing signal ACT is used to switch the address to be transmitted onto internal address bus 206, fixing the signal on internal address bus 206 to refresh address bits QA<13:0>. Thus, the charging and discharging of the signal line do not occur on the internal address bus so that the current consumption can be reduced.

If the multi-bank structure is employed, internal row address bits RA<13:0> may be transmitted commonly via internal address bus 206 to the plurality of banks. Even in this case, refresh can be performed on a bank basis or commonly to all the banks (the bank address signal is transmitted via a different bank address bus).

Multiplexer 201 is supplied with array activation instructing signal RACT, and selects external address bits extA<13:0> only for a predetermined period when the row active command is applied. In the case of a single bank configuration, array activating signal RA may maintain the active state after activation of row active signal ACT and before application of precharge command PRC. In the case of a multi-bank configuration, array activation instructing signal RACT is activated when the row active command is applied to any one of the banks. Even if multiplexer 201 is configured to select external address bits extA<13:0> when array activation instructing signal RACT is active, the plurality of banks can be simultaneously driven to the selected state in the multi-bank configuration (because external address signal extA<13:0> is selected when array activation instructing signal RACT is active).

In local control circuits LOCT0–LOCT11, local control circuit LOCT (LOCT11 in FIG. 34) provided for the memory block (final refresh block) to be refreshed finally in the refresh sequence produces a final block refresh detection signal SMXRF and applies the same to refresh counter 204 if the refresh is executed on the corresponding memory block. When final block refresh detection signal SMXRF is active, refresh counter 204 resets the refresh address bits to a initial value when the refresh in the final memory block (MB11) is completed. Refresh activating signal REF is kept active for a predetermined period when the refresh command is applied, and the refresh is internally executed while refresh activating signal REF is active.

Accordingly, when the refresh for the final memory block in the refresh sequence is detected and final block refresh detection signal SMXRF is activated, refresh address bits QA<13:0> produced by refresh counter 204 are reset when the refresh for the final refresh block is completed. Thereby, when refresh of the whole memory space is completed, refresh counter 204 can always set its refresh address to the initial value regardless of the number of memory blocks, and it is not necessary to apply externally an extra refresh command.

Accordingly, even if the number of memory blocks MB is changed, it is merely required to apply final block refresh detection signal SMXRF from the final refresh block to refresh counter 204, and it is not necessary to change circuit structures of refresh counter 204 and the local control circuit. Accordingly, it is possible to accommodate for various structures of sub-memory array SMA without changing the structure of refresh counter 204.

It is possible to achieve refresh cycles of the number different from an integer of a power of 2 such as 4 K, and it is not necessary to input an extra refresh command, which is required in a conventional counter circuit counting a value equal to an integer of a power of 2, so that the power consumption can be reduced. Also, external access can be performed during such period, so that an access efficiency can be improved. The refresh cycles indicate the number of times, by which the refresh operation is to be performed for refreshing the whole memory space one time, or by which an auto-refresh command is to be applied.

Figure 35:
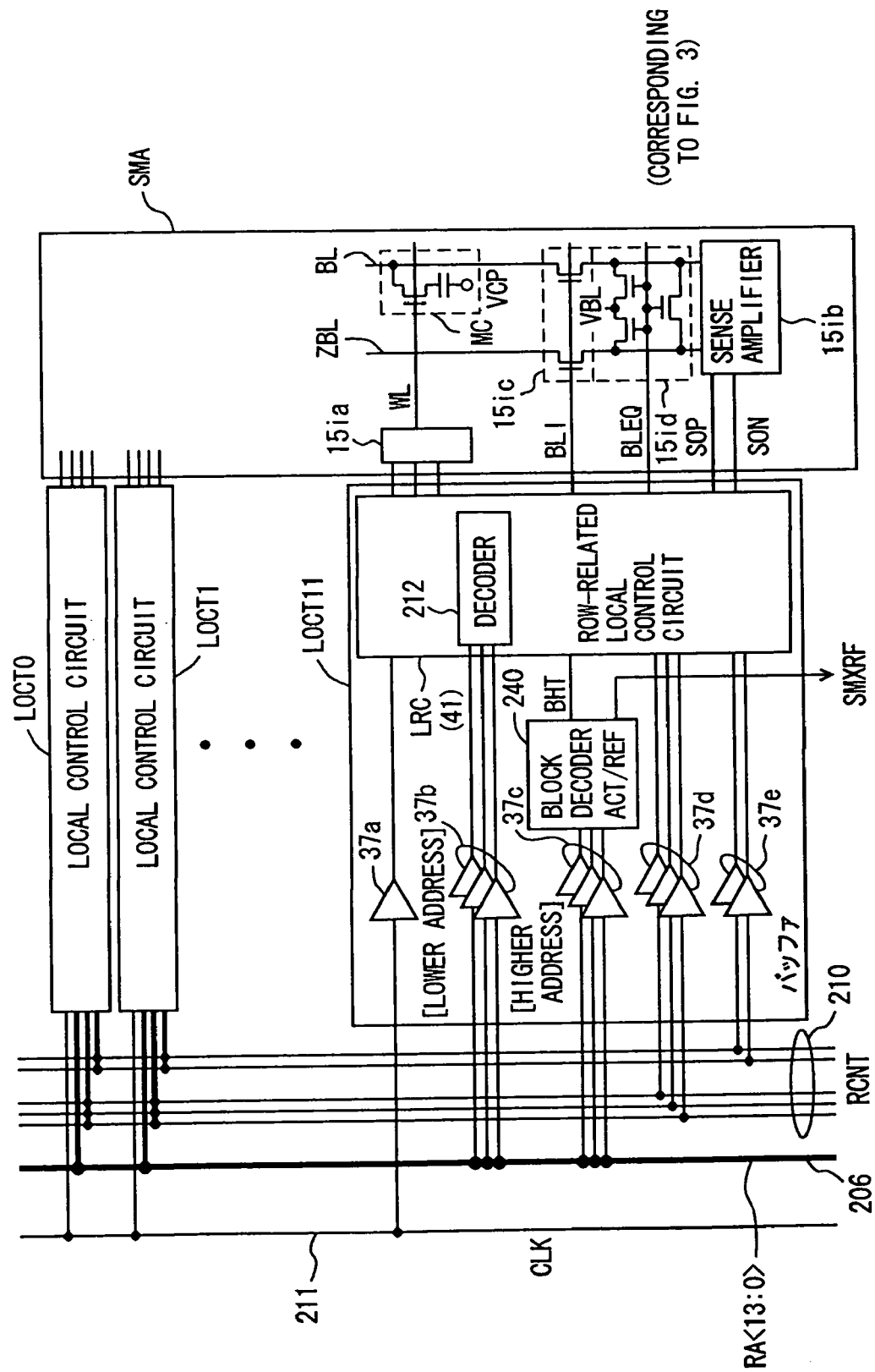
FIG. 35 schematically shows a structure of local control circuits shown in FIG. 34.

FIG. 35 schematically shows a structure of local control circuits LOCT0–LOCT11 shown in FIG. 34. Local control circuits LOCT0–LOCT11 has the same structure as already described in connection with the first embodiment and others. Therefore, FIG. 35 representatively shows the structure of local control circuit LOCT11.

In FIG. 35, a clock signal line 211 transmitting clock signal CLK, an internal address bus 206 transmitting internal address bits RA<13:0> and a control signal bus 210 transmitting a row-related control signal group RCNT are arranged commonly to local control circuits LOCT0–LOCT11, similarly to the structure shown in FIG. 3. As already described with reference to FIG. 3, row-related control signal group RCNT includes row selection activating signals RCNTAA–RCNTAC of a plurality of phases as well as row selection completion instructing signals RCNTPA and RCNTPB.

Local control circuit LOCT11 includes: clock input circuit 37a for receiving internal clock signal CLK (corresponding to internal clock signal CLK1 in FIG. 3) on clock signal line 211; address input circuit 37b for receiving lower address bits RA<8:0> on internal address bus 206; address input circuit 37c for receiving higher address bits RA<13:9> on internal address bus 206; input circuit 37d for receiving a main row activating signal included in main row control signal group RCNT; and input circuit 37e for receiving a main precharge control signal included in main row control signal group RCNT.

Input circuits 37a–37e include buffer circuits having the same structure and the same transistor size, and have the same input load similarly to the first embodiment. In the structure shown in FIG. 35, therefore, even if the number of memory blocks changes in sub-memory array SMA, each of local control circuits LOCT0–LOCT11 has the same input load, and a signal skew does not occur in each of local control circuits LOCT0–LOCT11 so that the row selecting operation can be performed accurately.

Local control circuit LOCT11 further includes: a block decoder 240 which receives and decodes higher address bits RA<13:9> from address input circuit 37c to produce block hit signal BHT and final block refresh detection signal SMXRF; and a row-related local control circuit LRC which receives the output signals of input circuits 37a–37e and block hit signal BHT applied from block decoder 240, and produces row-related operation control signals BLI, BLEQ, SOP, SON and others for the corresponding memory block in sub-memory array SMA. Row-related local control circuit LRC corresponds to row-related local control circuit 41 shown in FIG. 41, and includes a decoder 212 which decodes and latches lower address bits RA<8:0> applied from address input circuit 37c.

Block decoder 240 includes an ACT block decode circuit which decodes an address signal applied in the normal operation mode (row selecting operation upon application of the row active command), and an REF block decode circuit which decodes the block address applied thereto in the refresh mode. Block hit signal BHT is driven to the active state when the higher address bits (block address) RA<13:9> applied from address input circuit 37c designate the corresponding memory block.

Final block refresh detection signal SMXRF is produced in accordance with the block hit signal applied from the REF block decode circuit that performs the decode operation in the refresh mode, and is applied to refresh counter 204 shown in FIG. 34. In the refresh mode, when local control circuit LOCT11 selects the corresponding memory block to perform the refreshing, final block refresh detection signal SMXRF is activated. Therefore, all local control circuits LOCT0–LOCT11 can have the same structure. In the local control circuit (LOCT11) provided corresponding to the memory block (final refresh block) to be refreshed finally in the refresh sequence, the output signal of REF block decode circuit is applied as final block refresh detection signal SMXRF to refresh counter 204. Without making any change in the circuit structure, execution of the refresh of the final memory block in the refresh sequence can be easily detected.

FIG. 35 does not clearly show the memory block included in sub-memory array SMA. FIG. 35 shows bit line peripheral circuitry related to local row control signals BLI, BLEQ, SOP and SON, which are produced from row-related local control circuit LRC. These bit line peripheral circuits have the same structure as that shown in FIG. 3, and include, for bit lines BL and ZBL, bit line isolating circuit 15ic which is turned on in response to bit line isolation instructing signal BLI; bit line precharge/equalize circuit 15id which selectively precharges and equalizes bit lines BL and ZBL to intermediate voltage VBL in accordance with bit line precharge/equalize instructing signal BLEQ; and sense amplifier 15ib which differentially amplifies potentials on bit lines connected to the common bit lines in accordance with sense amplifier activating signals SOP and SON.

In accordance with the output signal of the decoder 212 included in row-related local control circuit LRC, a word line driver 15ia drives word line WL to the selected state. Memory cell MC is arranged corresponding to each of crossings between bit lines BL or /BL and word lines WL. Memory cell MC includes a capacitor for storing information, and an access transistor for connecting the capacitor to an associated bit line in response to the signal potential on word line WL. The capacitor receives on its cell plate elect-rode a cell plate voltage VCP.

Accordingly, local control circuits LOCT0–LOCT11 have the same structure as that shown in FIG. 3, except for that block decoder 240 which in turn includes: the decode circuit which performs the decode operation when the row active command is applied, and the array activation instructing signal to be activated in accordance with row active signal ACT is active; and the decode circuit which performs the decode operation when refresh activating signal REF is active.

Figure 36:
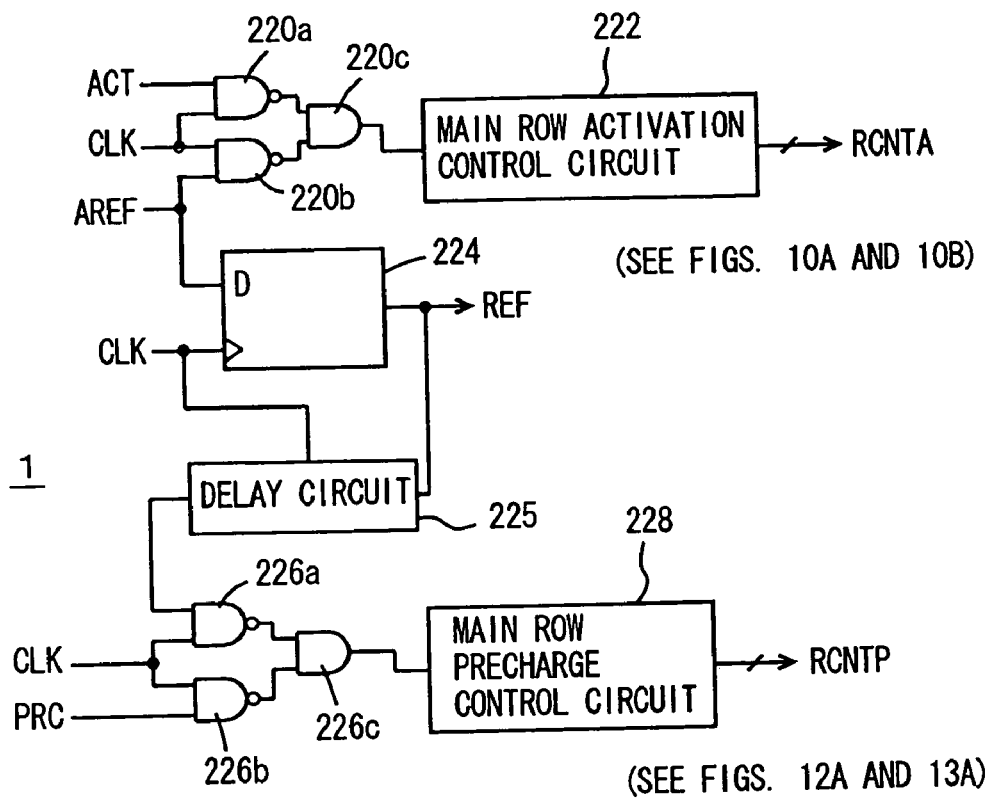
FIG. 36 schematically shows a structure of a row-related control portion in a main control circuit of the ninth embodiment of the invention.

FIG. 36 schematically shows a structure of the row-related control circuit included in main control circuit 1 of the ninth embodiment of the present invention. In FIG. 36, main control circuit 1 includes: an NAND circuit 220a which receives row active signal ACT and clock signal CLK; an NAND circuit 220b which receives an auto-refresh instructing signal (command) AREF and clock signal CLK; an AND circuit 220c which receives the output signals of NAND circuits 220a and 220b; a main row activation control circuit 222 which produces a row-related control signal group (row-related activating signals) RCNTA of a plurality of phases in accordance with the output signal of AND circuit 220c; a latch circuit 224 which takes in auto-refresh instructing signal AREF in synchronization with the rising edge of clock signal CLK, to produce refresh activating signal REF; a delay circuit 225 which delays refresh activating signal REF by half a cycle of clock signal CLK; an NAND circuit 226a which receives the output signal of delay circuit 225 and clock signal CLK; an NAND circuit 226b which receives precharge instructing signal (command) PRC and clock signal CLK; an AND circuit 226c which receives the output signals of NAND circuits 226a and 226b; and a main row precharge control circuit 228 which produces a precharge operation control signal group RCNTP of a plurality of phases in response to the output signal of AND circuit 226c.

Similarly to the structure shown in FIGS. 10A and 11A, main row activation control circuit 222 includes flip-flop circuits, which delay applied signals by predetermined time periods to produce main row activating signals RCN-TAA–RCNTAC as main row activating signal RCNTA, respectively. Main row precharge control circuit 228 has the structure shown in FIGS. 12A or 13A, and is responsive to the output signal of NAND circuit 226 for producing, e.g., main precharge operation control signals RCNTPA and RCNTPB of two phases as main precharge operation control signal group RCNTP.

Latch circuit 224 is of a rising edge type, and takes in auto-refresh instructing signal AREF at the rising edge of clock signal CLK. Refresh activating signal REF is kept active (H-level) for a period of one clock cycle of clock signal CLK when auto-refresh instructing signal AREF is active. Auto-refresh instructing signal AREF is an externally applied refresh instructing signal, and may be formed of a combination of a plurality of control signals. Alternatively, auto-refresh instructing signal AREF may be applied as one control signal by decoding a command in the logic.

In the structure shown in FIG. 36, auto-refresh instructing signal AREF is a refresh command with an auto-precharge function. While refresh activating signal REF is active, the refresh operation is internally executed, and main row precharge operation control signal group RCNTP is deactivated in accordance with deactivation of refresh activating signal REF. In this case, an auto-refresh completion instruction command AREFPRC instructing completion of the refresh is applied instead of the output signal of delay circuit 225 if this auto-refresh completion instruction command AREFPRC is present in association with auto-refresh instructing signal (command) AREF.

Figure 37:
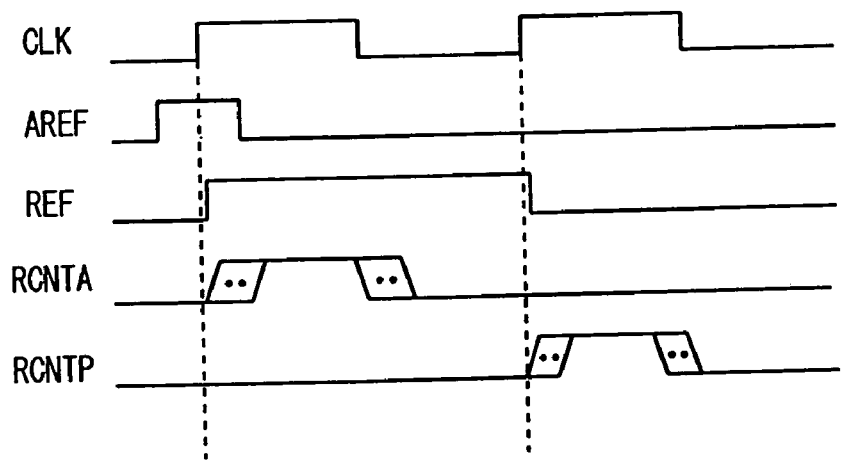
FIG. 37 is a timing chart representing an operation of a main row control portion shown in FIG. 36.

The operation of the main control circuit shown in FIG. 36 will now be described with reference to a timing chart of FIG. 37. Auto-refresh instructing signal AREF is applied in synchronization with clock signal CLK. When auto-refresh instructing signal AREF is applied, the output signal of NAND circuit 220b attains L-level in response to the rising of clock signal CLK so that the output signal of AND circuit 220c attains L-level. Therefore, main row activation control circuit 222 activates main row activating signal group RCNTA of a plurality of phases in a predetermined sequence. In response to the rising of clock signal CLKE, latch circuit 224 takes in auto-refresh instructing signal AREF to activate refresh activating signal REF.

Delay circuit 225 performs the delay operation for a period of half a clock cycle of clock signal CLK, and the output signal of delay circuit 225 attains H-level when clock signal CLK falls to L-level. When clock signal CLK rises in the next clock cycle, auto-refresh instructing signal AREF is at L-level, and refresh activating signal REF becomes inactive. Since the output signal of delay circuit 225 is at H-level, the output signal of NAND circuit 226a is at L-level so that the output signal of AND circuit 226c attains L-level. In the next clock cycle, therefore, main row precharge control circuit 228 successively activates main precharge operation control signal group RCNTP.

When auto-refresh instructing signal AREF is externally applied, therefore, the main row control signal is internally and successively activated, and the refresh is performed in the memory block designated by the block address. In this refresh operation, activation of the sense amplifier is performed to restore the memory cell data is performed, and refresh of the memory cell data can be performed with the word line potential raised within one clock cycle period. When this one clock cycle period elapses, main precharge activating signal group RCNTP is activated, and the precharge operation is executed on the memory block, which is currently designated by the refresh address signal.

The refresh address produced by the refresh counter is updated upon each activation of refresh activating signal REF. The block and the row (word line) are selected in accordance with the address signal at the rising edge of clock signal CLK.

Figure 38:
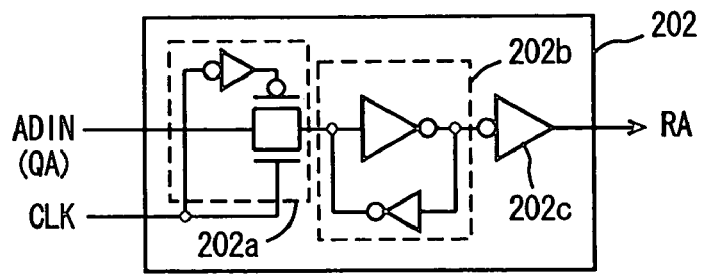
FIG. 38 shows, by way of example, a structure of an address input buffer shown in FIG. 34.

FIG. 38 shows an example of a structure of address input buffer 202 shown in FIG. 34. In FIG. 38, address input buffer 202 includes: a transfer circuit 202a which is turned on to pass an address signal ADIN applied from multiplexer 201 when clock signal CLK is at H-level; a latch circuit 202b which latches the address signal received via transfer circuit 202a; and an inverter circuit 202c which inverts the signal latched by latch circuit 202b to produce an internal row address signal RA. In the following description, characters "RA<13:0>" are used for specifying the address bits, and characters "RA" are used for representing the whole row address signal formed of the address bits. This holds for the refresh address.

Figure 39:
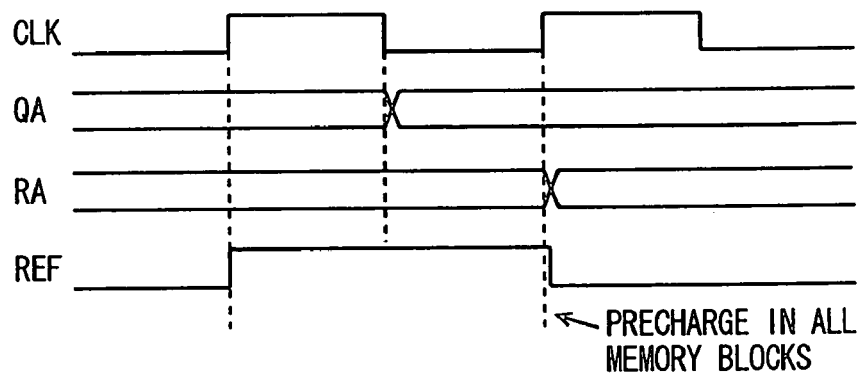
FIG. 39 is a timing chart representing a refresh address generating sequence in the ninth embodiment of the invention.

FIG. 39 is a timing chart representing an operation of address input buffer 202 shown in FIG. 38. Referring to FIG. 39, description will now be given on an operation of address input buffer 202 shown in FIG. 38.

When an auto-refresh instruction is applied, refresh activating signal REF is activated for one clock cycle period in synchronization with the rising of clock signal CLK. As will be described later in greater detail, refresh address signal QA output from the refresh address counter is updated in response to the rising of clock signal CLK when refresh activating signal REF is active. When clock signal CLK is at L-level, transfer circuit 202a in address input buffer 202 is off, and address input buffer 202 is in the latching state.

When clock signal CLK then rises to H-level, transfer circuit 202a is turned on, and internal row address signal RA changes in accordance with refresh address signal QA. In response to deactivation of refresh activating signal REF, a precharge operation is executed. In this case, the structure may be configured to perform the precharge operation commonly on all the memory blocks. Thereby, the precharge can be effected on all the memory blocks regardless of activation and deactivation of block hit signal BHT. Thus, the refreshed memory block can be returned to the precharged state even if the next refresh address signal is already transmitted to the internal address bus while the precharge is being executed.

Figure 40:
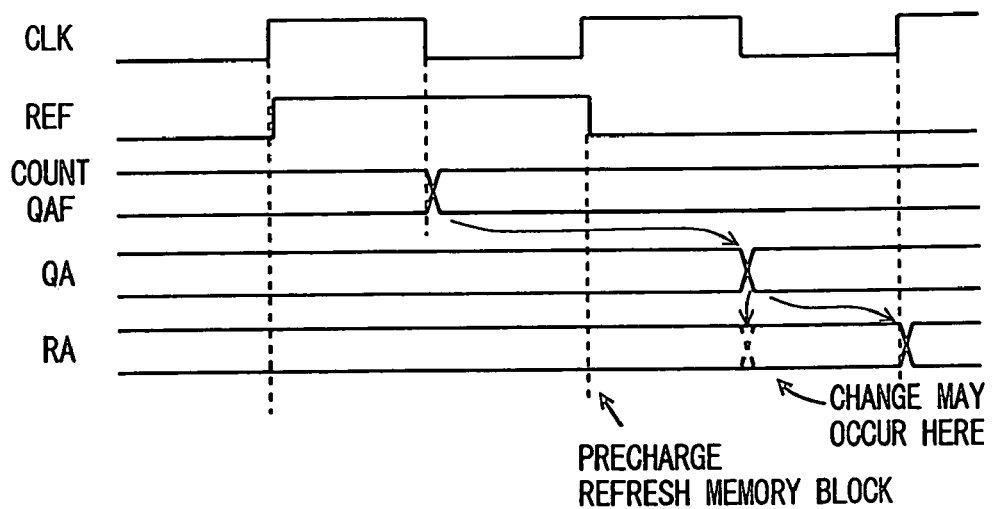
FIG. 40 is a timing chart showing another example of a refresh address generating sequence in the ninth embodiment of the invention.

FIG. 40 shows a modification of the operation of address input buffer 202 shown in FIG. 38. In FIG. 40, count value QA of the refresh address counter changes in response to the falling of clock signal CLK when refresh activating signal REF is active. Count value QA of this refresh address counter is delayed by one clock cycle, and then is transmitted as refresh address signal QA to the address input buffer via the multiplexer. Therefore, if the precharge operation is performed in response to deactivation of refresh activating signal REF, internal row address signal RA indicates the same address as the internal row address indicated when executing the refresh. Accordingly, if the precharge operation is to be performed in response to deactivation of refresh activating signal REF, the refreshed memory block can be precharged using the block address signal of internal row address signal RA.

For implementing the structure shown in FIG. 40, it is merely required to arrange a delay circuit, which delays a received signal by one clock cycle, at an output portion of the structure of address input buffer 202 shown in FIG. 38.

Referring to FIG. 40, internal row address signal RA may change in accordance with the falling of clock signal CLK as shown by the dotted signal waveform. The structure for this can be achieved by configuring the address input buffer shown in FIG. 38 such that transfer circuit 202a is turned on in response to the falling of clock signal CLK. In this structure, the refresh address may change in response to the rising of clock signal CLK or the falling of refresh activating signal REF.

In the structures shown in FIGS. 36 to 42, when the auto-refresh command is applied, a period of two clock cycles is used for the refresh, and the access operation stops during this period (if the refresh is to be performed commonly to all the banks). Even in the case where the refresh is performed on a bank basis (i.e., bank by bank) in the multi-bank configuration, it is not identifiable externally which bank is being refreshed, in the case where the internal refresh address counter is configured to produce a bank address. Therefore, the access is likewise inhibited. A configuration for making arbitration of conflict between the refresh block and access block may be provided.

[Modification of Main Control Circuit]

Figure 41:
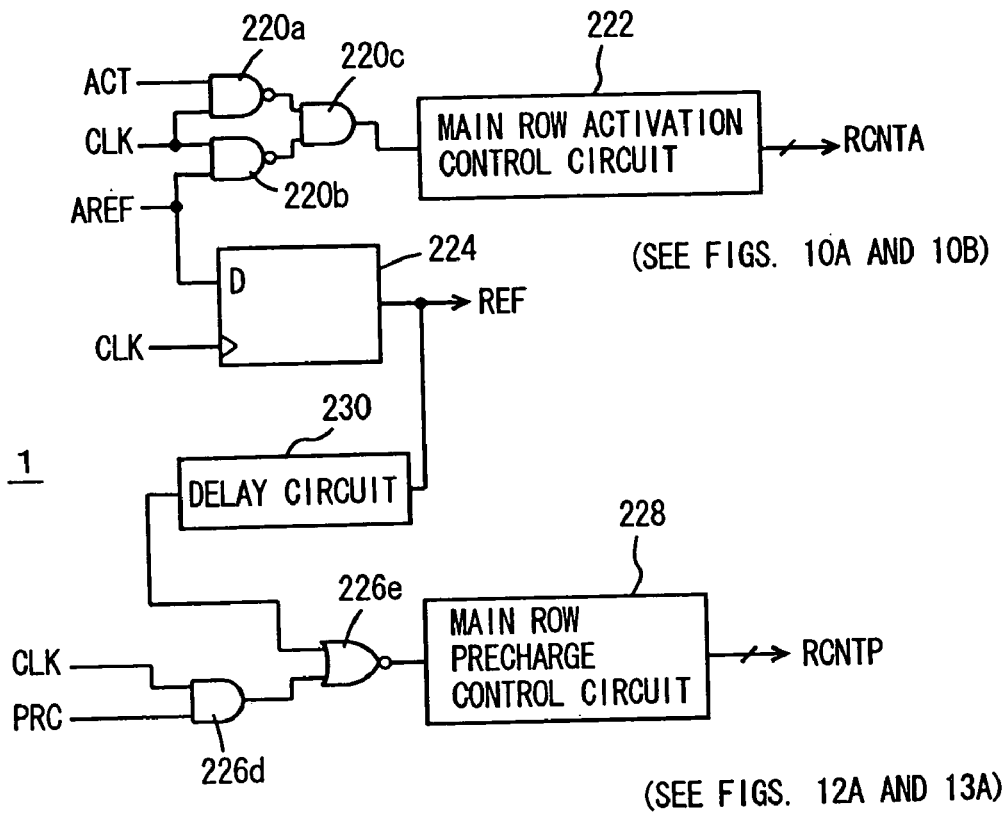
FIG. 41 schematically shows a modification of the main control circuit in the ninth embodiment of the invention.

FIG. 41 schematically shows a structure of a modification of the main control circuit in the ninth embodiment of the invention. The main control circuit 1 shown in FIG. 41 includes: a delay circuit 230 which delays refresh activating signal REF by a predetermined time for generating main precharge operation control signal RCNTP; an AND circuit 226d which receives clock signal CLK and precharge instructing signal PRC; an NOR circuit 226e which receives the output signal of delay circuit 230 and the output signal of AND circuit 226d; and a main row precharge control circuit 228 which produces main precharge operation control signal RCNTP in accordance with the output signal of NOR circuit 226e.

Delay circuit 230 delays refresh activating signal REF by a predetermined delay time. NOR circuit 226e outputs the signal at L-level to activate main row precharge control circuit 228 when one of the output signal of AND circuit 226d and the output signal of delay circuit 230 attains H-level. Others structures of the main control circuit shown in FIG. 41 are the same as those of main control circuit 1 shown in FIG. 36. The same parts bear the same reference numerals, and description thereof is not repeated.

Figure 42:
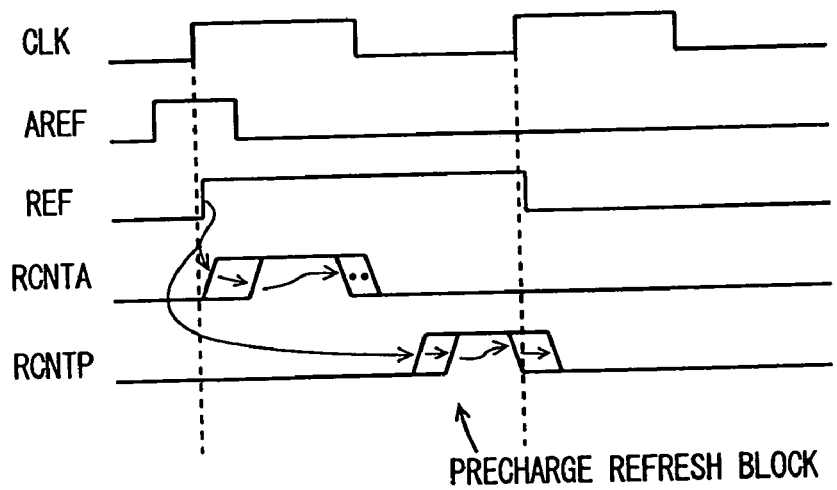
FIG. 42 is a timing chart representing an operation in a refresh mode of the main row control circuit shown in FIG. 41.

FIG. 42 is a timing chart representing the operation of the main control circuit shown in FIG. 41. An operation of the main control circuit shown in FIG. 41 will now be briefly described with reference to FIG. 42.

When auto-refresh instructing signal AREF is applied, refresh activating signal REF is activated for a period of one clock cycle of clock signal CLK. In response to activation of refresh activating signal REF, main row activation control circuit 222 successively activates the signals of main row activating signal group RCNTA in a predetermined sequence. In accordance with main row activating signal group RCNTA, a refresh operation is performed in the selected memory block, and storage data of the memory cells is rewritten.

When the delay time of delay circuit 230 elapses, the output signal of NOR circuit 226e attains L-level in accordance with delayed refresh activating signal REF, and main row precharge control circuit 228 is activated to activate main the signals of precharge operation control signal group RCNTP in a predetermined sequence. When clock signal CLK is, e.g., at L-level, internal row address signal RA on the internal address bus designates the same address as the refresh address used at the time of applying the auto-refresh instructing signal. In this case, therefore, the precharge can be accurately executed on the refreshed memory block even in the structure, in which the precharge operation is performed by the local row control circuit for the memory block corresponding to the activated block hit signal BHT as shown in FIG. 18.

Even if the main precharge operation control signal group RCNTP is successively activated even in the next clock cycle, first main precharge operation control signal RCNTP (see FIG. 18) may be activated in the same clock cycle as the clock cycle of the application of auto-refresh instructing signal AREF. In this case, next main precharge activating signal RCNTPB is activated in the corresponding memory block in accordance with the first main precharge operation control signal RCNTPA for controlling the precharge operation. Therefore, even if internal row address RA changes in the next clock cycle, the precharging can be accurately effected on the refreshed memory block.

Figure 43:
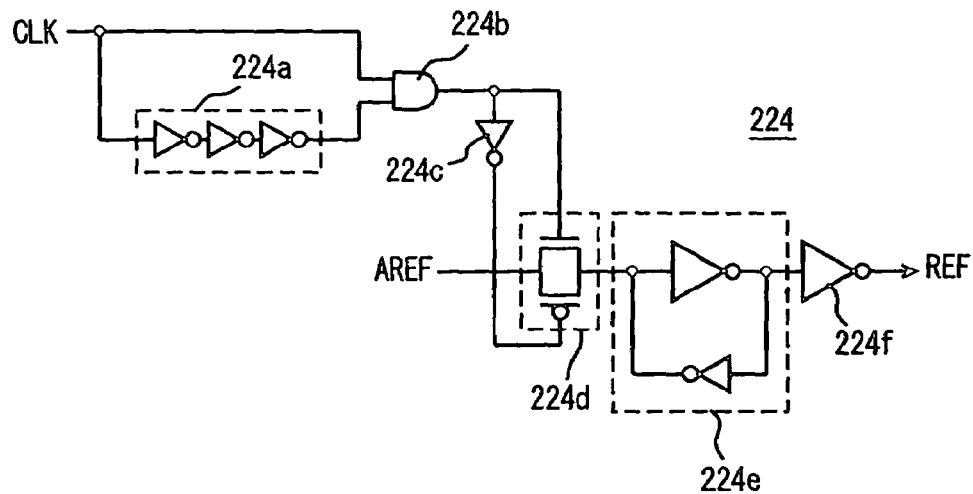
FIG. 43 shows, by way of example, a structure of a transfer circuit shown in FIG. 41.

FIG. 43 shows an example of the structure of latch circuit 224 shown in FIGS. 36 and 41. In FIG. 43, latch circuit 224 includes: an inverting delay circuit 224a which delays by a predetermined time and inverts internal clock signal CLK; an AND circuit 224b which receives the output signal of inverting delay circuit 224a and clock signal CLK; an inverter 224c which receives the output signal of AND circuit 224b; a transfer gate 224d which is turned on to pass auto-refresh instructing signal AREF in accordance with the output signals of inverter 224c and AND circuit 224b; an inverter latch circuit 224e which latches a signal applied from transfer gate 224d; and an inverter circuit 224f which inverts the latched signal of inverter latch circuit 224e, and produces refresh activating signal REF.

Inverting delay circuit 224a and AND circuit 224b produce a pulse signal of one shot, which is kept at H-level for a predetermined period in response to the rising of clock signal CLK. Transfer circuit 224d is turned on to pass auto-refresh instructing signal AREF in response to a pulse signal of one shot, which is generated in response to the rising of clock signal CLK. Inverter latch circuit 224e latches auto-refresh instructing signal AREF. Transfer gate 224d is kept off when the output signal of AND circuit 224b is at L-level. Therefore, latch circuit 224 takes in anD latches auto-refresh instructing signal AREF at the rising edge of clock signal CLK. When auto-refresh instructing signal AREF is set to the H-level, or active state at the rising edge of clock signal CLK, refresh activating signal REF is held at H-level for a period of one clock cycle of clock signal CLK.

[Structure of Block Decoder]

Figure 44:
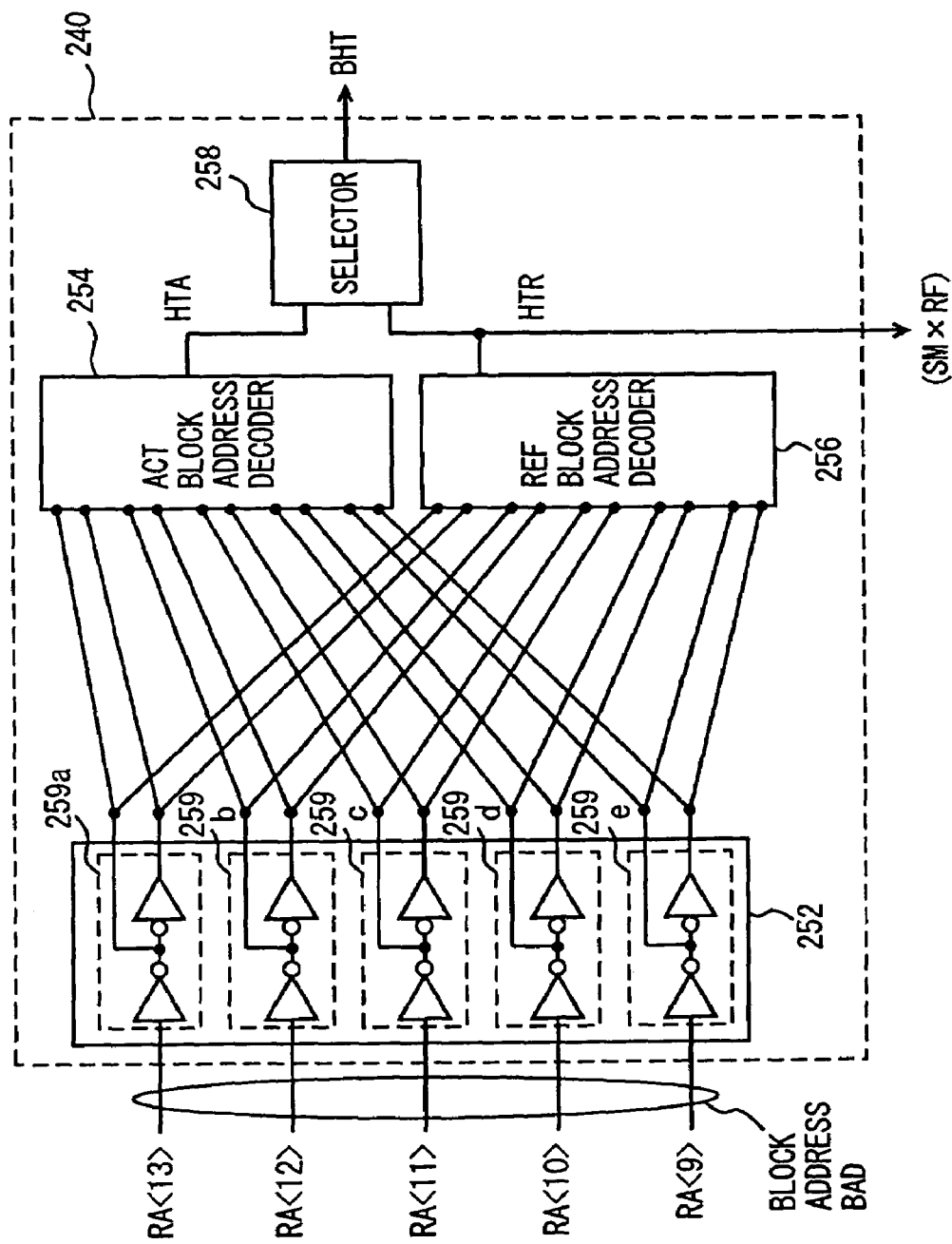
FIG. 44 schematically shows a structure of a block decoder shown in FIG. 35.

FIG. 44 schematically shows a structure of block decoder 240 shown in FIG. 35. In FIG. 44, block decoder 240 includes: a complementary signal generating circuit 252 which generates complementary block address bits RA<13:

9> and ZRA<13:9> from row address bits RA<13:9> forming a block address signal BAD transmitted on the internal address bus; an ACT block address decoder 254 (i.e., block address decoder for ACT) which produces a block hit signal HTA for the normal operation mode in accordance with the complementary block address bits generated from complementary signal generating circuit 252; an REF block address decoder 256 (i.e., block address decoder for REF) which produces a block hit signal HTR for the refresh operation in accordance with the complementary block address bits generated from complementary signal generating circuit 252; and a selector 258 which produces a block hit signal BHT activating the corresponding memory block in accordance with block hit signals HTA and HTR applied from block address decoders 254 and 256.

If block decoder 240 described above is provided for the final memory block in the refresh sequence, refresh block hit signal HTR applied from REF block address decoder 256 is used as final block refresh detection signal SMXRF.

Complementary signal generating circuit 252 includes complementary bit generating circuits 259a–259g provided corresponding to row address bits RA<13>–RA<9>, respectively. Each of complementary bit generating circuits 259a–259e includes cascaded inverters. The cascaded inverters produce complementary block address bits RA<i> and ZRA<i>, where i is a number from 13 to 9.

Each of ACT and REF block address decoders 254 and 256 includes a select circuit for internally programming the block address. When the complementary address bits generated from complementary signal generating circuit 252 designate the block address programmed by the above select circuit, ACT and REF block address decoders 254 and 256 activate normal operation mode block hit signal HTA and refresh mode block hit signal HTR, respectively.

As for ACT and REF block address decoders 254 and 256, there are arranged, independently of each other, the block address decoder for the normal operation mode and the block address decoder for the refresh operation mode, whereby the following effect can be achieved. According to a certain specification of the DRAM, the number of memory block(s) selected simultaneously in the normal operation mode is different the number of the memory block(s) selected simultaneously in the refresh mode. For example, according to one specification, two memory blocks are simultaneously selected in the normal operation mode, and one memory block is selected in the refresh mode. In contrast, according to another specification, one memory block is be selected in the normal operation mode, and two memory blocks is be simultaneously selected in the refresh mode. A relationship in the number of selected memory blocks between the refresh mode and the normal operation mode is determined in accordance with the refresh cycles (i.e., the number of times of refreshing required for refreshing all the memory cells one time). In DRAMs (e.g., an embedded type) having various specifications to be satisfied, the block address decoder for the normal operation mode is allowed to be arranged independently for the block address decoder for the refresh operation mode so that any refresh configuration can be accommodated for, and the block hit signal can be produced to drive accurately the corresponding memory block to the selected state in both the normal operation mode and the refresh mode reliably.

The block decoder provided for the final memory block in the refresh sequence may merely transfer refresh mode block hit signal HTR as final block refresh detection signal SMXRF. According to such modification, while the block decoders for all the memory blocks can have the same structure, final block refresh detection signal SMXRF can be easily produced. Thereby, the refresh final block can be easily detected without changing the circuit configuration even if the number of memory blocks changes.

Figure 45:
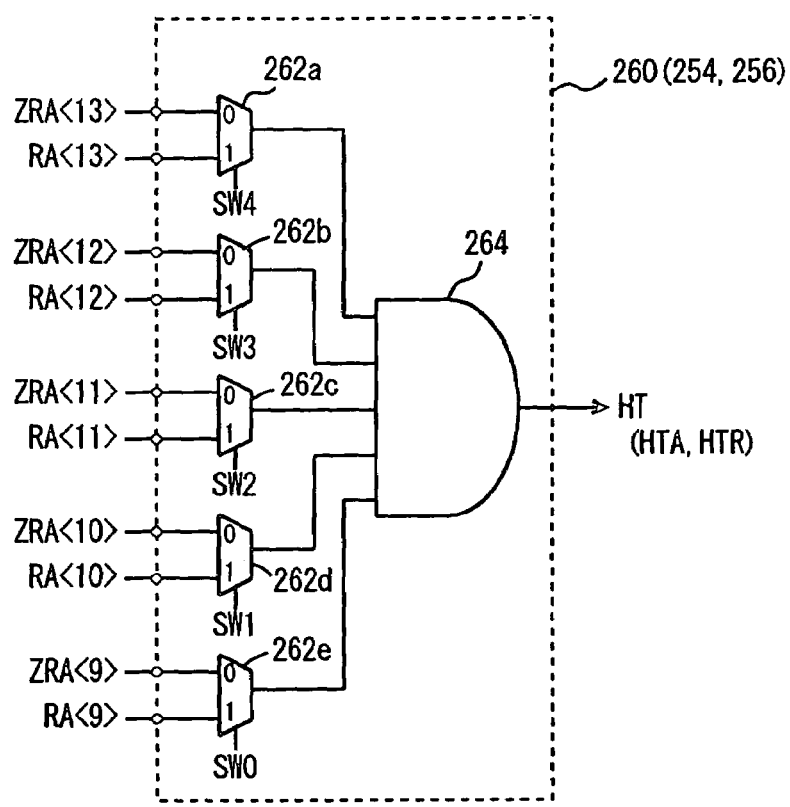
FIG. 45 schematically shows a structure of a block address decoder shown in FIG. 44.

FIG. 45 schematically shows, by way of example, the structures of ACT and REF block address decoders 254 and 256 shown in FIG. 44. Since ACT and REF block address decoders 254 and 256 have the same structure, FIG. 45 shows only one block address decoder 260 representing these block decoders.

In FIG. 45, block address decoder 260 (254 or 256) includes selectors 262a–262e provided corresponding to sets of complementary block address bits RA<13> and ZRA<13>–RA<9> and ZRA<9>, and an AND circuit 264 which receives the output signals of selectors 262a–262e, and produces block hit signal HT (HTA or HTR).

Each of selectors 262a–262e selects one of the complementary block address bits in the corresponding set in accordance with corresponding one of select signals SW4–SW0. Logical levels of select signals SW4–SW0 are determined by interconnections as shown in FIG. 23. Selectors 262a–262e select corresponding block address bits RA<13>–RA<9>, respectively, when corresponding select signals SW4–SW0 are set "1". When select signals SW4–SW0 are set "0", selectors 262a–262e select complementary block address bits ZRA<13>–ZRA<9>, respectively.

By programming these select signals SW4–SW0 through interconnections, the block addresses of the corresponding memory blocks can be set, respectively. By utilizing these selectors, all the input loads on the respective bits of the block decoders can be equal to each other, and the respective bits can be made definite substantially at the same timing without causing a skew. Thus, the block select signal (block hit signal) for the selected memory block can be set to the definite state at a faster timing.

FIG. 46 shows, by way of example, the logical levels of the select signals for selectors 262a–262e in the ACT and REF block address decoders. In FIG. 46, memory blocks MB0–MB11 are represented, in the column of memory block MB, the numerals in the respective rows in the column. The logical levels of select signals SW4–SW0 are set such that each memory block number may be represented by a binary number in the select signals SW4–SW0 for ACT block address decoder 254. Select signal SW4 is set to "0", and row address bit RA<13> is always selected. In this case, block address bit RA<13> is fixed to H-level. In the case where twelve memory blocks, i.e., memory blocks MB0–MB11 are used, therefore, the block address can be set such that select signals SW0–SW3 select one memory block in the normal operation mode.

In REF block address decoder 256, both select signals SW3 and SW4 are set to "0". Select signals SW3–SW0 simultaneously select two memory blocks. Select signals SW2–SW0 for REF block address decoder 256 have such logical levels that the block numbers of memory blocks MB0–MB5 are be represented by binary numbers. For memory blocks MB6–MB11, the logical levels of select signals SW2–SW0 are set in the same manner as memory blocks MB0–MB5. In this refresh mode, therefore, the two memory blocks can be simultaneously selected. In the refresh mode, the block address bits RA<13:12> are both set to L-level.

In the arrangement shown in FIG. 46, it is ensured that two memory blocks are selected in the refresh mode, and one memory block are selected in the normal operation mode. By these ACT and REF block address decoders 254 and 256, the designated memory (s) block can be accurately driven to the selected state in each operation mode.

FIG. 47 shows, by way of example, the logical levels of select signals in the case where memory blocks MB are reduced to six in number. In FIG. 47, select signals SW3 and SW4 for the ACT block address decoder are set to "0". The logical levels of the select signals SW2–SW0 are set such that select signals SW2–SW0 in combination represent the block number of each of memory blocks MB0–MB5 in a binary number notation.

In the REF block address decoder, the refresh is executed simultaneously on the three memory blocks in the refresh mode. Therefore, the logical levels of select signals SW4–SW2 are fixed to "0". For the even-numbered memory blocks, select signals SW1 and SW0 are both set to "0". For the odd-numbered memory blocks, select signals SW1 and SW0 are set to "0" and "1", respectively.

In the case where the memory blocks are reduced in number, therefore, block addresses of the respective memory blocks can be allocated merely by changing the logical levels of the select signals, and it is easy to accommodate for the change in arrangement of the memory blocks or in refresh cycle. It is easy to change the number of memory blocks which are selected simultaneously in the refresh mode. In the case where the REF block address decoder is configured as shown in FIG. 47, 512 word lines WL are arranged in one memory block so that 512×3=1.5 K refresh cycles can be implemented without an additional circuit.

In the case where the memory blocks are ten in number and a memory core of 512×5=2.5 K refresh cycles is required, this can be achieved merely by programming the logical levels of select signals SW4–SW0 for selectors 262a–262e of the REF block address decoder. Thereby, for the embedded memories (eDRAMs), for which various memory structures are required to design within a short period of time, it is merely required to make the optimum design of the local control circuit for one memory block. Accordingly, it becomes easy to accommodate for the change in memory configuration within a short period time.

[Structure of Selector 258]

Figure 48A:
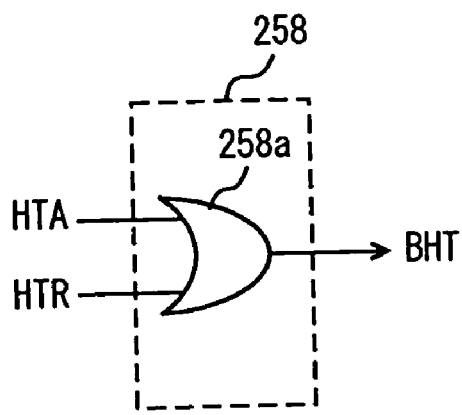
FIGS. 48A–48C schematically show a structure of the selector shown in FIG. 44.

FIG. 48A shows, by way of example, a structure of selector 258 shown in FIG. 44. In FIG. 48A, selector 258 includes an OR circuit 258a, which in turn receives normal mode block hit signal HTA applied from ACT block address decoder 254 and refresh mode block hit signal HTR applied from REF block address decoder 256 to produce block hit signal BHT.

In the case where the block address selector has the structure shown in FIG. 48A, the number of word lines to be selected simultaneously (i.e., the number of memory blocks to be selected simultaneously) in the normal operation mode must be equal to that in the refresh mode. This is for the following reason. Each of REF and ACT block address decoders 254 and 256 receives, in parallel, the complementary block address signal bits from complementary signal generating circuit 252, and performs the decoding operation. When memory block MB0 is selected in the normal operation mode according to the block addresses allocated, e.g., as shown in FIG. 46, REF block address decoder 256 activates refresh block hit signal HTR for memory blocks MB0 and MB6.

In the normal operation mode, when memory block MB0 is accessed, word line selection is performed in memory block MB6 in parallel with the normal access so that a malfunction may occur. In the structure shown in FIG. 48A, therefore, the memory blocks selected in the normal operation mode must be equal in number to those refreshed in the refresh mode.

If the memory blocks selected in the normal operation mode is different in number from those in the refresh mode, a problem of multiple selection of the memory blocks occur even in the 6-memory-block structure as shown in FIG. 47, for example. If main block MB0 is selected in the normal operation mode in accordance with row active signal ACT, REF block address decoder 256 produces refresh block hit signals HTR for memory blocks MB0 and MB4 so that the row selection is performed in memory blocks MB0 and MB4, and a malfunction occurs in row selection in the normal operation mode.

Accordingly, OR circuit 256a can be applied as a block address selector for producing block hit signal BHT in the case where the memory blocks selected in the refresh mode are the same as the memory blocks simultaneously selected in the normal operation mode.

Figure 48B:
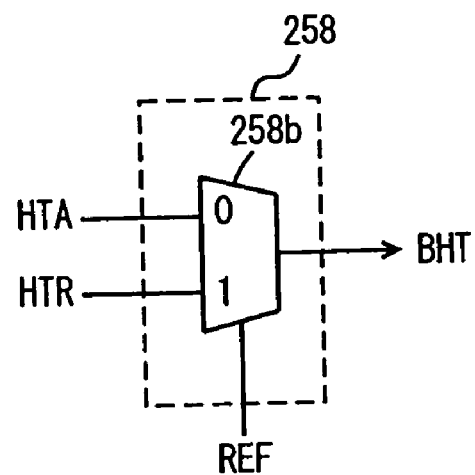

FIG. 48B schematically shows a structure of a first modification of selector 258 shown in FIG. 44. In FIG. 48B, selector 258 includes a select circuit 258b which selects one of block hit signals HTA and HTR in accordance with refresh activating signal REF. Select circuit 258b selects refresh block hit signal HTR when refresh activating signal REF is activated, and otherwise selects normal mode block hit signal HTA.

According to the structure shown in FIG. 48B, therefore, the output signal of REF block address decoder 256 becomes valid in the refresh mode so that block hit signal BHT for the refresh memory block is activated. In the normal operation mode, block hit signal BHT is produced in accordance with normal mode block hit signal HTA output from ACT block address decoder. With the arrangement as shown in FIG. 48B, even if the memory blocks selected simultaneously in the normal operation mode is different in number from those in the refresh mode, the block hit signal BHT for the selected memory block can be accurately driven to the active state without selection failure.

Figure 48C:
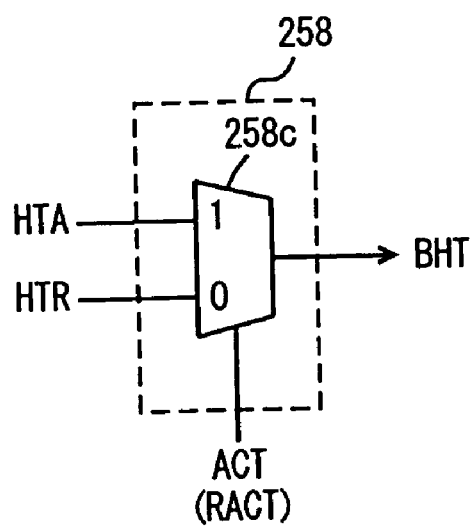

FIG. 48C schematically shows a structure of a second modification of selector 258 shown in FIG. 44. Selector 258 shown in FIG. 48C is formed of a select circuit 258c which selects one of normal mode block hit signal HTA and refresh mode block hit signal HTR in accordance with row active signal ACT. When row active signal ACT is active, select circuit 258c selects normal mode block hit signal HTA applied from ACT block address decoder 254. Otherwise, select circuit 258c selects refresh mode block hit signal HTR applied from REF block address decoder 256. In the structure shown in FIG. 48C, therefore, block hit signal BHT can be accurately driven to the active state for the memory block designated by the block address signal in accordance with the operation mode.

In the structure shown in FIG. 48C, row active signal ACT is used. Row active signal ACT is activated in accordance with a row active command when the row active command is externally applied. By using this row active signal ACT, block hit signal BHT can be activated asynchronously to the clock signal even in the normal operation mode so that block hit signal BHT can be driven to the definite state at a faster timing.

Array activation instructing signal RACT may be used instead of row active signal ACT, if internal row address signal RA changes in synchronization with the rising of clock signal CLK by the use of address input buffer 202 shown in FIG. 38. In this structure, normal mode block hit signal HTA is activated in accordance with internal row address signal RA which changes in accordance with the rising of clock signal CLK. In this case, the operation of taking in the word line address is performed in accordance with the main row select signal, and the block hit signal BHT can be held in the definite state before the row select operation (decoding of the word line address). Accordingly, array activation instructing signal RACT becomes active in synchronization with clock signal CLK and in accordance with row active signal ACT, and this array activation instructing signal may be used instead of row active signal ACT. It is sufficient that operation control signals for select circuit 258c are merely required to be determined appropriately in accordance with the structure of input buffer 202.

[Modification of Block Decoder]

Figure 49:
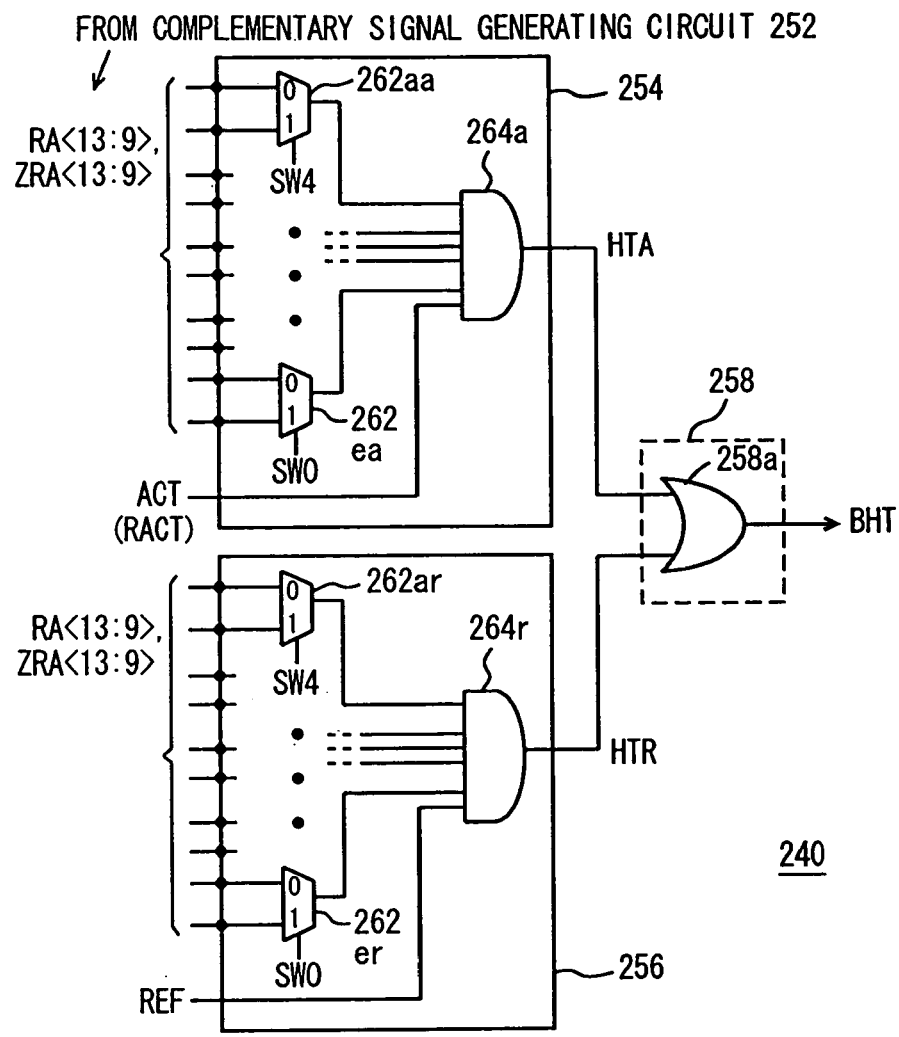
FIG. 49 schematically shows a modification of a block decoder shown in FIG. 35.

FIG. 49 schematically shows a structure of a modification of block decoder 240 shown in FIG. 35. In FIG. 49, block decoder 240 includes ACT and REF block address decoders 254 and 256 as well as selector 258 for producing block hit signal BHT in accordance with block hit signals HTA and HTR applied from block address decoders 254 and 256, respectively.

Complementary signal generating circuit 252 shown in FIG. 44 is provided commonly to block address decoders 254 and 256. For avoiding complication of interconnection lines, individual complementary signal generating circuits may be provided for block address decoders 254 and 256, respectively.

ACT block address decoder 254 includes: selectors 262aa–262ea which are provided for sets of complementary bits of block address bits RA<13:9> and ZRA<13:9>, respectively; and an AND circuit 264a which receives the output signals of selectors 262aa–262ea and row active signal ACT, and produces normal mode block hit signal HTA. Each of selectors 262aa–262ea selects one of block address bits RA<i> and ZRA<i> in accordance with corresponding one of select signals SW0–SW4, similarly to the structure shown in FIG. 45.

REF block address decoder 256 likewise includes: selectors 262ar–262er, which are provided corresponding to respective pairs of block address bits RA<13:9> and ZRA<13:9> applied from complementary signal generating circuit 252; and an AND circuit 264r which produces refresh mode block hit signal HTR in accordance with the output signals of selectors 262ar–262er and refresh mode block hit signal HTR. Selectors 262ar–262er correspond to selectors 262a–262e shown in FIG. 45, and the block address in the refresh mode is programmed in accordance with select signals SW4–SW0.

Selector 258 includes an OR circuit 258a which receives normal mode block hit signal HTA applied from ACT block address decoder 254 and refresh mode block hit signal HTR applied from REF block address decoder 256, and produces block hit signal BHT.

In the structure of block decoder 240 shown in FIG. 49, when row active signal ACT becomes active in the normal operation mode, ACT block address decoder 254 is enabled to decode block address bits output from selectors 262aa–262ea, and selectively drives normal mode block hit signal HTA to the active state in accordance with a result of decoding. In this normal mode, refresh activating signal REF is inactive, and REF block address decoder 256 is disabled. Therefore, block hit signal BHT for the designated memory block can be accurately driven to the selected state in accordance with the block address independently of the programmed block address in the refresh mode.

In the refresh mode, refresh activating signal REF is activated, and REF block address decoder 266 is enabled to perform the decoding operation. In this case, row active signal ACT is inactive, ACT block address decoder 254 is disabled, and normal mode block hit signal HTA is in the inactive state at L-level. In the refresh mode, therefore, block hit signal BHT can be accurately driven to the selected state in accordance with the block address programmed in selectors 262ar–262er for performing the row selection and the refresh of memory cell data.

In block decoder 240 shown in FIG. 49, one of block address decoders 254 and. 256 is activated to perform the decoding operation when row active signal ACT or refresh activating signal REF is active. Therefore, the power consumption can be reduced as compared with the preceding structure, in which REF block address decoder 256 and ACT block address decoder 254 operate in parallel. Block decoder 240 is statically supplied with the address signal via the internal address bus. Even when the internal address signal changes, e.g., in the standby state, it is possible to stop the operation of block decoder 240 if row active signal ACT or refresh activating signal REF is made inactive. Therefore, the power consumption can be reduced.

Further, upon transmitting the column address signal in the case where the internal address signal lines transmit both the row address signal and the column address signal, row active signal ACT or array activation instructing signal RACT is inactive, and refresh activating signal REF is inactive so that the operation of block decoder 240 can be stopped, and the power consumption during the column access can be reduced.

In the structure as shown in FIG. 49, array activation instructing signal RACT, which becomes active for a predetermined period in synchronization with the clock signal when the row active command is applied, may be employed instead of row active signal ACT. In this case, internal address signal RA changes in synchronization with clock signal CLK, and is transmitted via internal address signal line 206. When the decoding of the row address is internally performed in accordance with the row-related control signals of a plurality of phases, internal address signal RA is already made definite.

[Structure of Refresh Counter 204]

Figure 50:
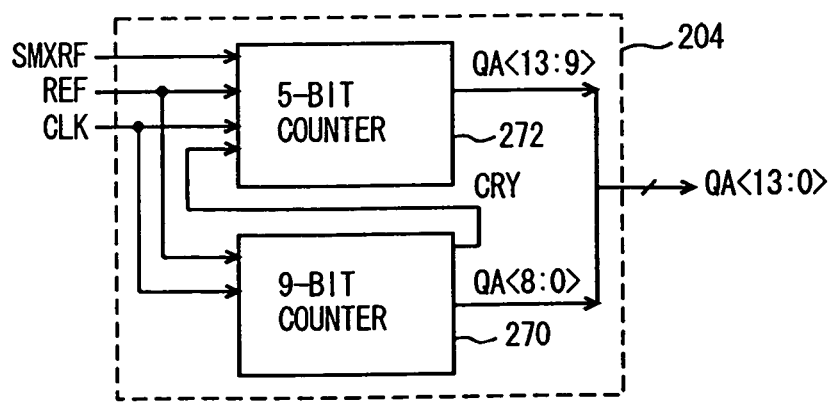
FIG. 50 schematically shows a structure of a refresh counter shown in FIG. 34.

FIG. 50 schematically shows a structure of a refresh counter 204 shown in FIG. 34. In FIG. 50, refresh counter 204 includes: a 9-bit counter 270 which produces word line address bits QA<8:0> specifying a word line; and a 5-bit counter 272 which increments the count value by one when refresh activating signal REF and a carry CRY applied from 9-bit counter 270 are active. 5-bit counter 272 produces block address bits QA<13:9>.

5-bit counter 272 also receives final block refresh detection signal SMXRF. 5-bit counter 272 initializes its count value to an initial value QA<13:9>=(00000> when final block refresh detection signal SMRF and refresh activating signal REF are both active, and carry CRY applied from 9-bit counter 270 is active.

In 9-bit counter 270 producing refresh word line address bits QA<8:0> for specifying a refresh word line, carry CRY attains the active state at H-level upon count-up, i.e., when all refresh word line address bits QA<8:0> go to "1", and all the count values thereof should be initialized to "0" upon reception of subsequent refresh activating signal REF.

Figure 51:
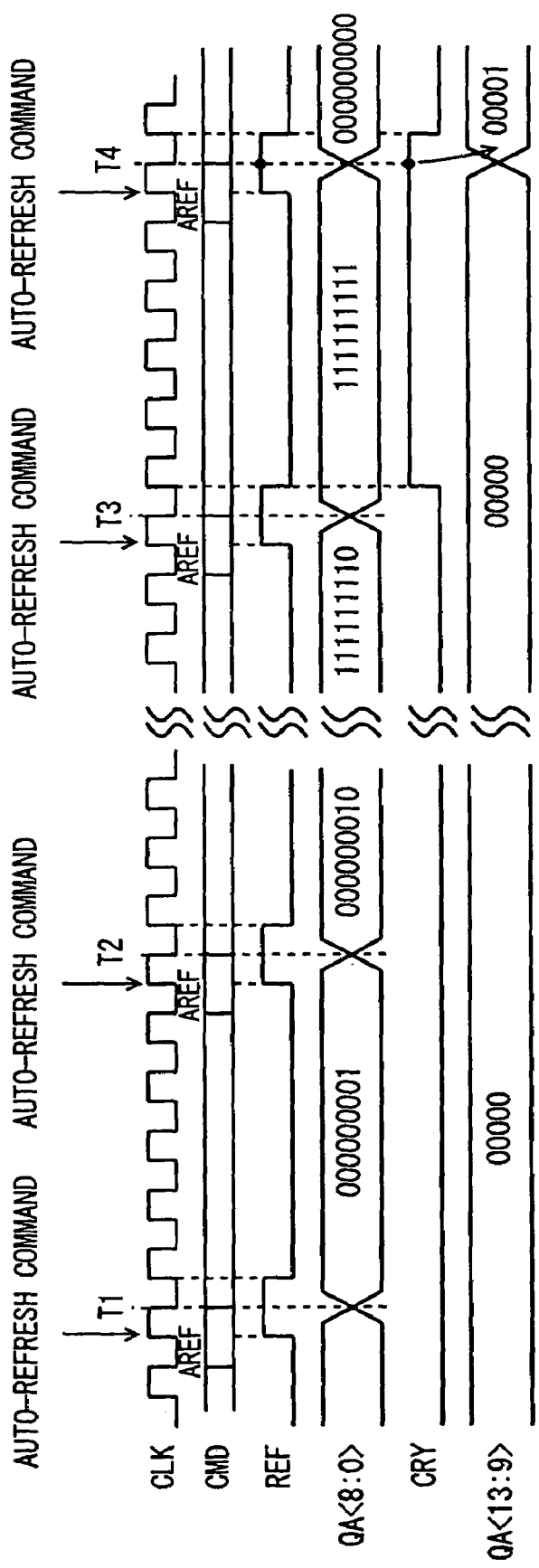
FIG. 51 is a timing chart representing a count operation of the refresh counter shown in FIG. 50.

FIG. 51 is a timing chart representing a normal count operation of the refresh counter shown in FIG. 50. Referring to FIG. 51, description will now be given on the count operation of refresh counter 204 shown in FIG. 50.

Referring to FIG. 51, auto-refresh command (instructing signal) AREF is applied as an external command (operation mode instructing signal) CMD in synchronization with clock signal CLK. In response to the rising of clock signal CLK, auto-refresh command AREF is taken in, and refresh activating signal REF is at H-level for a period of one clock cycle.

When refresh activating signal REF becomes active, 9-bit counter 270 performs the count operation in synchronization with the falling edge of clock signal CLK, and increments its count value by one. At a time T1 in FIG. 51, 9-bit counter 270 increments its count value by one to "000000001". Count value QA<13:9> of 5-bit counter 272 is equal to the initial value of "00000".

At times T2 and T3, 9-bit counter 270 performs the count operation at the falling edge of clock signal CLK in accordance with refresh activating signal REF, which is activated in response to application of auto-refresh command AREF, and count value Q<8:0> thereof is incremented by each counting. Through this count operation, count value A<8:0> of 9-bit counter 270 reaches the maximum value of "111111111" at a time T3. When the count value of 9-bit counter 270 reaches the maximum value of all "1", carry CRY is activated to attain H-level in synchronization with the rising of clock signal CLK in the next cycle.

Auto-refresh command AREF is applied again, and refresh activating signal REF is activated. When auto-refresh command is applied, the final word line in memory block MB0 is refreshed in accordance with all "1's" of the maximum count value of 9-bit counter 270 and all "0's" of count value Q<13:9> of 5-bit counter 272.

While refresh activating signal REF is active, clock signal CLK falls to L-level at a timeT4 so that count value QA<13:9> of 5-bit counter 272 is incremented by one to "00001" because carry CRY is at H-level and refresh activating signal REF is active. When the auto-refresh command is applied again, therefore, refresh is effected on the block address "00001".

At time T4, the 9-bit counter performs the count operation in accordance with the falling of clock signal CLK, and count value QA<8:0> is set to the initial value of all "0's". Thus, 5-bit counter 272 counts carry CRY when refresh activating signal REF is active.

Figure 52:
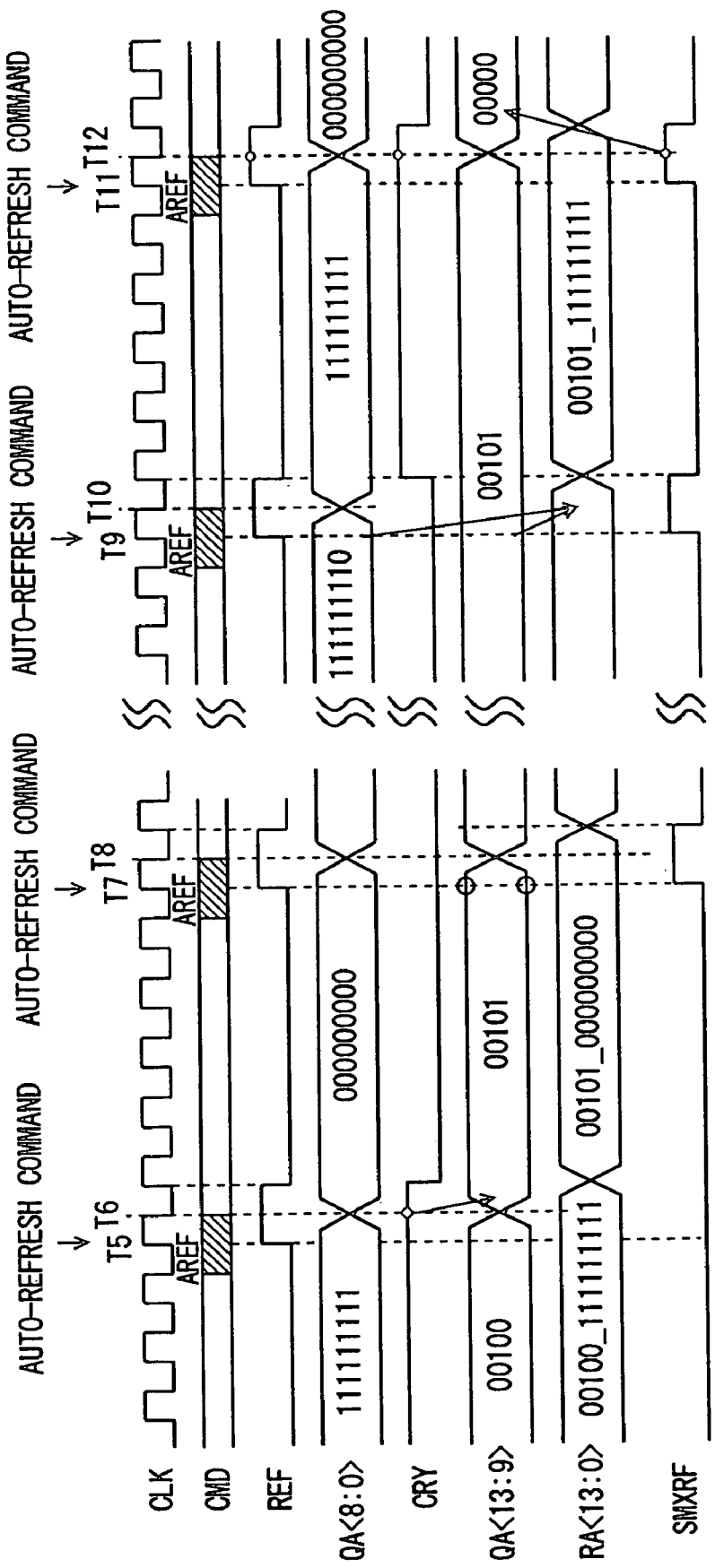
FIG. 52 is a timing chart representing an operation for resetting of the refresh counter shown in FIG. 50.

FIG. 52 is a timing chart representing an operation for resetting refresh address counter 204 shown in FIG. 50. Referring to FIG. 52, description will now be given on the operation for resetting refresh address counter 204 shown in FIG. 50. The reset operation shown in FIG. 52 is performed in such a situation that the sub-memory array is formed of 12 memory blocks MB0–MB11, and the block addresses shown in FIG. 46 are allocated to memory blocks MB0–MB11. More specifically, a block address "00101" is allocated to memory block MB1 in the refresh operation, and this memory block MB11 is the final memory block in the refresh sequence. According to the allocation of the block addresses shown in FIG. 46, memory block MB5 is also the final refresh memory block in the refresh sequence. However, final block refresh detection signal SMXRF is output from the block decoder (REF block address decoder) provided for memory block MB11.

9-bit counter 270 has count value QA<8:0> of all "1's", and 5-bit counter 272 has count value QA<13:9> of "00100". Accordingly, internal address bits RA<13:0> are a combination of count values QA<8:0> and QA<13:9>.

When auto-refresh command AREF is applied at a time T5, the refresh operation is executed in accordance with current internal row address bits RA<13:0>. At a time T6, refresh activating signal REF is at H-level, and clock signal CLK falls to L-level. Thereby, 5-bit counter 272 performs the count operation to increment its count value QA<13:9> by one to "00101", so that final refresh memory block MB11 (MB5) is designated.

In synchronization with the falling of clock signal CLK at time T6, count value QA<8:0> of 9-bit counter 270 is reset to the initial value of all "0's". In accordance with count value QA<13:0> of address counter 204, internal row address bits RA<13:0> on the internal address bus are set to the state of designating the first or leading word line address in the final memory block according to the refresh sequence, in response to the rising of clock signal CLK in the next clock cycle.

When auto-refresh command AREF is applied at a time T7, the refresh block hit signal is activated in accordance with current row address bits RA<13:0> so that final block refresh detection signal SMXRF is activated. This block decoder may have any of the structures of block decoders shown in FIG. 44 et seq. FIG. 52 shows, by way of example, a structure, in which the refresh block address decoder becomes active when refresh activating signal REF is active. In this structure, final block refresh detection signal SMXRF is at H-level for a period of one clock cycle, similarly to refresh activating signal REF.

When clock signal CLK falls to L-level at a time T8, 9-bit counter 270 performs the count operation to increment its count value by one. Carry CRY is at L-level. In response to the falling of clock signal CLK in the next clock cycle, row address bits RA<13:0> change to the state of designating the next refresh address in accordance with this count value.

At a time T9, auto-refresh command AREF is applied. At a time T10, count value QA<8:0> of 9-bit counter 270 changes to the state of all "1's" in accordance with the falling of clock signal CLK, and responsively, carry CRY attains H-level in accordance with the rising of next clock signal. In this state, carry CRY is at L-level when clock signal CLK falls at a time T10, and count value QA<13:9> of 5-bit counter 272 does not change, and is maintained at the state of designating final refresh memory block MB11 (MB5). The refresh operation is performed in accordance with internal row address signal RA at the rising of clock signal CLK.

In response to the rising of clock signal CLK in the next clock cycle, the internal row address changes, and internal row address bits RA<13:0> are set to the state of designating the final word line address in the final refresh memory block.

Even when auto-refresh command AREF is applied at time T9, since carry CRY is at L-level, the count value of 5-bit counter 272 is not reset even when final block refresh detection signal SMXRF attains H-level.

When auto-refresh command AREF is applied at a time T11, refresh is effected on the final word line address in the final refresh memory block in accordance with current row address bits RA<13:0>.

When clock signal CLK falls at a time T12, carry CRY is at H-level, and final block refresh detection signal SMXRF is at H-level so that count value QA<13:9> of 5-bit counter 272 is initialized to all "0's".

Count value QA<8:0> of 9-bit counter 270 is reset to the initial value of all "0's" through its count-up operation. In response to the rising of clock signal CLK in the next clock cycle, internal row address bits RA<13:0> are reset to the initial value of all "0's".

Therefore, the refresh address is initialized when the refresh is executed on the final word line in the final refresh block, and the refresh will be executed in accordance with the initialized refresh address in the next refresh operation.

As shown in FIG. 52, refresh activating signal REF is active for one clock cycle, and determines the refresh period. In response to the rising of clock signal CLK in the next cycle, the value of refresh address bits RA<13:0> serving as the internal row address change. In this case, therefore, the precharging of the refresh operation must be completed within one clock cycle. If the precharge operation is performed in response to deactivation of refresh activating signal REF, this change in internal row address bits RA<13: 0> is further delayed by one clock cycle. This structure can be easily achieved merely by transferring output count value QA<13:0> of refresh address counter 204 to the address input buffer via the delay circuit, which performs the transfer operation in synchronization with the clock signal.

As shown in FIG. 52, therefore, 5-bit counter 272 is reset in accordance with a combination of carry signal CRY and final refresh block refresh detection signal SMXRF.

Figure 53:
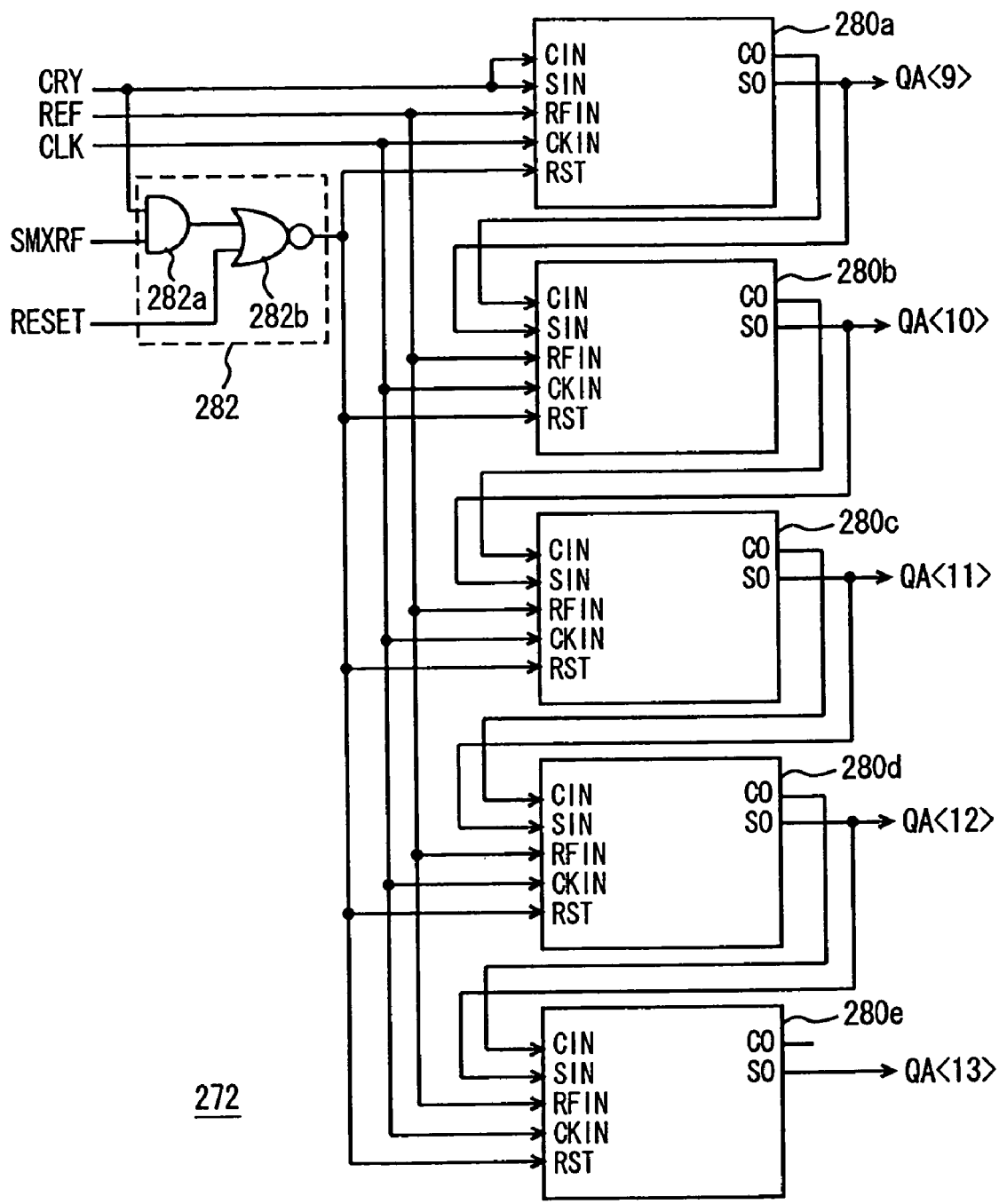
FIG. 53 schematically shows a structure of a 5-bit counter shown in FIG. 50.

FIG. 53 schematically shows, by way of example, a structure of 5-bit counter 272 shown in FIG. 50. In FIG. 53, 5-bit counter 272 includes: 1-bit arithmetic circuits 280a–280e which perform the count operation in accordance with refresh activating signal REF and clock signal CLK to produce count bits QA<9>–QA<13>, respectively; and a reset circuit 282 which resets count values of 1-bit arithmetic circuits 280a–280e to "0" in accordance with carry signal CRY, final block refresh detection signal SMXRF and a system reset signal RESET.

1-bit arithmetic circuits 280a–280e are cascaded with respect to the input data and each receives, on its input nodes CIN and SIN, output signals applied from output nodes CO and SO of the 1-bit arithmetic circuit in the preceding stage. Each of 1-bit arithmetic circuits 280a–280e has a refresh input RFIN receiving refresh activating signal REF, a clock input CKIN receiving clock signal CLK and a reset input RST receiving the output signal of reset circuit 282.

Reset circuit 282 includes: an AND circuit 282a receiving carry signal CRY and final block refresh detection signal SMXRF; and an NOR circuit 282b which receives the output signal of AND circuit 282a and reset signal RESET, and produces the counter reset signal. Reset signal RESET is activated upon power-on or system resetting.

Reset circuit 282 produces a counter reset signal at L-level when carry signal CRY is at H-level and final block refresh detection signal SMXRF is at H-level. Therefore, count value QA<13:9> of 5-bit counter 272 is reset to all "0's" when carry signal CRY is at H-level and the refresh is effected on the final word line in the final refresh block.

The count circuit formed of 1-bit arithmetic circuits 280a–280e increments its count value QA<13:9> by one in synchronization with the falling of clock signal CLK when carry signal CRY attains H-level and refresh activating signal REF is active. One-bit arithmetic circuits 280a–280e form a full adder circuit, and successively accumulate the number of carry signals CRY to output the accumulated value as count value QA<13:9>.

Figure 54:
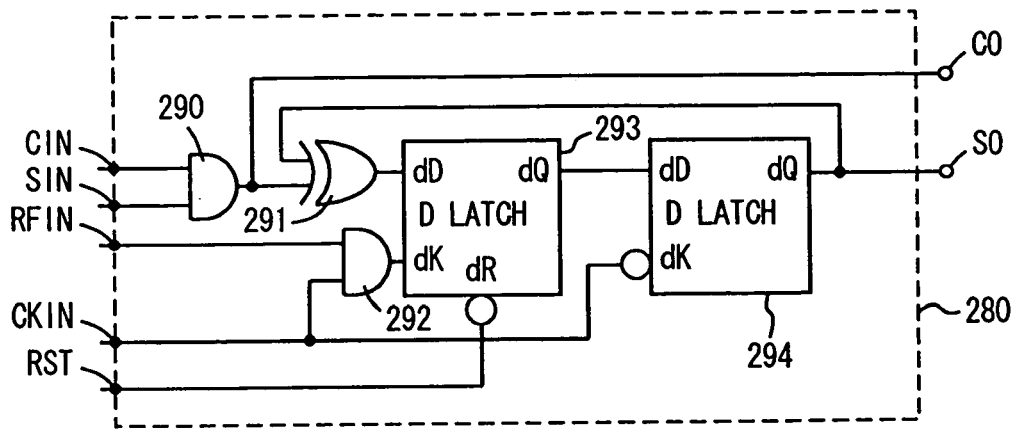
FIG. 54 schematically shows a structure of a 1-bit arithmetic circuit shown in FIG. 53.

FIG. 54 schematically shows a structure of 1-bit arithmetic circuits 280a–280e shown in FIG. 53. Since 1-bit arithmetic circuits 280a–280e have the same structure, FIG. 54 representatively shows the structure of 1-bit arithmetic circuit 280 generically representing the structure of 1-bit arithmetic circuits.

In FIG. 54, 1-bit arithmetic circuit 280 includes an AND circuit 290 which receives signals applied to inputs CIN and SIN; an EXOR circuit 291 which receives the output signal of AND circuit 290 and the signal on output node SO; an AND circuit 292 which receives the signal on refresh input RFIN and clock input CIN; a D latch 293 which transfers the output signal of EXOR circuit 291 in accordance with the output signal of AND circuit 292; and a D latch 294 which transfers the output signal of D latch 293 to output node SO in accordance with the clock signal applied to clock input CKIN.

D latch 293 receives, on its data input dD, the output signal of EXOR circuit 291, and receives, on its clock input dK, the output signal of AND circuit 292. D latch 293 has a reset function, and resets the signal on its input dQ to L-level when it receives the reset signal at L-level from reset input RST. D latch 293 enters a through state for passing and latching a received signal when the signal applied to clock input dK is at H-level, and enters the latch state when the signal applied to clock input dK attains L-level.

D latch 294 includes an input dD receiving the output signal from output dQ of D latch 293, a clock input dK receiving the clock signal applied to clock input CKIN, and an output dQ transmitting the output signal to output node SO. D latch 294 enters the through state when the signal applied to clock input dK attains L-level, and enters the latch state when the signal applied to clock input dK attains H-level.

Figure 55:
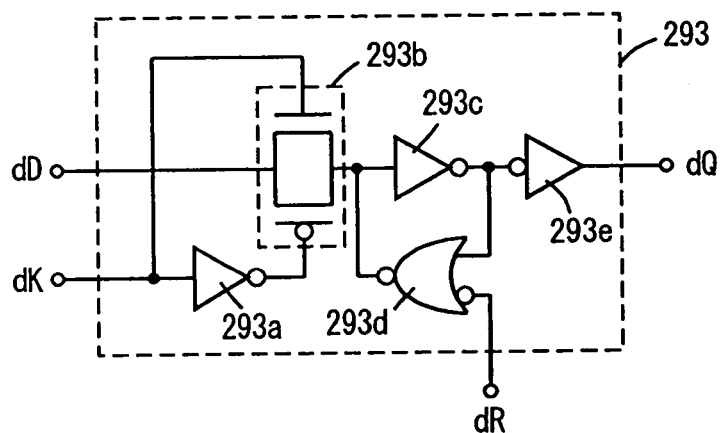
FIG. 55 shows a structure of a D latch at a first stage shown in FIG. 54.

FIG. 55 shows, by way of example, a structure of D latch 293 in the first stage shown in FIG. 54. In FIG. 55, D latch 293 includes: an inverter 293s which inverts the signal applied to clock input dK: a transmission gate 293b which is selectively turned on to pass the signal applied to input dD in response to the output signal of inverter 293a and the signal applied to clock input dK; an inverter 293c which receives the signal passed through transmission gate 293b; a gate circuit 293d which receives the output signal of inverter 293c and the signal applied to reset input dR, and transmits the received output signal to the input of inverter 293c; and an inverter 293e which inverts and transmits the output signal of inverter 293c to output node dQ.

Transmission gate 293b is turned on when the signal applied to clock input dK is at H-level, and is turned off when the signal applied to clock input dK is at L-level.

Gate circuit 293d sets its output signal to L-level when the signal applied to reset input dR is at L-level, and operates as an inverter when the signal applied to reset input dR is at H-level.

Therefore, D latch 293 takes in the received signal in response to the rising of clock signal CLK in the refresh operation, and enters the latch state when clock signal CLK attains L-level.

Figure 56:
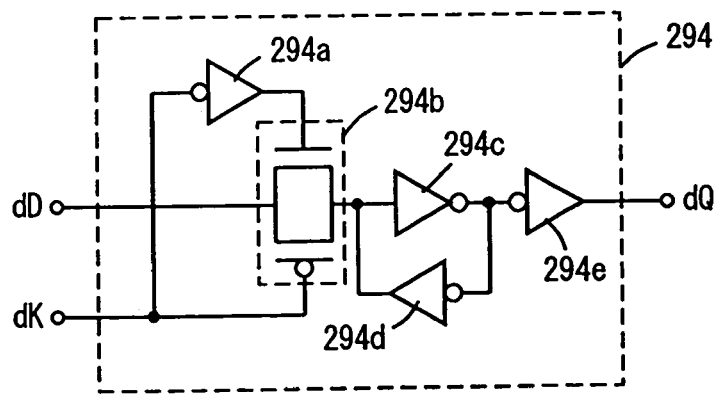
FIG. 56 shows a structure of a D latch at an output stage shown in FIG. 54.

FIG. 56 shows, by way of example, a structure of D latch 294 in the output stage shown in FIG. 54. In FIG. 56, D latch 294 includes: an inverter 294a which inverts the clock signal on clock input dK; a transmission gate 294b which is selectively turned on to pass the signal on input dD in accordance with clock signal CLK on clock input dK and the inverted clock signal applied from inverter 294a; an inverter 294c which inverts the output signal of transmission gate 294b; an inverter 294d which inverts the output signal of inverter 294c for transmission to the input of inverter 294c; and inverter 293e which inverts the output signal of inverter 294c for transmission to output node dQ.

D latch 294 shown in FIG. 56 is rendered conductive to take in the output signal of D latch 293 when clock signal CLK applied to clock input dK is at L-level, and enters the latch state when clock signal CLK attains H-level.

In the refresh mode of 1-bit arithmetic circuit 280, D latch 293 takes in and latches the output signal of EXOR circuit 291 in synchronization with the rising of clock signal applied to clock input CKIN, and D latch 294 transmits the latched signal of D latch 293 to output node SO when clock signal CLK attains L-level. In the refresh operation, therefore, the count value of 5-bit counter 272 changes in response to the falling of clock signal CLK and in accordance with the output signal of D latch 294.

Figure 57:
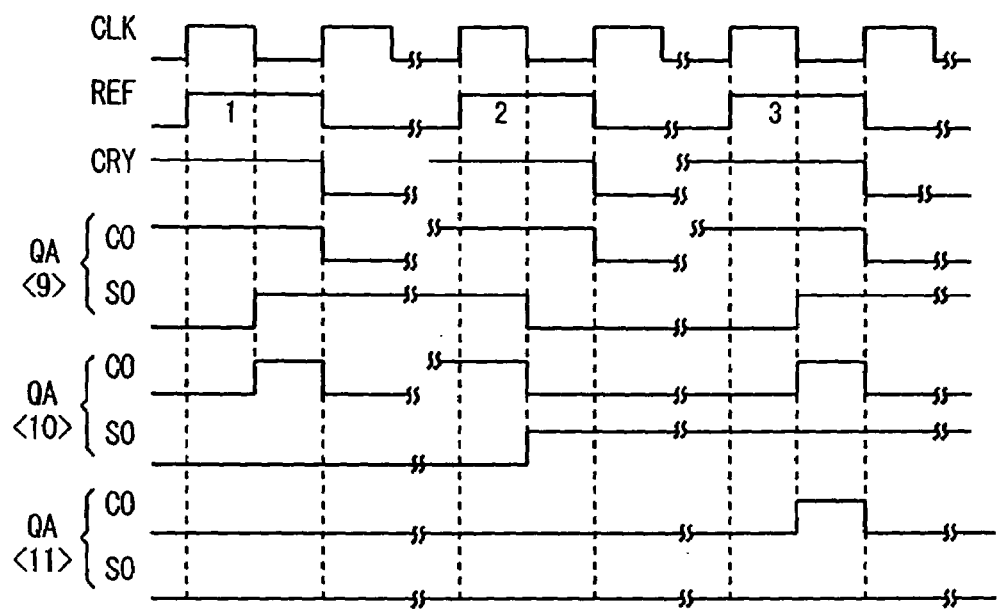
FIG. 57 is a timing chart representing a count operation of a 5-bit counter shown in FIG. 53.

FIG. 57 is a timing diagram representing an operation of the arithmetic circuits of 5 bits shown in FIGS. 53–56. FIG. 57 representatively shows the change in count bits QA<11:9>.

When refresh activating signal REF becomes active while carry signal CRY is at H-level, an operation for count bit QA<9> is performed such that corresponding 1-bit arithmetic circuit 280a receives carry signal CRY on its inputs CIN and SIN, and outputs from its output CO a signal at H-level according to carry signal CRY. At the time of rising of clock signal CLK, count value QA<9> is at L-level. For this count bit QA<9>, therefore, the output signal of EXOR circuit 291 is at H-level, and corresponding D latch 293 transfers the signal at H-level in synchronization with clock signal CLK. D latch 294 takes in and transfers the output signal of D latch 293 in synchronization with the falling of clock signal CLK. Therefore, when refresh activating signal REF is activated for the first time after the initialization of the refresh address, count bit QA<9> first rises to H-level in response to the falling of clock signal.

For count bit QA<10>, an operation is performed as follows. If clock signal CLK is at H-level when refresh activating signal REF is applied for the first time as described above, inputs CIN and SIN receive signals at H- and L-levels, respectively, so that a signal on its output CO attains H-level in synchronization with the falling of CLK. If clock signal CLK is at H-level, the output signal of EXOR circuit 291 is at L-level, and corresponding D latch 293 takes in and transfers the signal at L-level so that count bit QA<10> does not change, and maintains L-level.

For count bit QA<11>, an operation is performed as follows. Even when output CO for count bit QA<10> rises to H-level in synchronization with the falling of clock signal CLK, the output signal of AND circuit 290 for count bit QA<11> is at L-level, and the output signal of EXOR circuit 291 is likewise at L-level so that count bit QA<11> does not change, and maintains L-level.

Refresh activating signal REF becomes active for the second time, and it is assumed that carry signal CRY is at H-level. At this time, the operation for count bit QA<9> is performed as follows. Since the output signal of AND circuit 290 and count bit QA<9> are both at H-level, the output signal of EXOR circuit 291 is at L-level, and D latches 293 and 294 successively transfer this signal at L-level. Therefore, count bit QA<9> falls to L-level in synchronization with the falling of clock signal CLK.

The operation for count bit QA<10> is performed as follows. At the time of rising of the clock signal, count bit QA<9> is at H-level, and the signal on corresponding output CO is at H-level so that the output signal of AND circuit 290 is at H-level. Therefore, the output signal of EXOR circuit 291 is at H-level, and D latch 293 takes in and transfers the output signal of EXOR circuit 291 in synchronization with the rising of clock signal CLK so that count bit QA<10> attains H-level in synchronization with the falling of clock signal CLK.

For count bit QA<1 1>, the operation is performed as follows. Since count bit QA<10> is at L-level when clock signal CLK falls, both the output signals of AND circuit 290 and EXOR circuit 291 are at L-level, and count bit QA<11> maintains L-level.

It is now assumed that refresh activating signal REF becomes active for a third time while carry signal CRY is at H-level. In this state, as to the operation for count bit QA<9>, the output signal of EXOR circuit 291 attains H-level, and the signal applied from D latch 294 attains H-level in response to the falling of clock signal CLK, so that count bit QA<9> attains H-level again.

For count bit QA<10>, the output signal of AND circuit 290 attains H-level in synchronization with the falling of clock signal CLK, and the output signal of AND circuit 290 is at L-level while clock signal CLK is at H-level. Therefore, the output signal of EXOR circuit 291 is at H-level, and count bit QA<10> maintains H-level.

Thereafter, the above operations are repeated so that carry signal CRY for count bit QA<9> becomes active, and the state thereof changes upon each application of refresh activating signal REF.

In each of 1-bit arithmetic circuits 280b–280e for higher bits, when the count bit in the preceding stage is at H-level, carry signal CRY is transmitted, and the signal on its output node SO, i.e., the corresponding count bit changes its state. When the refresh operation is completed for all the word lines in one memory block and the carry signal CRY is activated, 5-bit counter 272 increments its count value by one in the next cycle, and the next memory block is designated.

In the reset operation, carry signal CRY attains H-level, and final block refresh detection signal SMXRF becomes active in response to the activation of refresh activating signal REF. Thereby, the output signal. of reset circuit 282 becomes active, and latched data of D latch 293 at the initial stage of each of 1-bit arithmetic circuits 280a–280e is reset so that count bits QA<13:9> are reset to all "0"s in synchronization with the falling of clock signal CLK.

The refresh address counter described above is of an increment type and the count value is successively incremented, and the final memory block in the refresh sequence is the memory block at the maximum refresh block address.

However, if the refresh address counter is of a decrement type successively decrementing the count value, the memory block at the minimum refresh block address becomes the final refresh block. In this case, therefore, the block hit signal produced from the REF block decoder provided for the minimum refresh block address, is used as the final block refresh detection signal, and the refresh counter of the decrement type can easily reset the count value.

Figure 58:
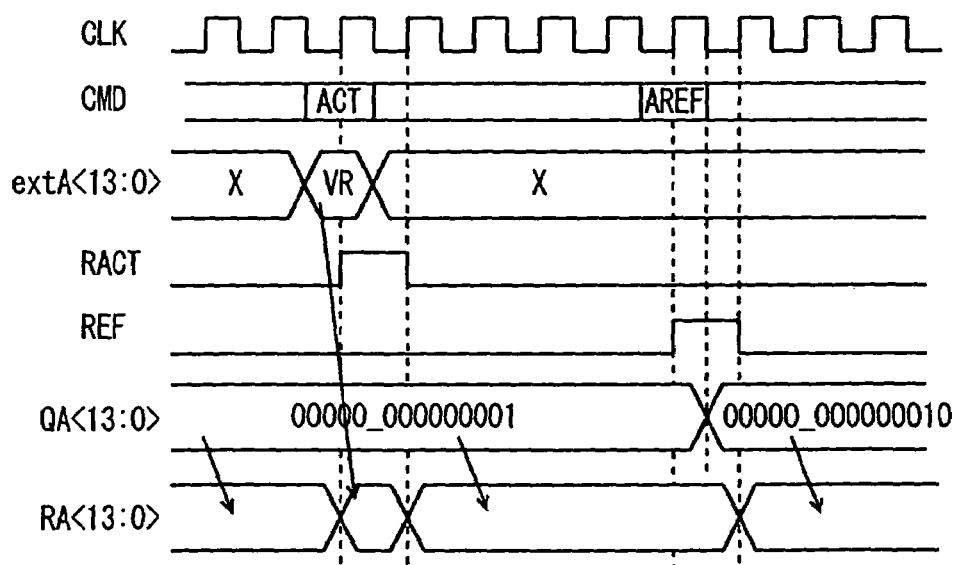
FIG. 58 is a timing chart representing an operation of an address input circuit shown in FIG. 34.

FIG. 58 is a timing diagram representing an operation of address input circuit 200 shown in FIG. 34. In address input circuit 200, as shown in FIG. 34, multiplexer 201 selects and applies external address bits extA<13:0> to address input buffer 202 when array activation instructing signal RACT is active. When array activation instructing signal RACT is inactive, multiplexer 201 selects refresh address bits QA<13:0> applied from refresh counter 204, and applies the selected bits to address input buffer 202. When receiving, as external command CMD, row active signal (row active command) ACT, and receiving the current external address bits extA<13:0> as definite address signal VR, multiplexer 201 selects definite address signal VR in accordance with array activation instructing signal RACT, and transmits the selected address signal to address input bus 206. Array activation instructing signal RACT becomes active for a predetermined period (one clock cycle period in FIG. 58) in synchronization with clock signal CLK and in accordance with row active command (row active signal) ACT.

Address input buffer 202 transmits the definite address signal to the internal address bus in response to the rising of clock signal CLK, and enters the latching state when clock signal CLK is at L-level. Therefore, internal row address bits RA<13:0> on internal address bus 206 shown in FIG. 34 change in accordance with externally applied address signal extA<13:0> and in synchronization with the rising of clock signal CLK.

When array activation instructing signal RACT becomes inactive, multiplexer 201 selects refresh address bits QA<13:0> applied from refresh counter 204, and transmits the same to internal row address bus 206 via address input buffer 202. In this standby state, therefore, signal lines of internal address bus 206 are fixed to values of refresh address bits QA<13:0>, respectively, so that charging and discharging of internal address bus 206 do not occur even if the external address signal changes during the standby state, and the power consumption during the standby state can be reduced.

In the refresh operation, refresh activating signal REF becomes active for a predetermined period in accordance with auto-refresh command AREF, output bits QA<13:0> of the refresh counter change in synchronization with the falling of clock signal CLK, and address bits RA<13:0> on the internal address bus change again in synchronization with the rising of clock signal CLK. Therefore, only in the row access operation of performing row selection or in performing the refresh operation, internal address bus 206 is charged and discharged. In the case where the row address signal lines are independent of the column address signal lines, the charging and discharging of internal address bus 206 do not occur even when the column address signal changes in the column access. Therefore, the power consumption can be reduced.

In the case where the internal address bus transfers both the row and column addresses, a signal produced by a logical OR between array activating signal RACT and column access activating signal CACT is applied to multiplexer 201 so that the address signal can be accurately transferred. In the local control circuit, the row decoder is in the latch state in accordance with row address enable signal RADE. Therefore, even if the block hit signal is activated in accordance with the column address signal, the row-related circuits are in the latch state, and the column address signal does not affect the row-related circuits.

Accordingly, in the case where internal address bus 206 transmits both the row and column address signals, the signal produced by the logical OR between array activating signal RACT and the column access activating signal made active when the read or write command is applied, is used as the switching control signal for multiplexer 201 instead of array activating signal RACT. Thereby, the charging and discharging of the internal address bus can likewise be reduced during the standby state, and the current consumption during the standby state can be reduced.

According to the ninth embodiment of the invention, as described above, when the refresh of the final memory block in the refresh sequence is completed, such an operation is merely required that the refresh address counter is reset to the initial value, and the refresh command is applied by the number of times required for refreshing the memory space regardless of the number of memory blocks. It is possible to suppress the increase in power consumption and the decrease in access efficiency. Further, even in the memory such as an embedded DRAM which includes the memory blocks variable in number depending on specifications, it is possible to accommodate for all the refresh cycles without a further additional circuit and change in circuit configuration. Thus, the circuit design efficiency can be improved, and a turn-around time can be reduced.

The internal address bus transmits the external row address signal for a predetermined period when the row active command is applied, and is fixed in voltage level by the refresh address signal in the operations other than the row access in the normal mode of operation. Therefore, charging and discharging of the internal address bus can be reduced during the standby state so that the current consumption can be reduced.

TENTH EMBODIMENT

Figure 59:
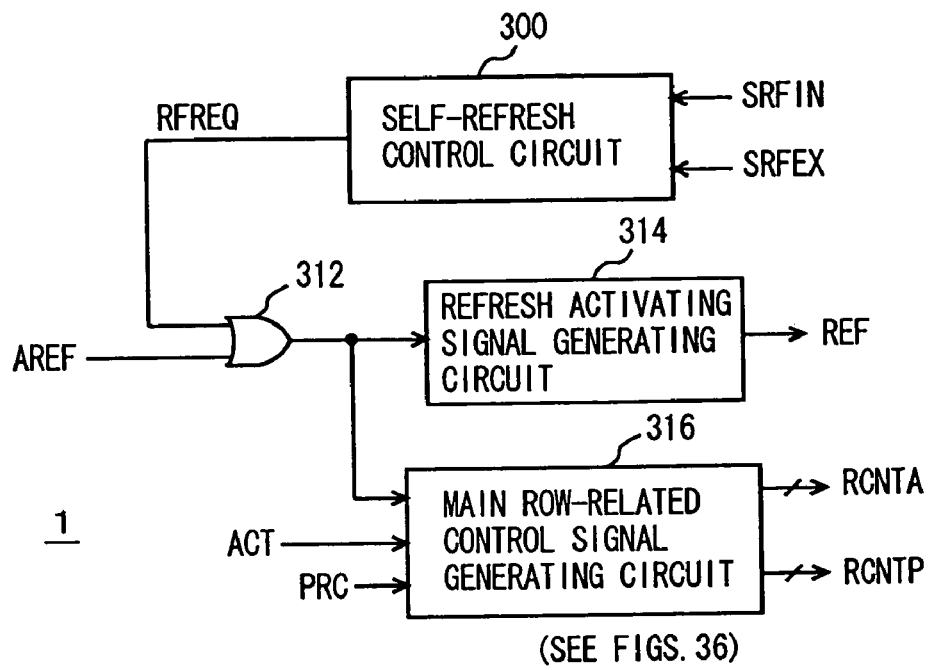
FIG. 59 schematically shows a structure of a main control circuit according to a tenth embodiment of the invention.

FIG. 59 schematically shows a structure of a main control circuit of a semiconductor integrated circuit device according to a tenth embodiment of the invention. In FIG. 59, main control circuit 1 includes: a self-refresh control circuit 300 which receives an externally applied self-refresh instructing signal (command) SRFIN and an externally applied self-refresh mode completion instructing signal SRFEX, and issues a refresh request signal RFREQ at predetermined time intervals; an OR circuit 312 which receives refresh request signal RFREQ applied from self-refresh control circuit 300 and auto-refresh instructing signal AREF; a refresh activating signal generating circuit 314 which produces refresh activating signal REF in accordance with the output signal of OR circuit 312; and a main-row-related control signal generating circuit 316 which receives the output signal of OR circuit 312, row active signal ACT and precharge instructing signal RPC, and produces main row-related control signal groups RCNTA and RCNTP each of a plurality of phases. Main-row-related control signal generating circuit 316 has substantially the same structure as that shown in FIG. 36.

Self-refresh control circuit 300 issues refresh request RFREQ at predetermined time intervals when the self-refresh mode is set in accordance with self-refresh instructing signal SRFIN when access is not made for a long time, e.g., in the sleep mode. Therefore, by utilizing the output signal of OR circuit 312 instead of auto-refresh instructing signal AREF in the ninth embodiment already described, it is possible to control the refresh operations in the self-refresh mode and the auto-refresh mode in a similar manner.

In the structure shown in FIG. 59, the word lines simultaneously selected in the auto-refresh mode are equal in number to those in the self-refresh mode. If the word lines simultaneously selected in the auto-refresh mode are different in number to those in the self-refresh mode, the block decoder may further be provided with a block address decoder for the self-refresh so that the block hit signal can be accurately produced in accordance with the number of the selected word lines in the respective operation modes. In this case, refresh activating signal generating circuit 314 must be configured such that a circuit for generating the refresh activating signal in the auto-refresh mode is independent of a circuit for generating the refresh activating signal in the self-refresh mode. Refresh activating signal generating circuit 314 is formed of latch circuits (transfer circuits), e.g., as shown in FIG. 36 or 41.

According to the tenth embodiment, as described above, the auto-refresh instructing signal and the refresh request signal that are generated at predetermined time intervals even in the self-refresh mode, are combined to produce the signal for controlling the refresh operation, and the effect similar to that of the ninth embodiment can be achieved even in the self-refresh mode.

By arranging the block decoders for the auto-refresh and the self-refresh separately from each other, with a part of the whole memory space used as a data holding region for the self-refresh, the refresh can be performed only for the data to be held. Thus, the number of times of the self-refresh operation performed in the self-refresh mode can be reduced.

ELEVENTH EMBODIMENT

Figure 60:
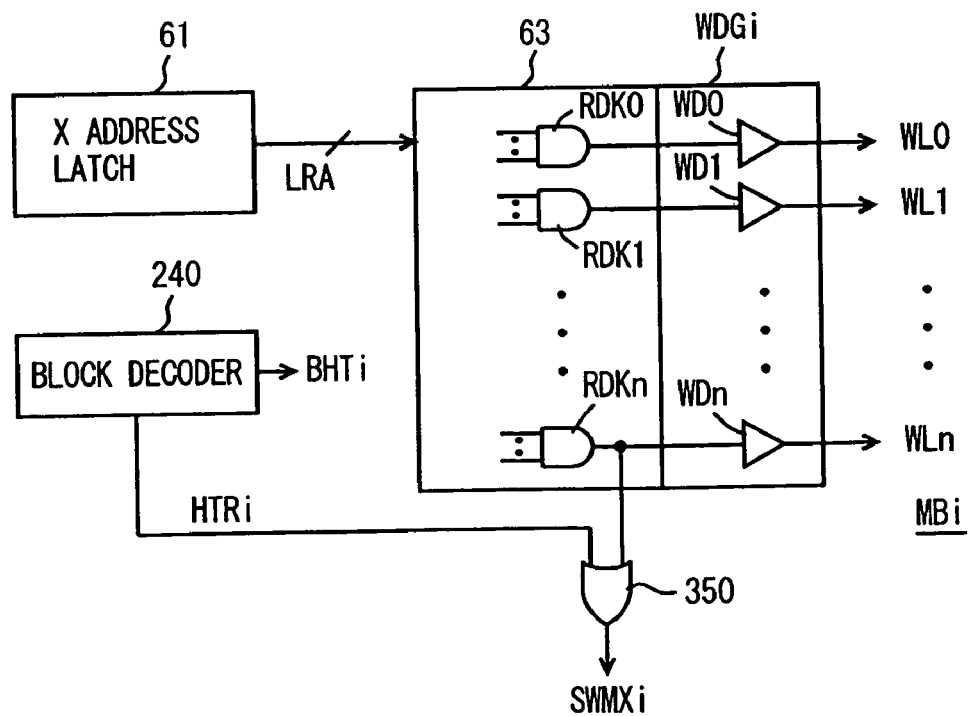
FIG. 60 schematically shows a structure of a local control circuit according to an eleventh embodiment of the invention.

FIG. 60 schematically shows a structure of a local control circuit of one memory block in a semiconductor memory device according to an eleventh embodiment of the invention. FIG. 60 shows a structure of the local control circuit for one memory block MBi.

In FIG. 60, the local control circuit includes: an X-address latch 61 for latching the internal address signal applied from an internal address bus (not shown); an X address decoder 63 which is activated when block hit signal BHTi applied from block decoder 240 is active, and performs the decode operation in accordance with an address signal LRA latched by X address latch 61; and a word line driver group WDGi which drives one of word lines WL0–WLn to the selected state in accordance with the output decode signal of X-address decoder 63.

X address decoder 63 includes row decode circuits RDK0–RDKn, which are provided corresponding to word lines WL0–WLn, respectively, and each of which decodes a predetermined combination of the bits of latched address signal LRA applied from X address latch 61. For each of row decode circuits RDK0–RDKn, a corresponding word line address is set by interconnection lines if latched row address signal LRA of X address latch 61 includes complementary address bits. In this case, each of row decode circuits RDK0–RDKn may be provided with a selector, and the word line address may be programmed by the select signal for each selector, similarly to the program decoder in the ninth embodiment already described.

Word line driver group WDGi includes word line drive circuits WD0–WDn, which are provided corresponding word lines WL0–WLn, for driving the corresponding word lines to the selected state in accordance with the output signals of corresponding row decode circuits RDK0–RDKn, respectively. Word lines WL0–WLn are variable in number.

The local control circuit further includes an OR circuit 350 which receives refresh mode block hit signal HTRi applied from corresponding block decoder 240 and the output signal of row decode circuit RDKn provided for the final word line (final refresh word line) in the refresh sequence. The output of OR circuit 350 is used as final word line refresh detection signal SWLXi in memory block MBi.

Therefore, even if the word lines arranged in this memory block MBi are variable and odd in number, for example, the refresh for the. final refresh word line can be detected reliably. The selected state of row decode circuit RDKn, which is provided for the final word line in the refresh operation, can be detected, and the refresh of the final word line in the memory block MBi can be detected. Based on a result of such detection, the count value of, e.g., 9-bit counter in the foregoing refresh counter for generating the refresh address is reset. Thereby, the number of the word lines included in one memory block can be set to an desired value, and the number of the memory blocks can also be determined desirably. Thus, the semiconductor memory device with any refresh cycle can be achieved without changing the circuit structure.

Figure 61:
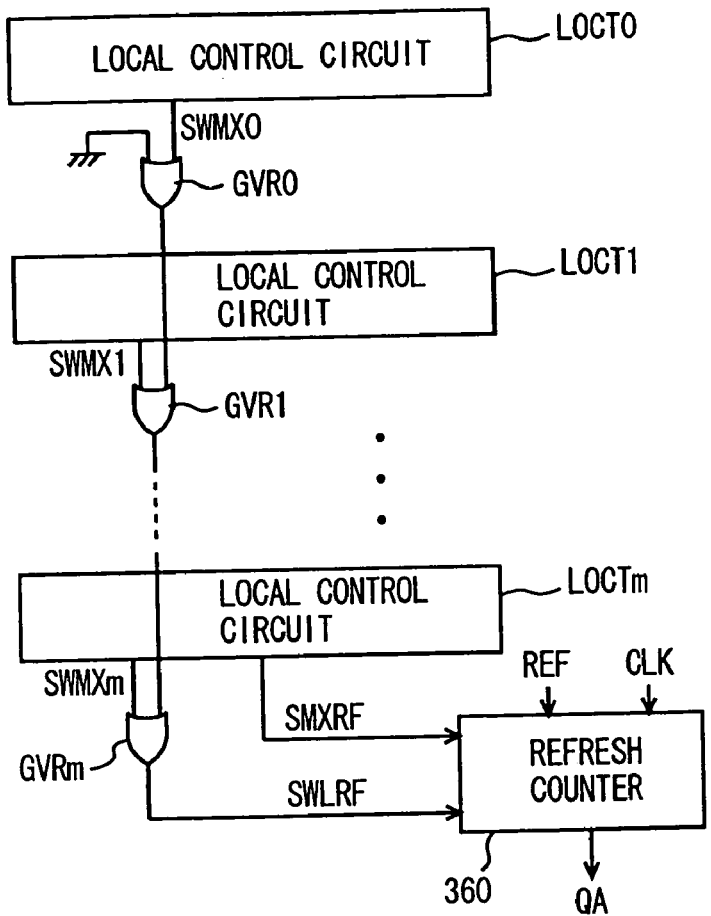
FIG. 61 schematically shows a structure of a refresh address reset portion according to an eleventh embodiment of the invention.

FIG. 61 schematically shows a structure of a portion for detecting the completion of refresh at the word line level in the eleventh embodiment. In FIG. 61, local control circuits LOCT0–LOCTm are arranged corresponding to the memory blocks (not shown), respectively. Drive gate circuits GVR0–GVRm are arranged corresponding to local control circuits LOCT0–LOCTm, respectively. These drive gate circuits GVR0–GVRm are formed of, e.g., OR circuits, and receive final word line refresh detection signals SWLX0–SWLXm applied from corresponding local control circuits LOCT0–LOCTm as well as the output signals of the drive gate circuits in the preceding stage, respectively. Drive gate circuit GVR0 provided for local control circuit LOCT0 receives the ground voltage on one input thereof.

The refresh block hit signal applied from local control circuit LOCTM, which is provided for the final memory block (final refresh block) in the refresh sequence, is applied as final block refresh detection signal SMXRF to a refresh counter 360. For refresh counter 360, the output signal of drive gate circuit GVRm arranged for the final refresh block is applied as main final word line refresh detection signal SWLRF.

In the structure shown in FIG. 61, when refresh is effected on word lines WL0–WLn in memory blocks MB0–MBm provided corresponding to local control circuits LOCT0–LOCTm, a final word line refresh detection signal SWMXa applied from the memory block under refreshing is activated, and the word line address of refresh counter 360 is reset via the paths of drive gate circuits GVR0–GVRm. In accordance with this resetting of word line address, the count value of the block address counter, which produces the block address designating a memory block, is incremented or decremented by one.

All local control circuits LOCT0–LOCTm have the same structure, and the structures thereof is similar to that in the ninth embodiment. The output signal of final refresh row decode circuit RDKn of the row decode circuit in X address decoder 63 is utilized as the final word line refresh detection signal. Therefore, the number of word lines per memory block can be set to any desired value. Moreover, the number of memory blocks can be set to any desired value. Any number of word lines may be arranged effectively for one memory block. Accordingly, arbitrary refresh cycles can be achieved. One memory block can be effectively formed of an odd number of word lines.

Figure 62:
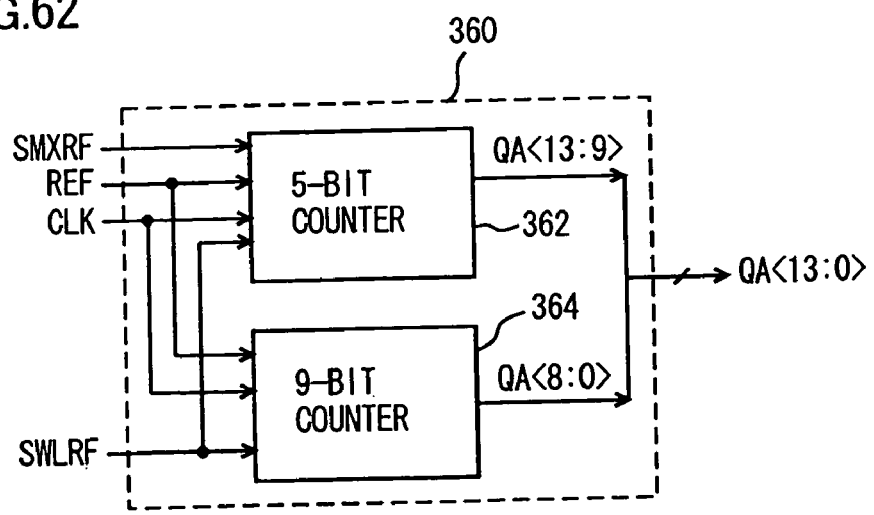
FIG. 62 schematically shows a structure of a refresh counter shown in FIG. 61.

FIG. 62 schematically shows a structure of refresh counter 360 shown in FIG. 61. In FIG. 62, refresh counter 360 includes: a 9-bit counter 364 which performs the count operation in accordance with refresh activating signal REF and clock signal CLK, and has a count value thereof reset in accordance with main final word line refresh detection signal SWLRF; and a 5-bit counter 362 which counts main final word line refresh detection signal SWLRG, and has a count value thereof reset in accordance with final block refresh detection signal SMXRF. 9-bit counter 364 produces address bits QA<8:0> specifying a refresh word line, and 5-bit counter 362 produces block address bits QA<13:9> specifying a refresh memory block.

In this structure shown in FIG. 62, refresh address bits QA<13:0> are produced. Refresh counter 360 has a structure not affected by a change in configuration of the memory blocks in the sub-memory array. 9-bit counter 364 increments or decrements its count value by one upon each activation of refresh activating signal REF in accordance with refresh activating signal REF and clock signal CLK, and the count value thereof is reset when main final word line refresh detection signal SWLRF is activated.

5-bit counter 362 performs the counting in accordance with final word line refresh detection signal SVLRF, refresh activating signal REF and clock signal CLK, and the count value thereof is reset in accordance with final block refresh detection signal SMXRF. Therefore, 5-bit counter 362 increments or decrements its count value by one upon each completion of the refresh of all the word lines in one memory block, and the count value of 5-bit counter 362 is reset when the refresh for all the memory blocks is completed.

Figure 63:
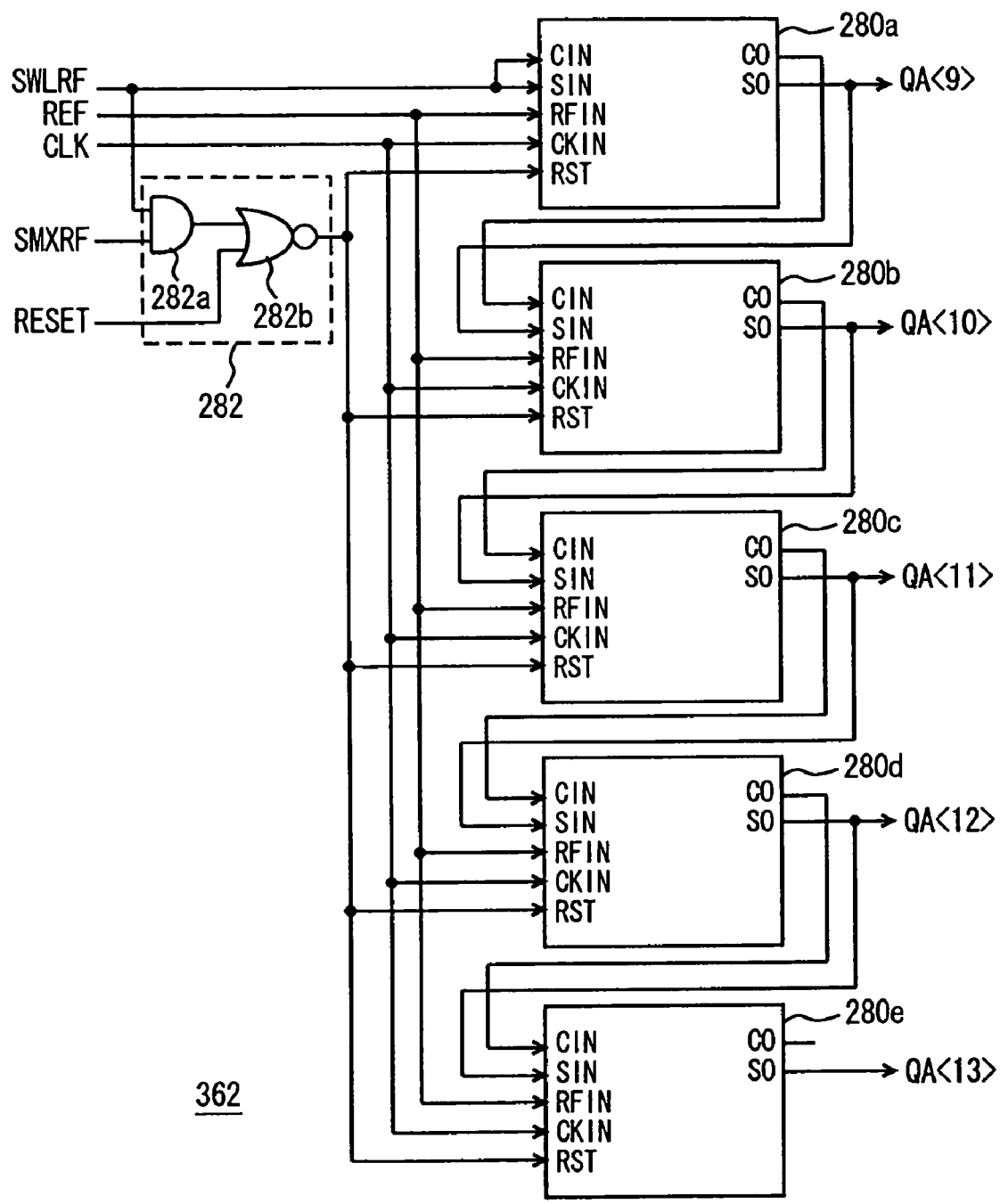
FIG. 63 schematically shows a structure of a 5-bit counter shown in FIG. 62.

FIG. 63 schematically shows a structure of 5-bit counter 362 shown in FIG. 62. 5-bit counter 362 shown in FIG. 63 has the same structure as 5-bit counter 272 shown in FIG. 53 except for that main final word line refresh detection signal SWLRF is used instead of carry signal CRY. In FIG. 63, therefore, portions corresponding to those in the structure of 5-bit counter 272 shown in FIG. 53 are allotted with the same reference numerals, and description thereof is not repeated. The operation of the 5-bit counter shown in FIG. 63 is similar to that represented in the timing chart of FIG. 52, except for that main final word line refresh detection signal SWLRF is used instead of carry signal CRY.

Main word line refresh detection signal SWLRF is held at H-level while refresh activating signal REF is active. In the timing chart of FIG. 57, therefore, main word line refresh detection signal SWLRF is replaced with carry signal CRY, whereby the count value of 5-bit counter 362 can be incremented upon completion of refreshing of the memory block in accordance with the main word line refresh detection signal.

In the reset operation of 5-bit counter 362, the refreshing is effected on the final refresh word line when final word line refresh detection signal SWLRF is active. During this period, therefore, the count value can be updated in synchronization with the falling of clock signal CLK. In the timing chart of FIG. 52, carry signal CRY may be replaced with main word line refresh detection signal SWLRF, which in turn attains H-level in synchronization with refresh activating signal REF, whereby the count operation and reset operation similar to those of the 5-bit counter in the ninth embodiment can be achieved.

Figure 64:
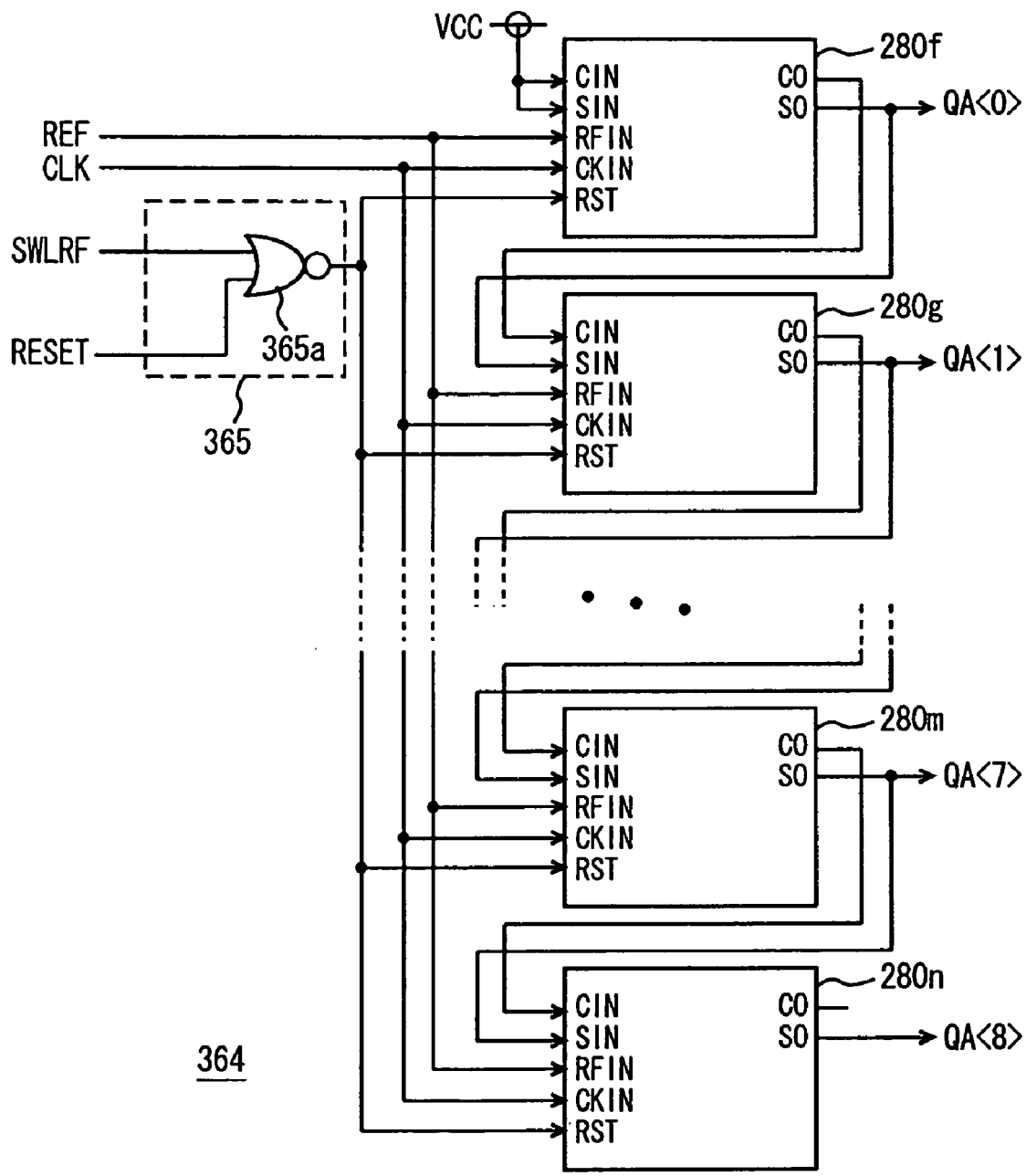
FIG. 64 schematically shows a structure of a 9-bit counter shown in FIG. 62.

FIG. 64 schematically shows a structure of 9-bit counter 364 shown in FIG. 62. In FIG. 64, 9-bit counter 364 includes nine 1-bit arithmetic circuits 280f–280n having inputs and outputs cascaded sequentially. 1-bit arithmetic circuits 280f–280n produce count values QA<0>–QA<8> of nine bits. 1-bit arithmetic circuits 280f–280n have structures similar to those shown in FIGS. 54–56, and each count value is updated in response to the change from H-level to L-level of the signal on output node SO of the 1-bit arithmetic circuit in the preceding stage.

1-bit arithmetic circuit 280f in the first stage receives power supply voltage VCC on inputs CIN and SIN commonly. A reset circuit 365 is formed of an NOR circuit 365a receiving main final word line refresh detection signal SWLRF and reset signal RESET.

Figure 65:
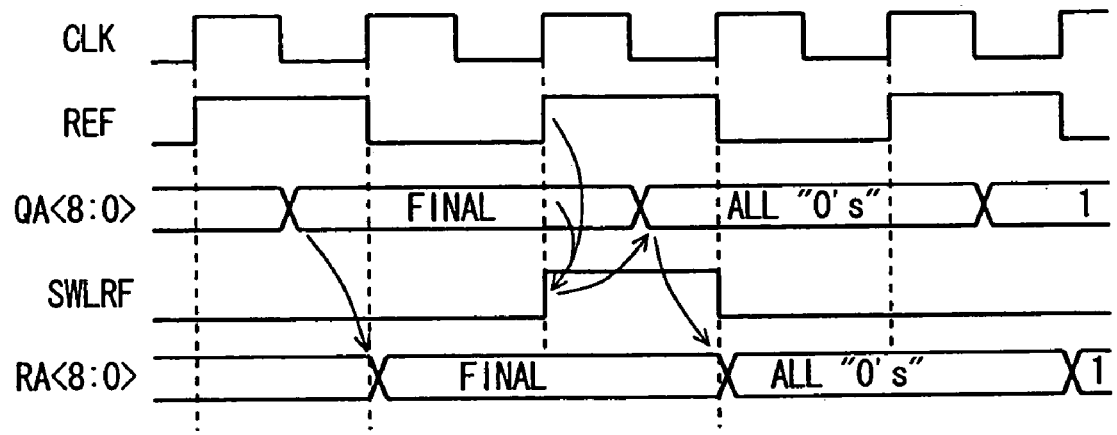
FIG. 65 is a timing chart representing an operation for resetting of a 9-bit counter shown in FIG. 64.

FIG. 65 is a timing chart representing an operation for resetting of the 9-bit counter shown in FIG. 64. Referring to FIG. 65, brief description will now be given on the operation of resetting 9-bit counter 364 shown in FIG. 64.

An auto-refresh command is applied, and refresh activating signal REF is activated. In synchronization with the falling of clock signal CLK, count value QA<8:0> of 9-bit counter 364 changes to a final value FINAL. The count value of 9-bit counter 364 is transmitted as row address bits RA<8:0> to each memory block in response to the rising of clock signal CLK. In accordance with this refresh activating signal, therefore, the refresh is effected on the word line immediately preceding the final refresh word line.

When the auto-refresh command is applied again to activate refresh activating signal REF, the refresh is effected on the final refresh word line in accordance with final value FINAL. While the final refresh word line is being refreshed, the final word line refresh detection signal SWLRF is active, and output signal of reset circuit 365 is at L-level so that all the count values of 1-bit arithmetic circuits 280f–280n are reset to "0". This reset count value of all "0's" is output in synchronization with the falling of clock signal CLK. When the refresh for the final refresh word line is completed, row address signal RA of the first refresh word line address (0 . . . 0) is transmitted.

Therefore, even in the case where any number of word lines are arranged in one memory block, when the refresh for the final refresh word line is detected, the refresh address counter is reset in the same cycle, and the refresh word line address is initialized. In the next refresh operation, the address of the leading word line is designated in accordance with this initial value.

For the block address, similar operations are performed as follows. When both final block refresh detection signal SMXRF and final refresh word line detection signal SWLRF attain H-level, count value QA<13:9> for the block address is initialized in the same cycle. Therefore, even in the case where the memory blocks as well as the word lines in the memory block are arbitrary in number, the word lines in the whole memory space can be refreshed without applying an extra auto-refresh command.

In the structures shown in FIGS. 63 and 64, the refresh address is incremented, and the memory block address is also incremented in response to each execution of the refresh. However, a decrement type address counter may be used, the count value can be reset to the maximum value by using similar structures.

In the case where word lines WL have a hierarchical word line structure having main word line MWL and sub-word lines SWL, the refreshing can be effected on any desired number of word lines in a similar manner as described below.

Figure 66:
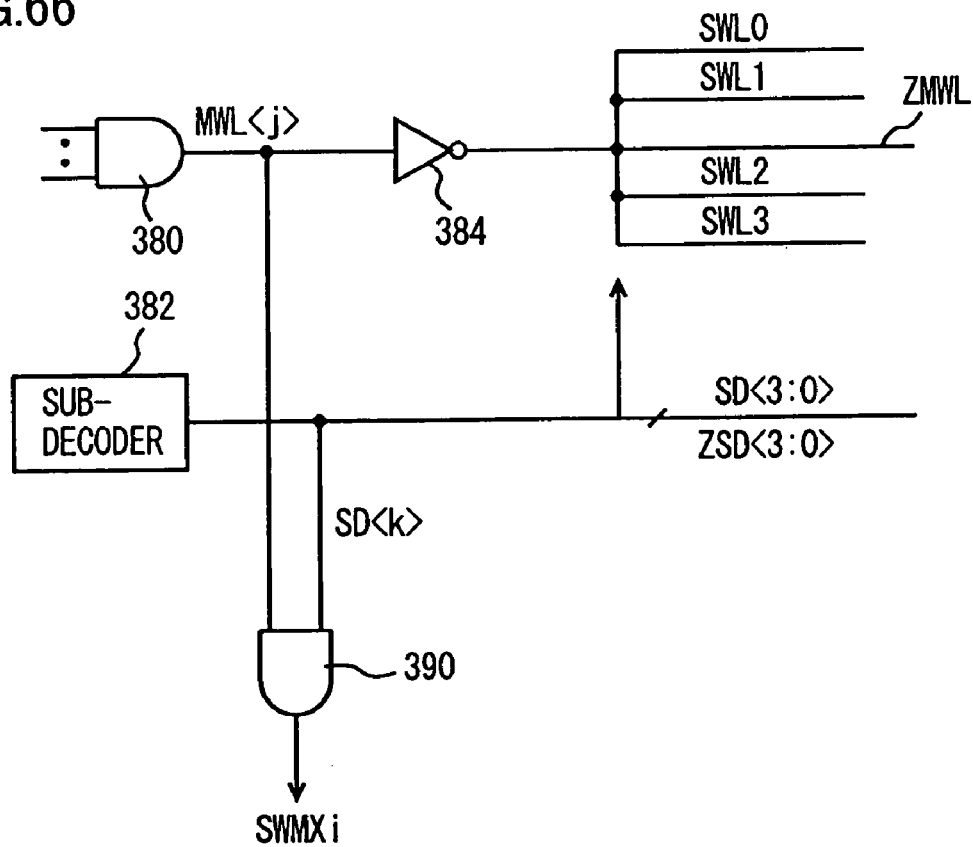
FIG. 66 schematically shows a modification of an eleventh embodiment of the invention.

As shown in FIG. 66, it is now assumed that a four-way hierarchical word line structure is employed in which four sub-word lines SWL0–SWL3 are provided for one main word line ZMWL. A main word line ZMWL is selected by a main word line decode circuit 380, and is driven to the selected state in accordance with the output signal of main word line decode circuit 380. Four sub-word lines SWL0–SWL3 are designated by sub-decode signals SD<3:0> and ZSD<3:0> applied from a sub-decoder 382 for decoding row address RA<1:0> of 2 bits. For each of these sub-word lines SWL0–SWL3, a sub-word line driver (not shown) is arranged, and one of four sub-word lines SWL0–SWL3 is driven to the selected state in accordance with sub-decode signals SD<3:0> and ZSD<3:0>.

In the case of the hierarchical word line structure as shown in FIG. 66, a final word line refresh detection signal SWLXi is produced from an AND circuit 390, which receives an output signal MWL<j> of main word line decode circuit 380 and a specific sub-decode signal SD<k> applied from sub-decoder 382. Therefore, one of sub-word lines SWL0–SWL3 can be designated as the final refresh word line, and the number of word lines to be refreshed for final refresh main word line ZMWL can be set to any desired number between one and four inclusive. For one memory block, therefore, the number of word lines can be selectively set to $4n$, $4n+1$, $4n+2$ and $4n+3$, and the refresh operation can be performed without applying an extra refresh command, regardless of the number of word lines.

The hierarchical word line structure may be an eight-way hierarchical word line structure in which eight sub-word lines are provided for one main word line. Even in this case, a similar configuration can be employed so that the final refresh sub-word lines connected to the final refresh main word line can be detected to produce final word line refresh detection signal SWMi.

According to the eleventh embodiment of the invention, as described above, the final refresh word line at the word line level is detected, refresh address counter producing the refresh word line address is reset in accordance with the final refresh word line detection signal, and the refresh for the final memory block is detected in accordance with the same. Through these operations, the block address designating a memory block is reset to the initial value. The memory blocks can be any in number, and the refresh can be accurately performed in the structure in which any desired number of word lines are provided per memory block without making any change in the circuit structure.

TWELFTH EMBODIMENT

Figure 67:
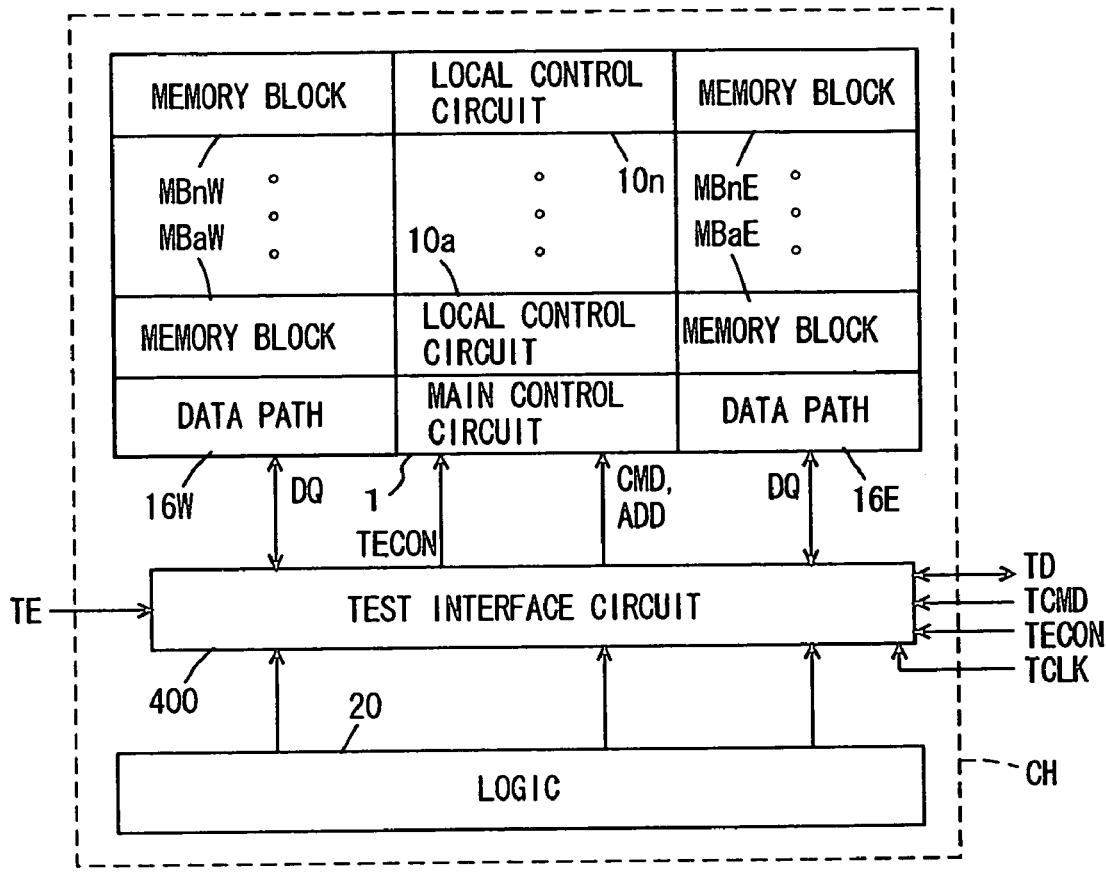
FIG. 67 schematically shows a whole structure of a semiconductor integrated circuit device according to a twelfth embodiment of the invention.

FIG. 67 schematically shows a whole structure of a semiconductor integrated circuit device according to a twelfth embodiment of the invention. The semiconductor integrated circuit device shown in FIG. 67 differs in structure from the device shown in FIG. 2 in the point that a test interface circuit 400 is arranged between logic 20 and the semiconductor memory device. When test mode instructing signal TE is active, test interface circuit 400 receives test clock signal TCLK, test data TD, test command TCMD and test control signal TECON externally applied, and transfers a command CMD, data QD and address signal ADD to the semiconductor memory device in synchronization with the test clock signal.

When test mode instructing signal TE is active, logic 20 is isolated from semiconductor memory device. In the test operation, test interface circuit 400 receives signal/data from a test apparatus (referred to as a "tester" hereinafter) through pin terminals arranged for the logic. In the test operation, the connection path of the multiplexer arranged for the pin terminals is switched from the logic to the test interface circuit to allow the tester to make a direct access to the semiconductor memory device.

By using test interface circuit 400 for testing the semiconductor memory device, an external tester can directly access the semiconductor memory device for testing the semiconductor memory device, and dynamic characteristics and others of the semiconductor memory device can be tested more accurately than in the test performed via the logic.

Test control signal TECON is asynchronous to the test clock signal TCLK, and is applied to main control circuit 1 to adjust the activation timing of row-related control signal RCNT generated from the main control circuit when measuring the internal operation characteristics. Test interface circuit 400 uses the pin terminals arranged for logic 20 in the test operation. Even if signals used in the test increase in number, the external tester can sufficiently apply the signals and data to test interface circuit 400 because pin terminals arranged for logic 20 are 100 or more in number.

In the structure shown in FIG. 67, data read from the semiconductor memory device is shown to be transferred to logic 20 via test interface circuit 300. However, the data read from the semiconductor memory device is commonly applied to test interface circuit 400 and logic 20 in practice. Upon reading of data in the normal operation, the load of the data transfer path from the semiconductor memory device to logic 20 is reduced to achieve fast data transfer.

The semiconductor memory device has the same structure as that shown in FIG. 2. Portions corresponding to those shown in FIG. 2 are allotted with the same reference numerals, and description thereof is not repeated.

Figure 68:
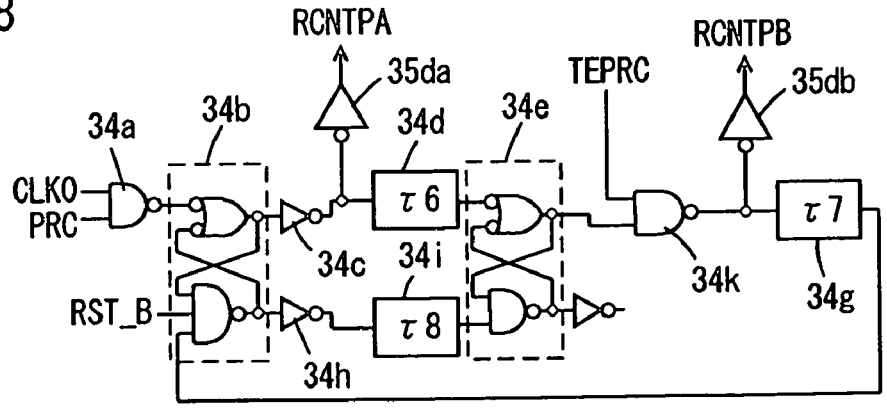
FIG. 68 shows a structure of a main precharge control circuit according to the twelfth embodiment of the invention.

FIG. 68 shows a structure of main control circuit 1 according to the twelfth embodiment of the invention. FIG. 68 shows a structure of main precharge control circuit 34 for producing main precharge control signals RCNTPA and RCNTPB. The structure of main precharge control circuit 34 shown in FIG. 68 corresponds to the circuit structure shown in FIG. 12A In FIG. 68, an NAND circuit 34$k$ receiving the output signal of flip-flop 34$e$ and test precharge control signal TEPRC is arranged at a stage preceding the buffer circuit 35$db$ producing main precharge activating signal RCNTPB. Other structures are the same as those shown in FIG. 12A. Corresponding portions are allotted with the same reference numerals, and description thereof is not repeated.

Test precharge control signal TEPRC is a control signal asynchronous to clock signal CLK0. Clock signal CLK0 is produced in accordance with test clock signal TCLK in the test mode operation. When test precharge control signal TEPRC is at L-level, the output signal of NAND circuit 34$k$ is at H-level, and main precharge activating signal RCNTPB is at L-level. Accordingly, as is clear from the structure of local control circuit shown in FIG. 18, latch signal ACTLAT maintains H-level, and each row-related control signal holds the corresponding main block in the selected state.

When test precharge control signal TEPRC attains H-level, NAND circuit 34$k$ operates as an inverter to produce main precharge activating signal RCNTPB in accordance with the output signal of flip-flop 34$e$ at the preceding stage. When main precharge activating signal RCNTPB is activated, each row-related control signal is deactivated/activated as shown in FIG. 18, and precharge is carried out on the corresponding memory block. Accordingly, the precharge timing of the memory block can be set in accordance with this test precharge control signal TEPRC, and a so-called RAS precharge time tRP and others can be measured.

Figure 69:
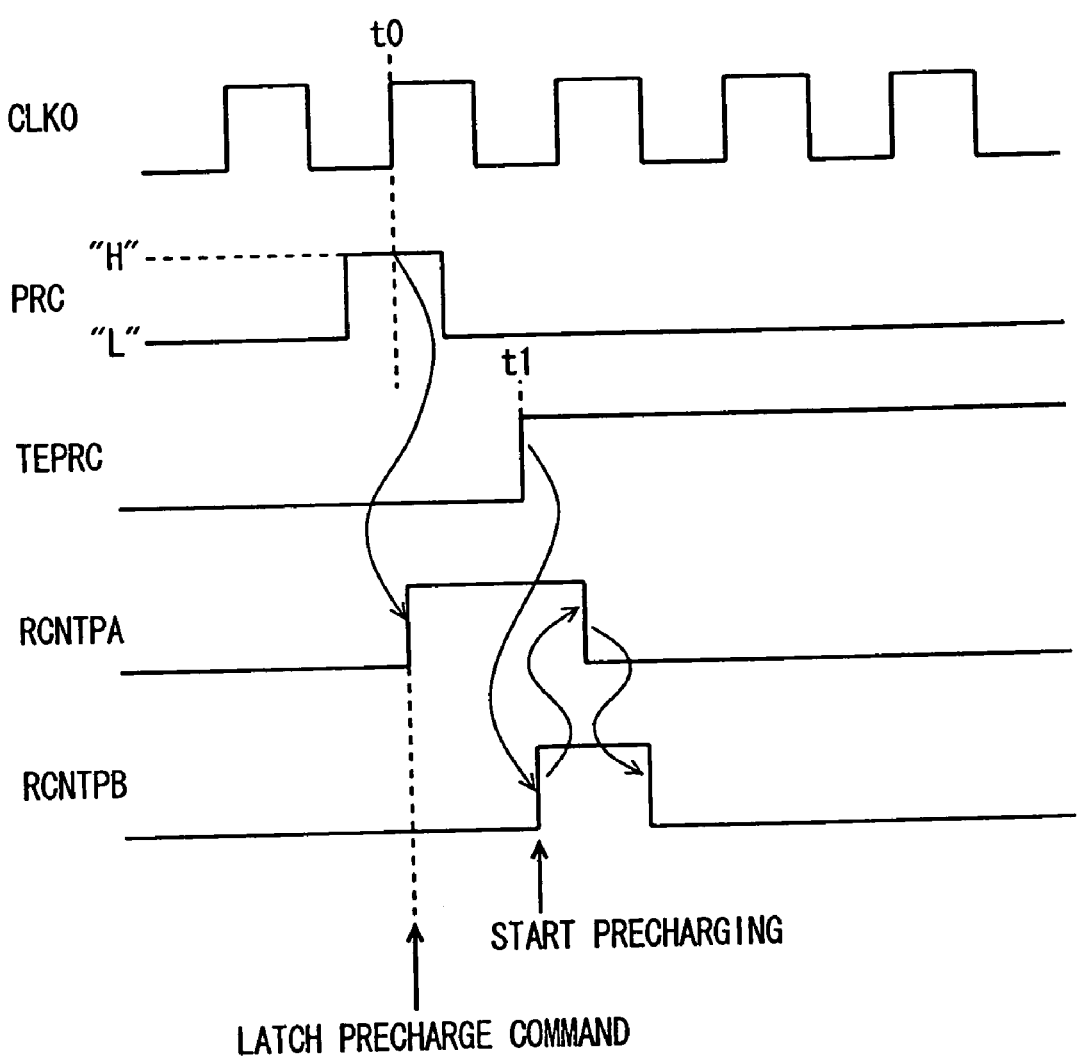
FIG. 69 is a timing chart representing an operation of a main precharge control circuit shown in FIG. 69.

FIG. 69 is a timing chart representing an operation of main precharge control circuit 34 shown in FIG. 68. Referring to FIG. 69, description will now be given on the operation of the circuits shown in FIG. 68. It is assumed here that the local row control circuit has the structure shown in FIG. 18.

When precharge command (precharge instructing signal) PRC is applied, and clock signal CLK0 rises to H-level at a time t0, the output signal of NAND circuit 34$a$ attains L-level, and flip-flop 34$b$ is set so that main precharge activating signal RCNTPA applied from inverter 35$da$ attains H-level. When a delay time τ6 of delay circuit 34$d$ elapses, flip-flop 34$e$ is set. At this point in time, test precharge control signal TEPRC is at L-level, the output signal of NAND circuit 34$k$ is at H-level and main precharge activating signal RCNTPB maintains L-level.

When clock signal CLK0 rises to H-level at time t0, the precharge command is merely latched, and the precharging of the corresponding memory block is not yet performed. Thus, even when internal precharge control signal PRCA rises to H-level in the structure of the local row-related control circuit shown in FIG. 18, latch signal ACTLAT maintains H-level, and the corresponding memory block is in the selected state.

As will be described later, block hit signal BHT may be kept in the latched state while main precharge activating signal RCNTPA is at H-level, or may be driven to the deselected state in accordance with the block address signal.

When test precharge control signal TEPRC rises to H-level at a time t1, the output signal of NAND circuit 34k shown in FIG. 68 attains L-level so that main precharge activating signal RCNTPB applied from inverter 35db attains H-level. In response to the activation of main precharge activating signal RCNTPB, internal precharge control signal PRCB shown in FIG. 18 attains H-level, and each row-related control signal returns to the standby state. Thus, the precharge operation is performed in the corresponding memory block in response to the rising of test precharge control signal TEPRC at a time t1.

Accordingly, by applying test precharge control signal TEPRC asynchronously to clock signal CLK0, the timing for internally starting the precharging operation can be desirably set, and an operation period shorter than one clock cycle can be measured. Measurement and test of the operation period will now be described more specifically.

Figure 70:
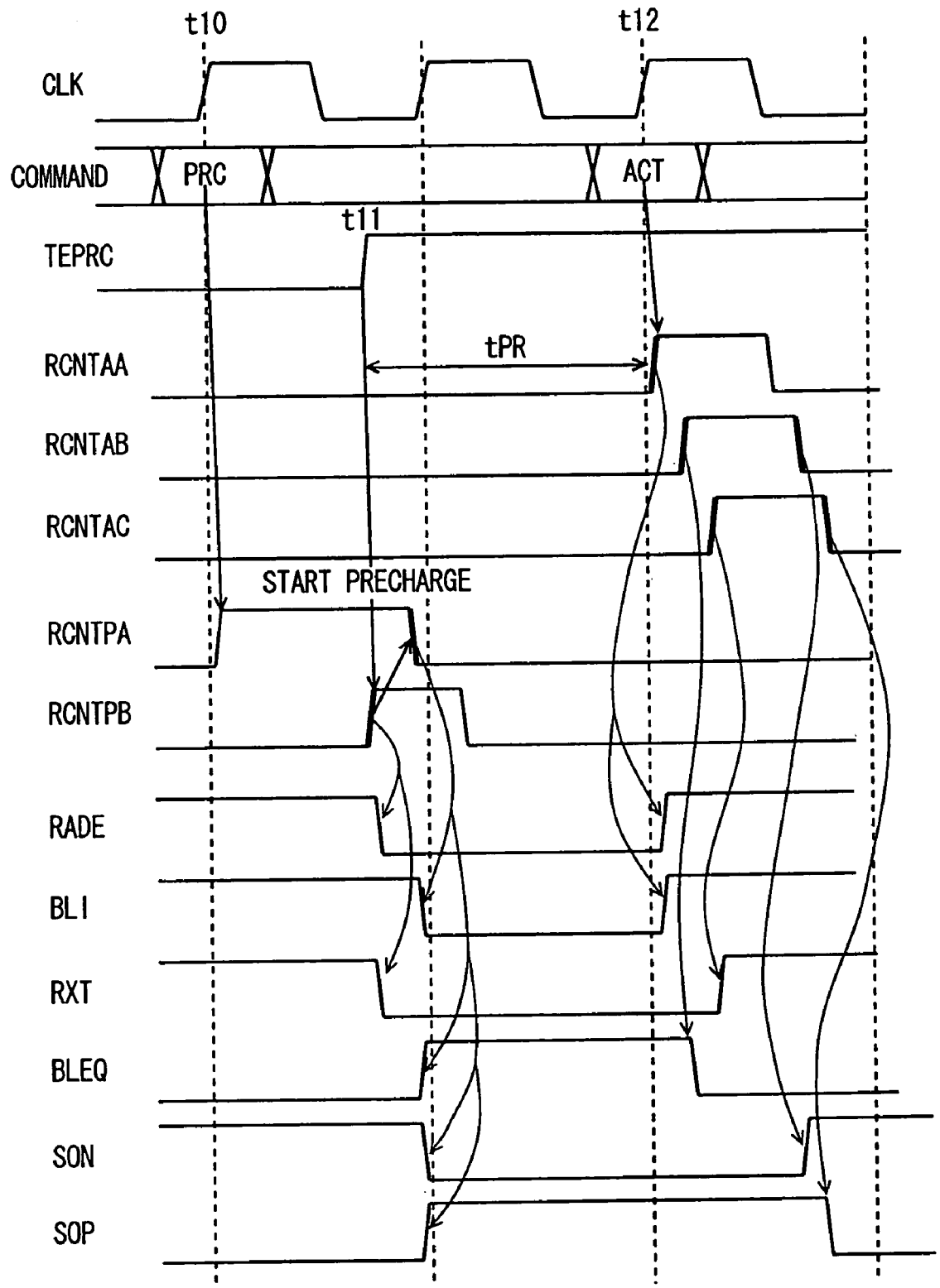
FIG. 70 is a timing chart representing changes in row-related control signals in measuring of an RAS precharge time when using the main precharge control circuit shown in FIG. 69.

FIG. 70 is a timing chart representing an operation for testing RAS precharge time tRP. Referring to FIG. 70, an operation of measuring the RAS precharge time will now be described.

With test precharge control signal TEPRC maintained at L-level, precharge command PRC is applied. In response to the rising of clock signal CLK0 at a time 10, precharge command PRC is latched, and main precharge activating signal RCNTPA is driven to H-level. Since test precharge control signal TEPRC is at L-level, main precharge activating signal RCNTPB maintains L-level even after elapsing of a predetermined time.

When test precharge control signal TEPRC is set to H-level at time t11, main precharge activating signal RCNTPB attains. H-level, and the precharge starts in the corresponding memory block. In the local row-related control circuit shown in FIG. 18, row decoder enable signal RADE and word line drive timing signal RXT attains L-level. When a predetermined time (delay time τ7) elapses, flip-flop 34b is reset, and main precharge activating signal RCNTPA falls to L-level. In response to the falling of main precharge activating signal RCNTPA, latch signal ACTLAT is reset. In the local row-related control circuit shown in FIG. 18, gate circuits 69–73 are initialized, and bit line isolation instructing signal BLI and sense amplifier activating signal SON fall from H-level to L-level, and bit line precharge/equalize instructing signal BLEQ and sense amplifier activating signal SOP rise from L-level to H-level.

After test precharge control signal TEPRC rises to H-level, row active command ACT is applied. When clock signal CLK rises at a time t12, main row activating signal RCNTAA rises to H-level in accordance with row active command ACT, and subsequently main row activating signals RCNTAB and RCNTAC are successively driven to H-level. In accordance with main row activating signal RCNTAA, internal row control signal ACTA is set to H-level, and row decoder enable signal RADE and bit line isolation instructing signal BLI attain H-level.

In accordance with internal row control signal ACTA and main row activating signal RCNTAB, internal row control signal ACTB becomes active, and bit line equalize instructing signal BLEQ falls to L-level so that the equalize/precharge operation is completed.

In accordance with main row activating signal RCNTAC and internal row control signal ACTB, internal row control signal ACTC is activated, and latch signal ACTLAT is latched at H-level. Word line drive timing signal RXT attains H-level to drive the selected word line to the selected state.

Then, sense amplifier activating signals SON and SOP become active in accordance with the falling of main row activating signals RCNTAB and RCNTAC.

The RAS precharge time is a time from start of the precharging at time t11 to the row activation at time t12. By adjusting the time of rising of test precharge control signal TEPRC to H-level, the RAS precharge time can be changed. The RAS precharge time is shorter than one clock cycle of clock signal CLK0. By merely adjusting the rising timing of test precharge control signal, the RAS precharge time can be changed. Accordingly, it is not necessary to apply successively the precharge command and the row active command in accordance with a fast clock signal for the test of RAS precharge time, and a sufficiently short RAS precharge time can be measured with a slow tester.

The minimum RAS precharge time is determined as follows. An active command is applied, a read command is then applied, storage data of the memory cell is compared with an expected read value, and the RAS precharge time immediately before the test cycle, in which a read failure occurs, is determined as the minimum RAS precharge time.

Figure 71:
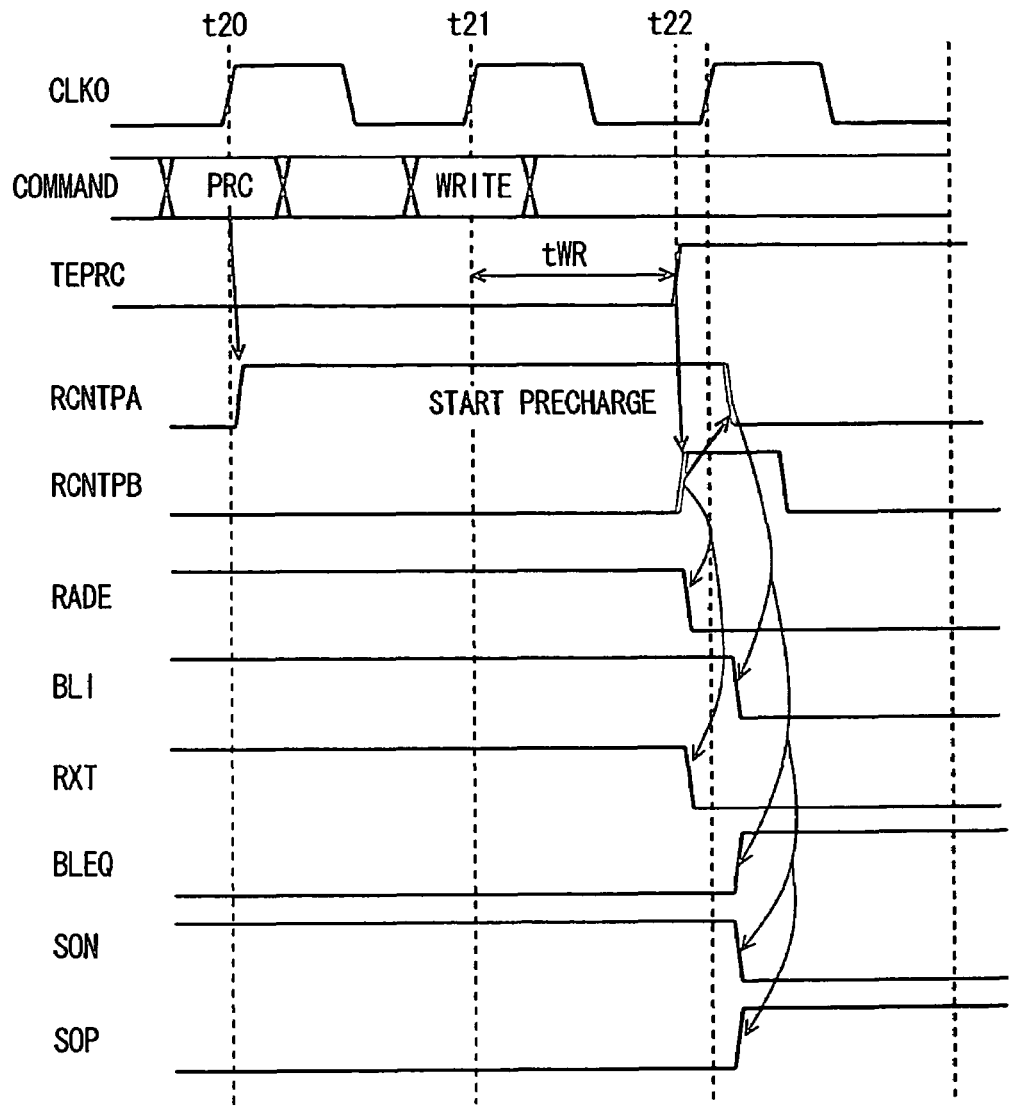
FIG. 71 is a timing chart representing changes in row-related control signals in measuring of a write cycle time when using the main precharge control circuit shown in FIG. 69.

FIG. 71 represents operation waveforms in the test of a write cycle time tWR. Referring to FIG. 71, description will now be given on the operation of testing the write cycle time tWR.

Test precharge control signal TEPRC is maintains at L-level, and precharge command PRC is applied. When clock signal CLK0 rises to H-level at a time t20, flip-flop 34b shown in FIG. 68 is set in accordance with precharge command PRC, and main precharge activating signal RCNTPA is driven to H-level. Main precharge activating signal RCNTPB maintains L-level even after elapsing of delay time τ6 of delay circuit 34d because test precharge control signal TEPRC is at L-level.

Then, a write command WRITE instructing data writing is applied. This write command is taken in when clock signal CLK0 rises at a time t21, and the data write operation is executed.

After this data writing, test precharge control signal TEPRC rises to H-level at a time t22, main precharge activating signal RCNTPB is activated, and internal precharge control signals PRCA and PRCB shown in FIG. 18 are successively activated to perform the precharge operation. Thus, similarly to the RAS precharge time test already described, row-related control signals RADE, RXT, SON and SOP are deactivated, bit line isolation instructing signal BLI is raised to H-level, bit line equalize instructing signal BLEQ is set to H-level, and the bit line is precharged and equalized to the intermediate voltage level.

At a time t21, the write command is internally taken in synchronization with clock signal CLK0 to start the data write operation, and write cycle time tWR is defined to be a time period between time t21 and a subsequent time t22, at which test precharge control signal TEPRC rises to H-level. If the precharge operation starts before data is fully written into the selected memory cell, the storage node potential of the memory cell is at an intermediate voltage level different from the power supply voltage level and the ground voltage level, or at the voltage level corresponding to the storage data of the memory cell before the writing. Therefore, in the measurement of the write cycle time, data at a logical level different from the storage data of a memory cell is written in the memory cell, and the memory cell is then returned to the precharge state in accordance with test precharge control signal TEPRC. Thereafter, the memory cell data is read out to and is compared with the expected read data. Thus, it can be determined whether the data writing is performed accurately or not. In this manner, the minimum write cycle time can be measured.

In the operation of measuring (testing) write cycle time tWR as well, test precharge control signal TEPRC is applied asynchronously to clock signal CLK0, whereby the write cycle time tWR can be set to a value independent of clock signal CLK0. Accordingly, it is not necessary to apply successively the precharge command and the write command in accordance with a fast clock signal in measuring write cycle time tWR. A sufficiently short write cycle time can be measured with a slow tester operating in accordance with a slow clock signal. In this case, it is merely required to activate test precharge control signal TEPRC by utilizing a delay circuit in a tester upon application of the write command, and the measurable time of write cycle time tWR can be reduced to a minimum measurable delay time of the tester. This holds for the measuring of the RAS precharge time.

Now, description will now be given on the structure in the case of latching block hit signal BHT in the test. For example, as shown in FIGS. 18 and 24, a latch circuit 60d is arranged for local precharge control signal PRCA. Therefore, when main precharge activating signal RCNTPA attains H-level, block hit signal BHT is at H-level according to the current block address, and the local precharge control signal PRCA is set to H-level in the selected memory block. In this state, even when block hit signal BHT attains L-level in accordance with the change in block address signal, latch circuit 60d holds the latch state, so that local precharge control signal PRCA maintains H-level.

For example, latch circuit 60 for producing local precharge control signal PRCB can produce local precharge control signal PRCB in accordance with main precharge activating signal RCNTPB as shown in FIG. 18. Accordingly, when main precharge activating signal RCNTPB rises to H-level in accordance with test precharge control signal TEPRC, local precharge control signal PRCB attains H-level, and the precharge operation is performed in the corresponding memory block.

When main precharge activating signal RCNTPA falls to L-level, local precharge control signal PRCA attains L-level regardless of the state of block hit signal BHT, and the precharge operation is performed on the bit line peripheral circuits. In this test, therefore, it is not particularly required to latch block hit signal BHT.

In this test, however, block hit signal BHT may be latched at the selected state while main precharge activating signal RCNTPA is at H-level so that the state of the internal local precharge control signals can be reliably changed in accordance with the change in main precharge activating signal RCNTPA (the structure for this arrangement will be described later). In this case, even with the structure employing main precharge control signal RCNTPA, which is asserted at a L-level, internal circuitry can be accurately returned to the precharge state. Further, even if a latch circuit has a structure different from those shown in FIGS. 18 and 24, the precharging of the memory block can be controlled in accordance with test precharge control signal TEPRC in the test operation.

Figure 72:
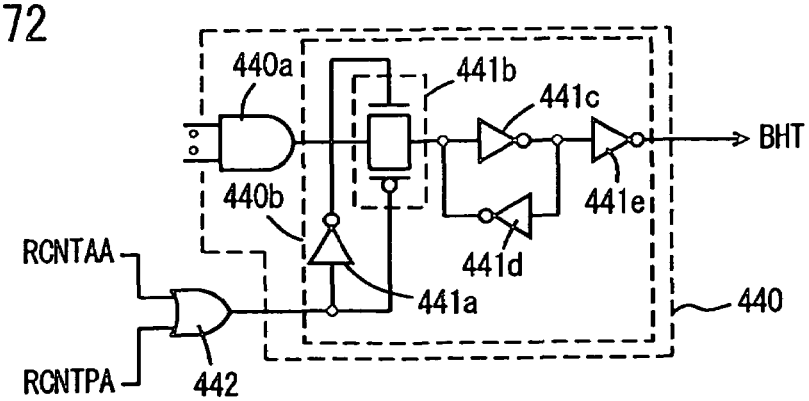
FIG. 72 shows, by way of example, a structure of the block decoder according to the twelfth embodiment of the invention.

FIG. 72 schematically shows, by way of example, a structure of a block decoder employed in the twelfth embodiment of the invention. In FIG. 72, block decoder 440 includes a decode circuit 440a which receives the block address signal asynchronously to the clock signal, and a latch circuit 440b which takes in and latches the output signal of decode circuit 440a in accordance with the main row-related activating signal.

Latch circuit 440b enters the latch state or the through state in accordance with the output signal of an OR circuit 442, which receives main row-related activating signal RCNTAA and main precharge activating signal RCNTPA.

Latch circuit 440b includes: an inverter 441a which inverts the output signal of OR circuit 442; a transfer gate 441b which is selectively turned on to pass the output signal of decode circuit 440a in response to the output signals of inverter 441b and OR circuit 442; an inverter 441c which inverts the signal passed through transfer gate 441b; an inverter 441d which inverts the output signal of inverter 441c, for transmission to an input of inverter 441c; and an inverter 441e which inverts the output signal of inverter 441c to produce block hit signal BHT.

In the structure of block decoder 440 shown in FIG. 72, when main precharge control signal RCNTPA is at H-level, the output signal of OR circuit 442 is at H-level so that transfer gate 441b is off, and latch circuit 440b enters the latch state. The block address signal is applied asynchronously to the clock signal as already described, and the output signal of the row decode circuit is in the definite state in accordance with the received block address signal when the clock signal rises (see FIG. 19).

Thereafter, latch circuit 440b enters the latch state when main precharge control signal RCNTPA is activated in accordance with the precharge command. Even if the test precharge control signal TEPRC is at L-level during the test, block hit signal BHT can be reliably held in the selected state, and the precharge timing for the designated memory block can be adjusted without an influence due to a change, which may occur in address signal. Accordingly, even in the case where the test precharge control signal TEPRC is maintained at L-level for a long time, as is done, e.g., for measuring write cycle time tWR, the precharge can be accurately effected on the corresponding memory block.

In the case where the precharge activating signal is applied commonly to the memory blocks of one bank, the precharge operation is effected on the selected memory block, and the latch circuit is not particularly needed.

Main row activating signal RCNTAA is used for the latch control of block decoder 340 for the reason that block hit signal BHT must be latched similarly in the operation of testing the timing of row-related control signals.

Figure 73:
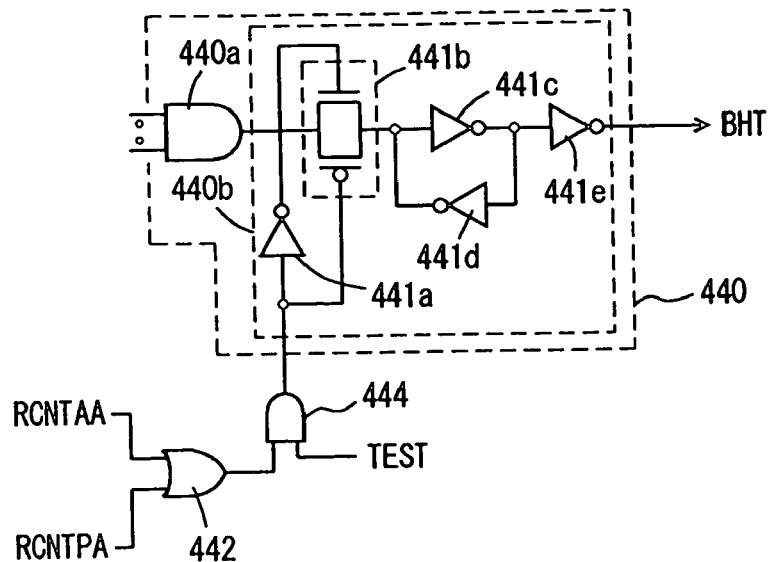
FIG. 73 shows a modification of a block decoder.

FIG. 73 shows a structure of a modification of the block decoder. In FIG. 73, block decoder 440 has the same structure as that shown in FIG. 72, and includes block decode circuit 440a for decoding the block address signal, and latch circuit 440b for selectively latching the output signal of block decode circuit 440a.

For controlling the latch operation of block decoder 440, there is provided OR circuit 442 which receives main row-related activating signals RCNTAA and RCNTPA, and an AND circuit 444 which receives the output signal of OR circuit 442 and test mode instructing signal TEST, and controls on/off of the transfer gate of latch circuit 440b.

Test mode instructing signal TEST is activated when performing a test related to the precharge operation. This test mode instructing signal TEST may be externally applied, or may be activated in test interface circuit 400 in accordance with a command applied from an external tester.

When test mode instruction signal TEST is at L-level in the structure shown in FIG. 73, the output signal of AND circuit 44 is always at L-level, and transfer gate 441b is always conductive, so that latch circuit 440b is in the through state. In this state, therefore, block hit signal BHT changes in accordance with the block address signal.

In the test operation, test mode instructing signal TEST is at H-level, and AND circuit 444 operates as a buffer circuit. Thus, the latch circuit 440b selectively enters the latch state in accordance with main row-related control signals RCNTAA and RCNTPA so that block hit signal BHT is maintained in the selected state until the precharge operation is internally performed.

In the normal operation, block hit signal BHT is driven to the selected state in accordance with the block address signal. In the test operation, block hit signal BHT is latched for a required period, and the timing of start of the internal precharge operation is externally and accurately controlled.

In the case where only the precharge control is a target of the test, conduction/non-conduction of transfer gate 441a may be controlled using the inverted signal of main precharge activating signal RCNTPA. More specifically, transfer gate 441b is turned off while main precharge activating signal RCNTPA is at H-level, and transfer gate 441b is turned on when main precharge activating signal RCNTPA is at L-level. Even if such a structure is meployed, the internal precharge operation can be accurately controlled.

By utilizing the circuit for latching block hit signal BHT as described above, as for the latch circuit producing the local precharge control signal, a latch circuit other than those shown in FIGS. 18 and 24 can be employed, and the logical level of the active state of the main precharge activating signal can be desirably set.

Figure 74:
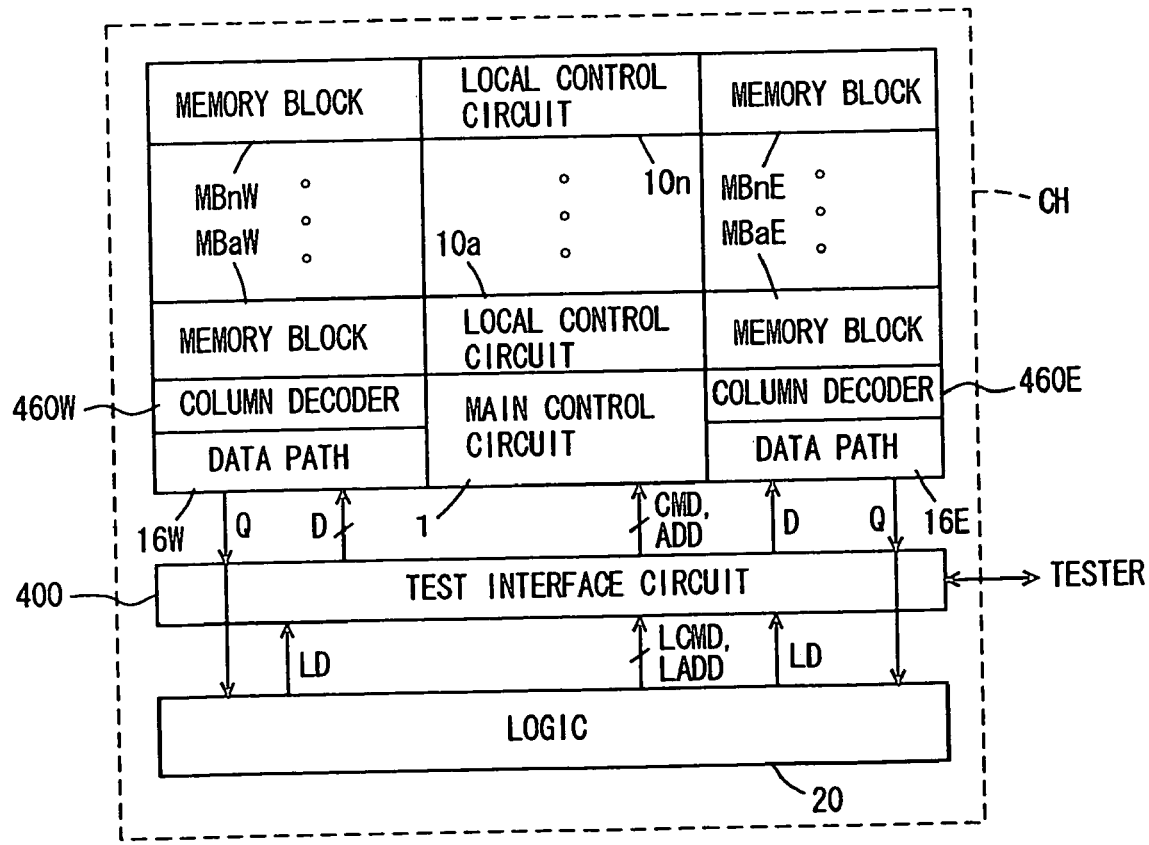
FIG. 74 shows more specifically the structure of the semiconductor integrated circuit device according to the twelfth embodiment of the invention.

FIG. 74 schematically shows a structure of a column selecting portion of the semiconductor integrated circuit device according to the twelfth embodiment of the invention. The structure shown in FIG. 73 corresponds to the structure shown in FIG. 67. Logic 20 transfers, via test interface circuit 400 to the semiconductor memory device, a logic command LCMD, a logic address LADD and write data LD. The semiconductor memory device receives command CMD, address ADD and write data D via test interface circuit 300, and transfers read data Q to test interface circuit 400 and logic 20. These structures are the same as those shown in FIG. 67, and corresponding portions are allotted with the same reference numerals.

In the semiconductor memory device, a column decoder 460W is arranged commonly to memory blocks MBaW––MBnW, and a column decoder 460E is arranged commonly to memory blocks MBaE–MBnE. These column decoders 460E and 460W perform the column address decode operation under control of main control circuit 1. In the column selecting operation, a block address specifying a memory block is applied. When measuring the write cycle time, a write command is applied after applying a precharge command, and then the column selecting operation is performed.

In this case, block decoder 440 is in the latched state, and block hit signal BHT is not affected by the block address during the column access (data writing or reading).

Column decoder 460W and 460E are arranged near main control circuit 1, but are located at positions different from those of the row decoders arranged in local control circuits 10a–10n, and signal lines for transmitting the row-related address signal are independent of those for transmitting the column-related address signal. Thereby, such a situation can be reliably prevented that the column-related address signal affects the operation of the row-related circuits.

Even in the case where the block address signal lines are arranged commonly to the row access and to the column access, the local row-related control circuit in the selected state is in such a state that the address decoder therein is in the latch state. Thus, even if block hit signal BHT is driven to the selected state in the column access, main row-related control signals RCNTAA and RCNTPA are kept inactive during this column access so that the row-related circuits do not change the states thereof.

In the structure shown in FIG. 74, the block address applied in the column access operation is utilized for connecting the local I/O line pair, which is arranged for a selected memory block, to a global I/O line pair.

Alternative to the structure shown in FIG. 74, the column decoders may be arranged corresponding to memory blocks MBaW–MBnW and MBaE–MBnE, respectively. The column decoder is activated in accordance with the block address applied in the column access operation.

The column select signal line may be arranged outside the memory array, and the column selection by a combination with the block select signal may be performed in the sense amplifier band. In any one of the structures, the address signal at the time of column access of the column selecting operation does not affect the row-related circuits.

As described above, the test control signal is used for controlling the internal precharge operation start timing. Therefore, even in the case where a fast semiconductor memory device actually operates in accordance with a slow clock signal applied from a slow tester, the RAS precharge time can be accurately measured.

[First Modification]

Figure 75:
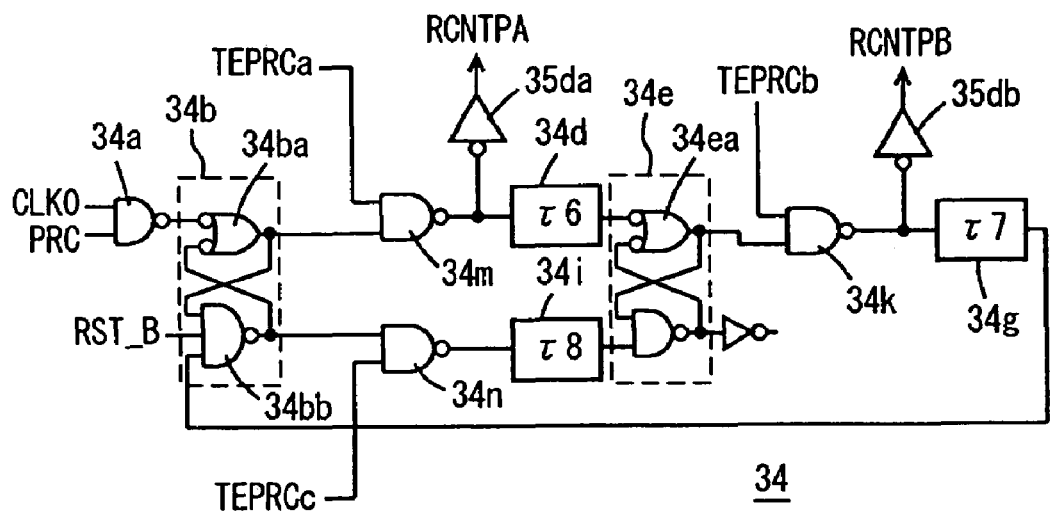
FIG. 75 shows a structure of a main precharge control circuit of a modification of the twelfth embodiment of the invention.

FIG. 75 shows a structure of a modification of main precharge control circuit 34 according to a first modification of the twelfth embodiment of the invention. The structure shown in FIG. 75 uses test precharge control signals TEPRCa, TEPRCb and TEPRCc of three phases.

In FIG. 75, main precharge control circuit 34 includes: an NAND circuit 34m receiving the output signal of an NAND circuit 34ba of flip-flop 34 and test precharge control signal TEPRCa, an NAND circuit 34k receiving the output signal of an NAND circuit 34ea of flip-flop 34 and test precharge control signal TEPRCb, and an NAND circuit 34n receiving the output signal of an NAND circuit 34bb of flip-flop 34b and test precharge control signal TEPRCc.

The output signal of NAND circuit 34m is applied to delay circuit 34d, and the output signal of NAND circuit 34k is applied to delay circuit 34g. The output signal of NAND circuit 34n is applied to delay circuit 34i. Other structures are the same as those shown in FIG. 68. Corresponding portions are allotted with the same reference numerals, and description thereof is not repeated.

According to the structure shown in FIG. 75, the active periods and activation timing of main precharge control signals RCNTPA, RCNTPB and RCNTPC can be controlled by test precharge control signals TERRCa, TEPRCb and TEPRCc of three phases.

Figure 76:
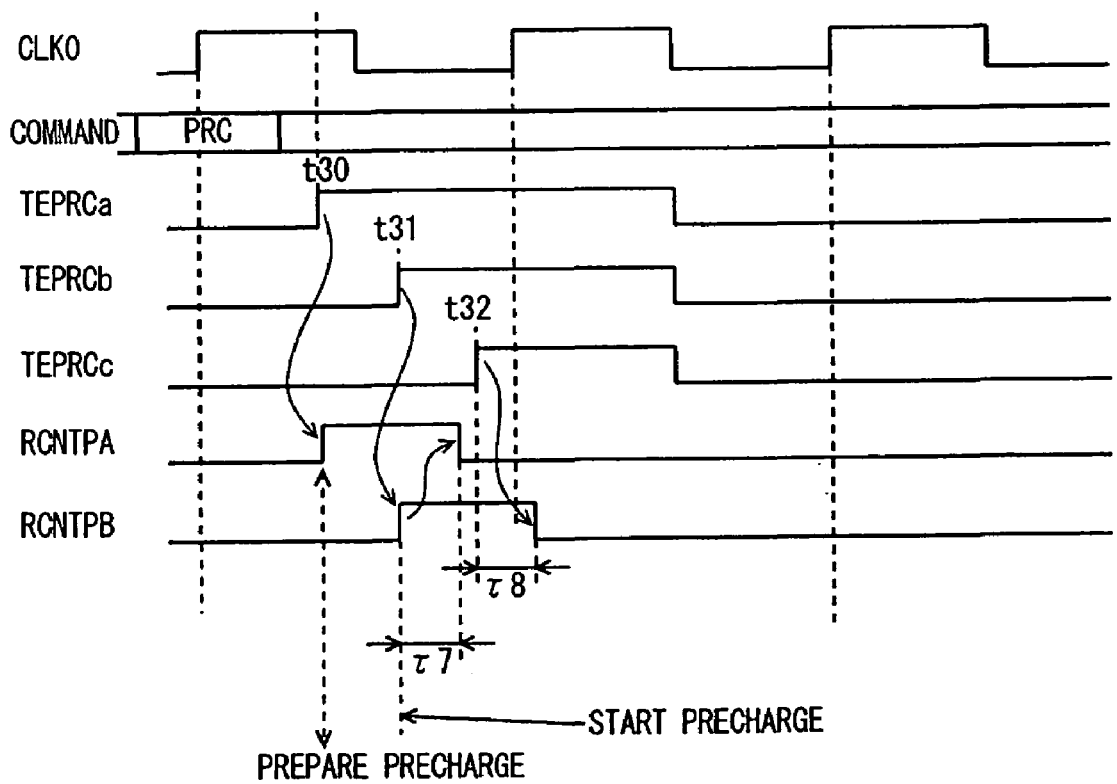
FIG. 76 is a timing chart representing an operation of the main precharge control circuit shown in FIG. 75.

FIG. 76 shows, by way of example, the operation sequence of main precharge control circuit 34 shown in FIG. 75. Referring to FIG. 76, description will now be given on the operation of main precharge control circuit 34 shown in FIG. 75.

Test precharge control signals TEPRCa–TEPRCc are all held at L-level, and precharge command PRC is applied. In response to the rising of clock signal CLK0, flip-flop 34b is set, and precharge command is latched.

At a time t30, test precharge control signal TEPRCa is driven to H-level so that main precharge activating signal RCNTPA rises to H-level, and preparation for the precharge operation is made. Thus, the local row-related control circuit enters the state for waiting for the next change of main precharge activating signal RCNTPC.

At a time t31, test precharge control signal TEPRCb is set to H-level. Responsively, the output signal of NAND circuit 34k attains L-level, main precharge activating signal RCNTPB attains H-level, and the precharge operation is performed in the corresponding memory block.

When delay time τ7 of delay circuit 34g elapses, flip-flop 34b is reset, and main precharge activating signal RCNTPA falls to L-level. In response to the falling of main precharge activating signal RCNTPA, the bit lines are equalized in potential, and the sense amplifier is deactivated as shown in FIG. 71.

At a time t32, test precharge control signal TEPRCc is set to H-level. Thereby, flip-flop 34e is reset after elapsing of a delay time τ8 of delay circuit 34i, and main precharge activating signal RCNTPB falls to L-level so that the precharge operation is completed.

Accordingly, by utilizing test precharge control signals TEPRCa–TEPRCc, it is possible to adjust the timing of internal execution of the precharge. In response to the rising of main precharge activating signal RCNTPA, the selected word line is deactivated. In response to the falling of main precharge activating signal RCNTPA, initialization of bit line peripheral circuits starts.

Test precharge control signals TEPRCa and TEPRCb determine the pulse width of main precharge activating signal RCNTPA, and test precharge control signals TEPRCb and TEPRCc determine a period of H-level of main precharge activating signal RCNTPB.

In this structure shown in FIG. 75, delay time τ7 of delay circuit 34g determines a time from start of deactivation of a selected word line to start of resetting of the bit line peripheral circuits such as bit line equalize circuits and sense amplifiers. However, NAND circuit 34n may be arranged at a preceding stage of flip-flop 34b, and may be supplied with an inverted signal of the output signal of delay circuit 34g so that test precharge control signal TEPRCc can adjust the falling timing of main precharge activating signal RCNTPA.

If the bit line peripheral circuits are adapted to be initialized in response to the falling of main precharge activating signal RCNTPB, according to the structure shown in FIG. 75, the time period, required from start of driving of a selected word line to the unselected state to the initialization of the bit line peripheral circuits, can be adjusted by the test precharge control signal independently of the delay time of delay circuit 34g. Thereby, the timing relationship between the main precharge activating signals RCNTPA and RCNTPB can be tested.

In the structure shown in FIG. 75, the RAS precharge time and others can be accurately measured with a slow tester, similarly to the structure shown in FIG. 68. The measuring operation is performed similarly to that shown by the operation sequence in the timing charts of FIGS. 70 and 71.

Main precharge control circuit 34 may be formed employing the structure as shown in FIG. 13A.

In the structure shown in FIG. 75, it is impossible to predict the time, at which test precharge control signal TEPRCa rises to H-level. Therefore, it is necessary to keep the latch circuit, which produces local precharge control signal PRCa, in the enabled state until main precharge activating signal RCNTPA rises to H-level in accordance with test precharge control signal TEPRCa. In the structure utilizing test precharge control signals TEPRCa–TEPRCc of the plurality of phases, therefore, it is necessary to latch block hit signal BHT.

The latch circuit is merely required to enter the latch state while at least one of clock signal CLK0 and main precharge activating signal RCNTPA is at H-level. However, with this structure, such a condition h as to be satisfied that test precharge control signal TEPRCa is raised to H-level when clock signal CLK0 is at H-level.

Alternatively, a set/reset flip-flop may be provided, which is set in accordance with a precharge instructing signal produced in accordance with precharge command PRC, and is reset in response to activation of main precharge activating signal RCNTPA. The state of latch circuit 440b (FIG. 72) latching block hit signal BHT is controlled in accordance with the output signal of such set/reset flip-flop. According to this structure, the precharge operation can be externally and accurately controlled even when it is impossible to predict the rising of test precharge control signal TEPRCa. In the normal operation, this flip-flop is in the reset state so that the latch circuit is in the through state, and block hit signal BHT is produced in accordance with the block address signal.

[Second Modification]

Figure 77:
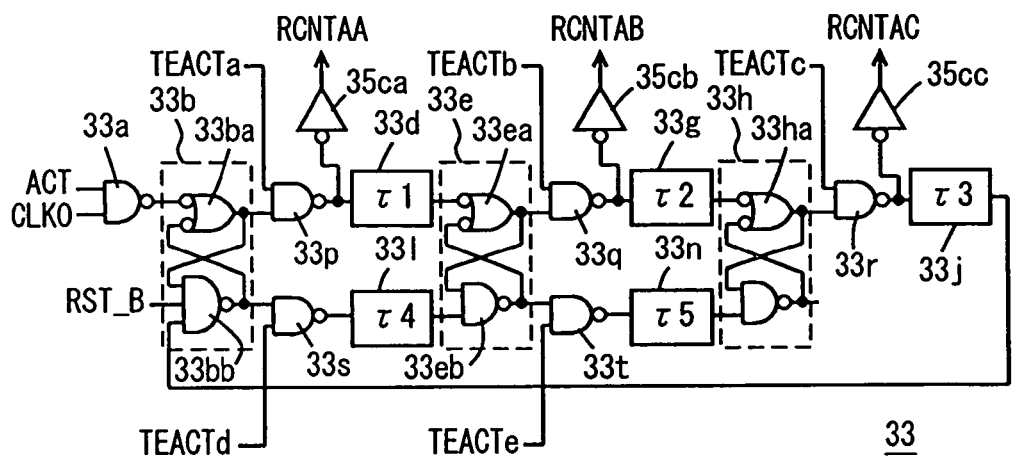
FIG. 77 shows a structure of a main row activation control circuit of a second modification of the twelfth embodiment of the invention.

FIG. 77 shows a structure of a main row activation control circuit 33 according to a second modification of the twelfth embodiment of the invention. The structure of main row activation control circuit 33 shown in FIG. 77 corresponds to the structure shown in FIG. 10A.

In FIG. 77, main row activation control circuit 33 includes: an NAND circuit 33p which receives a test row control signal TEACTa and an output signal of an NAND circuit 33ba of flip-flop 33b; an NAND circuit 33q which receives a test row control signal TEACTb and an output signal of an NAND circuit 33ea of flip-flop 33e; an NAND circuit 33r which receives a test row control signal TEACTc and an output signal of an NAND circuit 33bb of flip-flop 33b; an NAND circuit 33s which receives a test row control signal TEACTd and an output signal of an NAND circuit 33bb of flip-flop 33b; and an NAND circuit 33t which receives a test row control signal TEACTe and an output signal of an NAND circuit 33eb of flip-flop 33e.

The output signal of NAND circuit 33p is applied to inverter 35ca and delay circuit 33d. The output signal of NAND circuit 33q is applied to inverter 35cb and delay circuit 33g. The output signal of NAND circuit 33r is applied to inverter 35cc and delay circuit 33j.

The output signal of NAND circuit 33s is applied to delay circuit 33l, and the output signal of NAND circuit 33t is applied to delay circuit 33n.

Test row control signals TEACTa–TEACTe are applied asynchronously to clock signal CLK0 from an external tester through the test interface circuit.

Referring to a timing chart of FIG. 78, description will now be given on an operation of main row activation control circuit 33 shown in FIG. 77.

With test row control signals TEACTa–TEACTe all held at L-level, row active command ACT is applied. In response to the rising of clock signal CLK0, flip-flop 33b is set, and row active command ACT is latched.

When test row control signal TEACTa is set to H-level at a time t40, the output signal of NAND circuit 33p attains L-level, and responsively main row activating signal RCNTAA attains H-level. In response to the rising of main row activating signal RCNTAA, internal row control signal ACTA attains H-level in the local row-related control circuit in the selected memory block, the cycle of selecting a memory cell starts, and bit line isolation instructing signal BLI falls. Row decoder enable signal RADE is activated, and the operation of decoding the row address signal starts.

When test row control signal TEACTb rises to H-level at a time t41, the output signal of NAND circuit 33q attains L-level, and main row activating signal RCNTAB attains H-level. Thereby, bit line precharge/equalize instructing signal BLEQ attains L-level, and precharge/equalize of the bit lines are completed.

When test row activating signal TEACTc is set to H-level at a time t42, main row activating signal RCNTAc attains H-level, word line drive timing signal RXT attains H-level, and the word line arranged at the selected address is driven to the selected state.

When a delay time τ3 of delay circuit 33j elapses, flip-flop 33b is reset, and main row activating signal RCNTAA falls to L-level.

When test row control signal TEACTc rises to H-level at a time t43, the reset signal of flip-flop 33b is transmitted to delay circuit 33l via NAND circuit 33s. When a delay time τ4 of delay circuit 33l elapses, flip-flop 33e is reset, and main row activating signal RCNTAB falls to L-level so that sense amplifier activating signal SON becomes active.

When a delay time of delay circuit 33n elapses after test row control signal TEACTe rises to H-level at a time t44, main row activating signal RCNTAC falls to L-level, and sense amplifier activating signal SOP becomes active.

Figure 78:
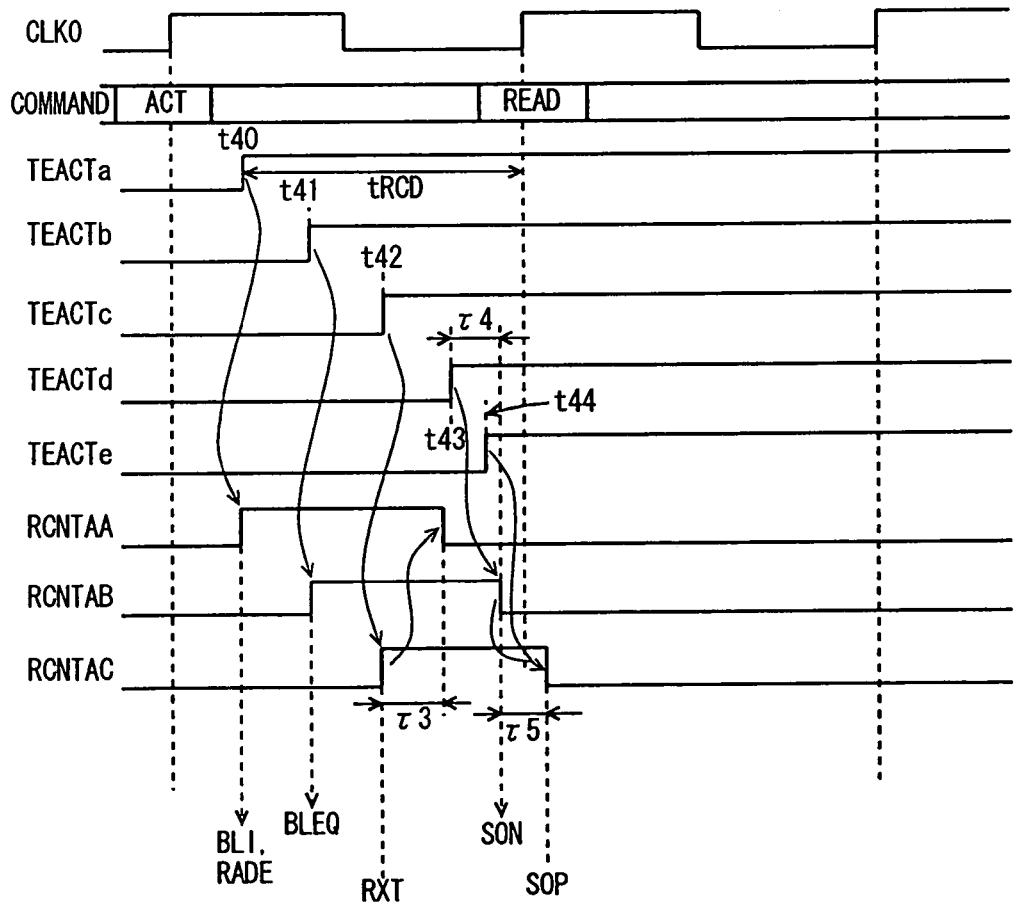
FIG. 78 is a timing chart representing:an operation of the circuit shown in FIG. 77.
Figure 79:
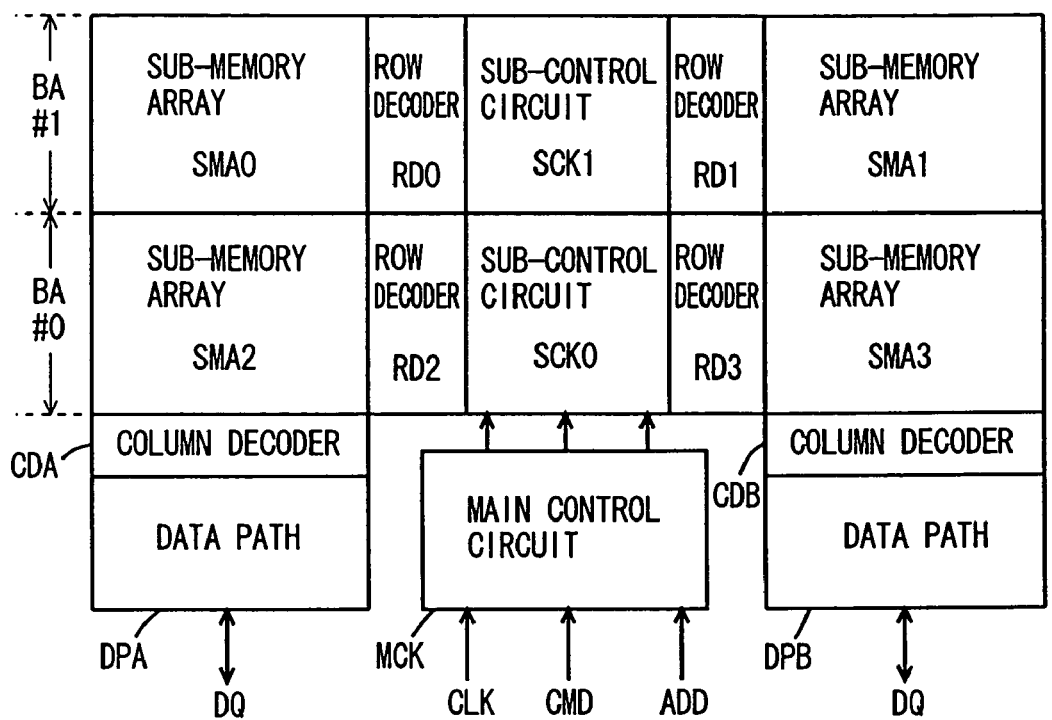
FIG. 79 schematically shows a whole structure of a conventional semiconductor memory device in the prior art.
Figure 80:
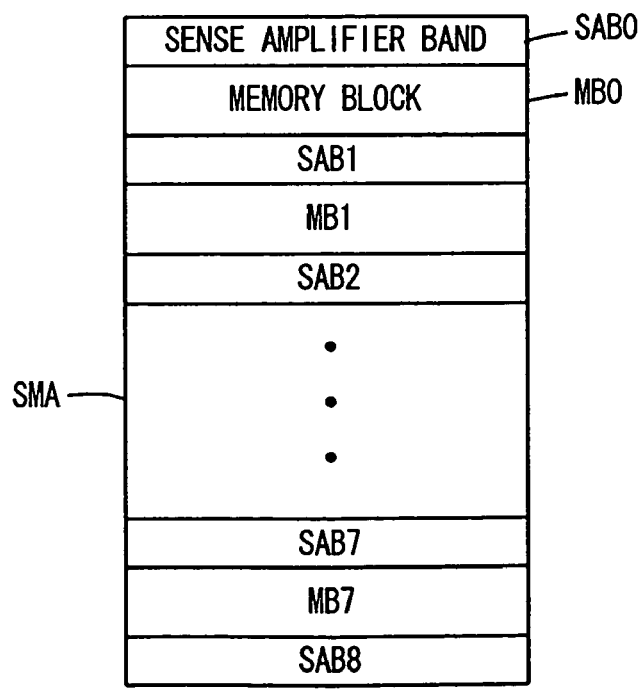
FIG. 80 schematically shows a structure of a sub-memory array shown in FIG. 79.
Figure 81:
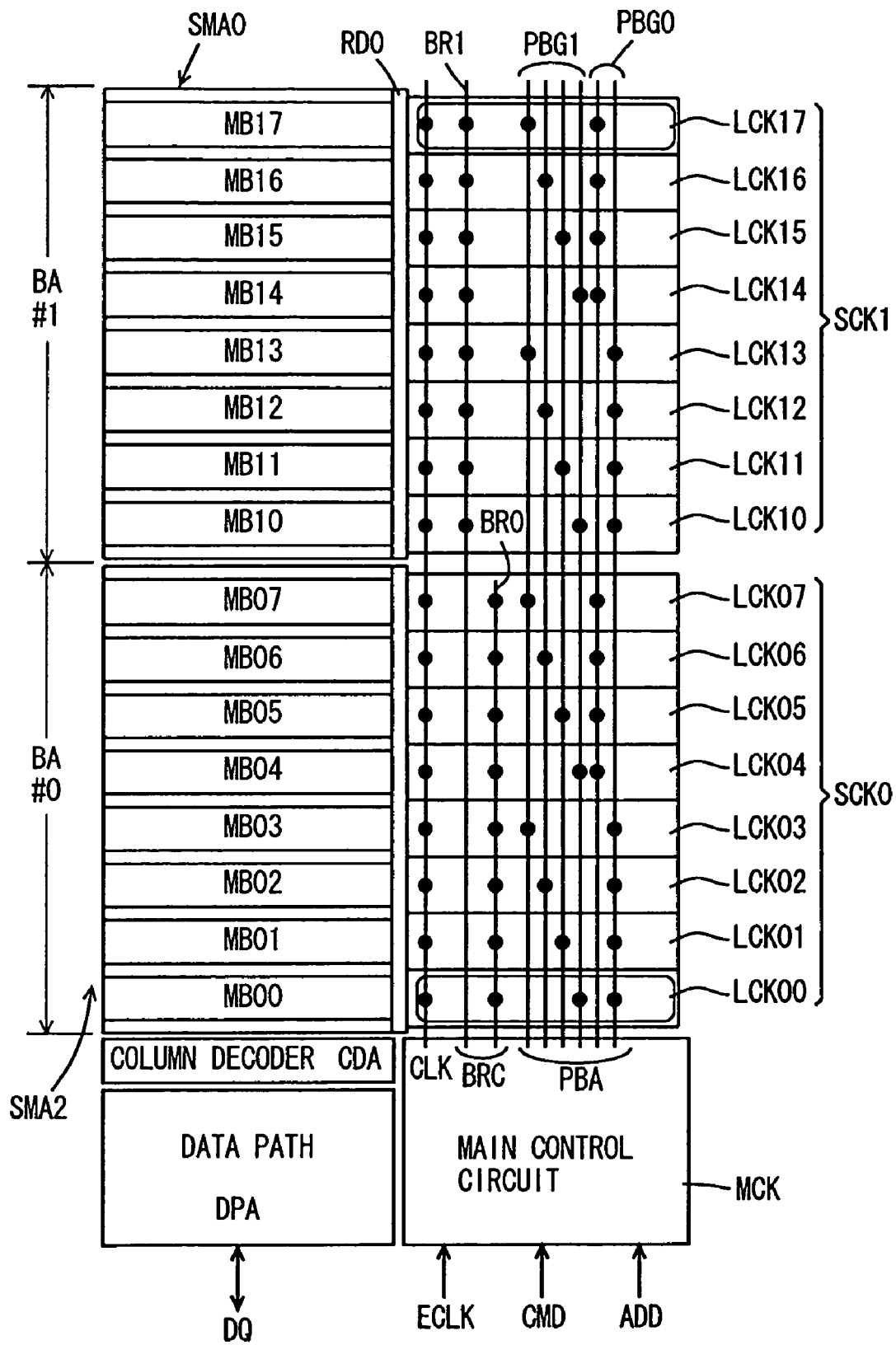
FIG. 81 schematically shows signal lines of a main control circuit and local control circuits of a conventional semiconductor memory device.
Figure 82:
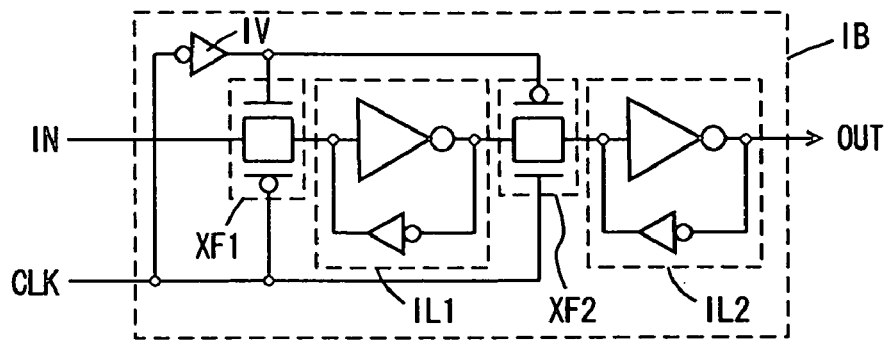
FIG. 82 shows a structure of an input buffer circuit in the conventional semiconductor memory device.
Figure 83:
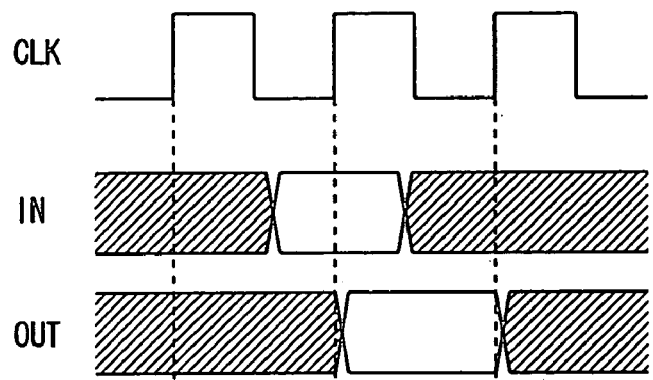
FIG. 83 is a signal waveform diagram representing an operation of the input buffer circuit shown in FIG. 82.
Figure 84:
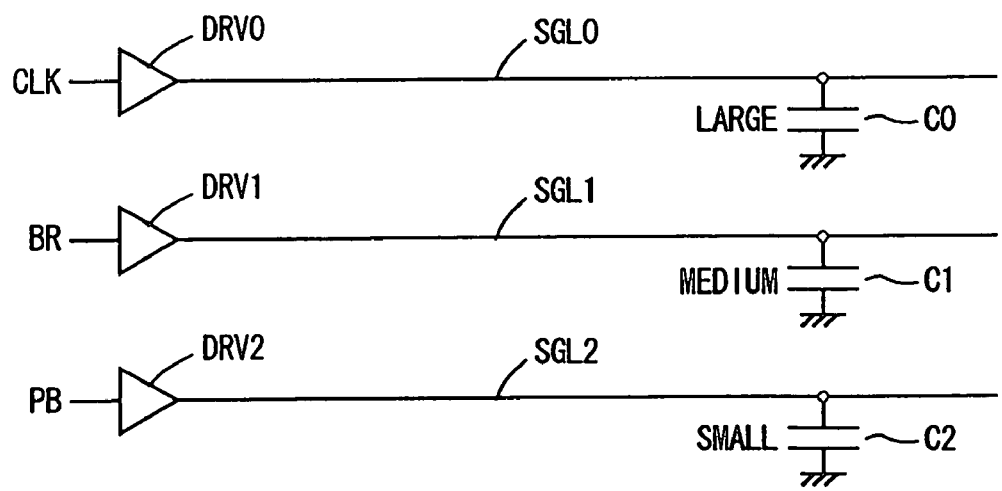
FIG. 84 schematically shows signal line loads of the semiconductor memory device.
Figure 85:
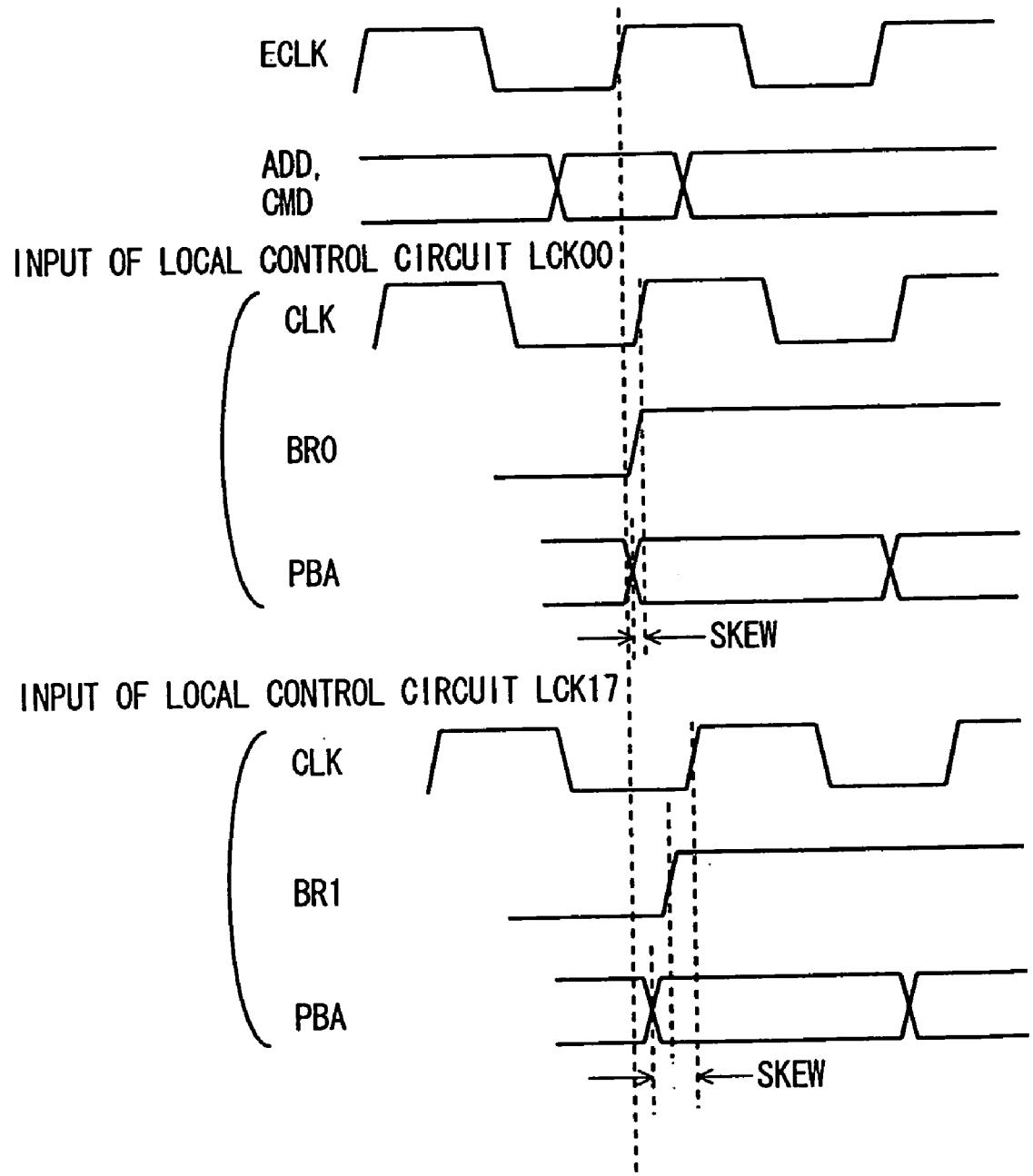
FIG. 85 is a signal waveform diagram representing an operation on signal lines shown in FIG. 84.
Figure 86:
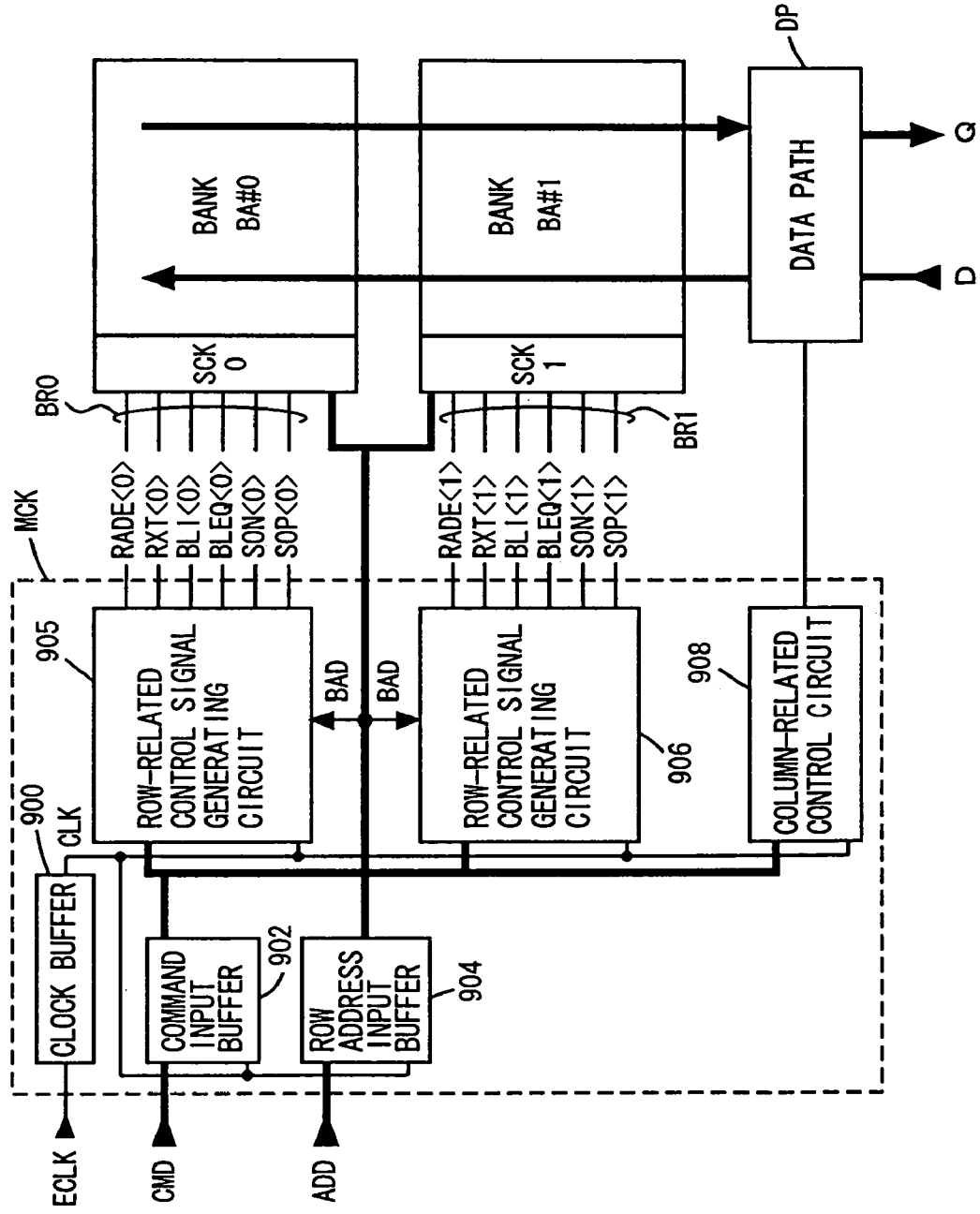
FIG. 86 schematically shows a structure of a main control circuit of the conventional semiconductor memory device.
Figure 87:
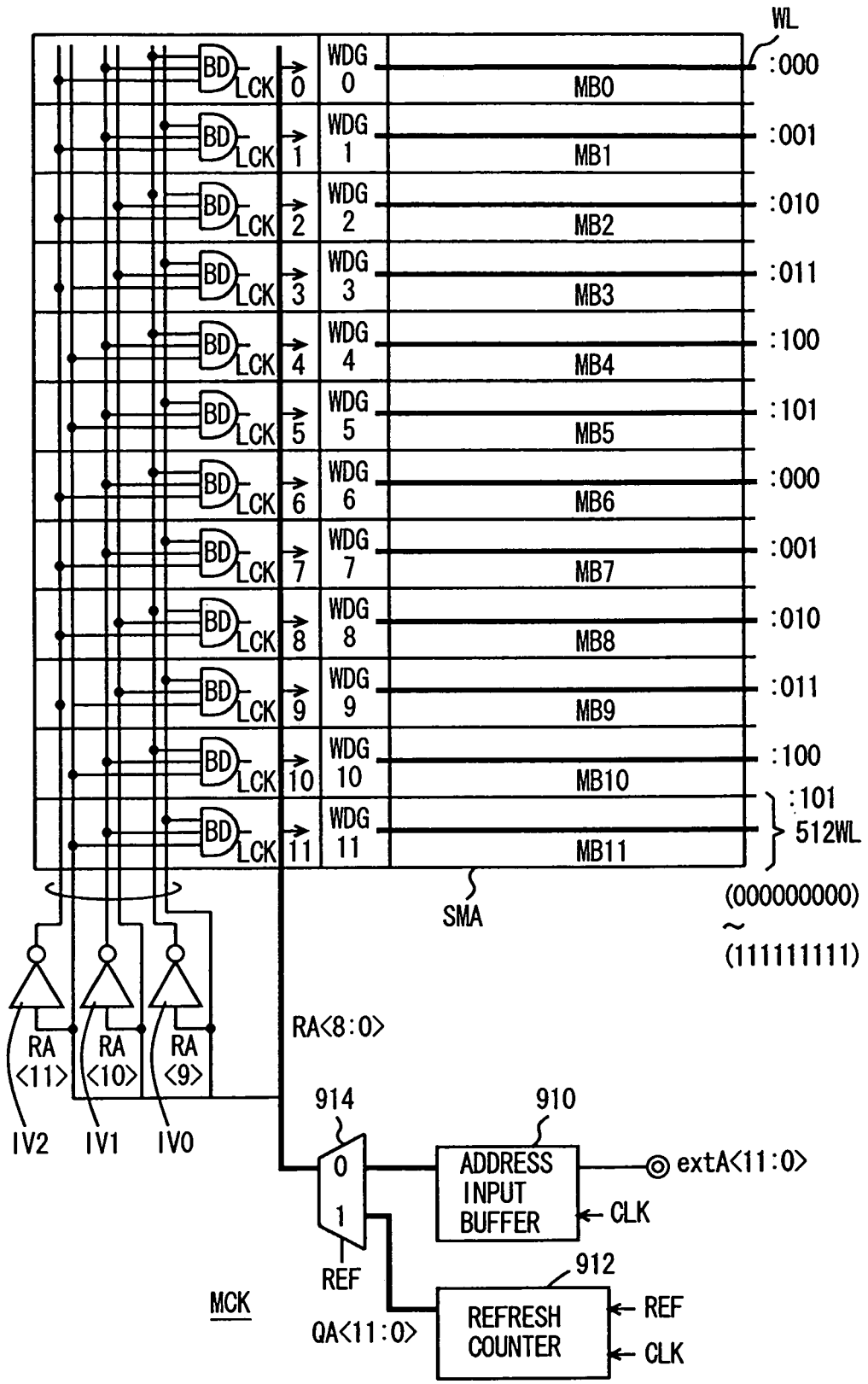
FIG. 87 shows an arrangement of a portion related to refreshing of a sub-memory array of a conventional semiconductor memory device.

FIG. 78 shows a state where test row control signal TEACTe rises to H-level before activation of sense amplifier activating signal SON. If test row control signal TEACTe rises after the activation of sense amplifier activating signal SON, i.e., after falling of main row activating signal RCNTAB, sense amplifier activating signal SOP is rendered active after elapsing of a delay time τ5 of delay circuit 33n from the rising of test row control signal TEACTe.

When a read command instructing data reading is applied at the rising of clock signal CLK0, data reading is performed. In the timing chart of FIG. 78, since a read command is applied before activation of sense amplifier activating signal SOP, accurate data reading cannot be ensured. The data thus read is compared with expected read data. Thereby, an RAS-CAS delay time tRCD can be measured.

The time period from the time of start of the internal row selecting operation to the time of reception of the column access command can be measured by adjusting the timing at which the test row control signal is driven to the H-level. Accordingly, even if clock signal CLK0 is slow, it is possible to measure the RAS-CAS delay time shorter than the cycle period of clock signal CLK0.

As shown in FIG. 78, with test row control signals TEACTa–TEACTe, the internal operation timing can be adjusted so that the operation timing margin of each row-related circuit in the row selecting operation can be measured, and a margin failure and others can be detected or measured with a tester operating in synchronization with a slow clock signal.

Since it is impossible to predict the timing of application of test row control signal TEACTa, it is necessary to latch block hit signal BHT until the row-related operation starts. For a latch circuit for latching the block hit signal BHT, the latch circuit is merely required to be in the latch state while at least one of clock signal CLK0 and main row activating signal RCNTAA is at H-level. Accordingly, as the latch circuit, the structure as shown in FIG. 73 may be employed with the modification that the output signal of the OR circuit receiving main row activating signal RCNTAA and clock signal CLK0 is applied to OR circuit 342 in place of main row activating signal RCNTAA.

Alternatively, such a set/reset flip/flop may be provided that is set in accordance with the row selecting operation instructing signal produced in accordance with row active command ACT, and is reset in accordance with activation of main row activating signal RCNTAA, for controlling the circuit latching block hit signal BHT in accordance with the output signal of this flip-flop. This latch circuit may be formed utilizing a structure of latch circuit 440b shown in FIG. 72. In the normal operation, this flip-flop is in the reset state, and the latch circuit latching block hit signal BHT is in the through state. In the normal operation, therefore, block hit signal BHT is produced in accordance with the block address signal.

In the use in combination with the configuration controlling the precharge operation, in the test operation, the flip-flop is set in response to the activation of either the precharge instructing signal produced in accordance with the precharge command or the row selection instructing signal produced in accordance with the row active command, and is reset in response to the activation of main precharge activating signal RCNTPA or main row activating signal RCNTAA. Thereby, it is possible to measure, with a slow tester, the parameters related to the precharge operation and the parameters related to the row selection.

Main row activation control circuit 33 may be formed utilizing the structure shown in FIG. 11A.

As described above, the test control signals of a plurality of phases are likewise used for the row activation control signal to control activation/deactivation of the main row activating signal, and it is possible to adjust the timing by a time period shorter than one clock cycle of the clock signal CLK. Accordingly, it is not necessary to apply successively the row active command and the column access command using a fast clock signal when measuring the RAS-CAS delay time, and therefore the RAS-CAS delay time can be measured with a slow tester.

These test control signals of the plurality of phases are merely required to have the phases shifted from each other, and can be produced independently of the clock signal in the tester using the delay circuit. The minimum time difference between test control signals TEACTa–TEACTe can be determined depending on the delay time of the delay circuit, which can be used in the tester. Test control signals TEACTa–TEACTe determine the timing of activation/deactivation of the internal row-related control signals, and a slow tester can be used for measuring the timing margin of various control signals of the row-related circuits.

According to the twelfth embodiment of the invention, activation/deactivation of the row-related control signals are controlled in accordance with the test control signals, which in turn are asynchronous to the clock signal applied from an external tester, and the internal state can be changed at a time period shorter than one cycle of the clock signal. Therefore, various row-related operation parameters of the semiconductor memory device operating fast can be measured with a slow tester.

The first to eleventh embodiments have been described in connection with the structure of the DRAM merged with the logic. However, the present invention can be applied to various semiconductor memory devices other than such embedded DRAM, provided that the memory devices operate in synchronization with a clock signal.

As described above, the present invention can provide the semiconductor memory device, which can achieve an excellent design efficiency, can be adapted to the bank change within a short time, and can operate fast and stably.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory blocks each having a plurality of memory cells, each of the memory cells requiring periodical refreshing of storage data;
   refresh address generating circuitry for generating a refresh address signal designating a memory cell to be refreshed in accordance with a refresh instruction instructing refreshing of data of the memory cell in the memory blocks, said refresh address signal including a refresh block address signal designating a memory block to be refreshed among said plurality of memory blocks; and
   block select circuits arranged corresponding to said plurality of memory blocks, each for producing a refresh block select signal indicating whether a corresponding memory block is selected, in accordance with said refresh block address signal, and
   said refresh address generating circuitry including a reset signal producing circuit for producing a reset signal for resetting said refresh block address signal to an initial value in accordance with at least said refresh block select signal.

2. The semiconductor memory device according to claim 1, wherein
   said refresh address generating circuitry includes:
   a refresh block address producing circuit for producing said refresh block address signal such that said plurality of memory blocks are refreshed in a predetermined sequence; and
   a refresh word line address generating circuit for producing a word line address signal successively designating rows of memory cells in each of the memory blocks, the memory cells being arranged in rows and columns in each of said memory blocks, and word lines being arranged corresponding to the rows of memory cells, and
   said reset signal producing circuit produces said reset signal in response to the refresh block select signal applied from a final memory block in said predetermined sequence of said plurality of memory blocks, and a final word line address signal, designating a final word line in a word line selection sequence, applied from said word line address generating circuit and said refresh instruction.

3. The semiconductor memory device according to claim 1, wherein
   said plurality of memory blocks are refreshed in a predetermined refresh sequence in accordance with the refresh address signal, and
   said reset signal producing circuit detects completion of the refresh for a final memory block in the refresh sequence of said plurality of memory blocks, for producing said reset signal.

4. The semiconductor memory device according to claim 1, wherein
   said block select circuits each include:
   a refresh block decoder for producing the block select signal for a corresponding memory block in accordance with the refresh block address signal applied from said refresh address generating circuitry; and
   said refresh block decoder includes:
   a refresh complementary bit producing circuit for producing complementary address signal bits from a multi-bit internal address signal transmitted through an internal address signal bus, said refresh address signal generated from said refresh address generating circuitry being a multi-bit signal and being transmitted through said internal signal bus;
   an address select circuit for selecting the complementary address signal bits generated from said refresh complementary bit producing circuit in accordance with a select signal, and
   a decode circuit for producing the block select signal for the corresponding memory block in accordance with selected address signal bits applied from said address select circuit.

5. The semiconductor memory device according to claim 1, wherein
   the memory cells are arranged in rows and columns in each of the memory blocks, and word lines are arranged corresponding to said rows,
   said refresh address signal further includes a refresh word line address signal designating a word line in each of the memory blocks, and
   said semiconductor memory device further comprises:
   a refresh final word line detecting circuit arranged corresponding to each of said memory blocks for detecting whether a final word line in a refresh sequence is selected in the corresponding memory block in a refresh mode of refreshing memory cell data, and
   a refresh word line reset signal generating circuit for producing a refresh word line reset signal resetting said refresh word line address signal to an initial value in accordance with a detection signal applied from said refresh final word line detecting circuit.

6. The semiconductor memory device according to claim 1, further comprising:
   an address select circuit for receiving an external address signal and a refresh address signal generated from said refresh address generating circuit, transmitting said external address signal to an internal address signal bus when a normal operation mode instructing signal instructing a normal operation mode is active, and transmitting the refresh address signal generated from said refresh address generating circuit to said internal address signal bus when said normal operation mode instructing signal is inactive.

* * * * *